(12) United States Patent
Lin et al.

(10) Patent No.: US 11,289,502 B2
(45) Date of Patent: Mar. 29, 2022

(54) MEMORY DEVICE AND METHOD FOR FABRICATING THE SAME

(71) Applicant: MACRONIX INTERNATIONAL CO., LTD., Hsinchu (TW)

(72) Inventors: Wei-Liang Lin, Taipei (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 12 days.

(21) Appl. No.: 16/727,009

(22) Filed: Dec. 26, 2019

(65) Prior Publication Data
US 2021/0202517 A1    Jul. 1, 2021

(51) Int. Cl.
*H01L 27/11582* (2017.01)
*H01L 27/11556* (2017.01)
(Continued)

(52) U.S. Cl.
CPC .... *H01L 27/11582* (2013.01); *G11C 16/0483* (2013.01); *G11C 16/10* (2013.01); *G11C 16/14* (2013.01); *G11C 16/26* (2013.01); *H01L 21/0223* (2013.01); *H01L 21/02164* (2013.01); *H01L 21/02636* (2013.01);
(Continued)

(58) Field of Classification Search
CPC ......... H01L 27/11582; H01L 21/32135; H01L 21/31116; H01L 29/40117; H01L 27/11519; H01L 27/11565; H01L 29/40114; H01L 29/4234; H01L 21/02164; H01L 21/02636; H01L 21/76224; H01L 27/11556; H01L 29/7884; H01L 21/0223; H01L 21/32055; H01L 29/7883;
(Continued)

(56) References Cited

U.S. PATENT DOCUMENTS

| 7,679,133 B2 * | 3/2010 | Son | H01L 27/11568 |
| | | | 257/328 |
| 9,893,075 B1 * | 2/2018 | Yasuda | H01L 29/42324 |

(Continued)

FOREIGN PATENT DOCUMENTS

TW    I668846 B    8/2019

OTHER PUBLICATIONS

TW Office Action dated Jul. 17, 2020 in Taiwan application (No. 108147915).

*Primary Examiner* — David Vu
(74) *Attorney, Agent, or Firm* — McClure, Qualey & Rodack, LLP

(57) ABSTRACT

A memory device includes a substrate having an upper surface; a stacked structure disposed on the upper surface of the substrate, wherein the stacked structure includes a first insulating layer, a first conductive layer, a second insulating layer; a second conductive layer and a third insulating layer sequentially stacked on the substrate; a plurality of channel structures penetrating the stacked structure and electrically connected to the substrate, wherein each of the channel structures includes an upper portion corresponding to the second conductive layer and a lower portion corresponding to the first conductive layer; a memory layer disposed between the second conductive layer and the upper portion; and a plurality of isolation structures penetrating the stacked structure to separate the stacked structure into a plurality of sub-stacks.

9 Claims, 110 Drawing Sheets

(51) Int. Cl.
*H01L 29/423* (2006.01)
*H01L 21/02* (2006.01)
*H01L 21/311* (2006.01)
*H01L 21/28* (2006.01)
*H01L 21/762* (2006.01)
*H01L 27/11519* (2017.01)
*H01L 27/11565* (2017.01)
*H01L 29/788* (2006.01)
*G11C 16/10* (2006.01)
*G11C 16/14* (2006.01)
*G11C 16/26* (2006.01)
*G11C 16/04* (2006.01)
*H01L 21/3205* (2006.01)
*H01L 21/3213* (2006.01)

(52) U.S. Cl.
CPC .. *H01L 21/31116* (2013.01); *H01L 21/32051* (2013.01); *H01L 21/32055* (2013.01); *H01L 21/32135* (2013.01); *H01L 21/76224* (2013.01); *H01L 27/11519* (2013.01); *H01L 27/11556* (2013.01); *H01L 27/11565* (2013.01); *H01L 29/40114* (2019.08); *H01L 29/40117* (2019.08); *H01L 29/4234* (2013.01); *H01L 29/42324* (2013.01); *H01L 29/7883* (2013.01); *H01L 29/7884* (2013.01); *H01L 21/02255* (2013.01)

(58) Field of Classification Search
CPC ......... H01L 29/42324; H01L 21/32051; H01L 21/02255
See application file for complete search history.

(56) References Cited

U.S. PATENT DOCUMENTS

2012/0276702 A1* 11/2012 Yang ................. H01L 29/66765
438/270
2018/0114722 A1   4/2018 Park et al.
2020/0227432 A1   7/2020 Lai et al.

\* cited by examiner

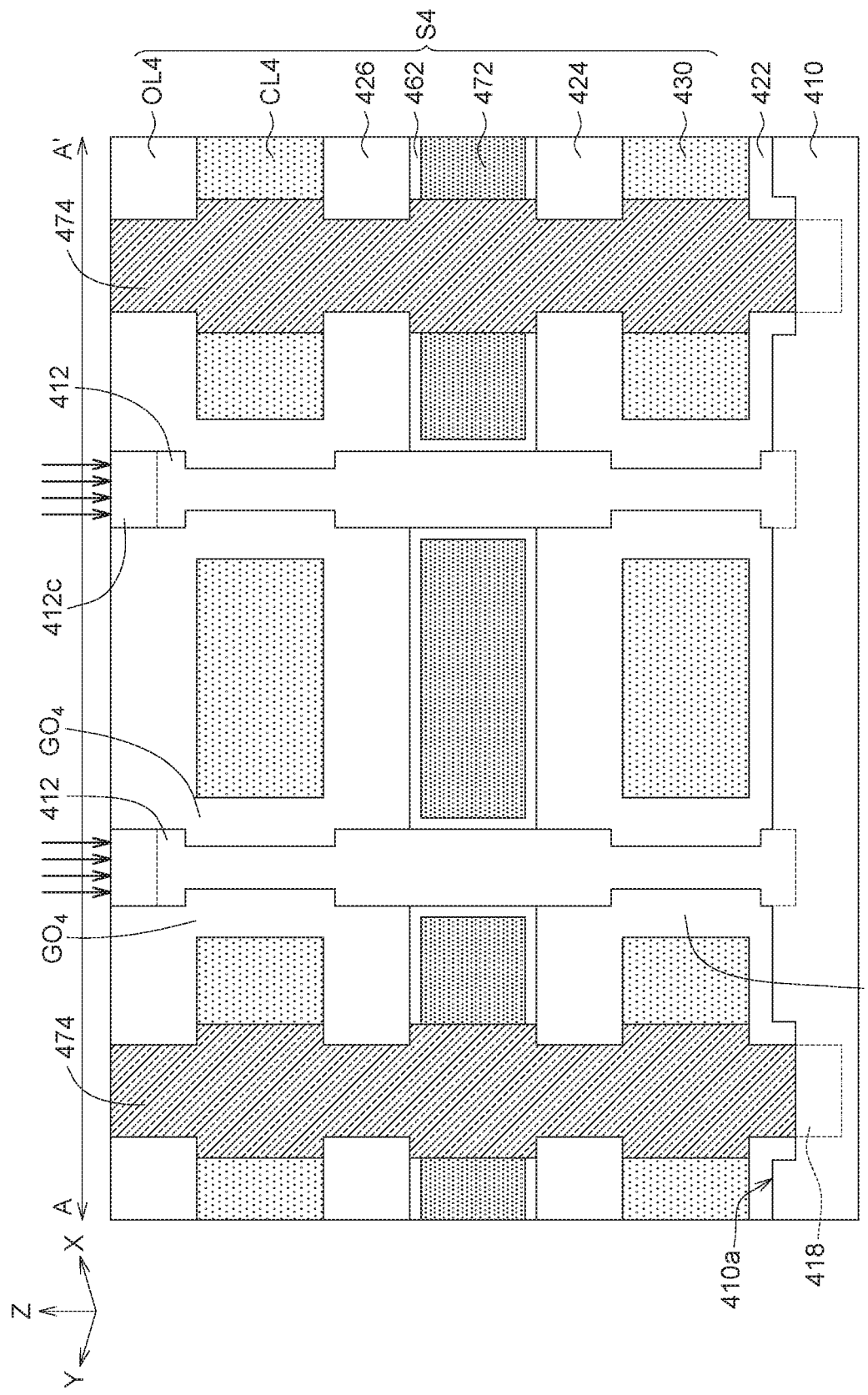

MEMORY DEVICE AND METHOD FOR FABRICATING THE SAME

BACKGROUND

Technical Field

The disclosure in generally relates to a semiconductor structure and method for fabricating the same, and more particularly to a memory device and method for fabricating the same.

Description of the Related Art

Recently, the demand for use of flash memory has been increasing. The flash memory device can be classified into a NOR type or a NAND type flash memory device. The NOR type memory device typically provides faster programming and reading speed by connecting one end of each memory cell to ground and the other end to a bit line. In general, the NOR type flash memory device is a two-dimensional type, and the memory cells are present in a two-dimensional array of a substrate. However, with the increasing number of applications, the size limitations of two-dimensional structures are no longer sufficient. Therefore, in order to provide a memory device with a higher storage capacity, there is still a need to develop a three-dimensional NOR type memory device having more excellent electric characteristics (for example, having good data storage reliability and operation speed).

SUMMARY

A memory device and a method for fabricating the same are provided in the present disclosure, to resolve a least a portion of the above problems.

According to an embodiment of the present invention, a memory device includes a substrate having an upper surface; a stacked structure disposed on the upper surface of the substrate, wherein the stacked structure includes a first insulating layer, a first conductive layer, a second insulating layer, a second conductive layer and a third insulating layer sequentially stacked on the substrate; a plurality of channel structures penetrating the stacked structure and electrically connected to the substrate, wherein each of the channel structures includes an upper portion corresponding to the second conductive layer and a lower portion corresponding to the first conductive layer; a memory layer disposed between the second conductive layer and the upper portion; and a plurality of isolation structures penetrating the stacked structure to separate the stacked structure into a plurality of sub-stacks.

According to an embodiment of the present invention, a method for fabricating a memory device includes the following steps. Firstly, a substrate having an upper surface is provided. Then, a stacked body on the upper surface of the substrate is formed, wherein the stacked body includes a first insulating layer, a first conductive layer, a second insulating layer, an upper sacrificial layer and a third insulating layer stacked on the upper surface of the substrate in sequence. A plurality of first openings penetrating the stacked body are formed. A plurality of channel structures in the first openings are formed, and the channel structures are electrically connected to the substrate, wherein each of the channel structures includes an upper portion and a lower portion, the lower portion corresponding to the a first conductive layer, the upper portion is disposed above the lower portion. A memory layer corresponding to the upper portion is formed. A plurality of second openings penetrating the stacked body are formed. The upper sacrificial layer is removed, and an upper opening is formed on position where the upper sacrificial layer is removed. A conductive material is filled in the upper opening to form a second conductive layer, so that a staked structure including the first insulating layer, the first conductive layer, the second insulating layer, the second conductive layer and the third insulating layer is formed. Thereafter, a plurality of isolation structures are formed in the second openings, and the isolation structures separate the stacked structures into a plurality of sub-stacks.

According to an embodiment of the present invention, a method for fabricating a memory device includes the following steps. Firstly, a substrate having an upper surface is provided. Then, a stacked body on the upper surface of the substrate is formed, wherein the stacked body includes a first insulating layer, a lower sacrificial layer, a second insulating layer, an upper sacrificial layer and a third insulating layer stacked on the upper surface of the substrate in sequence. A plurality of first openings penetrating the stacked body are formed. A plurality of lower portions of a plurality of channel structures are formed in the first openings. A memory layer corresponding to the upper sacrificial layer is formed. A plurality of upper portions of the channel structures are formed in the first openings, wherein the upper portions are disposed above the lower portions. A plurality of second openings penetrating the stacked body are formed. The upper sacrificial layer and the lower sacrificial layer are removed, and an upper opening and a lower opening respectively at positions where the upper sacrificial layer and the lower sacrificial layer are removed. A conductive material is filled in the upper opening and the lower opening to respectively form a second conductive layer and a first conductive layer, so that a stacked structure comprising the first insulating layer, the first conductive layer, the second insulating layer, the second conductive layer and the third insulating layer is formed. Thereafter, a plurality of isolation structures are formed in the second openings, and the isolation structures separate the stacked structures into a plurality of sub-stacks.

According to an embodiment of the present invention, before the forming of the stacking structure, the method for fabricating the memory device further comprises forming a semiconductor layer disposed on the first sacrifice layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
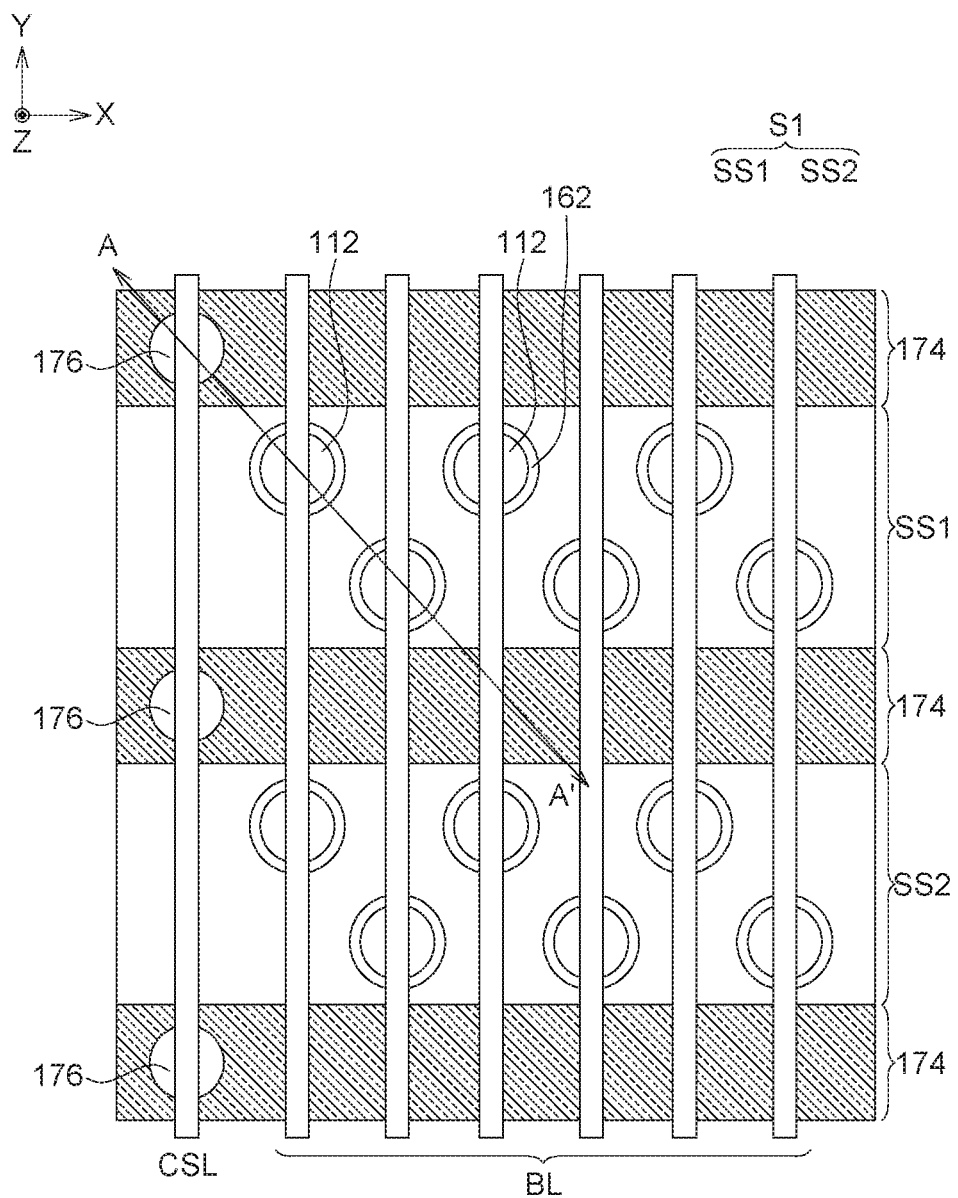
FIG. 1A is a top view illustrating a memory device in accordance with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
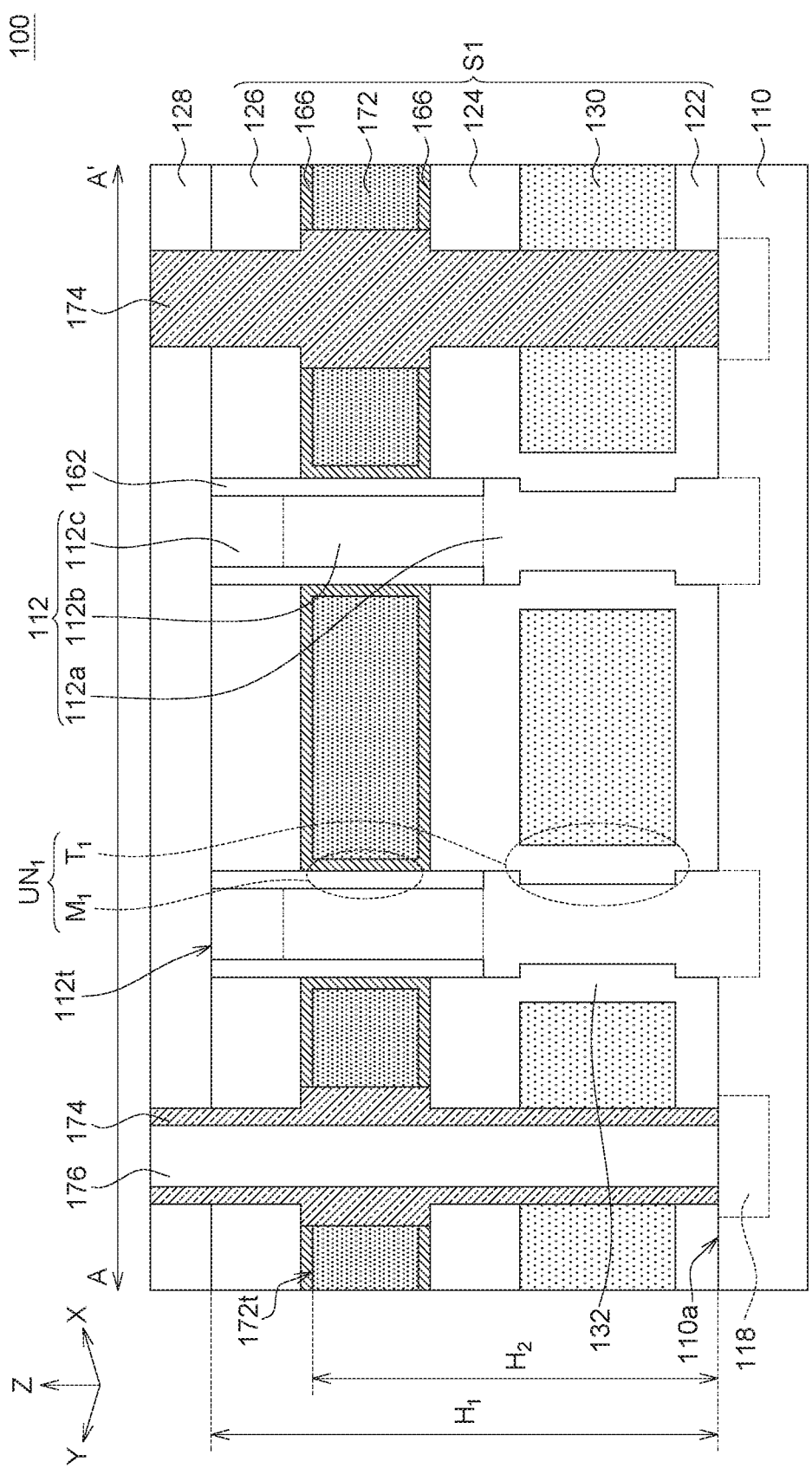
FIG. 1B is a cross-sectional view illustrating a memory device taken along with the line A-A' depicted in the FIG. 1 in accordance with one embodiment of the present invention.

FIG. 1A is a top view illustrating a memory device 100 in accordance with one embodiment of the present invention; FIG. 1B is a cross-sectional view illustrating a memory device 100 taken along with the line A-A' depicted in the FIG. 1 in accordance with one embodiment of the present invention.

Referring to FIG. 1A, a plurality of bit lines BL and a common source line CSL are disposed above the stacked structure S1, wherein the plurality of bit lines BL and the common source line CSL extend along a first direction (for example, the Y-axis direction) parallel to an upper surface 110a (as illustrated in FIG. 1B) of the substrate 110. The plurality of bit lines BL are disposed and separated along a second direction (for example, the X-axis direction) perpendicular to the first direction. The bit lines BL are electrically connected to the corresponding channel structures 112, respectively. The common source line CSL is electrically connected to the corresponding conductive connection structure 176.

Referring to FIGS. 1A and 1B simultaneously, the memory device 100 includes a substrate 110, a stacked structure S1, a capping layer 128, a plurality of channel structures 112, a thermal oxide layer 132, a memory layer 162, a dielectric material 166, a plurality of isolation structures 174, and a plurality of conductive connection structures 176. The stacked structure S1 is formed on the upper surface 110a of the substrate 110. The stacked structure S1 includes a first insulating layer 122, a first conductive layer 130, a second insulating layer 124, a second conductive layer 172, and a third insulating layer 126 stacked on the substrate 110 in sequence (for example, along the Z axis). The capping layer 128 may cover the stacked structure S1. That is, the capping layer 128 may be disposed on the third insulating layer 126. In some embodiments, substrate 110 can be a silicon substrate or other suitable substrate. The first insulating layer 122, the second insulating layer 124, the third insulating layer 126, and the capping layer 128 may be formed of an oxide, such as silicon dioxide (SiO2). The first conductive layer 130 and the second conductive layer 172 may be formed of a conductive material such as tungsten (W), aluminum (Al), titanium nitride (TiN), tantalum nitride (TaN), doped or undoped poly-silicon or other suitable material. In the present embodiment, the first conductive layer 130 and the second conductive layer 172 are formed of different materials, for example, n-type doped polysilicon and tungsten, respectively, but the invention is not limited thereto. A first conductive layer 130 and a second conductive layer 172 may be formed of the same material. In some embodiments, the first conductive layer 130 may have a thickness of 300 Å to 1000 Å, which can be used to adjust the threshold voltage (Vt).

The channel structures 112 (such as, along the Z axis) penetrate the stacked structure S1 and are electrically connected to the substrate 110, wherein each of the channel structures 112 includes a lower portion 112a and an upper portion 112b. The upper portion 112b is disposed above the lower portion 112a, and the upper portion 112b is directly connected to the lower portion 112a. In other words, the upper portion 112b corresponds to the second conductive layer 172, and the lower portion 112a corresponds to the first conductive layer 130. The top region of the channel structure 112 can have a doped region 112c, such as a dopant of an n-type semiconductor, such that the channel structure 112 can be electrically connected to the bit line BL. In some embodiments, the channel structure 112 can be an epitaxial growth layer, such as a single crystal or polycrystalline layer formed by an epitaxial growth process, or any combination thereof, which can be undoped or slightly P-type doped epitaxial growth layer. A first height H1 between a top surface 112t of the channel structure 112 (i.e., the epitaxial growth layer) and an upper surface 110a of the substrate 110 is larger than a second height H2 between a top surface 172t of the second conductive layer 172 and the upper surface 110a of the substrate 110. In comparison with a comparative example in which the channel structure only partially includes the epitaxial growth layer, since the channel structure 112 including the upper portion 112b and the lower portion 112a of the present invention is formed by the epitaxial growth process, the channel structure 112 may have a lower resistance and has better conductivity, and the memory device 100 can have a faster operating speed (for example, an operating speed of reading and writing).

The thermal oxide layer 132 is disposed between the first conductive layer 130 and the channel structure 112. For example, the thermal oxide layer 132 surrounds at least a portion of the lower portion 112a of the channel structure 112. In some embodiments, the thermal oxide layer 132 is an oxide layer formed by directly performing an oxidation process to the first conductive layer 130, such as silicon dioxide ($SiO_2$). Since the thermal oxide layer 132 is an oxide layer formed by directly oxidizing a conductive layer (for example, the first conductive layer 130), rather than an oxide layer formed by a deposition process (for example, chemical vapor deposition (CVD), physical vapor deposition (PVD) or other deposition processes, the purity of oxide of the thermal oxide layer 132 is larger than that of the insulating layer formed by the deposition method (for example, the first insulating layer 122, the second insulating layer 124 or the third insulating layer 126. Compared with the comparative example in which the thermal oxide layer is an oxide layer formed by a deposition process, since the thermal oxide layer of the present invention is an oxide layer formed by directly performing an oxidation process to the conductive layer, the thermal oxide layer has a higher oxide purity and quality, and the threshold voltage (Vt) can be better controlled, so that a lower threshold voltage can be achieved in low power applications, and the memory device 100 can have better reliability.

The memory layer 162 is disposed between the second conductive layer 172 and the upper portion 112b of the channel structure 112. For example, the memory layer 162 extends along the Z-axis direction and surrounds the upper portion 112b of the channel structure 112. The memory layer 162 may be formed of a composite layer (ie, an ONO layer) including a silicon dioxide ($SiO_2$) layer, a silicon nitride (SiN) layer, and a silicon oxynitride (SiON) layer. For example, memory layer 162 can include a tunneling layer, a trapping layer and a blocking layer. The tunneling layer may include silicon dioxide ($SiO_2$), a two-layer structure formed of silicon dioxide ($SiO_2$)/silicon oxynitride (SiON) or other suitable material. The trapping layer can include silicon nitride, polysilicon or other suitable materials. The blocking layer may include silicon dioxide ($SiO_2$) or other suitable material.

The dielectric material 166 is disposed between the memory layer 162 and the second conductive layer 172. A portion of the dielectric material 166 may extend along a normal direction of the upper surface 110a of the substrate 110, and a portion of the dielectric material 166 may extend in a direction parallel to the upper surface 110a of the substrate 110, and the dielectric material 166 may cover the second conductive layer 172. In some embodiments, the dielectric material 166 can include a high k material, such as aluminum oxide ($Al_2O_3$) or other suitable material. The dielectric material 166 can also act as a blocking layer to prevent lateral diffusion of charges. Compared with the comparative example in which the high k material is not used as the dielectric material, since the dielectric material 166 of the present invention can use a high k material, the operation (such as erasing and writing) of the memory device can be performed without using a too high voltage, the performance of the memory device can be improved.

The isolation structures 174 can penetrate the stacked structure S1 to separate the stacked structure S1 into a plurality of sub-stacks SS1, SS2. The present embodiment only exemplarily shows two sub-stacks. However, the present invention is not limited thereto, and the number of sub-stacks may be greater than two. The isolation structures 174 can be formed from an insulating material such as an oxide or other suitable material. The second conductive layers 172 of the adjacent sub-stacks 551, 552 can be physically and electrically isolated by the isolation structure 174, so the second conductive layers 172 in different sub-stacks can be operated independently, for example, applying different voltages.

The conductive connection structure 176 can penetrate the stacked structure S1 and is, for example, electrically connected to the substrate 110 through the doped region 118. The doped region 118 is doped, for example, by a dopant of an n-type semiconductor. The conductive connection structure 176 can be electrically connected to the common source line CSL.

In some embodiments, each of the intersections between the first conductive layer 130 and the thermal oxide layer 132 may form transistor $T_1$, and each of the intersections between the second conductive layer 172, the dielectric material 166, and the memory layer 162 may form a memory cell $M_1$. The transistor $T_1$ and the memory cell $M_1$ are connected in series by the channel structure 112, and both of them can form a unit cell $UN_1$ together. The first conductive layer 130 can serve as a ground selection line, and the second conductive layer 172 can serve as a word line.

Figure 1C:
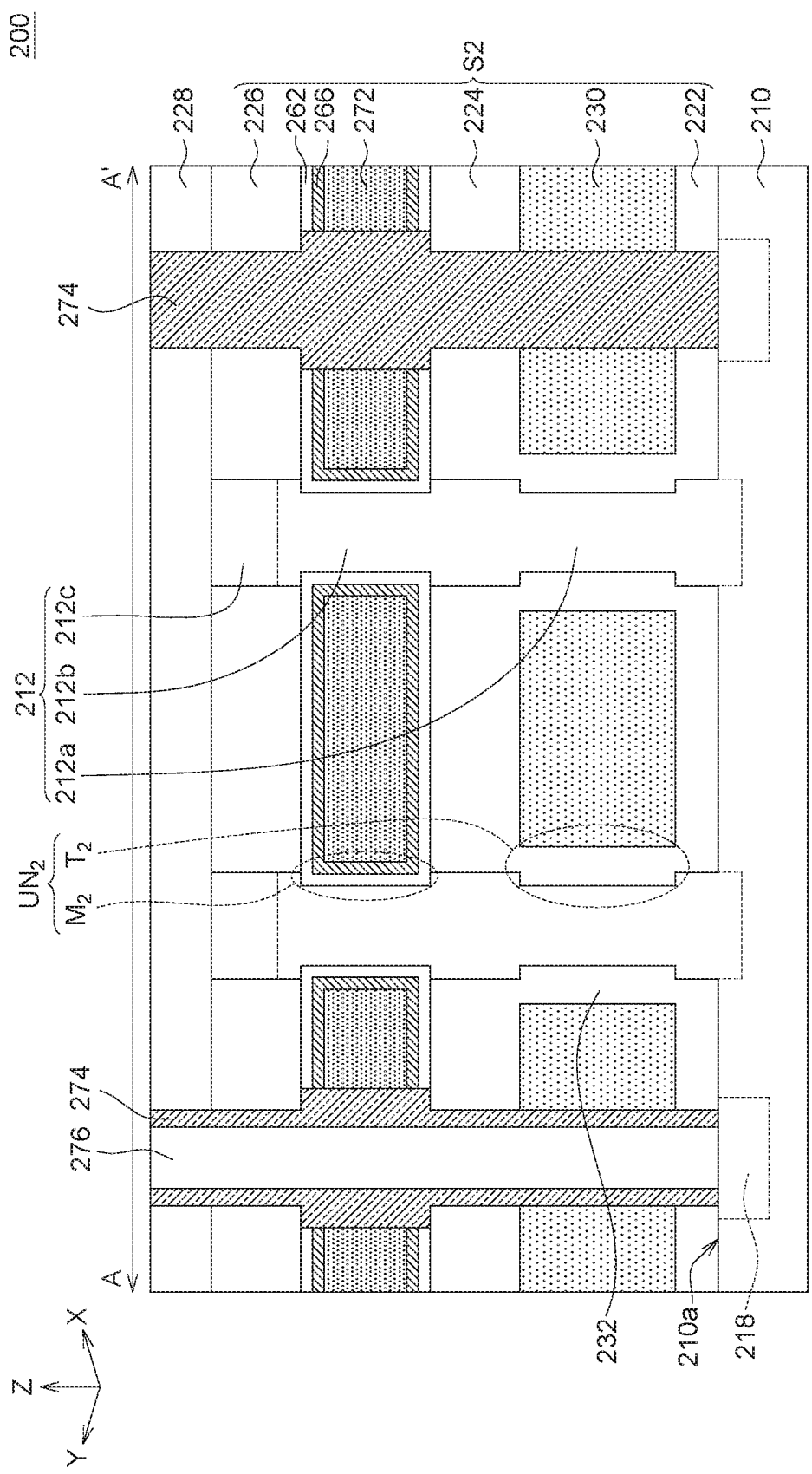
FIG. 1C is a cross-sectional view illustrating a memory device in accordance with another embodiment of the present invention.

FIG. 1C is a cross-sectional view illustrating a memory device 200 according to another embodiment of the present invention. The memory device 200 has a similar top view (such as FIG. 1A) as the memory device 100, so that FIG. 1C is similar to the cross-sectional view taken along line A-A'. The memory device 200 has a structure similar to that of the memory device 100, and the difference is in that the shape of the memory layer 262 is different.

Referring to FIG. 1C, the memory device 200 includes a substrate 210, a stacked structure S2, a capping layer 228, a plurality of channel structures 212, a thermal oxide layer 232, a memory layer 262, a dielectric material 266, a plurality of isolation structures 274 and a plurality of conductive connection structures 276. The stacked structure S2 is formed on the upper surface 210a of the substrate 210. The stacked structure S2 includes a first insulating layer 222, a first conductive layer 230, a second insulating layer 224, a second conductive layer 272, and a third insulating layer 226 stacked on the substrate 210 in sequence (for example, along the Z axis). The capping layer 228 can cover the stacked structure S2, that is, on the third insulating layer 226. In the present embodiment, the first conductive layer 230 and the second conductive layer 272 are formed of different materials, for example, respectively formed of n-type doped polysilicon and tungsten (W), but the invention is not limited thereto. A first conductive layer 230 and a second conductive layer 272 may be formed of the same material. In some embodiments, the first conductive layer 230 may have a thickness of 300 Å to 1000 Å, which can be used to adjust the threshold voltage (Vt).

The channel structures 212 (such as, along the Z axis) penetrate the stacked structure S2 and are electrically connected to the substrate 210, wherein each of the channel structures 212 includes a lower portion 212a and an upper portion 212b. The upper portion 212b corresponds to the second conductive layer 272, and the lower portion 212a corresponds to the first conductive layer 230. The top region of the channel structure 212 can have a doped region 212c, such as a dopant of an n-type semiconductor, such that the channel structure 212 can be electrically connected to the bit line BL. In some embodiments, the channel structure 212 can be an epitaxial growth layer, such as a single crystal or polycrystalline layer formed by an epitaxial growth process, or any combination thereof, which can be undoped or slightly P-type doped epitaxial growth layer. In comparison with a comparative example in which the channel structure only partially includes the epitaxial growth layer, since the channel structure 212 including the upper portion 212b and the lower portion 212a of the present invention is formed by the epitaxial growth process, the channel structure 212 may have a lower resistance and has better conductivity, and the memory device 200 can have a faster operating speed (for example, an operating speed of reading and writing).

The thermal oxide layer 232 is disposed between the first conductive layer 230 and the channel structure 212. For example, the thermal oxide layer 232 surrounds at least a portion of the lower portion 212a of the channel structure 212. In some embodiments, the thermal oxide layer 232 is an oxide layer formed by directly performing an oxidation process to the first conductive layer 230, such as silicon dioxide ($SiO_2$). Since the thermal oxide layer 232 is an oxide layer formed by directly oxidizing a conductive layer (for example, the first conductive layer 230), rather than an oxide layer formed by a deposition process (for example, chemical vapor deposition (CVD), physical vapor deposition (PVD) or other deposition processes, the purity of oxide of the thermal oxide layer 232 is larger than that of the insulating layer formed by the deposition method (for example, the first insulating layer 222, the second insulating layer 224 or the third insulating layer 226). Compared with the comparative example in which the thermal oxide layer is an oxide layer formed by a deposition process, since the thermal oxide layer of the present invention is an oxide layer formed by directly performing an oxidation process to the conductive layer, the thermal oxide layer has a higher oxide purity and quality, and the threshold voltage (Vt) can be better controlled, so that a lower threshold voltage can be achieved in low power applications, and the memory device 200 can have better reliability.

The memory layer 262 is disposed between the second conductive layer 272 and the upper portion 212b of the channel structure 212. For example, a portion of the memory layer 262 extends along a normal direction (eg, a Z-axis direction) of the upper surface 210a of the substrate 210, and a portion of the memory layer 262 extends in a direction parallel to the upper surface 210a of the substrate 210. The memory layer 262 can surround the upper portion 212b of the channel structure 212 and cover the second conductive layer 272. The memory layer 262 may be composed of a composite layer (ie, an ONO layer) including a silicon oxide layer, a silicon nitride layer, and a silicon oxide layer. For example, the memory layer 262 can include a tunneling layer, a trapping layer, and a blocking layer. The tunneling layer may include a two-layer structure formed of silicon dioxide ($SiO_2$), silicon dioxide ($SiO_2$)/silicon oxynitride (SiON) or other suitable material. The trapping layer can include silicon nitride, polysilicon or other suitable materials. The blocking layer may include silicon oxide ($SiO_2$) or other suitable material.

The dielectric material 266 is disposed between the memory layer 262 and the second conductive layer 272. A portion of the dielectric material 266 may extend along a normal direction of the upper surface 210a of the substrate 210, and a portion of the dielectric material 266 may extend in a direction parallel to the upper surface 210a of the substrate 210, and the dielectric material 266 may cover the second conductive layer 272. In some embodiments, the dielectric material 266 can include a high k material, such as aluminum oxide ($Al_2O_3$) or other suitable material. The dielectric material 266 can also act as a blocking layer to prevent lateral diffusion of charges. Compared with the comparative example in which the high k material is not used as the dielectric material, since the dielectric material 266 of the present invention can use a high k material, the operation (for example, erasing and writing) of the memory device can be performed without using a too high voltage, and the performance of the memory device can be improved.

The isolation structure 274 can penetrate the stacked structure S2 to separate the stacked structure S2 into a plurality of sub-stacks. The isolation structure 274 can be formed from an insulating material such as an oxide or other suitable material. The second conductive layers 272 in the adjacent sub-stacks can be physically and electrically isolated by the isolation structure 274, so the second conductive layers 272 in different sub-stacks can be operated independently, for example, by applying different voltages.

The conductive connection structure 276 can penetrate the stacked structure S2 and is electrically connected to the substrate 210 through, for example, the doped region 218. The doped region 218 is doped, for example, by a dopant of an n-type semiconductor. The conductive connection structure 276 can be electrically connected to the common source line.

In some embodiments, each of the intersections between the first conductive layer 230 and the thermal oxide layer 232 may form a transistor $T_2$, and each of the intersections between the second conductive layer 272, the dielectric material 266, and the memory layer 262 may form a memory cell $M_2$. The transistor $T_2$ and the memory cell $M_2$ are connected in series by the channel structure 212, and both of them form a unit cell $UN_2$ together. The first conductive layer 230 can serve as a ground selection line, and the second conductive layer 272 can serve as a word line.

Compared to the memory device 100, since the memory device 200 has a portion of the memory layer 262 of extending along the normal direction of the upper surface 210a of the substrate 210 and a portion of the memory layer 262 extending along the direction parallel to the upper surface 210a of the substrate 210, the memory layer 262 has an appearance similar to U shape, and has the better ability to prevent lateral diffusion of charges, and is less likely to affect the threshold voltage.

Figure 1D:
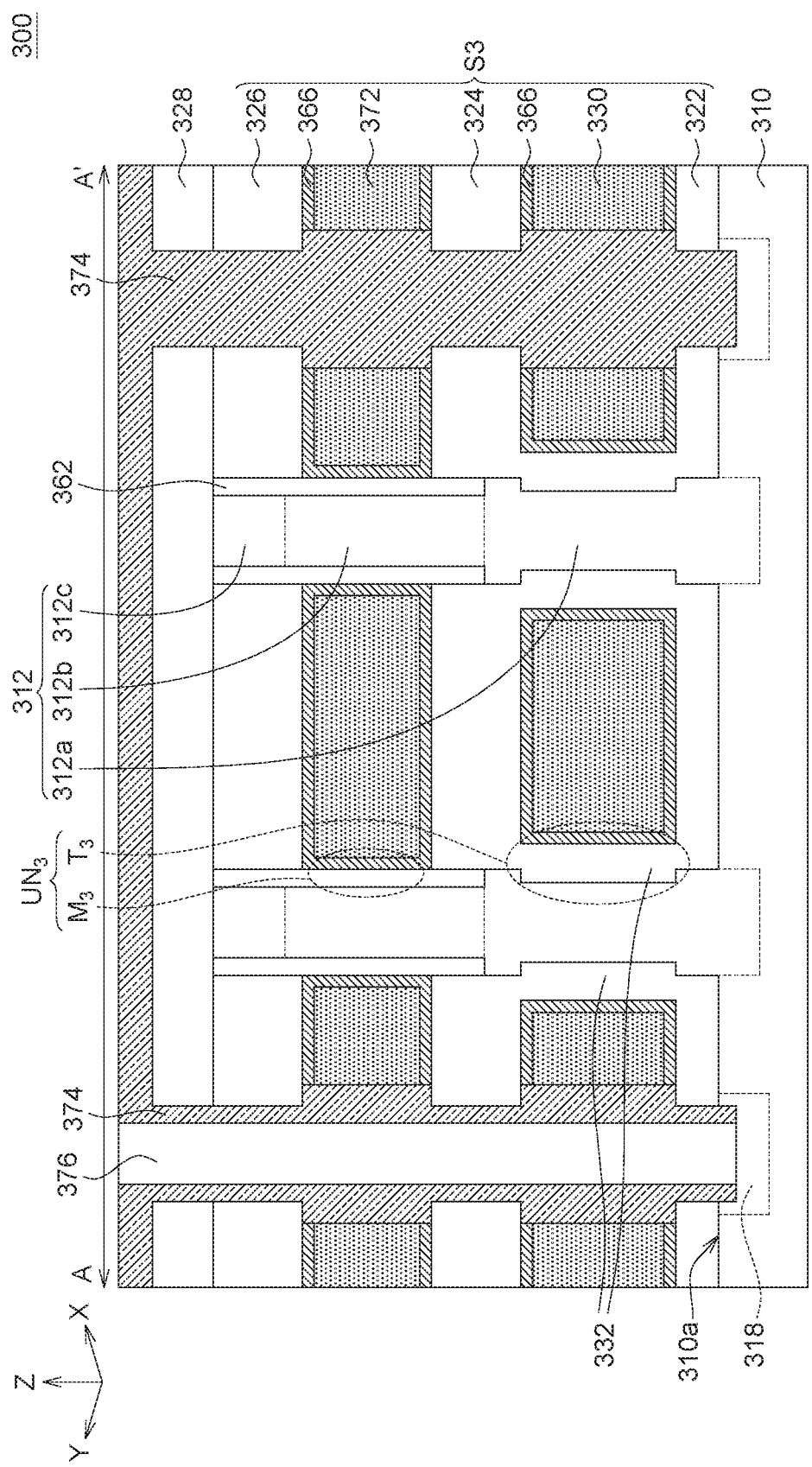
FIG. 1D is a cross-sectional view illustrating a memory device in accordance with one further embodiment of the present invention.

FIG. 1D is a cross-sectional view illustrating a memory device 300 according to one further embodiment of the present invention. The memory device 300 has a similar top view (such as FIG. 1A) as the memory device 100, so that FIG. 1D illustrates the cross-sectional view similar to the cross-sectional view taken along line A-A' of FIG. 1A. The memory device 300 has a structure similar to that of the memory device 100, the difference is in that the materials of the first conductive layer 330 are different, and the distribution of the dielectric materials 366 is different.

Referring to FIG. 1D, the memory device 300 includes a substrate 310, a stacked structure S3, a capping layer 328, a plurality of channel structures 312, a thermal oxide layer 332, a memory layer 362, a dielectric material 366, a plurality of isolation structures 374 and a plurality of conductive connection structures 376. The stacked structure S3 is formed on the upper surface 210a of the substrate 210. The stacked structure S3 includes a first insulating layer 322, a first conductive layer 330, a second insulating layer 324, a second conductive layer 372, and a third insulating layer 326 stacked on the substrate 310 in sequence (for example, along the Z axis). The capping layer 328 can cover the stacked structure S3. That is, the capping layer 328 is disposed on the third insulating layer 326. In some embodiments, the first conductive layer 330 and the second conductive layer 372 are formed of the same conductive material, such as tungsten (W), aluminum (Al), titanium nitride (TiN), tantalum nitride (TaN), poly-silicon or other suitable materials. In the present embodiment, the first conductive layer 330 and the second conductive layer 372 are both formed of tungsten (W). In some embodiments, the first conductive layer 330 may have a thickness of 300 Å to 1000 Å, which can be used to adjust the threshold voltage (Vt).

The channel structures 312 penetrate (eg, along the Z axis) the stacked structure S3 and are electrically connected to the substrate 310, wherein each of the channel structures 312 includes an upper portion 312b and a lower portion 312a. The upper portion 312b corresponds to the second conductive layer 372, and the lower portion 312a corresponds to the first conductive layer 330. The top region of the channel structure 312 can have a doped region 312c, such as a dopant of an n-type semiconductor, such that the channel structure 312 can be electrically connected to the bit line BL. In some embodiments, the channel structure 312 can be an epitaxial growth layer, such as a single crystal or polysilicon layer formed by an epitaxial growth process, or any combination thereof, which may be undoped or slightly P-type doped epitaxial growth layer. In comparison with the comparative example in which the channel structure only partially includes the epitaxial growth layer, since the channel structure 312 of the present invention including the upper portion 312b and the lower portion 312a is formed by an epitaxial growth process, the channel structure 312 can have a lower resistance, which has better conductivity, can have a faster operating speed (e.g., an operating speed of reading and writing).

The thermal oxide layer 332 is disposed between the first conductive layer 330 and the channel structure 312. For example, the thermal oxide layer 332 surrounds at least a portion of the lower portion 312a of the channel structure 312. In some embodiments, the thermal oxide layer 332 is an oxide formed directly on the channel structure 312 by an oxidation process, such as silicon dioxide (SiO2). Since the thermal oxide layer 332 is an oxide layer formed by directly oxidizing a conductive layer (eg, the channel structure 312), rather than an oxide layer formed by a deposition process (eg, chemical vapor deposition (CVD), physical vapor deposition (PVD) or other deposition process), the purity of the oxide of the thermal oxide layer 332 is greater than that of the insulating layer (for example, the first insulating layer 322, the second insulating layer 324, or the third insulating layer 326) formed by the deposition method. Compared with the comparative example in which the thermal oxide layer is an oxide layer formed by a deposition process, since the thermal oxide layer of the present invention is an oxide layer formed by directly performing an oxidation process on the conductive layer, the thermal oxide layer has a higher oxide purity and quality, and the threshold voltage (Vt) can be better controlled, so that a lower threshold voltage can be achieved in low power applications, and the memory device 300 can have better reliability.

The memory layer 362 is disposed between the second conductive layer 372 and the upper portion 312b of the channel structure 312. For example, the memory layer 362 extends along a normal direction (eg, a Z-axis direction) of the upper surface 210a of the substrate 210, and may surround the upper portion 312b of the channel structure 312. The memory layer 362 may be composed of a composite layer (ie, an ONO layer) including a silicon oxide layer, a silicon nitride layer, and a silicon oxide layer. For example, the memory layer 362 can include a tunneling layer, a trapping layer, and a blocking layer. The tunneling layer may include silicon dioxide ($SiO_2$), a two-layer structure formed of silicon dioxide ($SiO_2$)/silicon oxynitride (SiON) or other suitable material. The trapping layer can include silicon nitride, polysilicon or other suitable materials. The blocking layer may include silicon dioxide ($SiO_2$) or other suitable material.

The dielectric material 366 is disposed between the memory layer 362 and the second conductive layer 372 and is disposed between the first conductive layer 330 and the thermal oxide layer 332. A portion of the dielectric material 366 may extend along a normal direction of the upper surface 310a of the substrate 310, and a portion of the dielectric material 366 may extend in a direction parallel to the upper surface 310a of the substrate 310, and the dielectric material 366 may cover the first conductive layer 330 and the second conductive layer 372. In some embodiments, the dielectric material 366 can include a high k material, such as aluminum oxide ($Al_2O_3$) or other suitable material. The dielectric material 366 can also act as a blocking layer to prevent lateral diffusion of charges. Compared with the comparative example in which the high k material is not used as the dielectric material, since the dielectric material 366 of the present invention can use a high k material, the operation (for example, erasing and writing) of the memory device can be performed without using a too high voltage, and the performance of the memory device 300 can be improved.

The isolation structures 374 can penetrate the stacked structure to separate the stacked structure into a plurality of sub-stacks. The isolation structure 374 can be formed of an insulating material such as an oxide or other suitable material. The second conductive layers 372 in the adjacent sub-stacks can be physically and electrically isolated by the isolation structure 374, so the second conductive layers 372 in the different sub-stacks can be operated independently, for example, applying different voltages.

The conductive connection structure 376 can penetrate the stacked structure and is electrically connected to the substrate 310 through, for example, the doped region 318. The doped region 318 is doped, for example, by a dopant of an n-type semiconductor. The conductive connection structure 376 can be electrically connected to the common source line.

In some embodiments, each of the intersections between the first conductive layer 330 and the thermal oxide layer 332 may form a transistor $T_3$, and each of the intersections between the second conductive layer 372, the dielectric material 366, and the memory layer 362 may form a memory cell $M_3$. The transistor $T_3$ and the memory cell $M_3$ are connected in series by the channel structure 312, and both of them may form a unit cell $UN_3$ together. The first conductive layer 330 can serve as a ground selection line, and the second conductive layer 372 can serve as a word line.

The above-mentioned embodiments of the present application provide some memory devices 100-300 having two levels of conductive layers, but the present invention is not limited thereto, and the number (or level) of conductive layers may also be greater than two. In the following, some embodiments of memory devices 400 to 700 having three conductive layers are listed. Among the memory devices 400 to 700, elements similar to the memory devices 100 to 300 are represented by similar element symbols. Identical names of elements may have the same or similar materials.

Figure 1E:
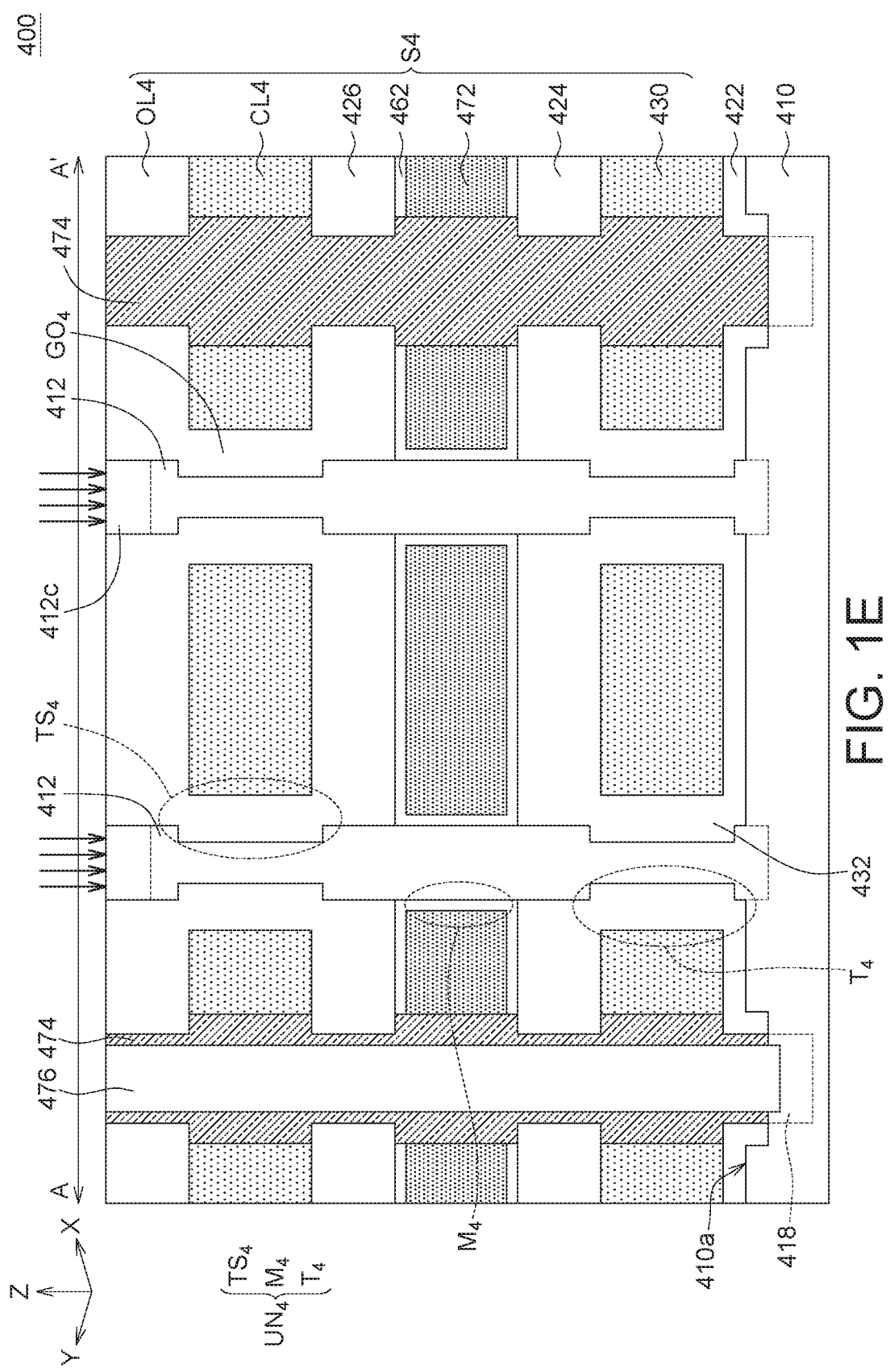
FIG. 1E is a cross-sectional view illustrating a memory device in accordance with one further embodiment of the present invention.

FIG. 1E is a cross-sectional view illustrating a memory device 400 according to one further embodiment of the present invention. The memory device 400 has a similar top view (such as FIG. 1A) as the memory device 100, so that FIG. 1E illustrates the cross-sectional view similar to the cross-sectional view taken along line A-A' of FIG. 1A.

Referring to FIG. 1E, the memory device 400 includes a substrate 410, a first insulating layer 422, a first conductive layer 430, a second insulating layer 424, a second conductive layer 472, a plurality of channel structures 412, thermal oxide layers 432 and $GO_4$, a memory layer 462, a third insulating layer 426, a top conductive layer CL4, a top insulating layer OL4, a plurality of isolation structures 474 and a plurality of conductive connection structures 476.

In the present embodiment, the first conductive layer 430 and the second conductive layer 472 can be formed of different materials, for example, formed of n type doped polysilicon and tungsten (W), respectively, but the present invention is not limited thereto. The first conductive layer 430 and the second conductive layer 472 may be formed of the same material. In some embodiments, the first conductive layer 430 may have a thickness of 300 Å to 1000 Å, which can be used to adjust the threshold voltage (Vt).

The channel structures 412 (such as, along the Z axis) penetrate the stacked structure S4 and are electrically connected to the substrate 410. The top region of the channel structure 412 can have a doped region 412c, such as a dopant of an n-type semiconductor, such that the channel structure 412 can be electrically connected to the bit line BL. In some embodiments, the channel structure 412 can be an epitaxial growth layer, such as a single crystal or polycrystalline layer formed by an epitaxial growth process, or any combination thereof, which can be undoped or slightly P-type doped epitaxial growth layer.

The thermal oxide layers 432 and $GO_4$ are disposed between the first conductive layer 430 and the channel structures 412, and disposed between the top conductive layer CL4 and the channel structures 412, respectively. For example, the thermal oxide layer 432 surrounds at least a portion of the lower portion of the channel structure 412, and the thermal oxide layer $GO_4$ surrounds at least a portion of the upper portion of the channel structure 412. In some embodiments, the thermal oxide layers 432 and $GO_4$ are the oxide formed by directly performing an oxidation process to the channel structure 412, such as silicon dioxide ($SiO_2$). Since the thermal oxide layers 432 and $GO_4$ are oxide layers formed by directly oxidizing the channel structure 412, rather than an oxide layer formed by a deposition process (for example, chemical vapor deposition (CVD), physical vapor deposition (PVD) or other deposition processes, the purity of oxide of the thermal oxide layer 432 and $GO_4$ are larger than that of the insulating layer formed by the deposition method (for example, the first insulating layer 422, the second insulating layer 424 or the third insulating layer 426). Compared with the comparative example in which the thermal oxide layer is an oxide layer formed by a deposition process, since the thermal oxide layer of the present invention is an oxide layer formed by directly performing an oxidation process to the conductive layer, the thermal oxide layer has a higher oxide purity and quality, and the threshold voltage (Vt) can be better controlled, so that a lower threshold voltage can be achieved in low power applications, and the memory device 400 can have better reliability.

The memory layer 462 is disposed between the second conductive layer 472 and the channel structure 412. For example, a portion of the memory layer 462 extends along a normal direction (eg, a Z-axis direction) of the upper surface 410a of the substrate 410, and a portion of the memory layer 462 extends in a direction parallel to the upper surface 410a of the substrate 410. The memory layer 462 can surround the channel structure 412 and cover the second conductive layer 472. The memory layer 462 may be composed of a composite layer (ie, an AONO layer) including aluminum oxide ($Al_2O_3$), a silicon oxide layer, a silicon nitride layer, and a silicon oxide layer. For example, the memory layer 462 can include a tunneling layer, a trapping layer, and a blocking layer. The tunneling layer may include a two-layer structure formed of silicon dioxide ($SiO_2$), silicon dioxide ($SiO_2$)/silicon oxynitride (SiON) or other suitable material. The trapping layer can include silicon nitride, polysilicon or other suitable materials. The blocking layer may include silicon oxide ($SiO_2$) or other suitable material.

The isolation structure 474 can penetrate the stacked structure S4 to separate the stacked structure S4 into a plurality of sub-stacks. The isolation structure 474 can be formed from an insulating material such as an oxide or other suitable material. The second conductive layers 472 in the adjacent sub-stacks can be physically and electrically isolated by the isolation structure 474, so the second conductive layers 472 in different sub-stacks can be operated independently, for example, by applying different voltages.

The conductive connection structure 476 can penetrate the stacked structure S4 and is electrically connected to the substrate 410 through, for example, the doped region 418. The doped region 418 is doped, for example, by a dopant of an n-type semiconductor. The conductive connection structure 476 can be electrically connected to the common source line.

In some embodiments, each of the intersections between the first conductive layer 430 and the thermal oxide layer 432 may form a transistor $T_4$, each of the intersections between the top conductive layer OL4 and the thermal oxide layer $GO_4$ may form a transistor $TS_4$, and each of the intersections between the second conductive layer 472 and the memory layer 462 may form a memory cell $M_4$. The transistor $T_4$, the transistor $TS_4$ and the memory cell $M_4$ are connected in series by the channel structure 412, and all of them form a unit cell $UN_4$ together. The first conductive layer 430 can serve as a ground selection line, the second conductive layer 472 can serve as a word line, and the top conductive layer CL4 can serve as a string selection line.

Figure 1F:
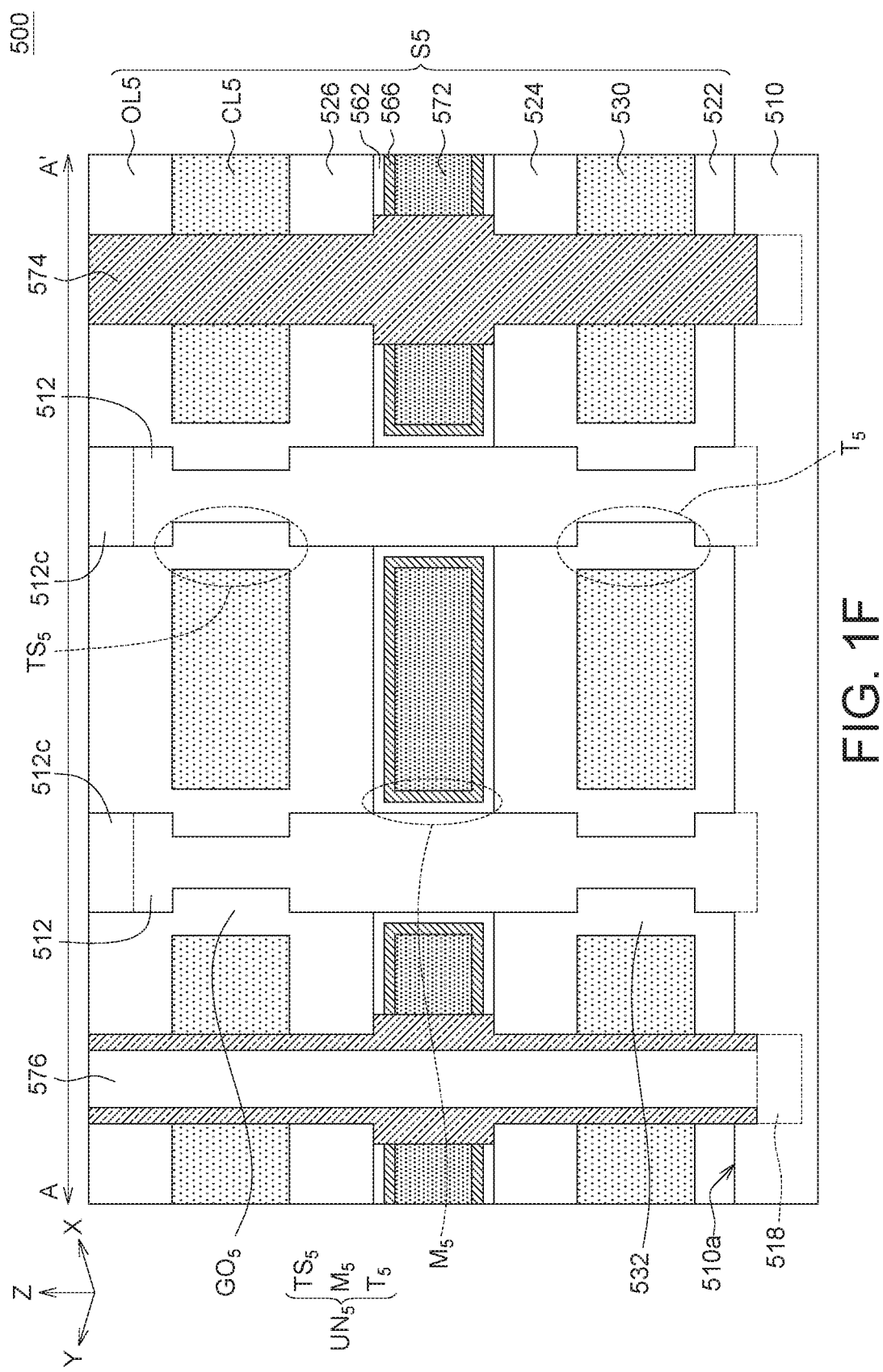
FIG. 1F is a cross-sectional view illustrating a memory device in accordance with one further embodiment of the present invention.

FIG. 1F is a cross-sectional view illustrating a memory device 500 according to one further embodiment of the present invention. The memory device 500 has a similar top view (such as FIG. 1A) as the memory device 100, so that FIG. 1F illustrates the cross-sectional view similar to the cross-sectional view taken along line A-A' of FIG. 1A.

Referring to FIG. 1F, the memory device 500 includes a substrate 510, a first insulating layer 522, a first conductive layer 530, a second insulating layer 524, a second conductive layer 572, a plurality of channel structures 512, thermal oxide layers 532 and $GO_5$, a memory layer 562, a third insulating layer 526, a top conductive layer CL5, a top insulating layer OL5, a plurality of isolation structures 574 and a plurality of conductive connection structures 576.

In the present embodiment, the first conductive layer 530 and the second conductive layer 572 can be formed of different materials, for example, formed of n type doped polysilicon and tungsten (W), respectively, but the present invention is not limited thereto. The first conductive layer 530 and the second conductive layer 572 may be formed of the same material. In some embodiments, the first conductive layer 530 may have a thickness of 300 Å to 1000 Å, which can be used to adjust the threshold voltage (Vt).

The channel structures 512 (such as, along the Z axis) penetrate the stacked structure S5 and are electrically connected to the substrate 510. The top region of the channel structure 512 can have a doped region 512c, such as a dopant of an n-type semiconductor, such that the channel structure 512 can be electrically connected to the bit line BL. In some embodiments, the channel structure 512 can be an epitaxial growth layer, such as a single crystal or polycrystalline layer formed by an epitaxial growth process, or any combination thereof, which can be undoped or slightly P-type doped epitaxial growth layer.

The thermal oxide layers 532 and $GO_5$ are disposed between the first conductive layer 530 and the channel structures 512, and disposed between the top conductive layer CL5 and the channel structures 512, respectively. For example, the thermal oxide layer 532 surrounds at least a portion of the lower portion of the channel structure 512, and the thermal oxide layer $GO_5$ surrounds at least a portion of the upper portion of the channel structure 512. In some embodiments, the thermal oxide layers 532 and $GO_5$ are the oxide formed by directly performing an oxidation process to the channel structure 512, such as silicon dioxide ($SiO_2$). Since the thermal oxide layers 532 and $GO_5$ are oxide layers formed by directly oxidizing the channel structure 512, rather than an oxide layer formed by a deposition process (for example, chemical vapor deposition (CVD), physical vapor deposition (PVD) or other deposition processes, the purity of oxide of the thermal oxide layer 532 and $GO_5$ are larger than that of the insulating layer formed by the deposition method (for example, the first insulating layer 522, the second insulating layer 524 or the third insulating layer 526). Compared with the comparative example in which the thermal oxide layer is an oxide layer formed by a deposition process, since the thermal oxide layer of the present invention is an oxide layer formed by directly performing an oxidation process to the conductive layer, the thermal oxide layer has a higher oxide purity and quality, and the threshold voltage (Vt) can be better controlled, so that a lower threshold voltage can be achieved in low power applications, and the memory device 500 can have better reliability.

The memory layer 562 is disposed between the second conductive layer 572 and the channel structure 512. For example, a portion of the memory layer 562 extends along a normal direction (eg, a Z-axis direction) of the upper surface 510a of the substrate 510, and a portion of the memory layer 562 extends in a direction parallel to the upper surface 510a of the substrate 510. The memory layer 562 can surround the channel structure 512 and cover the second conductive layer 572. The memory layer 562 may be composed of a composite layer (ie, an AONO layer) including aluminum oxide ($Al_2O_3$), a silicon oxide layer, a silicon nitride layer, and a silicon oxide layer. For example, the memory layer 562 can include a tunneling layer, a trapping layer, and a blocking layer. The tunneling layer may include a two-layer structure formed of silicon dioxide ($SiO_2$), silicon dioxide ($SiO_2$)/silicon oxynitride (SiON) or other suitable material. The trapping layer can include silicon nitride, polysilicon or other suitable materials. The blocking layer may include silicon oxide ($SiO_2$) or other suitable material.

The isolation structure 574 can penetrate the stacked structure S5 to separate the stacked structure S5 into a plurality of sub-stacks. The isolation structure 574 can be formed from an insulating material such as an oxide or other suitable material. The second conductive layers 572 in the adjacent sub-stacks can be physically and electrically isolated by the isolation structure 574, so the second conductive layers 572 in different sub-stacks can be operated independently, for example, by applying different voltages.

The conductive connection structure 576 can penetrate the stacked structure S5 and is electrically connected to the substrate 510 through, for example, the doped region 518. The doped region 518 is doped, for example, by a dopant of an n-type semiconductor. The conductive connection structure 576 can be electrically connected to the common source line.

In some embodiments, each of the intersections between the first conductive layer 530 and the thermal oxide layer 532 may form a transistor $T_5$, each of the intersections between the top conductive layer CL5 and the thermal oxide layer $GO_5$ may form a transistor $TS_5$, and each of the intersections between the second conductive layer 572 and the memory layer 562 may form a memory cell $M_5$. The transistor $T_5$, the transistor $TS_5$ and the memory cell $M_5$ are connected in series by the channel structure 512, and all of them form a unit cell $UN_5$ together. The first conductive layer 530 can serve as a ground selection line, the second conductive layer 572 can serve as a word line, and the top conductive layer OL5 can serve as a string selection line.

Figure 1G:
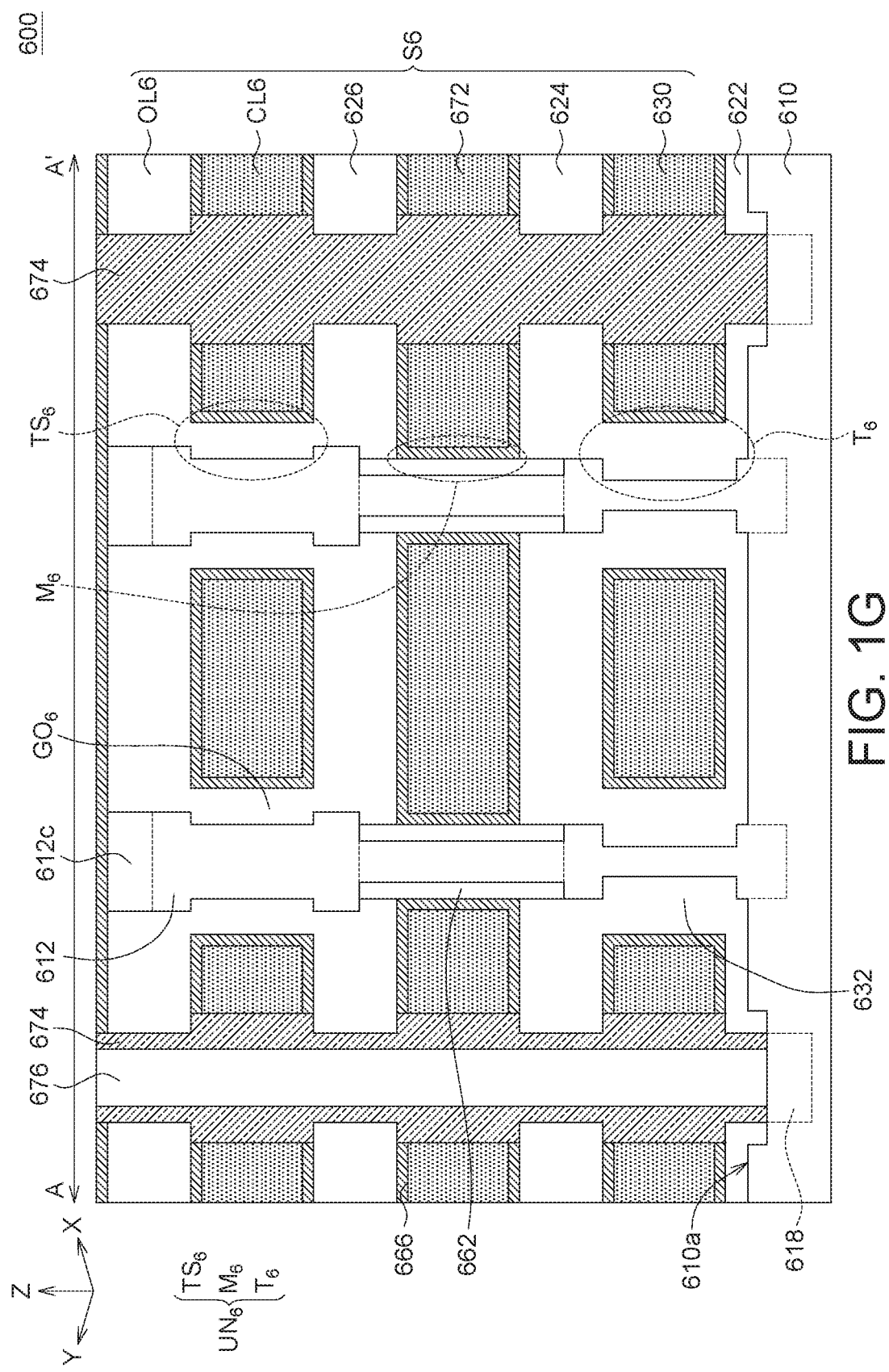
FIG. 1G is a cross-sectional view illustrating a memory device in accordance with one further embodiment of the present invention.

FIG. 1G is a cross-sectional view illustrating a memory device 600 according to one further embodiment of the present invention. The memory device 600 has a similar top view (such as FIG. 1A) as the memory device 100, so that FIG. 1G illustrates the cross-sectional view similar to the cross-sectional view taken along line A-A' of FIG. 1A.

Referring to FIG. 1G, the memory device 600 includes a substrate 610, a first insulating layer 622, a first conductive layer 630, a second insulating layer 624, a second conductive layer 672, a plurality of channel structures 612, thermal oxide layers 632 and $GO_6$, a memory layer 662, a third insulating layer 626, a top conductive layer CL5, a top insulating layer OL6, a plurality of isolation structures 674 and a plurality of conductive connection structures 676.

The channel structures 612 (such as, along the Z axis) penetrate the stacked structure S6 and are electrically connected to the substrate 610. The top region of the channel structure 612 can have a doped region 612c, such as a dopant of an n-type semiconductor, such that the channel structure 612 can be electrically connected to the bit line BL. In some embodiments, the channel structure 612 can be an epitaxial growth layer, such as a single crystal or polycrystalline layer formed by an epitaxial growth process, or any combination thereof, which can be undoped or slightly P-type doped epitaxial growth layer.

The thermal oxide layers 632 and $GO_6$ are disposed between the first conductive layer 630 and the channel structures 612, and disposed between the top conductive layer CL6 and the channel structures 612, respectively. For example, the thermal oxide layer 632 surrounds at least a portion of the lower portion of the channel structure 612, and the thermal oxide layer $GO_6$ surrounds at least a portion of the upper portion of the channel structure 612. In some embodiments, the thermal oxide layers 632 and $GO_6$ are the oxide formed by directly performing an oxidation process to the channel structure 612, such as silicon dioxide ($SiO_2$). Since the thermal oxide layers 632 and $GO_6$ are oxide layers formed by directly oxidizing the channel structure 612, rather than an oxide layer formed by a deposition process (for example, chemical vapor deposition (CVD), physical vapor deposition (PVD) or other deposition processes, the purity of oxide of the thermal oxide layer 632 and $GO_6$ are larger than that of the insulating layer formed by the deposition method (for example, the first insulating layer 622, the second insulating layer 624 or the third insulating layer 626). Compared with the comparative example in which the thermal oxide layer is an oxide layer formed by a deposition process, since the thermal oxide layer of the present invention is an oxide layer formed by directly performing an oxidation process to the conductive layer, the thermal oxide layer has a higher oxide purity and quality, and the threshold voltage (Vt) can be better controlled, so that a lower threshold voltage can be achieved in low power applications, and the memory device 600 can have better reliability.

The memory layer 662 is disposed between the second conductive layer 672 and the channel structure 612. For example, the memory layer 662 extends along a normal direction (eg, a Z-axis direction) of the upper surface 610a of the substrate 610. The memory layer 662 may be composed of a composite layer (ie, an ONO layer) including a silicon oxide layer, a silicon nitride layer, and a silicon oxide layer. For example, the memory layer 662 can include a tunneling layer, a trapping layer, and a blocking layer. The tunneling layer may include a two-layer structure formed of silicon dioxide ($SiO_2$), silicon dioxide ($SiO_2$)/silicon oxynitride (SiON) or other suitable material. The trapping layer can include silicon nitride, polysilicon or other suitable materials. The blocking layer may include silicon oxide ($SiO_2$) or other suitable material.

The isolation structure 674 can penetrate the stacked structure S6 to separate the stacked structure S6 into a plurality of sub-stacks. The isolation structure 674 can be formed from an insulating material such as an oxide or other suitable material. The second conductive layers 672 in the adjacent sub-stacks can be physically and electrically isolated by the isolation structure 674, so the second conductive layers 672 in different sub-stacks can be operated independently, for example, by applying different voltages.

The conductive connection structure 676 can penetrate the stacked structure S6 and is electrically connected to the substrate 610 through, for example, the doped region 618. The doped region 618 is doped, for example, by a dopant of an n-type semiconductor. The conductive connection structure 676 can be electrically connected to the common source line.

Figure 1H:
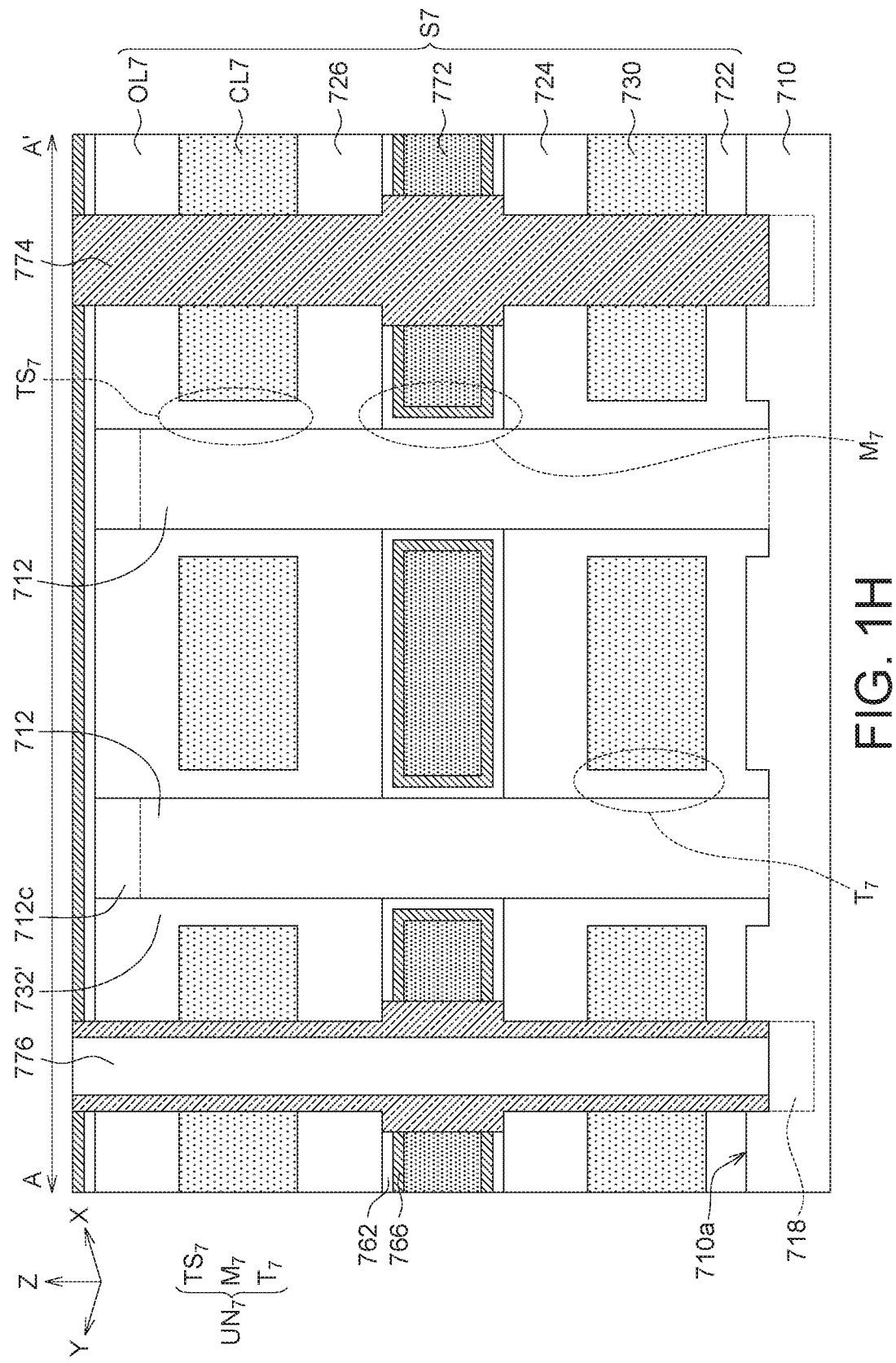
FIG. 1H is a cross-sectional view illustrating a memory device in accordance with one further embodiment of the present invention.

In some embodiments, each of the intersections between the first conductive layer 630 and the thermal oxide layer 632 may form a transistor $T_6$, each of the intersections between the top conductive layer CL6 and the thermal oxide layer $GO_6$ may form a transistor $TS_6$, and each of the intersections between the second conductive layer 672 and the memory layer 662 may form a memory cell $M_6$. The transistor $T_6$, the transistor $TS_6$ and the memory cell $M_6$ are connected in series by the channel structure 612, and all of them form a unit cell $UN_6$ together. The first conductive layer 630 can serve as a ground selection line, the second conductive layer 672 can serve as a word line, and the top conductive layer CL6 can serve as a string selection line, FIG. 1H is a cross-sectional view illustrating a memory device 700 according to one further embodiment of the present invention. The memory device 700 has a similar top view (such as FIG. 1A) as the memory device 100, so that FIG. 1H illustrates the cross-sectional view similar to the cross-sectional view taken along line A-A' of FIG. 1A.

Referring to FIG. 1H, the memory device 700 includes a substrate 710, a first insulating layer 722, a first conductive layer 730, a second insulating layer 724, a second conductive layer 772, a plurality of channel structures 712, oxide layers 732', a memory layer 762, a third insulating layer 726, a top conductive layer CL7, a top insulating layer OL7, a plurality of isolation structures 774 and a plurality of conductive connection structures 776. In some embodiments, the first insulating layer 722, the second insulating layer 724, the oxide layers 732', the third insulating layer 726 and the top insulating layer OL7 may be formed of the same material.

The channel structures 712 (such as, along the Z axis) penetrate the stacked structure S7 and are electrically connected to the substrate 710. The top region of the channel structure 712 can have a doped region 712c, such as a dopant of an n-type semiconductor, such that the channel structure 712 can be electrically connected to the bit line BL. In some embodiments, the channel structure 712 can be an epitaxial growth layer, such as a single crystal or polycrystalline layer formed by an epitaxial growth process, or any combination thereof, which can be undoped or slightly P-type doped epitaxial growth layer.

The oxide layers 732 is disposed between the first conductive layer 730 and the channel structures 712, and disposed between the top conductive layer CL7 and the channel structures 712.

The memory layer 762 is disposed between the second conductive layer 772 and the channel structure 712. For example, a portion of the memory layer 762 extends along a normal direction (eg, a Z-axis direction) of the upper surface 710a of the substrate 710, and a portion of the memory layer 762 extends along a direction parallel to the upper surface 710a of the substrate 710. The memory layer 762 may be composed of a composite layer including a silicon oxide layer, a silicon nitride layer, and a silicon oxide layer. For example, the memory layer 762 can include a tunneling layer, a trapping layer, and a blocking layer. The tunneling layer may include a two-layer structure formed of silicon dioxide ($SiO_2$), silicon dioxide ($SiO_2$)/silicon oxynitride (SiON) or other suitable material. The trapping layer can include silicon nitride, polysilicon or other suitable materials. The blocking layer may include silicon oxide ($SiO_2$) or other suitable material.

The isolation structure 774 can penetrate the stacked structure S7 to separate the stacked structure S7 into a plurality of sub-stacks. The isolation structure 774 can be formed from an insulating material such as an oxide or other suitable material. The second conductive layers 772 in the adjacent sub-stacks can be physically and electrically isolated by the isolation structure 774, so the second conductive layers 772 in different sub-stacks can be operated independently, for example, by applying different voltages.

The conductive connection structure 776 can penetrate the stacked structure S7 and is electrically connected to the substrate 710 through, for example, the doped region 618. The doped region 718 is doped, for example, by a dopant of an n-type semiconductor. The conductive connection structure 776 can be electrically connected to the common source line.

In some embodiments, each of the intersections between the first conductive layer 730 and the oxide layer 732' may form a transistor $T_7$, each of the intersections between the top conductive layer CL7 and the oxide layer 732' may form a transistor $TS_7$, and each of the intersections between the second conductive layer 772 and the memory layer 762 may form a memory cell $M_7$. The transistor $T_7$, the transistor $TS_7$ and the memory cell $M_7$ are connected in series by the channel structure 712, and all of them form a unit cell $UN_7$ together. The first conductive layer 730 can serve as a ground selection line, the second conductive layer 772 can serve as a word line, and the top conductive layer CL7 can serve as a string selection line.

Figure 2A:
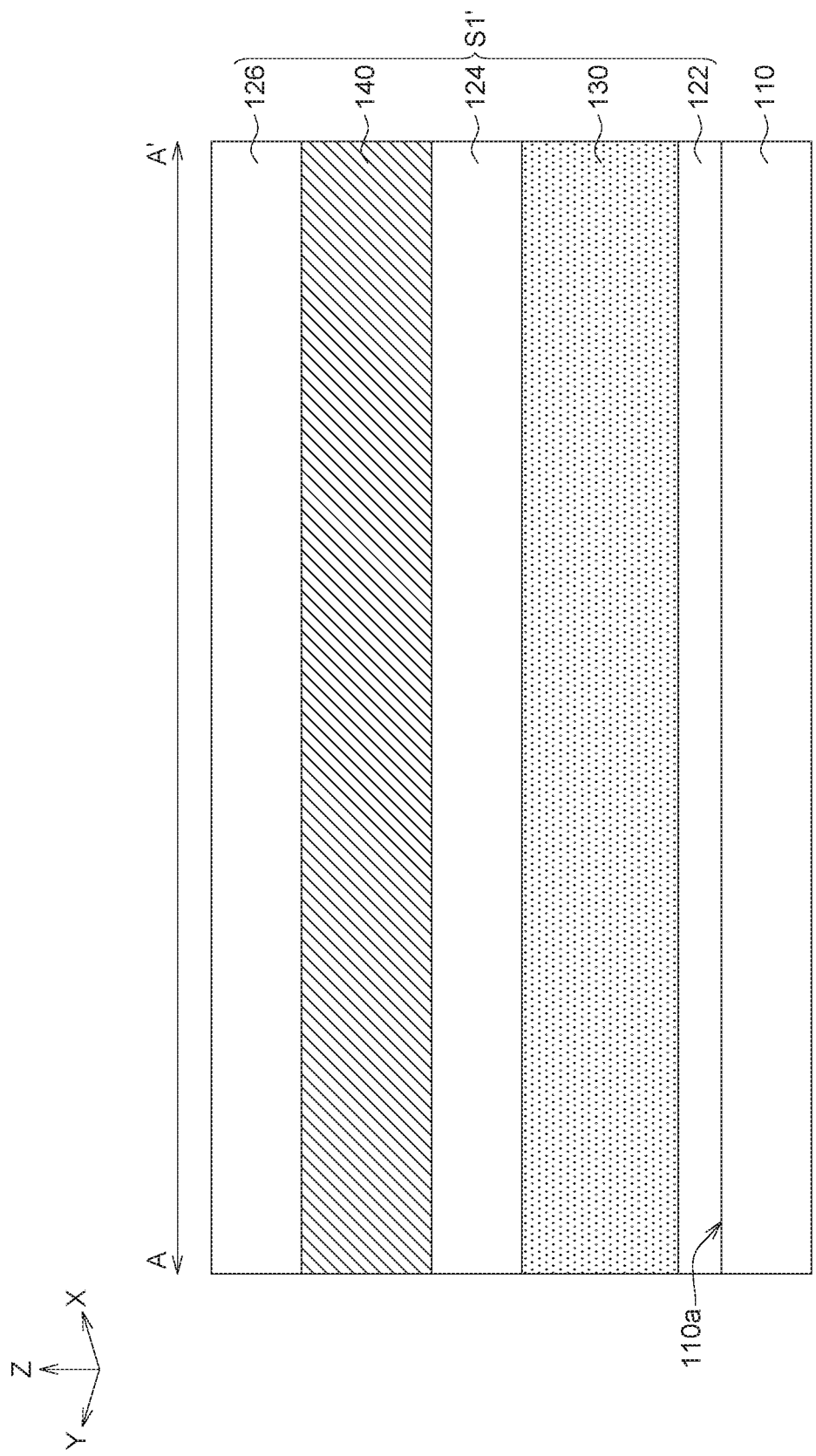
FIGS. 2A to 2N are cross-sectional views illustrating a method for fabricating a memory device in accordance with one embodiment of the present invention.
Figure 2B:
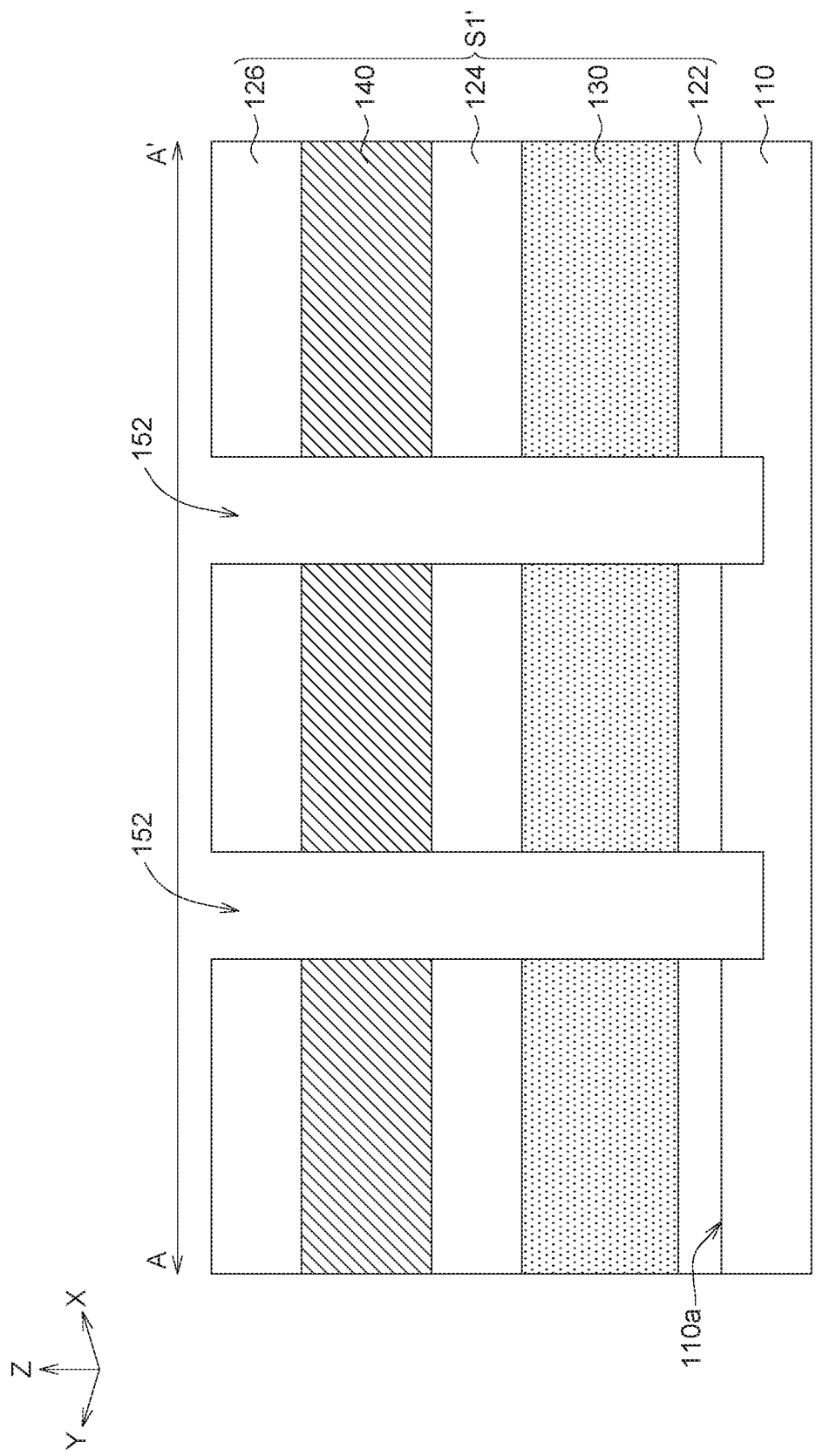
Figure 2C:
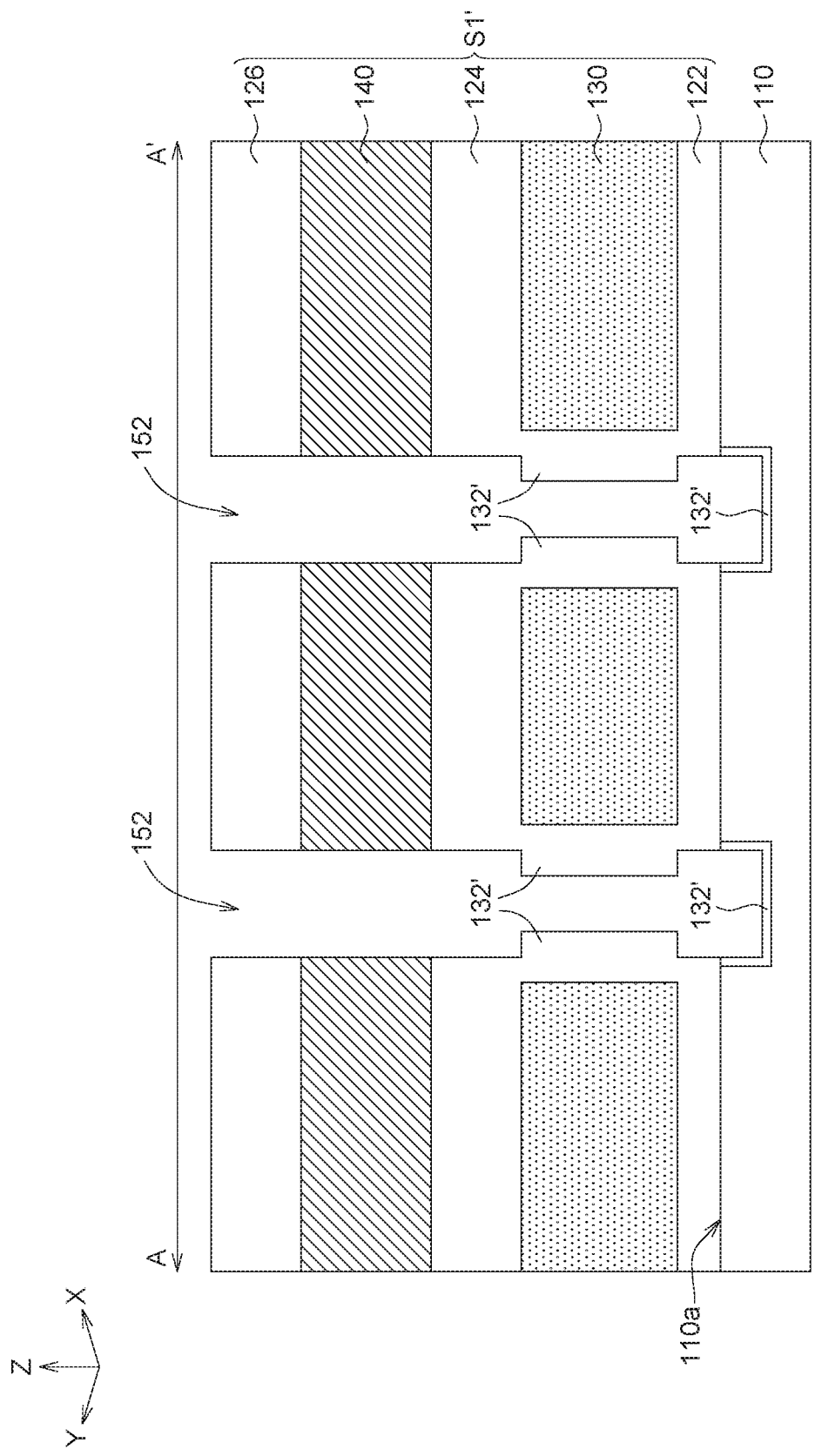
Figure 2D:
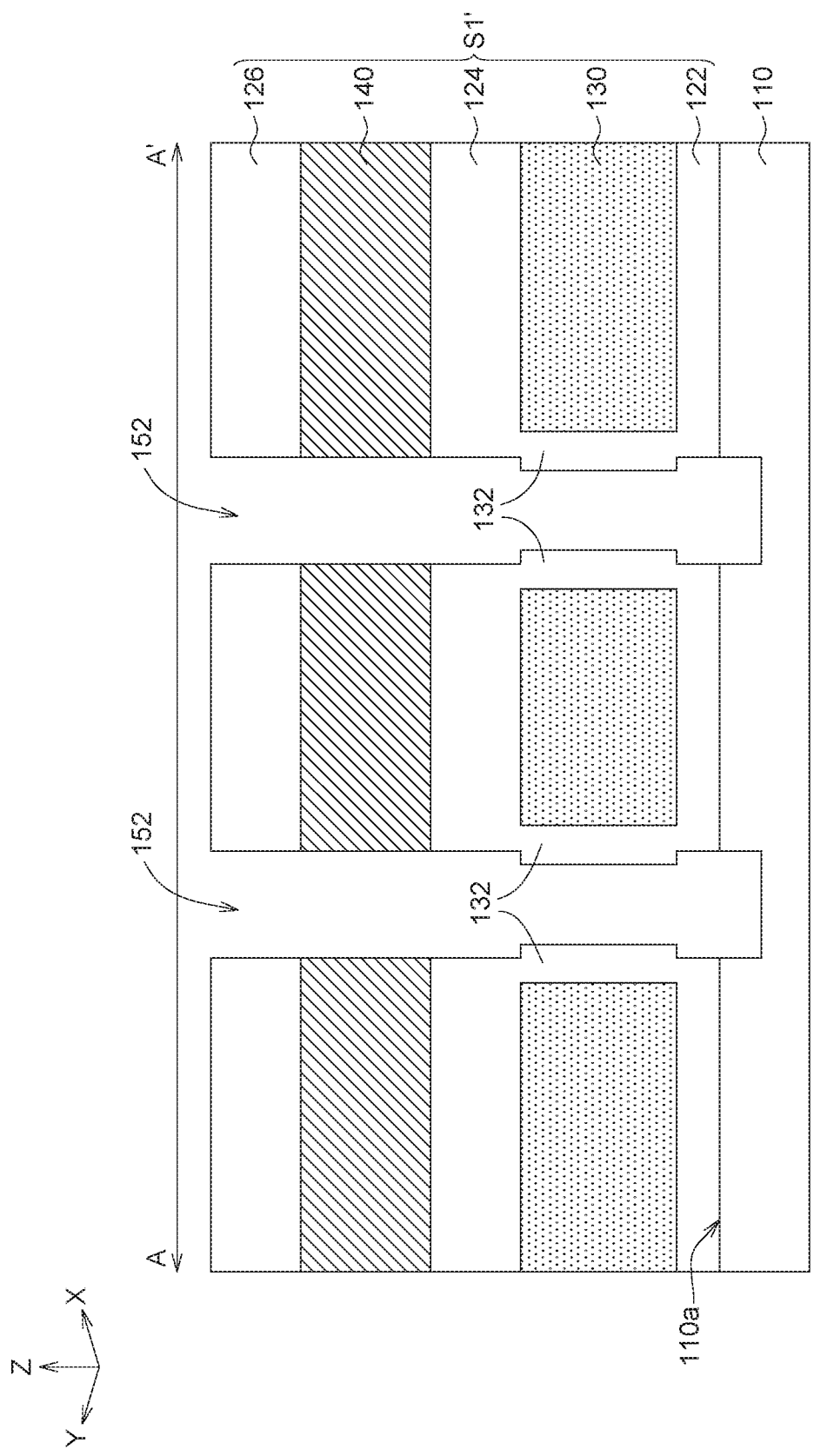
Figure 2E:
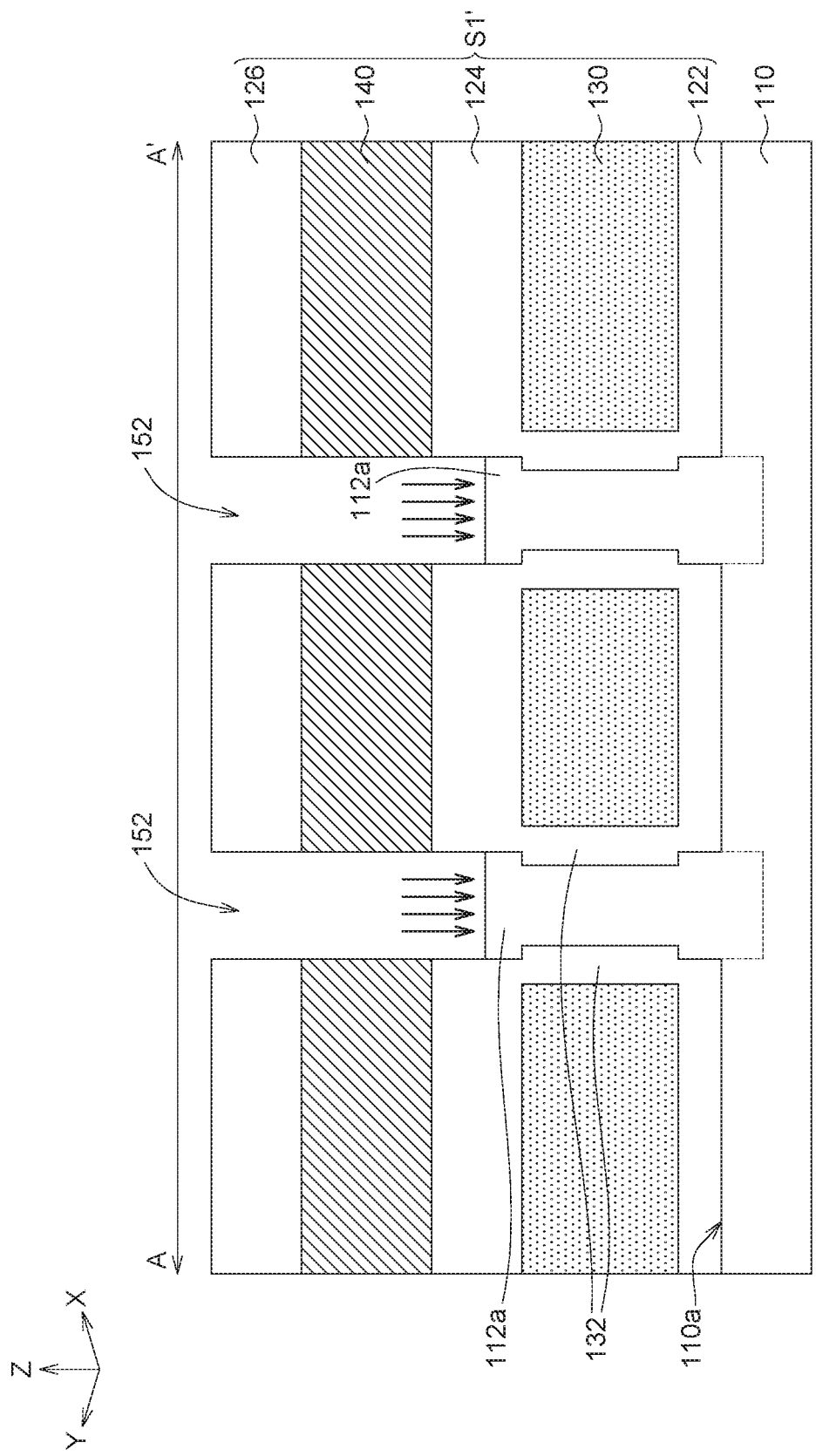
Figure 2F:
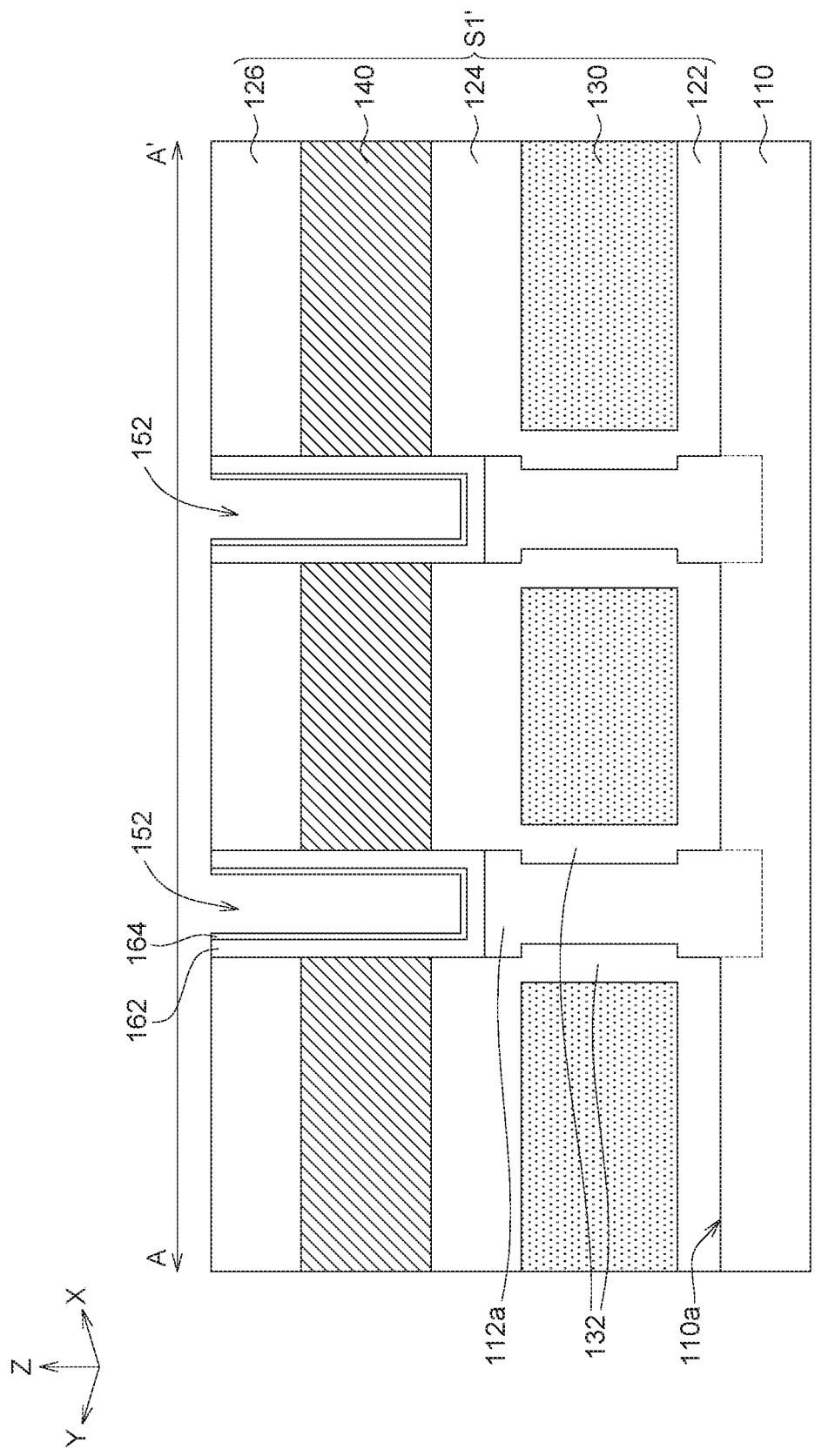
Figure 2G:
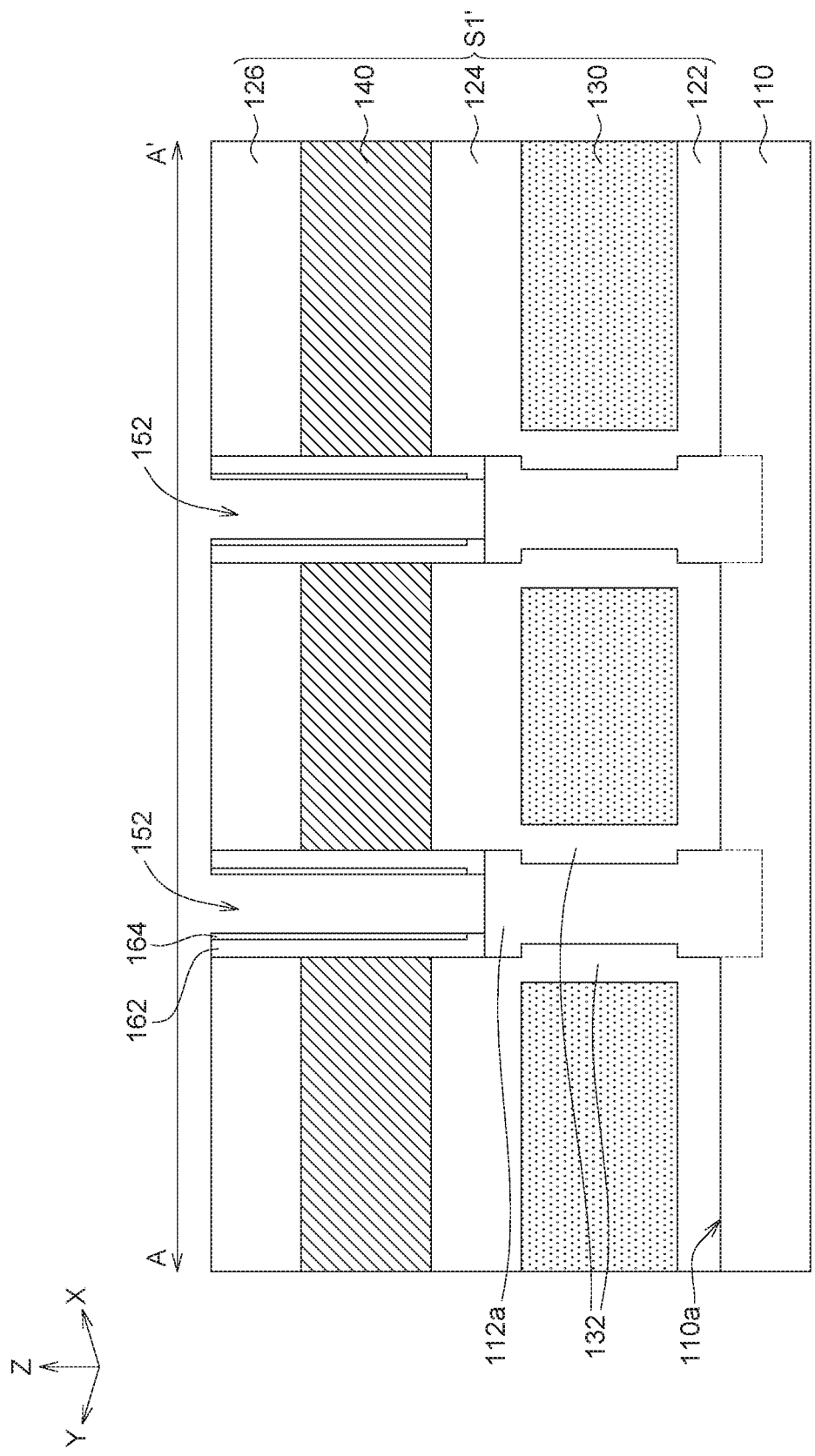
Figure 2H:
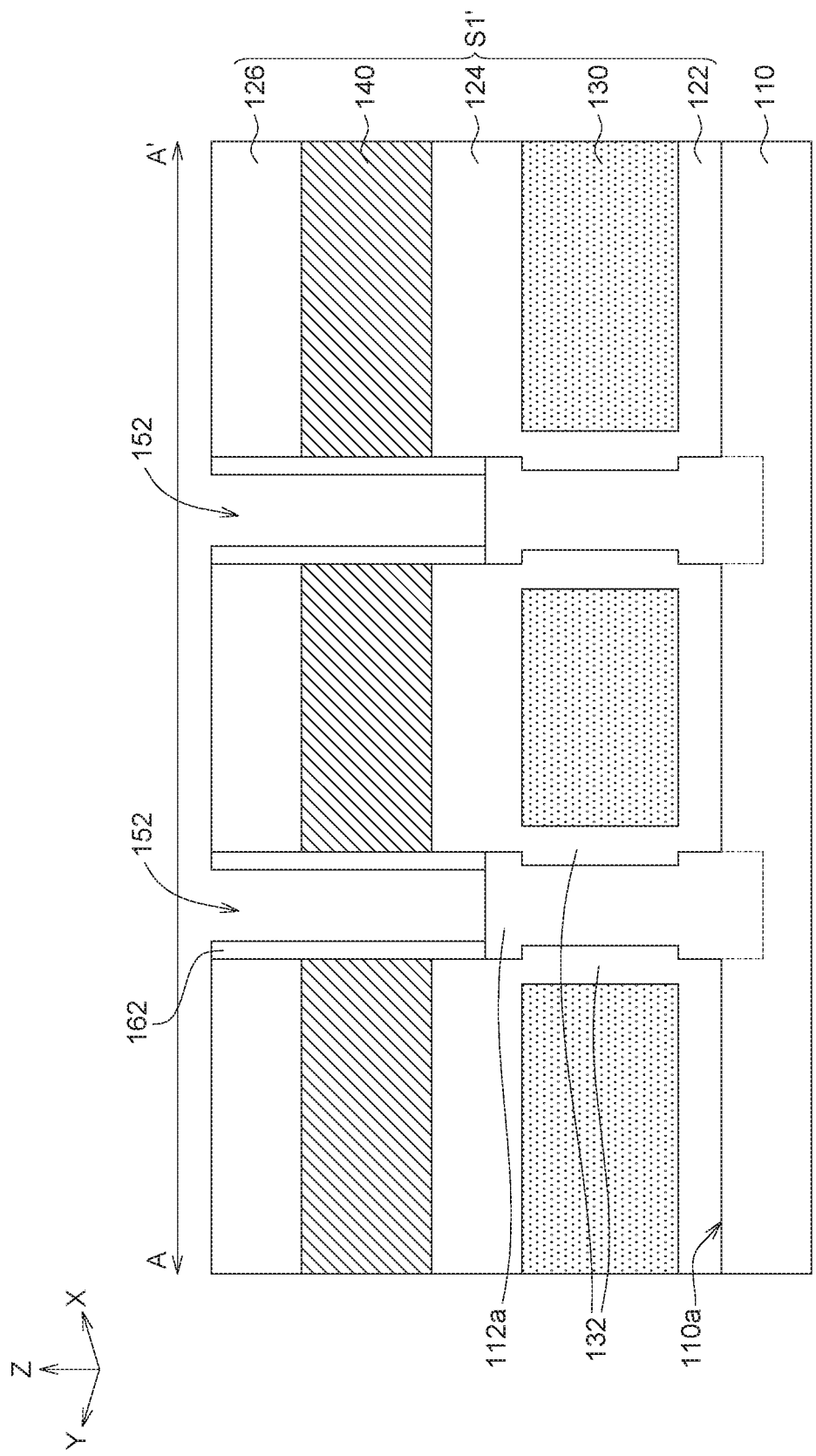
Figure 2I:
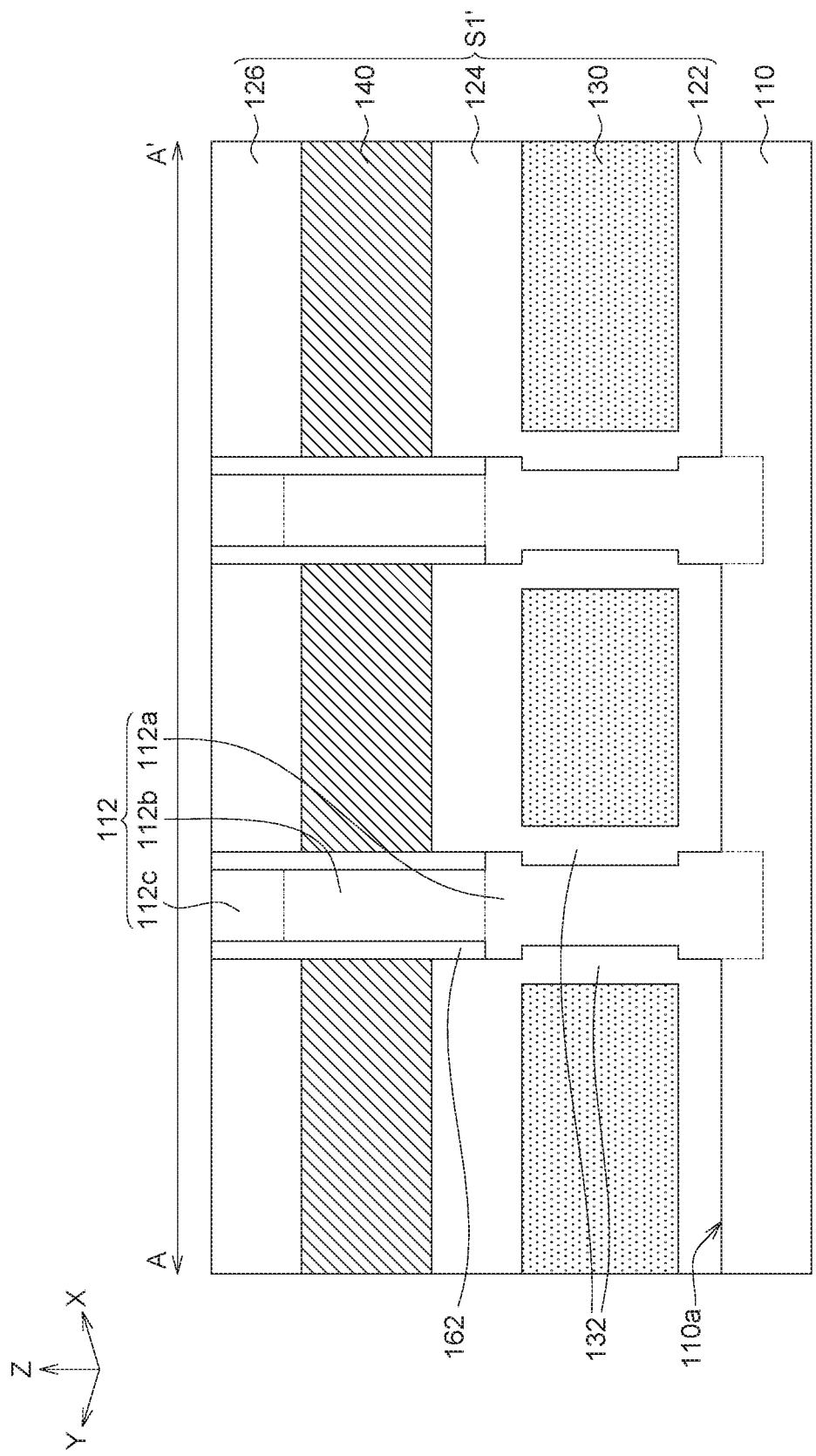
Figure 2J:
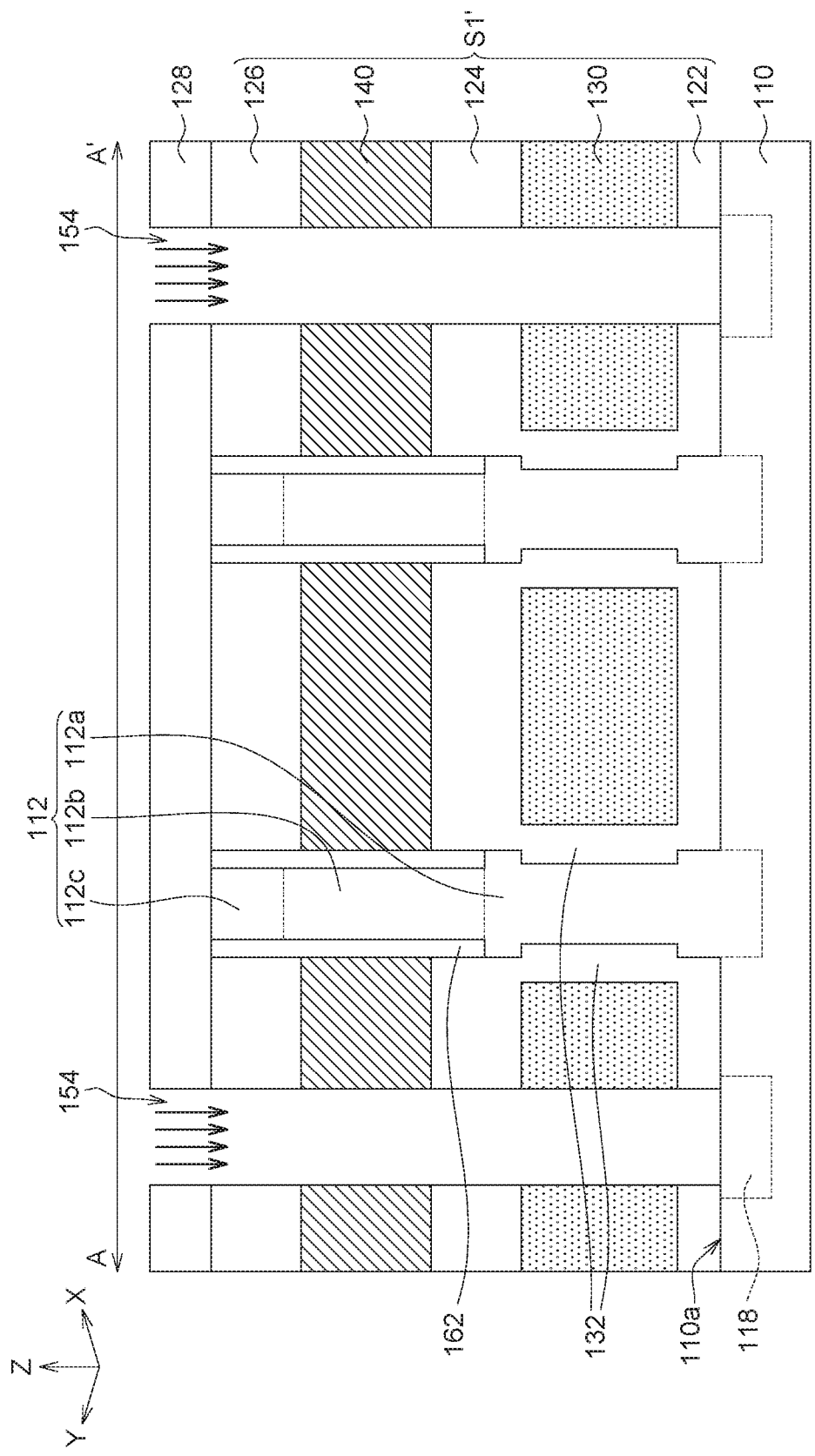
Figure 2K:
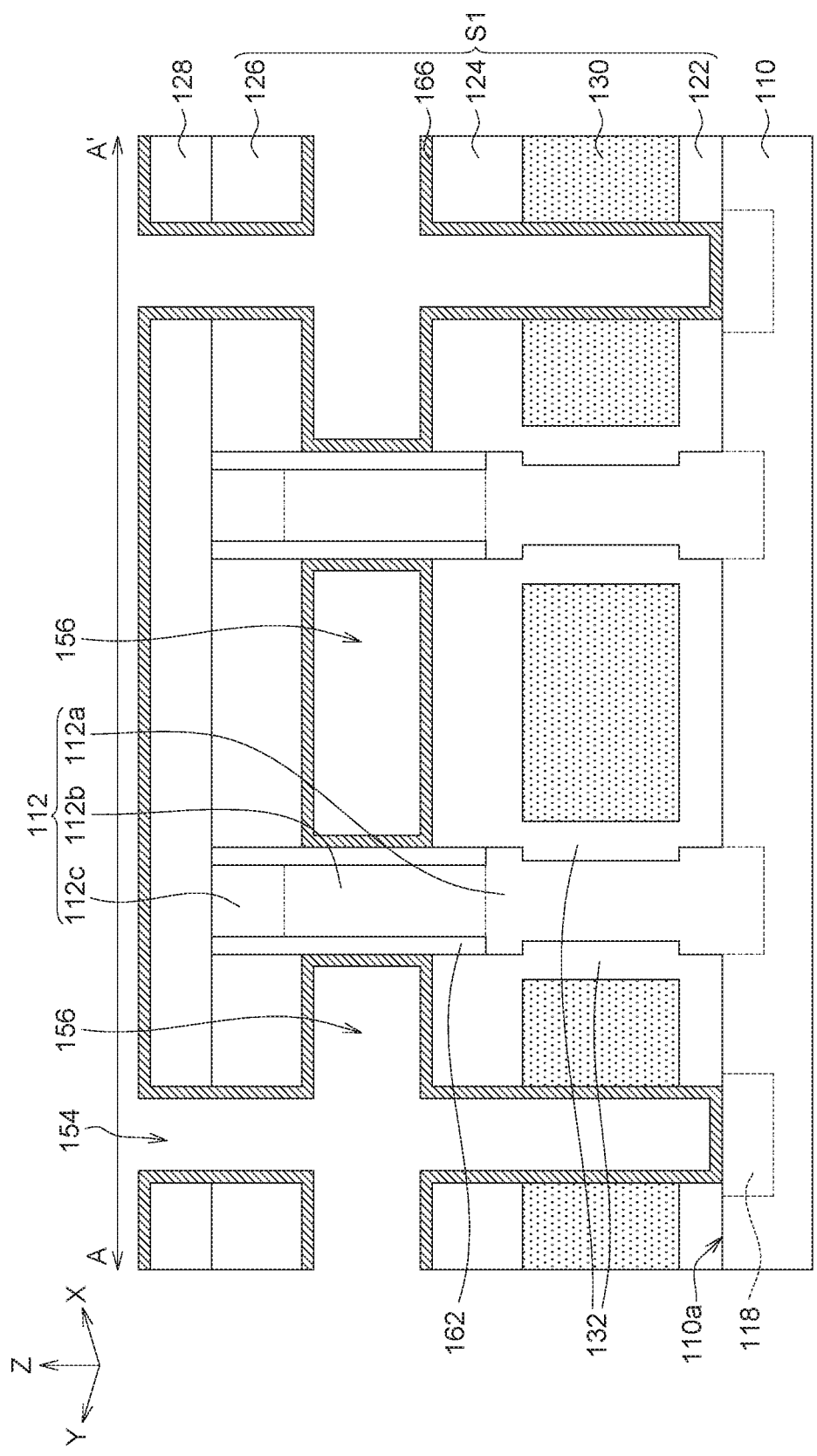
Figure 2L:
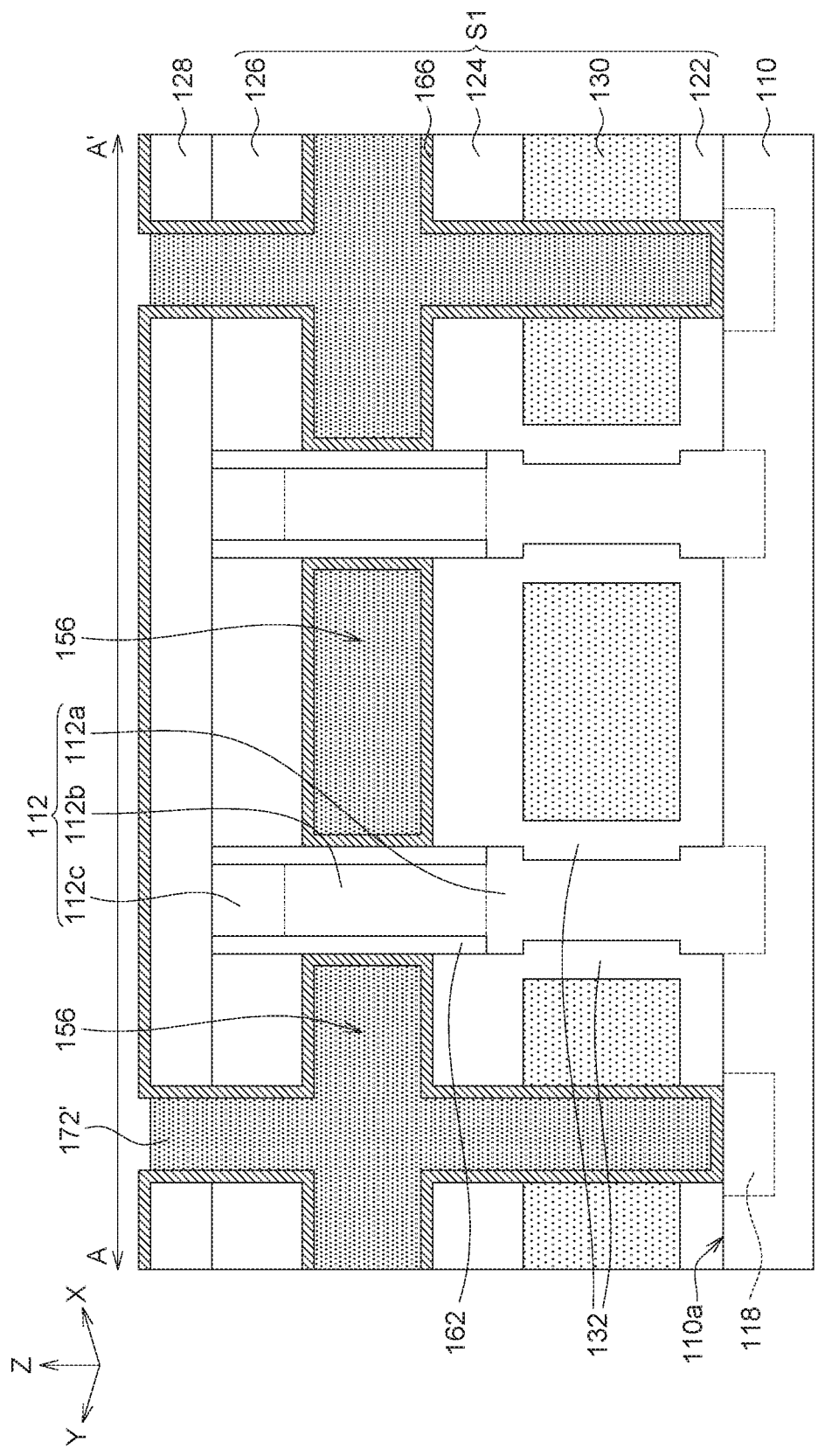
Figure 2M:
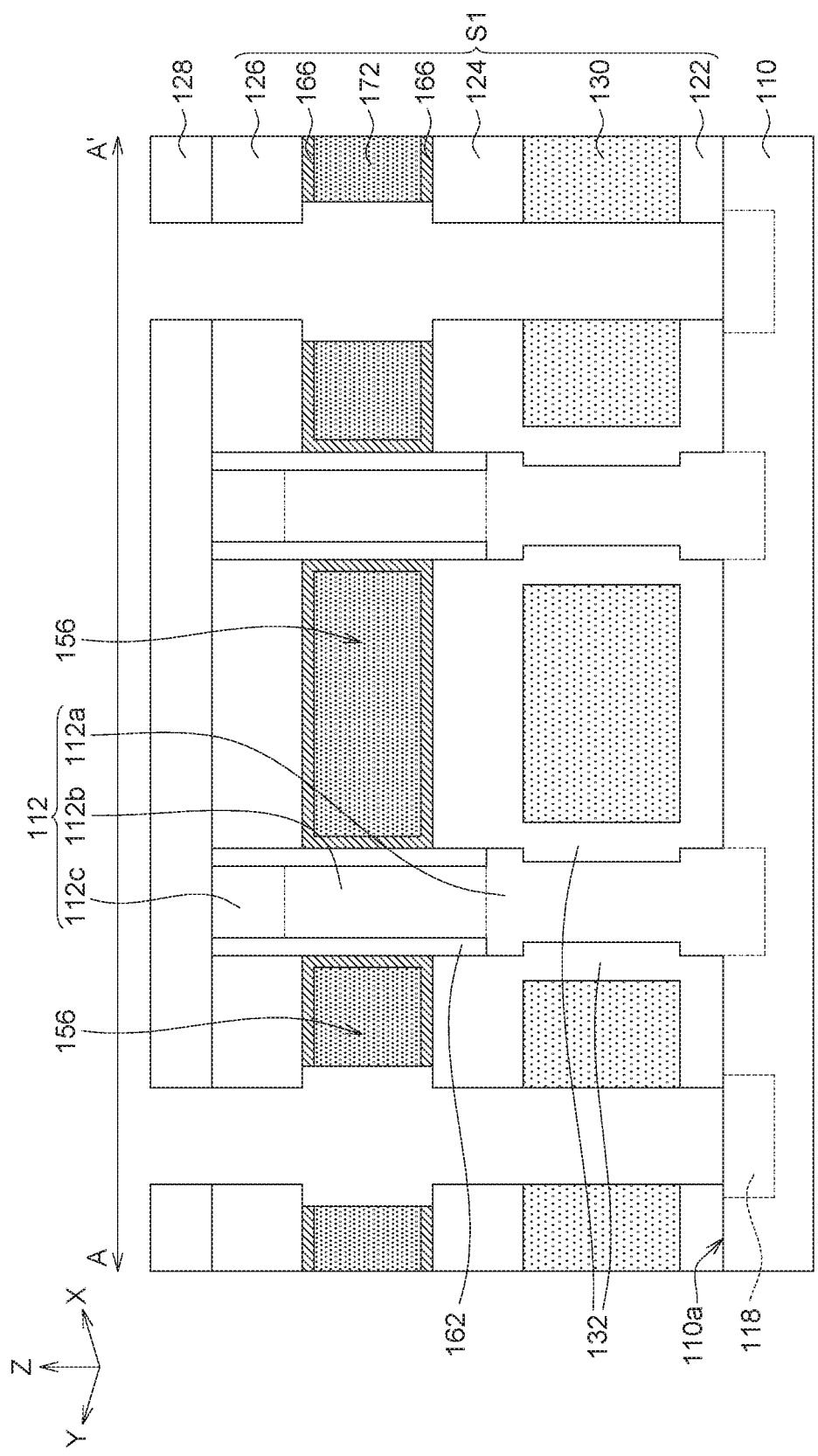
Figure 2N:
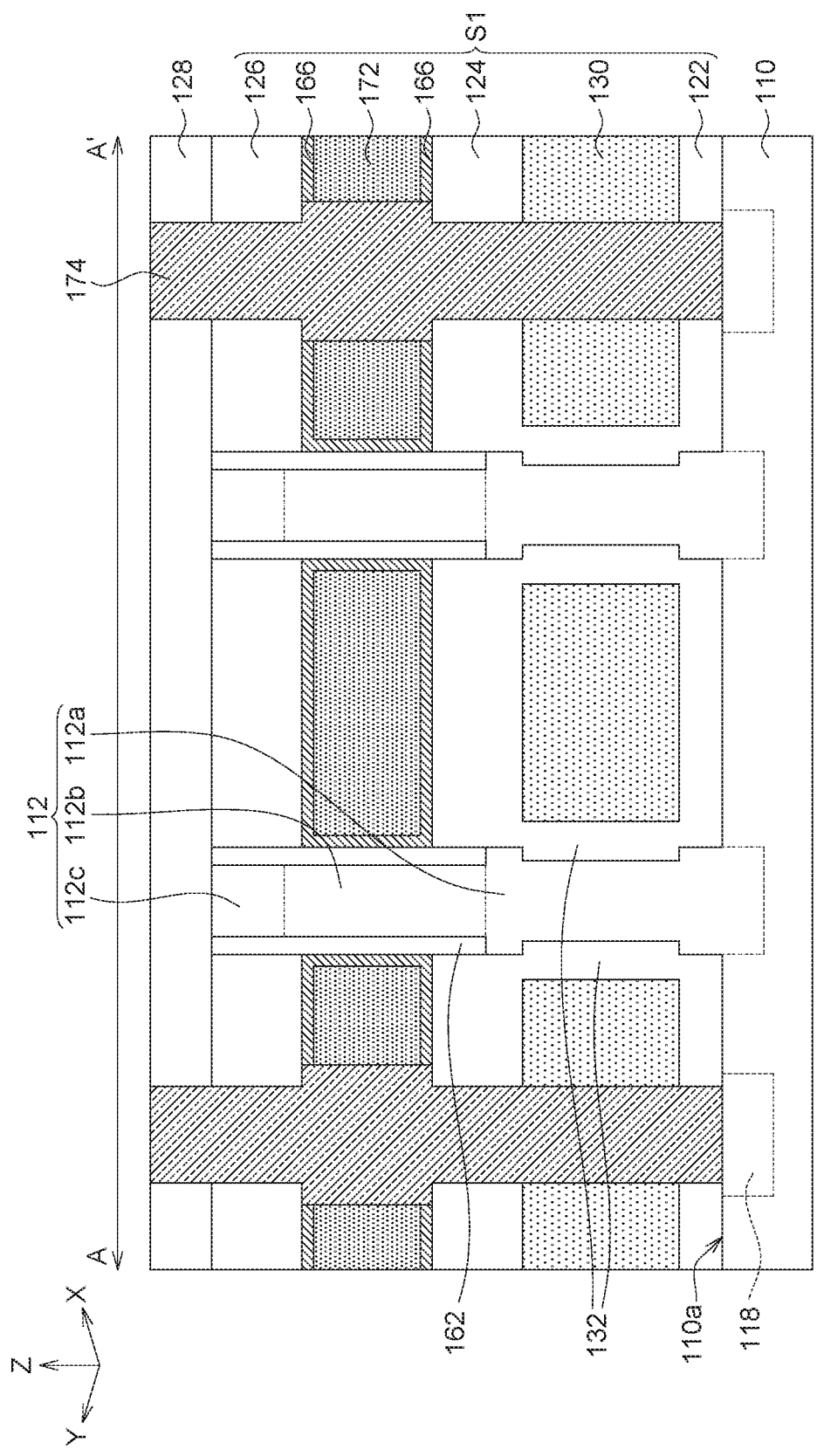

FIGS. 2A to 2N are cross-sectional views illustrating a method for fabricating a memory device 100 in accordance with one embodiment of the present invention.

Referring to FIG. 2A, a substrate 110 is provided, and a stacked body S1' is formed on the upper surface 110a of the substrate 110. The stacked body S1' includes a first insulating layer 122, a first conductive layer 130, a second insulating layer 124, an upper sacrificial layer 140, and a third insulating layer 126 sequentially stacked on (for example, by a deposition process) the upper surface 110a of the substrate 110.

In some embodiments, the substrate 110 can be a silicon substrate or other suitable substrate. The first insulating layer 122, the second insulating layer 124, and the third insulating layer 126 may be formed of an oxide such as silicon dioxide. The first conductive layer 130 may be formed of a conductive material such as tungsten (W), aluminum (Al), titanium nitride (TiN), tantalum nitride (TaN), doped or undoped polysilicon (poly-silicon) or other suitable material. In some embodiments, the first conductive layer 130 can be an n-type doped polysilicon layer. The upper sacrificial layer 140 may be formed of silicon nitride (SiN).

Referring to FIG. 2B, a plurality of first openings 152 are formed. Each of the first openings 152 penetrates the stacked body S1' and exposes a portion of the substrate 110. In some embodiments, the first opening 152 can be formed by an etching process, such as a dry etching process. In some embodiments, the substrate 110 can be overetched such that the bottom of the first opening 152 is lower than the upper surface 110a of the substrate 110.

Referring to FIG. 2C, a portion of an oxide layer 132' is formed on one side surface of the first conductive layer 130 exposed from the first opening 152 by an oxidation process, and a portion of the oxide layer 132' is formed on the surface of the substrate 110 exposed from the first opening 152. In some embodiments, when the first conductive layer 130 is an n-type doped polysilicon layer and the substrate 110 is a silicon substrate, the oxide layer 132' of silicon dioxide is formed on the side surface of the first conductive layer 130 exposed from the first opening 152, and the oxide layer 132' including a silicon dioxide layer is formed on the surface of the substrate 110 exposed from the first opening 152 by an oxidation process and a high temperature.

Referring to FIG. 2D, the excess oxide layer 132' in the first opening 152 is removed to form a thermal oxide layer 132 directly contacting the first conductive layer 130, and the substrate 110 is exposed. In some embodiments, the excess oxide layer 132' in the first opening 152 is removed by soaking a solvent such as hydrofluoric acid (HF). Since the thermal oxide layer 132 is an oxide layer formed by directly oxidizing a conductive layer (for example, the first conductive layer 130), rather than the oxide layer formed by a deposition process (for example, chemical vapor deposition (CVD), physical vapor deposition (PVD) or other deposition processes, the purity of the oxide of the thermal oxide layer 132 is higher than that of the insulating layer formed by the deposition method (for example, the first insulating layer 122, the second insulating layer 124 or the third insulating layer 126).

Referring to FIG. 2E, a lower portion 112a of the channel structure covering the thermal oxide layer 132 is formed by a first epitaxial growth process, and the thermal oxide layer 132 is disposed between the first conductive layer 130 and the lower portion 112a of the channel structure. That is, the lower portion 112a of the channel structure is an epitaxial growth layer of silicon. The height of the top surface of the lower portion 112a of the channel structure is greater than the height of the top surface of the first conductive layer 130.

Thereafter, a p-type dopant is implanted into the lower portion 112a of the channel structure by ion implantation. The p-type dopant helps to adjust the threshold voltage.

Referring to FIG. 2F, a memory layer 162 is formed to cover a portion of the sidewall of the first opening 152 and the lower portion 112a of the channel structure. The memory layer 162 may be composed of a composite layer (ie, an ONO layer) including a silicon oxide layer, a silicon nitride layer, and a silicon oxide layer. For example, the memory layer 162 can include a tunneling layer, a trapping layer, and a blocking layer. The tunneling layer may include silicon dioxide ($SiO_2$) or a two-layer structure formed of silicon dioxide ($SiO_2$)/silicon oxynitride (SiON) or other suitable material. The trapping layer can include silicon nitride, polysilicon or other suitable materials. The blocking layer may include silicon dioxide ($SiO_2$) or other suitable material.

Next, a protective layer 164 is formed on the memory layer 162 by a deposition process. The protective layer 164 can prevent the memory layer 162 from being damaged in subsequent processes. The protective layer 164 is, for example, silicon nitride, polysilicon or other suitable material.

Referring to FIG. 2G, a portion of the memory layer 162 and the protective layer 164 are removed by an etching process to expose the lower portion 112a of the channel structure. The etching process can be a dry etching process or a wet etching process.

Referring to FIG. 2H, the protective layer 164 is removed by immersing a solvent to expose the memory layer 162. The solvent is, for example, hot phosphoric acid ($H_3PO_4$), but the present invention is not limited thereto, as long as it is a solvent which can remove the protective layer 164 without damaging the memory layer 162.

Referring to FIG. 2I, the upper portion 112b of the channel structure is formed by a second epitaxial growth process, and thus the channel structure 112 including the lower portion 112a and the upper portion 112b is formed. In the present embodiment, the channel structure 112 is an epitaxial growth layer of silicon.

Thereafter, a doped region 112c is formed on top of the channel structure 112 by ion implantation, and the doped region 112c is, for example, a heavily doped region of an n-type semiconductor. The doped region 112c can be used to form a contact structure in a subsequent process to electrically connect to the bit line.

Referring to FIG. 2J, a capping layer 128 covering the stacked body S1' is formed by a deposition process. That is, the capping layer 128 covers the third insulating layer 126 and the channel structure 112.

Thereafter, a second opening 154 is formed penetrating the stacked body S1' by an etching process. This etching process is, for example, a dry etching process. Thereafter, the doped region 118 may be formed on the substrate 110 corresponding to the second openings 154 by ion implantation. The doped region 118 includes, for example, a heavily doped n-type semiconductor. Alternatively, the step of forming the doped region 118 may be performed after the upper sacrificial layer 140 is removed.

Referring to FIG. 2K, the upper sacrificial layer 140 is removed from the second opening 154 by an etching process to form the upper opening 156 at a position where the upper sacrificial layer 140 is removed. The etching process can be an isotropic etching (for example, a wet etching method), and can be a highly selective etching, such as selectively etching silicon nitride without etching the silicon oxide and polycrystalline silicon.

Next, a dielectric material 166 extending along the sidewalls of the second opening 154 and the upper opening 156 and covering the capping layer 128 is formed by a deposition process. In some embodiments, the dielectric material 166 can include a high k material, such as aluminum oxide ($Al_2O_3$) or other suitable material. The dielectric material 166 can also act as a blocking layer to prevent lateral diffusion of charges.

Referring to FIG. 2L, the conductive material 172' is filled in the second opening 154 and the upper opening 156 by a deposition process. The conductive material 172' may include tungsten (W), aluminum (Al), titanium nitride (TiN), tantalum nitride (TaN), or other suitable materials.

Referring to FIG. 2M, the conductive material 172' disposed in the second opening 154 is removed by an etching process to form a second conductive layer 172 disposed in the upper opening 156. This etching process is, for example, a dry etching process. In some embodiments, the etching process can remove a portion of the conductive material 172' disposed in the upper opening 156. The second conductive layer 172 may include tungsten (W), aluminum (Al), titanium nitride (TiN), tantalum nitride (TaN), or other suitable conductive material. In the present embodiment, the second conductive layer 172 includes tungsten (W). Thereby, a stacked structure S1 including the first insulating layer 122, the first conductive layer 130, the second insulating layer 124, the second conductive layer 172, and the third insulating layer 126 is formed.

Referring to FIG. 2N, an insulating material is filled in the second opening 154 by a deposition process to form a plurality of isolation structures 174. The isolation structures 174 can include an oxide or other suitable insulating material.

Thereafter, referring back to FIG. 1B, a plurality of vertical openings extending through the isolation structures 174 and extending along the normal direction of the upper surface 110a of the substrate 110 are formed, and then a conductive material is filled in the vertical openings by a deposition process, to form a plurality of electrically conductive connection structures 176. The conductive connection structures 176 can include tungsten (W), aluminum (Al), titanium nitride (TiN), or other suitable electrically conductive material. As a result, the memory device 100 as shown in FIG. 1B is formed.

FIGS. 3A to 3M are cross-sectional views illustrating a method for fabricating a memory device 200 in accordance with another embodiment of the present invention.

Figure 3A:
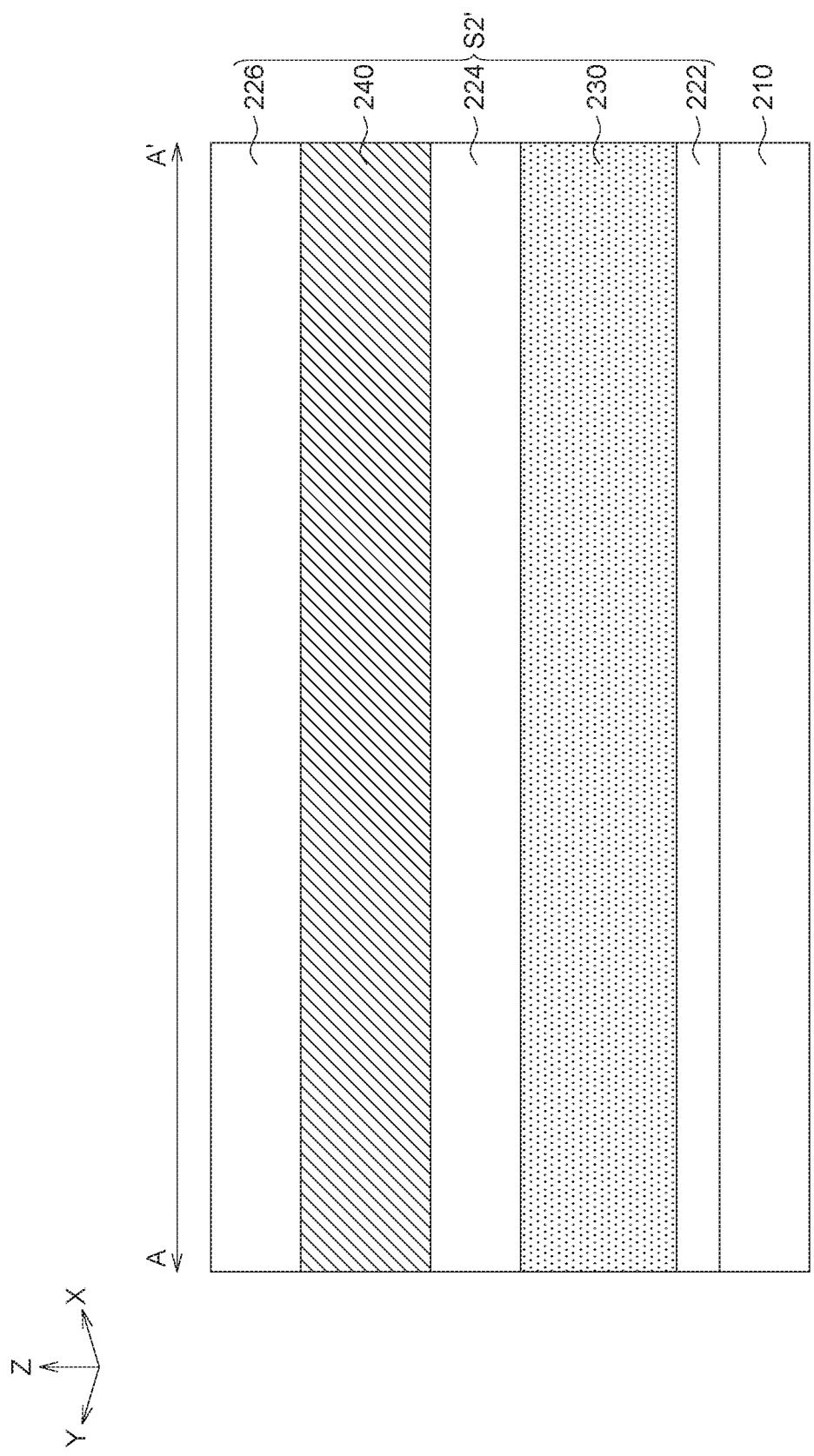
FIGS. 3A to 3M are cross-sectional views illustrating a method for fabricating a memory device in accordance with another embodiment of the present invention.

Referring to FIG. 3A, a substrate 210 is provided, and a stacked body S2' is formed on the upper surface 210a of the substrate 210. The stacked body S2' includes a first insulating layer 222, a first conductive layer 230, a second insulating layer 224, an upper sacrificial layer 240, and a third insulating layer 226 sequentially stacked on (for example, by a deposition process) the upper surface 210a of the substrate 210.

In some embodiments, the substrate 202 can be a silicon substrate or other suitable substrate. The first insulating layer 222, the second insulating layer 224, and the third insulating layer 226 may be formed of an oxide such as silicon oxide. The first conductive layer 230 may be formed of a conductive material such as tungsten (W), aluminum (Al), titanium nitride (TiN), tantalum nitride (TaN), doped or undoped polysilicon (poly-silicon) or other suitable material. In some embodiments, the first conductive layer 230 can be an n-type doped polysilicon layer. The upper sacrificial layer 240 may be formed of silicon nitride (SiN).

Figure 3B:
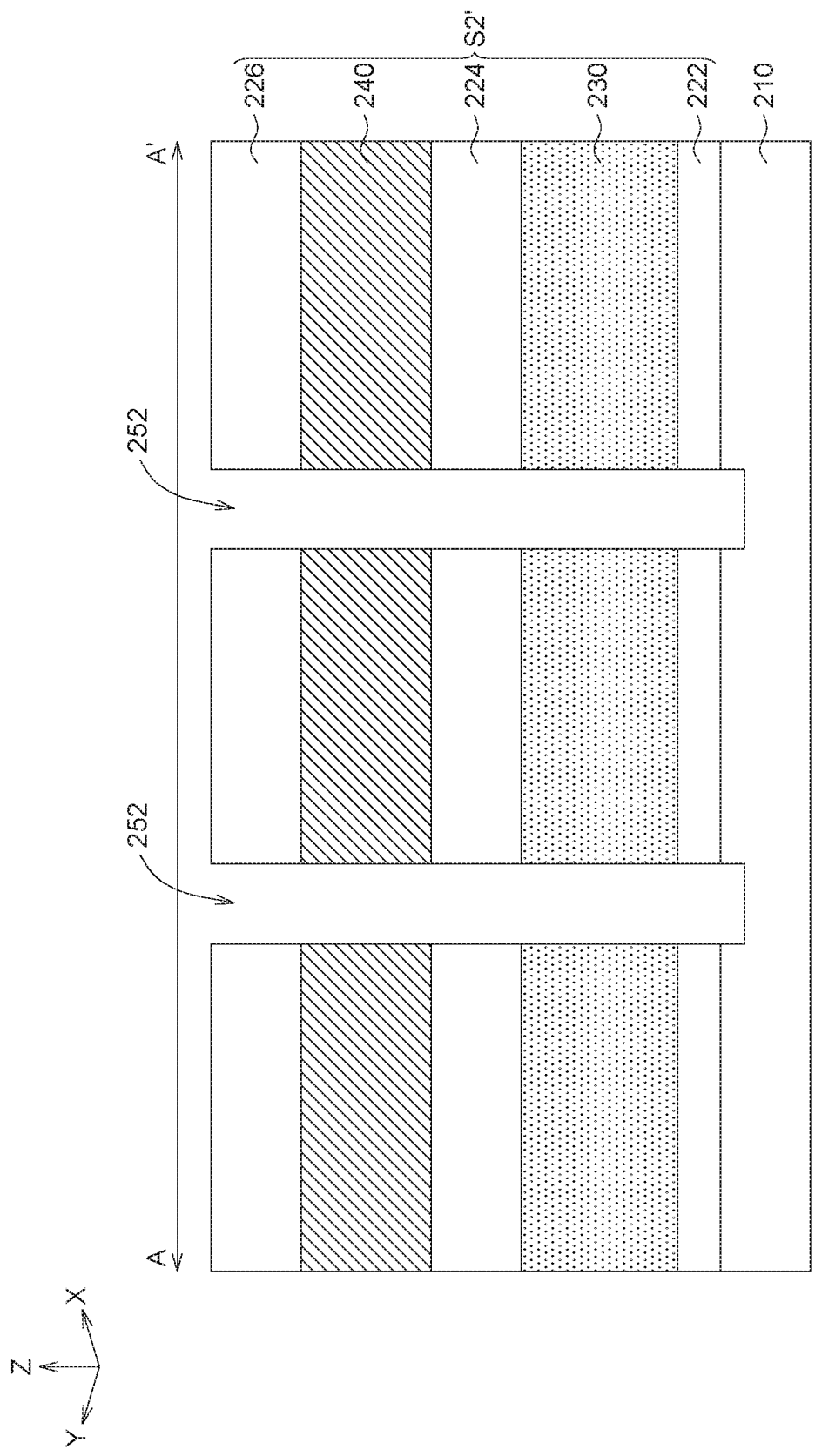

Referring to FIG. 3B, a plurality of first openings 252 are formed, each of the first openings 252 penetrates the stacked body S2' to expose a portion of the substrate 210. In some embodiments, the first opening 252 can be formed by an etching process, such as a dry etching process. In some embodiments, the substrate 210 can be overetched such that the bottom of the first opening 252 is lower than the upper surface 210a of the substrate 210.

Figure 3C:
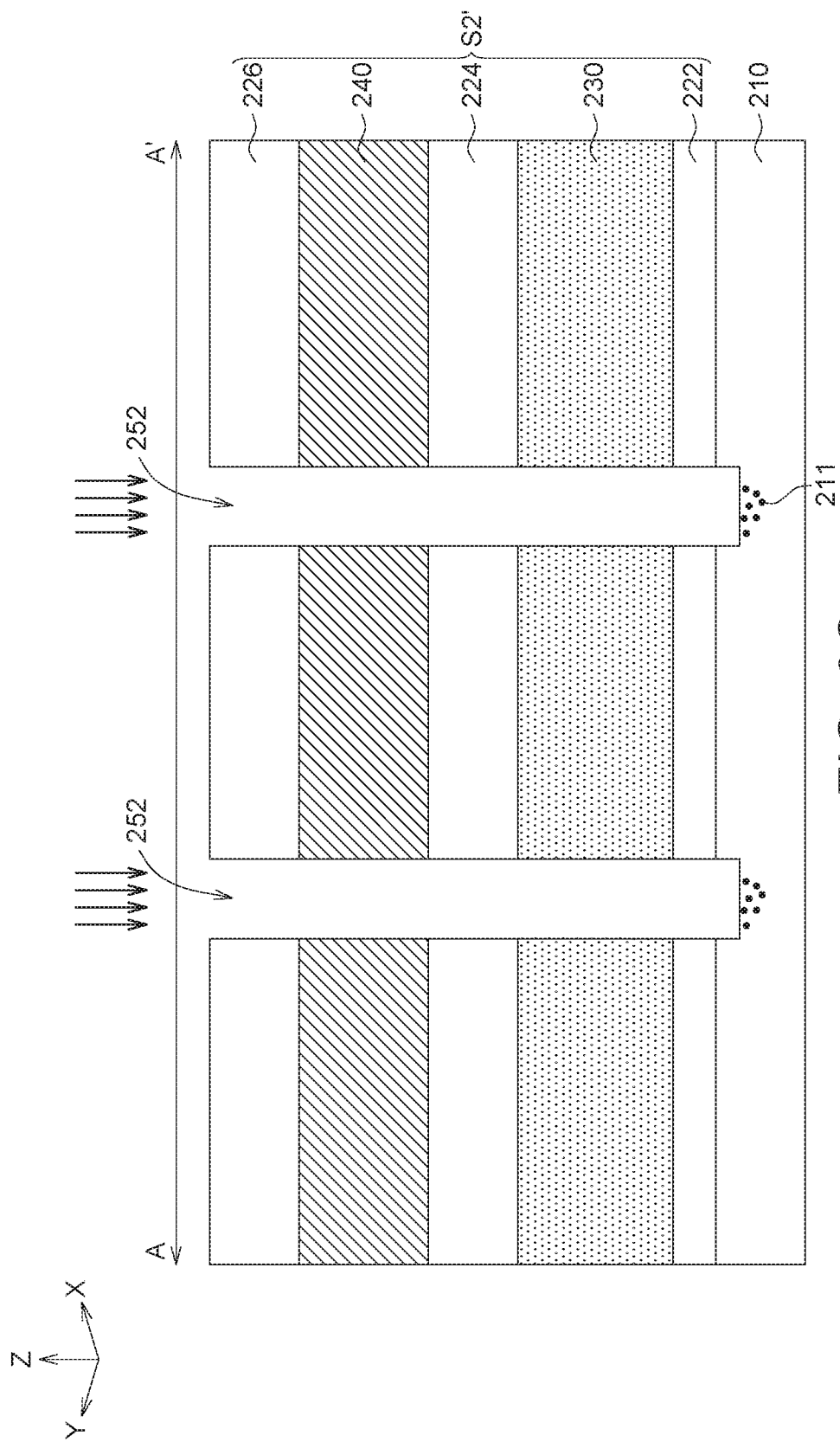

Referring to FIG. 3C, a dopant 211 is implanted in the substrate 210 corresponding to the first opening 252 by ion implantation. The dopant 211 is, for example, a p-type dopant. The dopant 211 helps to adjust the threshold voltage.

Figure 3D:
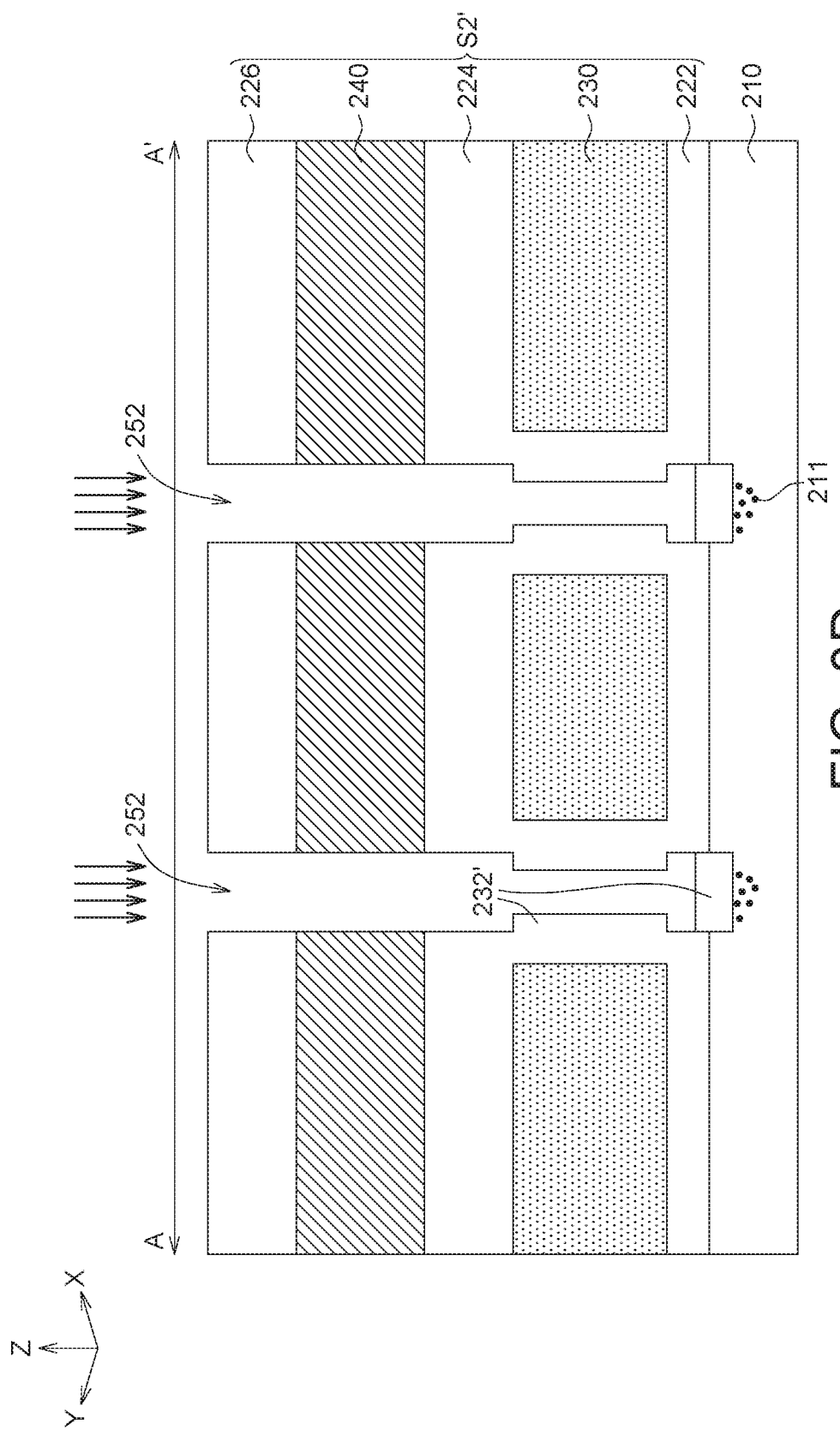

Referring to FIG. 3D, a portion of an oxide layer 232' is formed on one side surface of the first conductive layer 230 exposed from the first opening 252 and a portion of the oxide layer 232' is formed on the surface of the substrate 210 exposed from the first opening 252 by an oxidation process. In some embodiments, when the first conductive layer 230 is an n-type doped polysilicon layer and the substrate 210 is a silicon substrate, the oxide layer 232' including silicon dioxide is formed on the side surface of the first conductive layer 230 exposed from the first opening 252, and an oxide layer 232' including a silicon dioxide on the surface of the substrate 210 exposed from the first opening 252 is formed by an oxidation process and a high temperature.

Figure 3E:
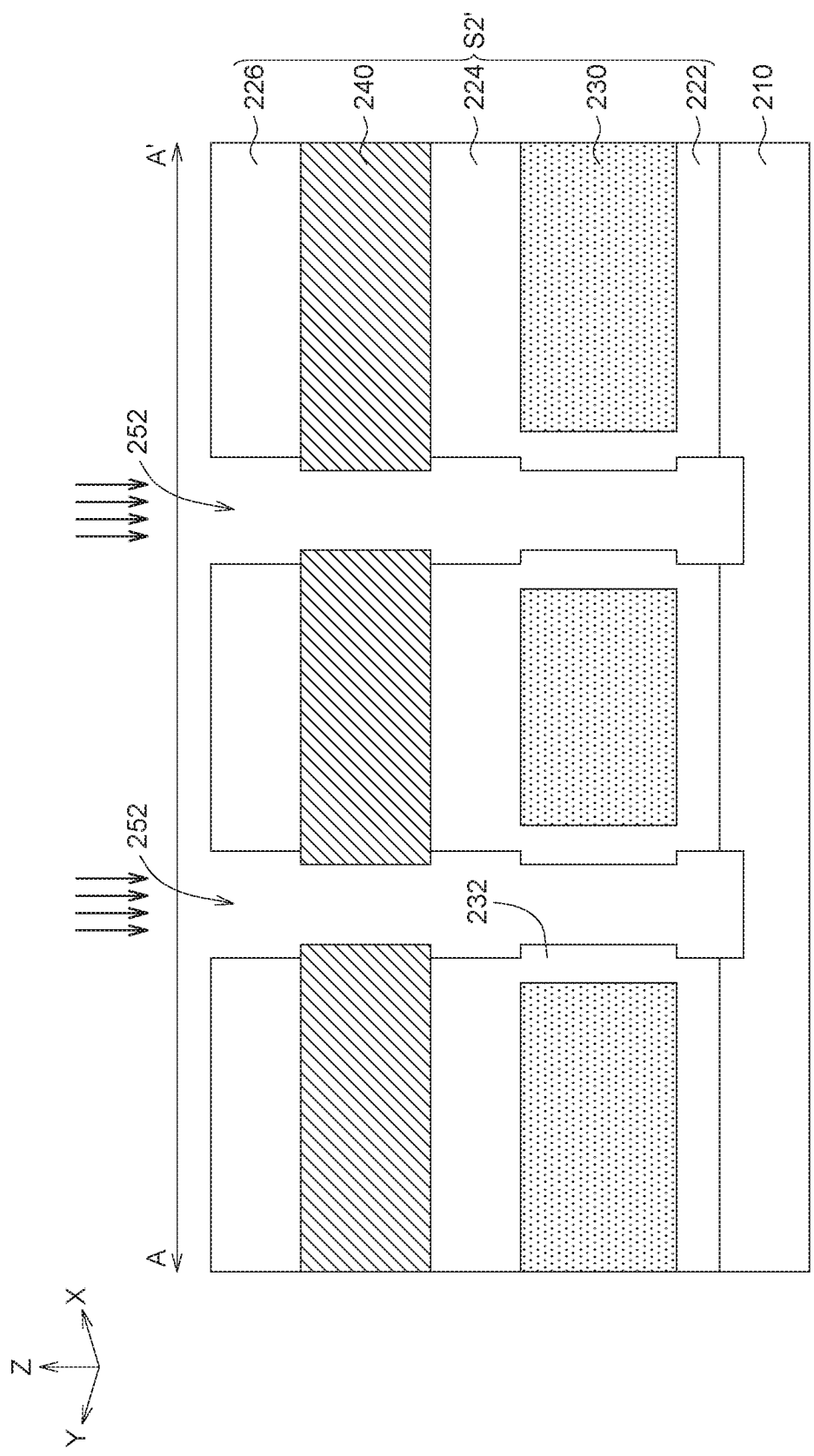

Referring to FIG. 3E, the excess oxide layer 232' in the first opening 252 is removed to form a thermal oxide layer 232 that is in direct contact with the first conductive layer 230, and the substrate 210 is exposed. In some embodiments, the excess oxide layer 232' in the first opening 252 is removed by soaking a solvent such as hydrofluoric acid (HF). Since the thermal oxide layer 232 is an oxide layer formed by directly oxidizing a conductive layer (for example, the first conductive layer 230), rather than an oxide layer formed by a deposition process (for example, chemical vapor deposition (CVD), physical vapor deposition (PVD) or other deposition process), the purity of the oxide of the thermal oxide layer 232 is greater than that of the insulating layer formed by the deposition method (for example, the first insulating layer 222, the second insulating layer 224 or the third insulating layer 226).

Figure 3F:
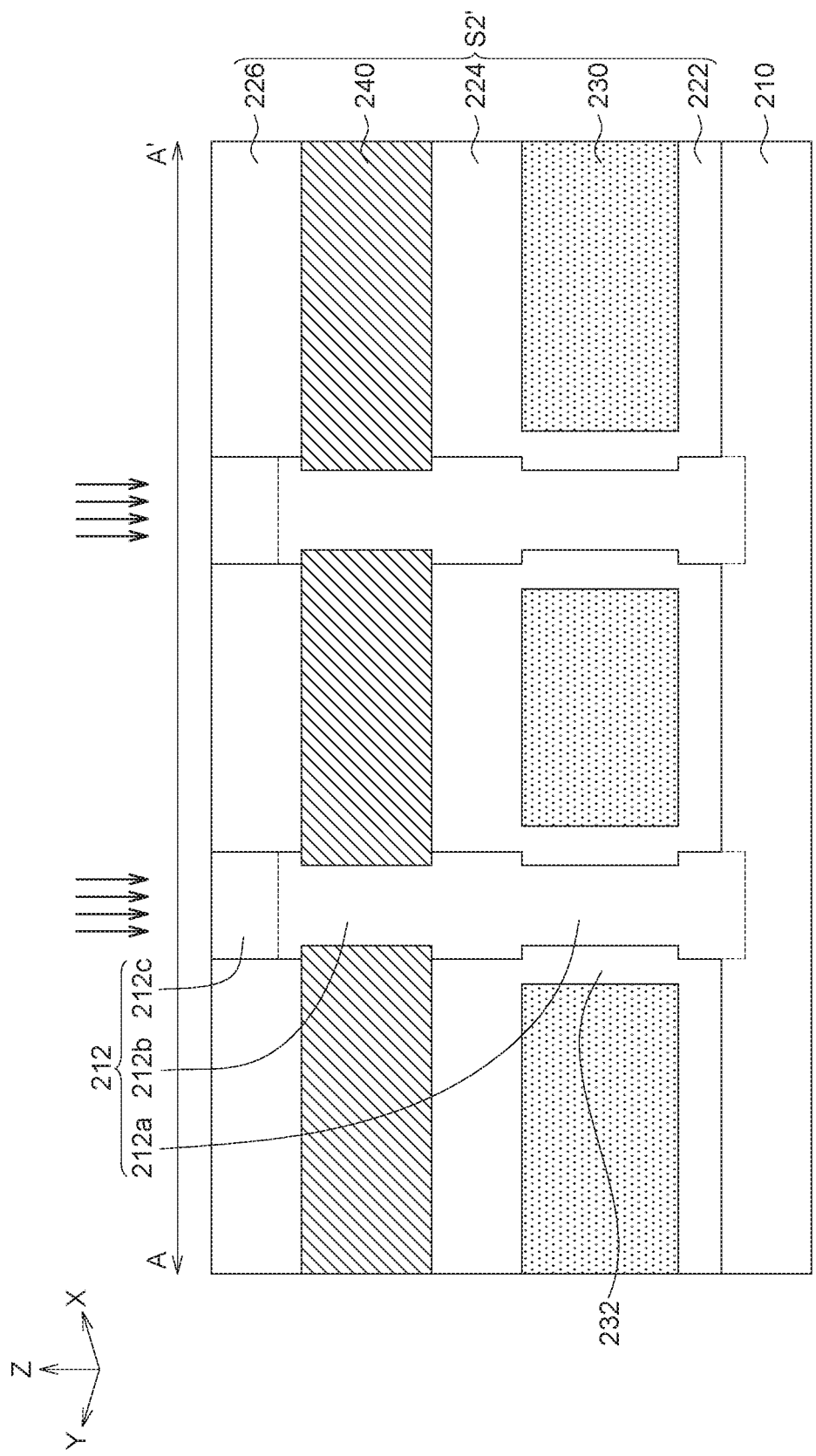

Referring to FIG. 3F, the lower portion 212a and the upper portion 212b of the channel structure 212 are formed by the same first epitaxial growth process. The lower portion 212a of the channel structure 212 corresponds to the first conductive layer 230. The upper portion 212b of the channel structure 212 corresponds to the upper sacrificial layer 240. The lower portion 212a of the channel structure 212 covers the thermal oxide layer 232, and the thermal oxide layer 232 is disposed between the first conductive layer 230 and the lower portion 212a of the channel structure 212. In the present embodiment, the entirety of the channel structure 212 is an epitaxial growth layer of silicon.

Thereafter, a doped region 212c is formed on the top surface of the channel structure 212 by ion implantation. The doped region 212c is, for example, a heavily doped region of an n-type semiconductor. The doped region 212c can be used to form a contact structure in a subsequent process to electrically connect to the bit line.

Figure 3G:
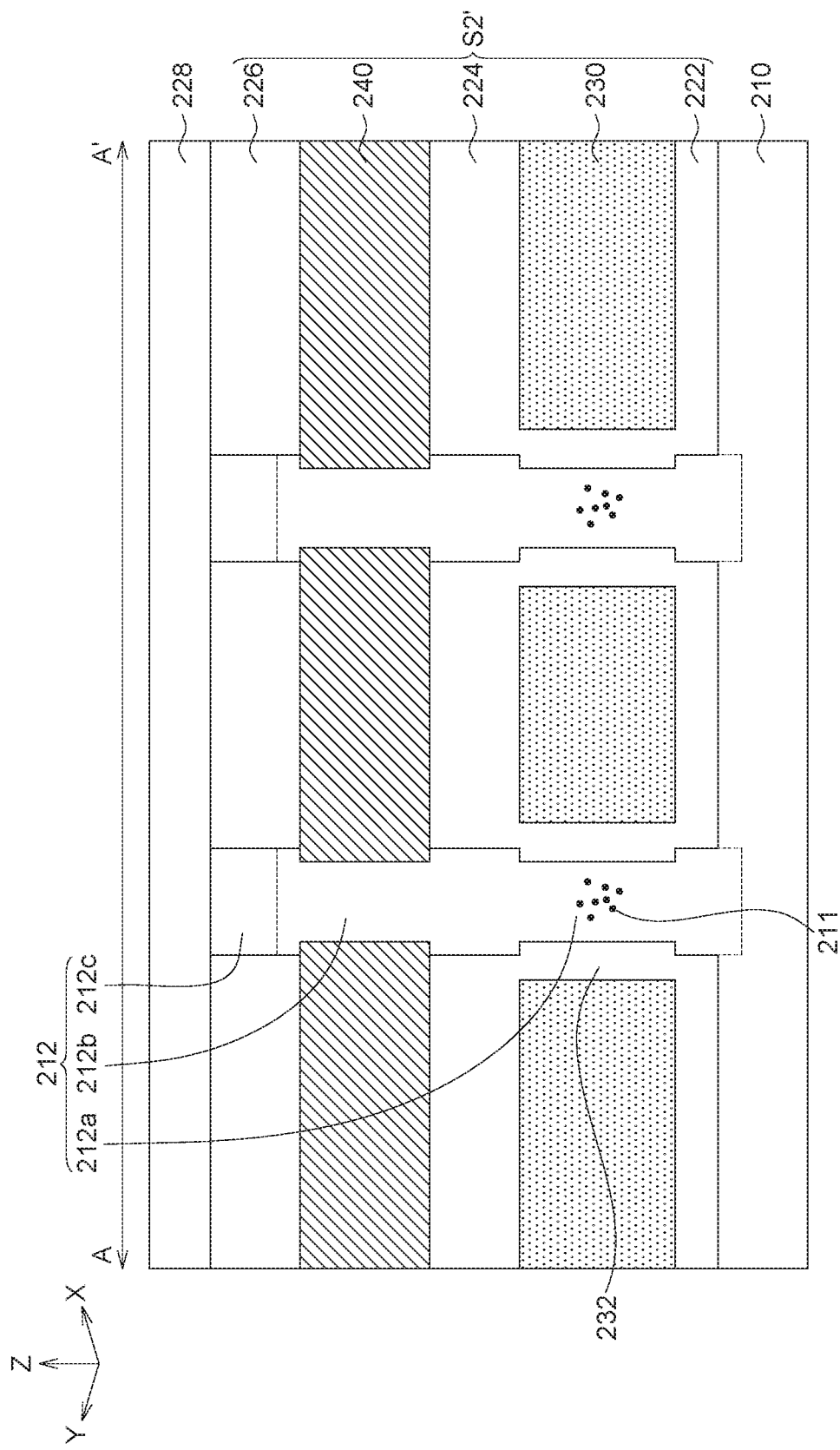

Referring to FIG. 3G, a capping layer 228 covering the stacked body S2' is formed by a deposition process, that is, the cover layer 228 covers the third insulating layer 226 and the channel structure 212. In this embodiment, the dopant 211 can be dissipated to the lower portion 212a of the channel structure 212 by a thermal process. The thermal process activates the dopant 211.

Figure 3H:
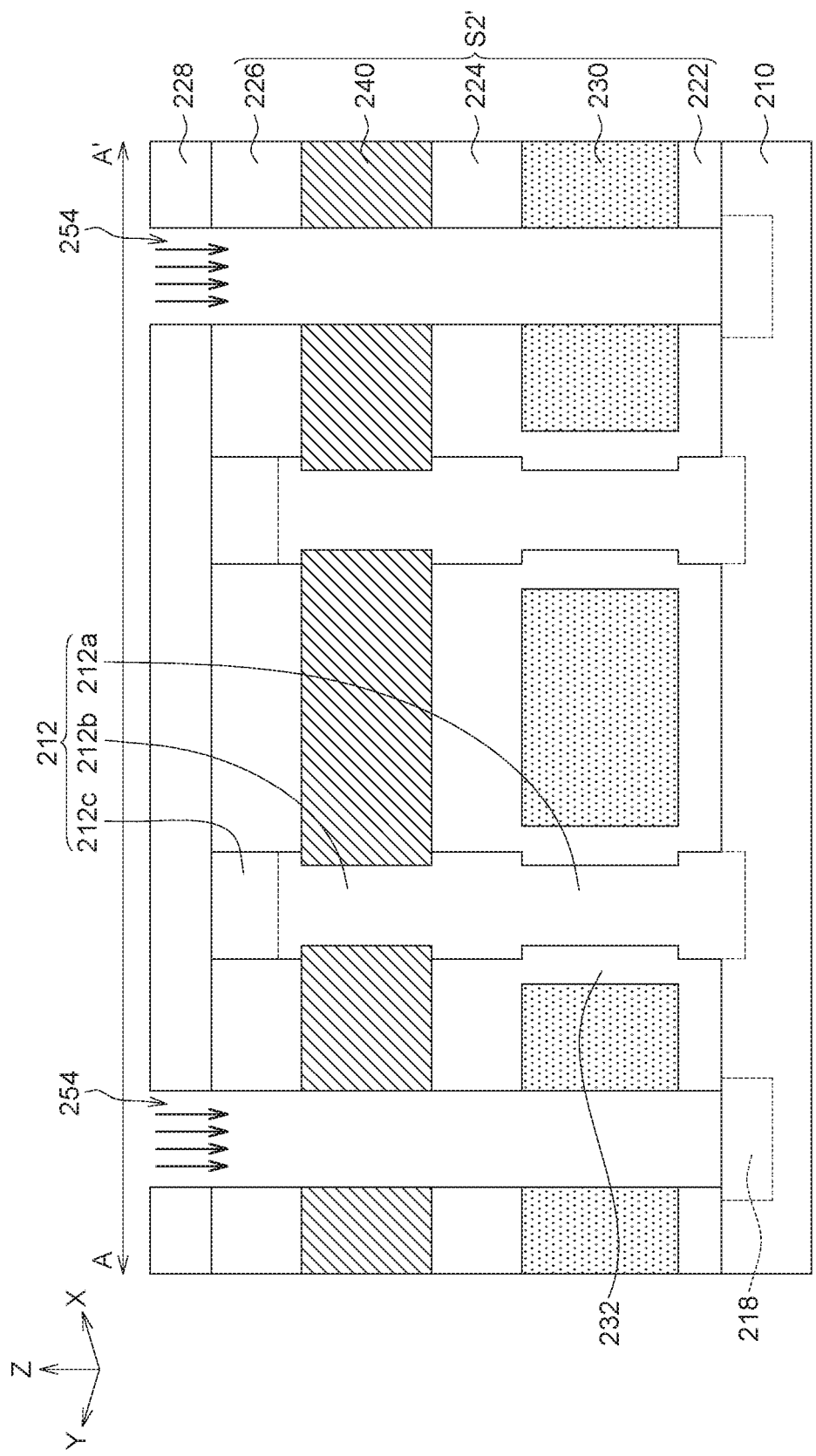

Referring to FIG. 3H, a second opening 254 penetrating the stacked body S2' is formed by an etching process. This etching process is, for example, a dry etching process. Thereafter, a doped region 218 may be formed on the substrate 210 through the second opening 254. The doped region 218 includes, for example, a heavily doped n-type semiconductor. Alternatively, the step of forming the doped region 218 can be performed after removal of the upper sacrificial layer 240.

Figure 3I:
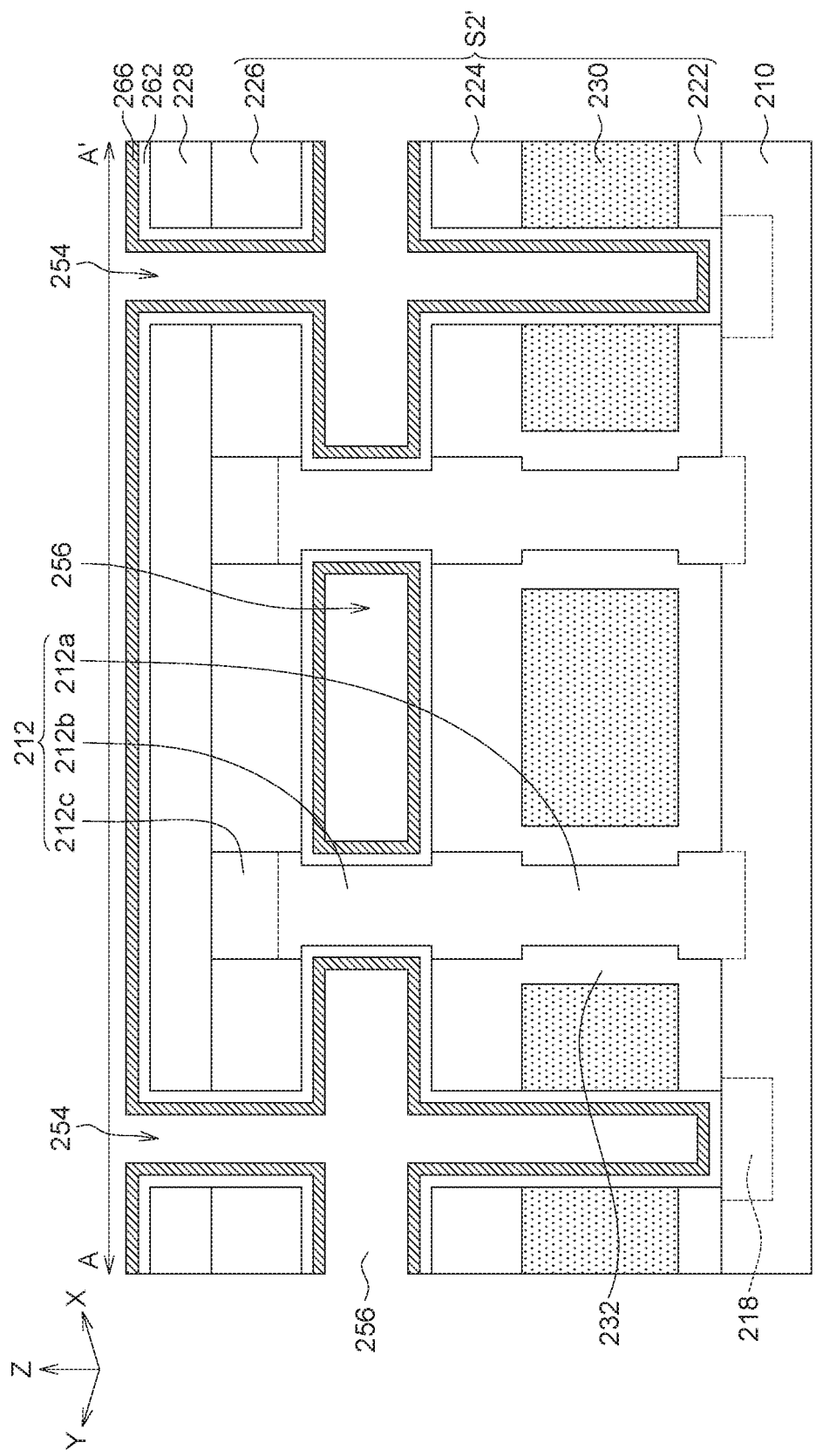

Referring to FIG. 3I, the upper sacrificial layer 240 is removed from the second opening 254 by an etching process to form the upper opening 256 at a position where the upper sacrificial layer 240 is removed. The etching process can be an isotropic etching (for example, a wet etching method), and can be a highly selective etching, such as selectively etching silicon nitride (SiN) without etching the silicon dioxide ($SiO_2$).

Next, a memory layer 262 and a dielectric material 266 extending along the sidewall of the second opening 254, the sidewall of the upper opening 256, a portion of the sidewalls of the channel structures 212, and covering the capping layer 128 are sequentially formed by a deposition process. The memory layer 262 may be composed of a composite layer (ie, an ONO layer) including a silicon oxide layer, a silicon nitride layer, and a silicon oxide layer. For example, the memory layer 162 can include a tunneling layer, a trapping layer, and a blocking layer. The tunneling layer may include silicon dioxide (SiO2), a two-layer structure formed of silicon dioxide (SiO2)/silicon oxynitride (SiON) or other suitable material. The trapping layer can include silicon nitride, polysilicon or other suitable materials. The blocking layer may include silicon dioxide (SiO2) or other suitable material. In some embodiments, the dielectric material 266 can include a high k material, such as aluminum oxide (Al2O3) or other suitable material. The dielectric material 166 can also act as a blocking layer to prevent lateral diffusion of charges.

Figure 3J:
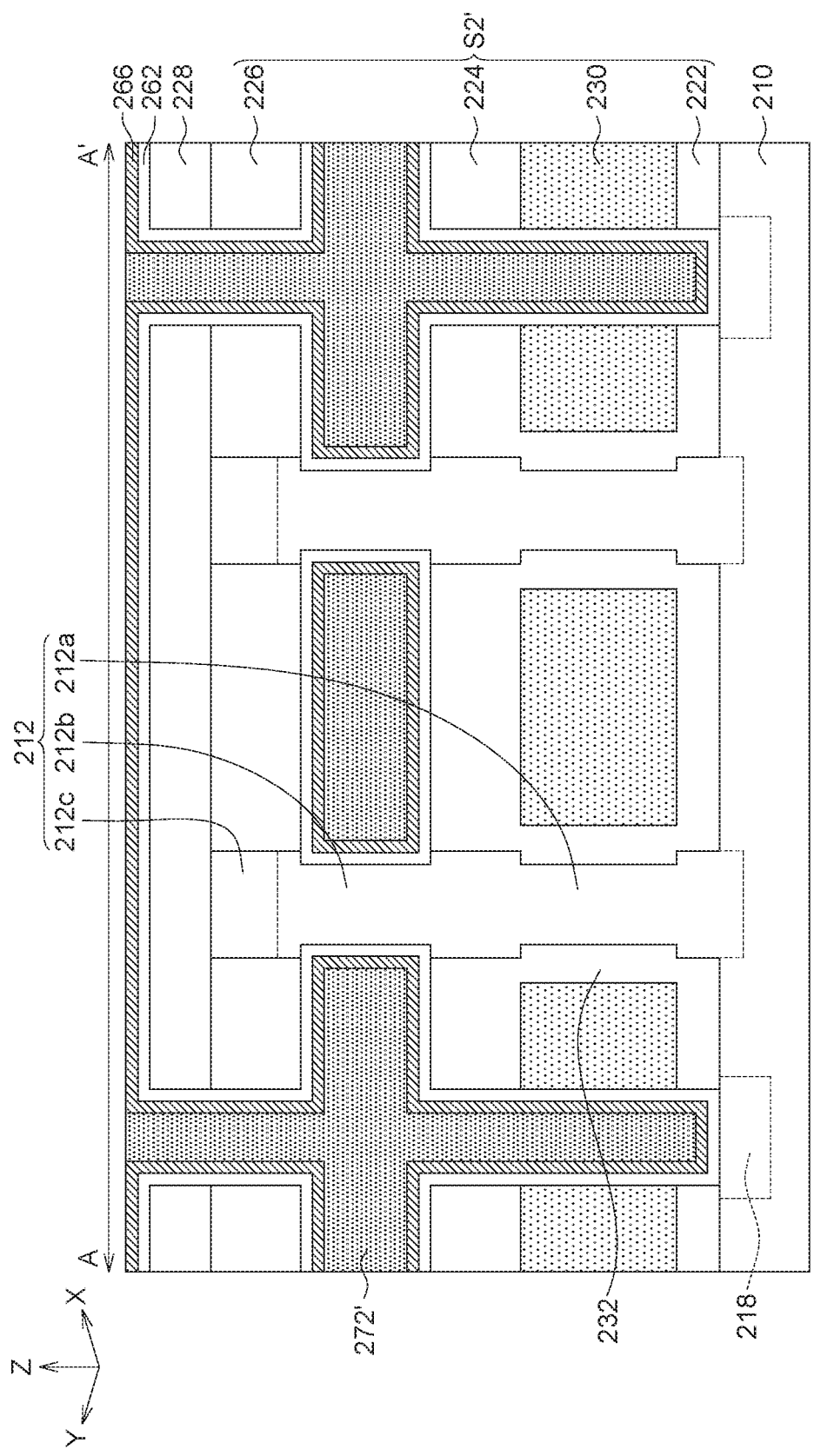

Referring to FIG. 3J, a conductive material 272' is filled in the second opening 254 and the upper opening 256 by a deposition process. The conductive material 272' may include tungsten (W), aluminum (Al), titanium nitride (TiN), tantalum nitride (TaN), or other suitable materials.

Figure 3K:
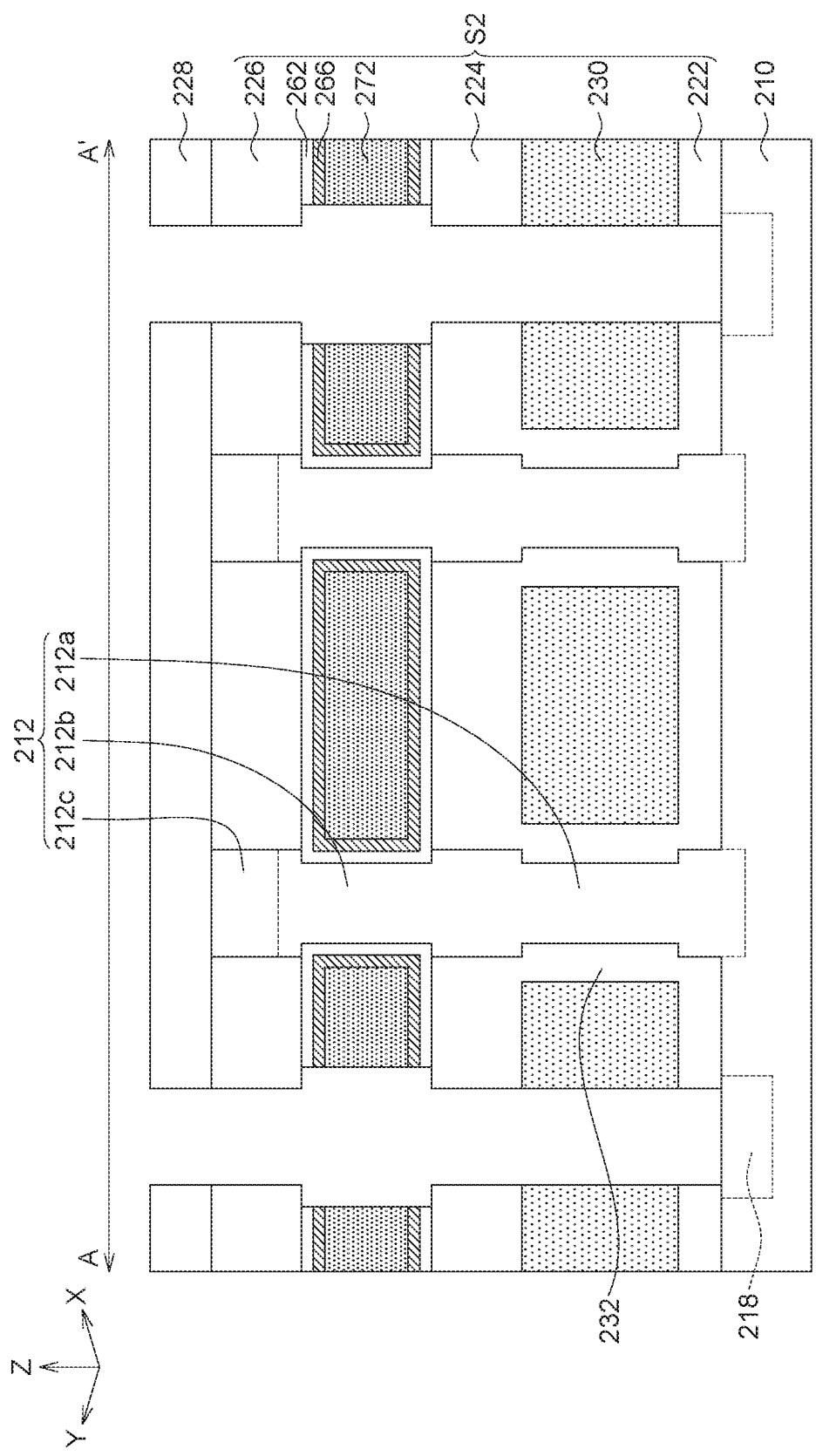

Referring to FIG. 3K, the conductive material 272' disposed in the second opening 254 is removed by an etching process to form a second conductive layer 272 disposed in the upper opening 256. This etching process is, for example, a dry etching process. In some embodiments, the etching process can remove a portion of the conductive material 272' disposed in the upper opening 256. The second conductive layer 272 may include tungsten (W), aluminum (Al), titanium nitride (TiN), tantalum nitride (TaN), or other suitable conductive material. In the present embodiment, the second conductive layer 272 includes tungsten (W). Thereby, a stacked structure S2 including the first insulating layer 222, the first conductive layer 230, the second insulating layer 224, the second conductive layer 272, and the third insulating layer 226 is formed.

Figure 3L:
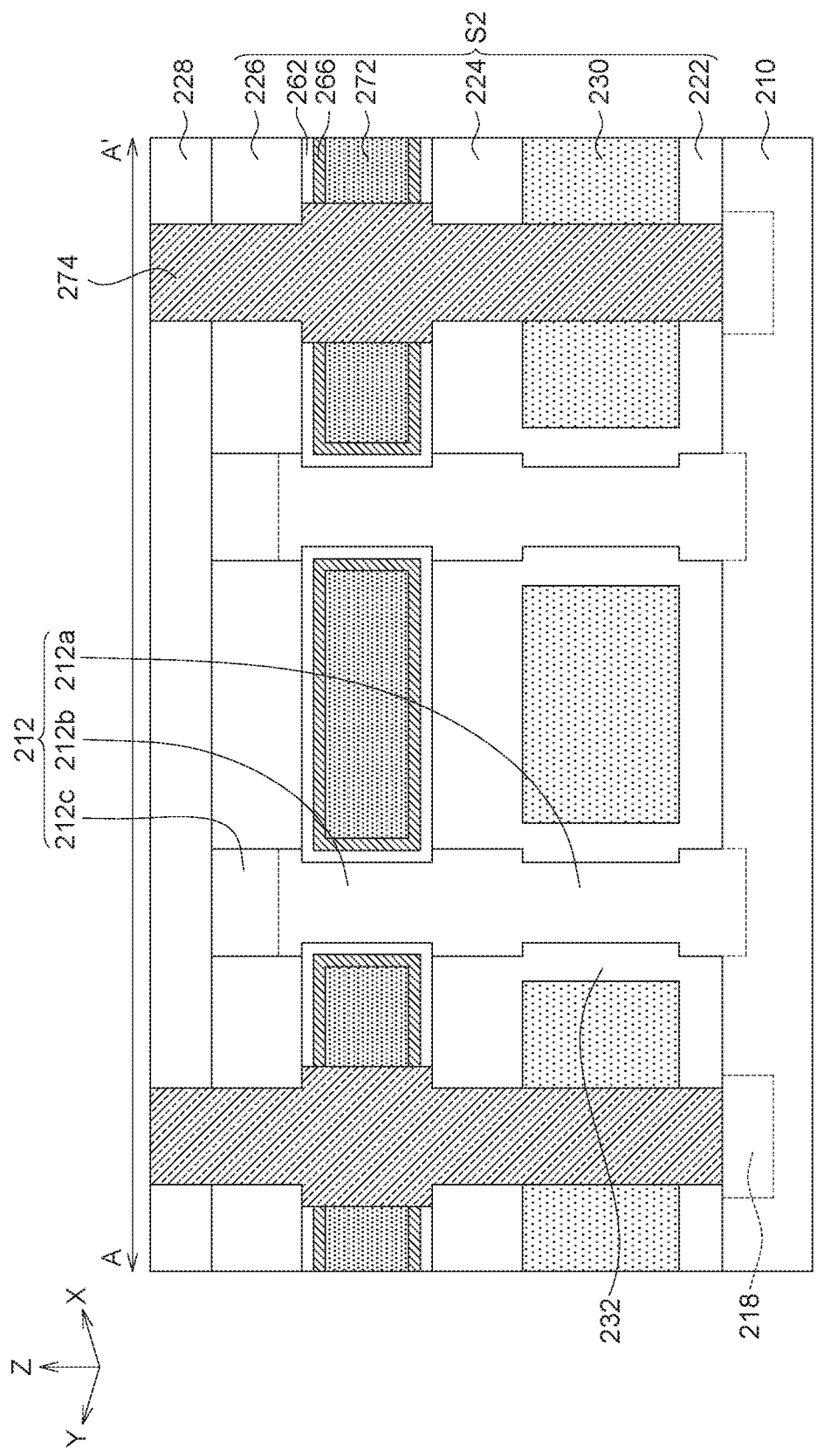

Referring to FIG. 3L, an insulating material is filled in the second opening 254 by a deposition process to form a plurality of isolation structures 274. The isolation structures 274 can include an oxide or other suitable insulating material.

Figure 3M:
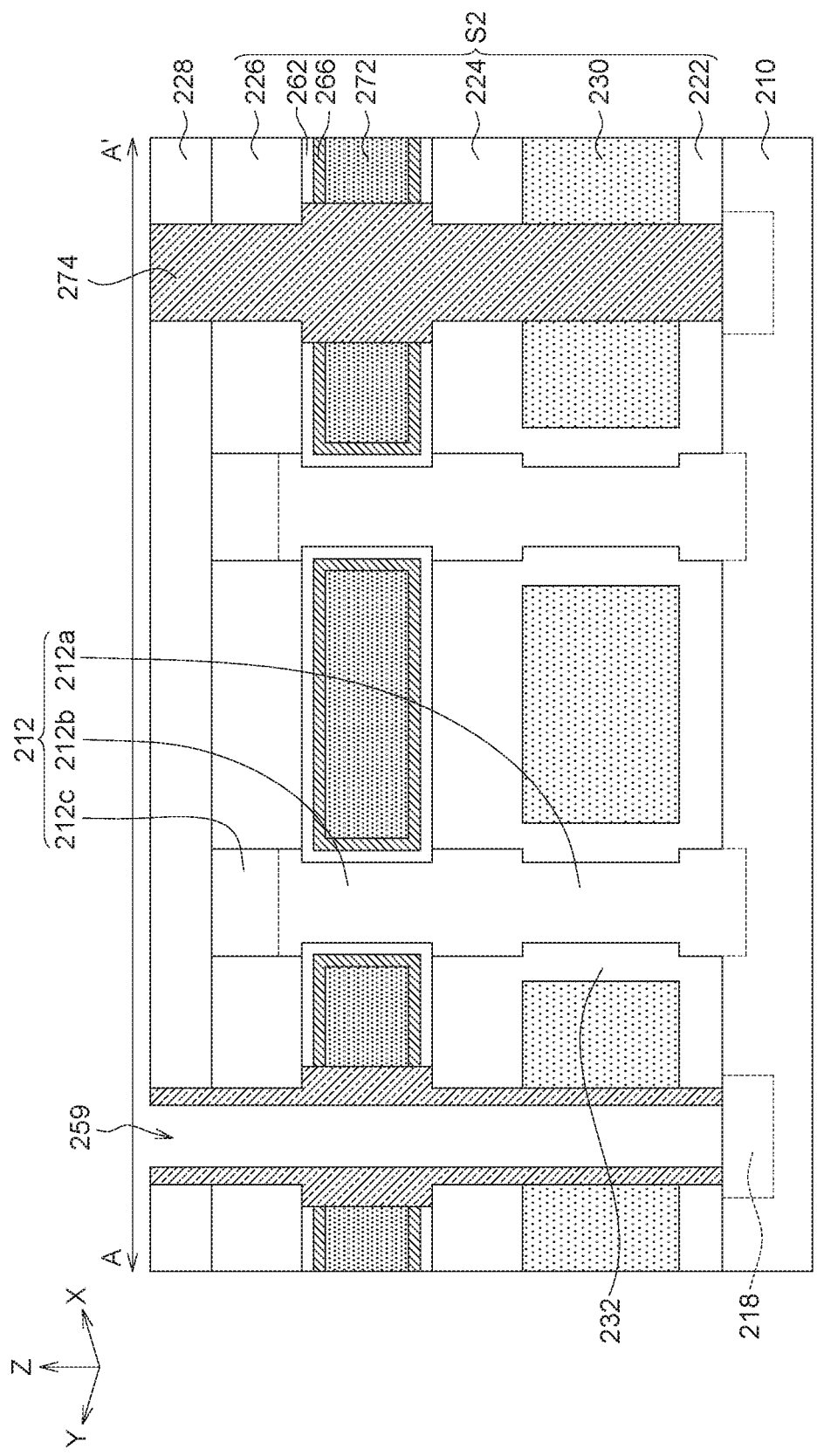

Referring to FIG. 3M, a plurality of vertical openings 259 are formed penetrating the isolation structures 174 and extending along the normal direction of the upper surface 110a of the substrate 110.

Thereafter, referring back to FIG. 1C, a conductive material is filled in the vertical openings 259 by a deposition process to form a plurality of conductive connection structures 276. Conductive connection structure 276 can include tungsten (W), aluminum (Al), titanium nitride (TiN), or other suitable electrically conductive material. As a result, the memory device 200 as shown in FIG. 1C is formed.

FIGS. 4A to 4L are cross-sectional views illustrating a method for fabricating a memory device 300 in accordance with one further embodiment of the present invention.

Figure 4A:
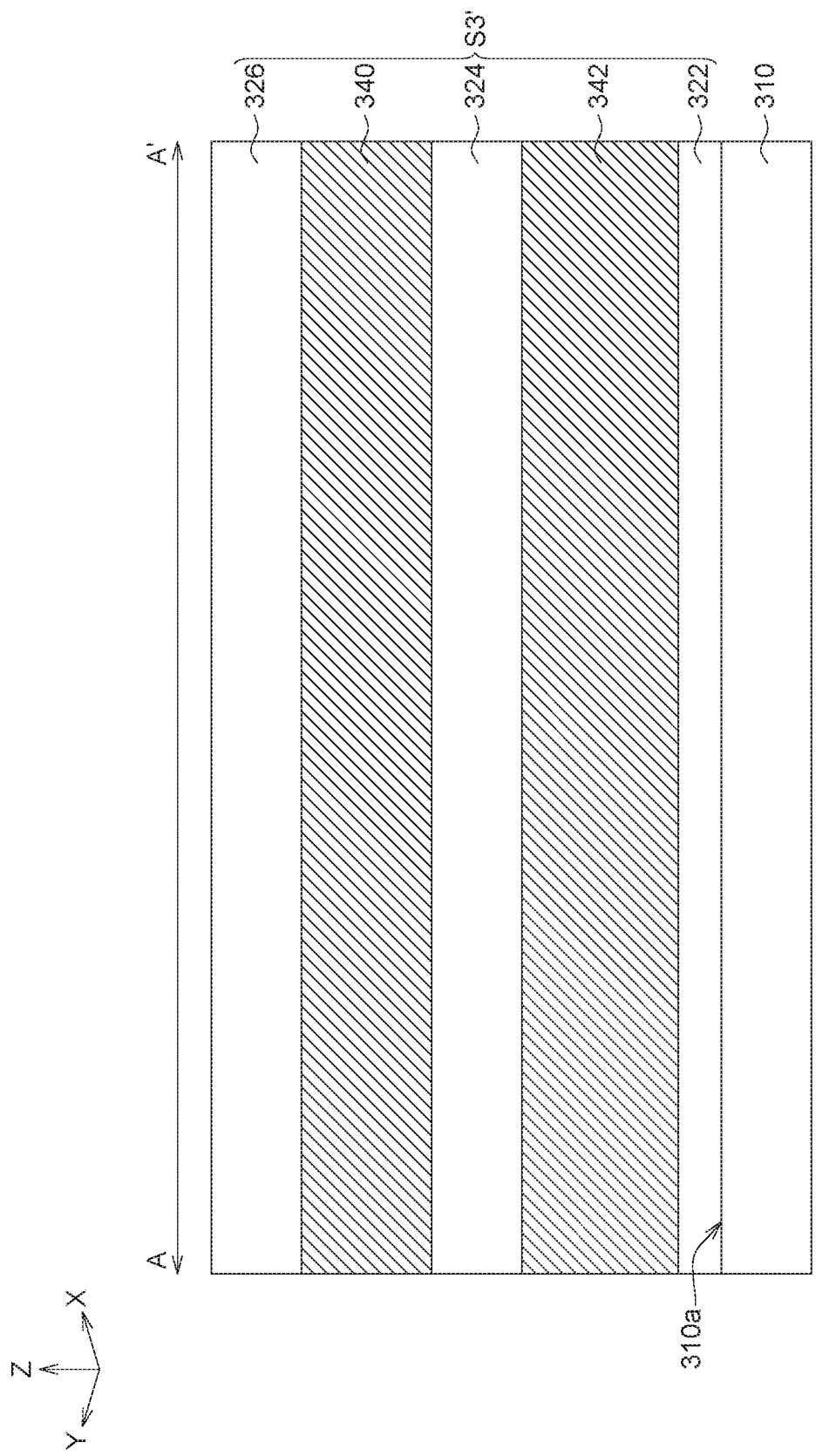
FIGS. 4A to 4L are cross-sectional views illustrating a method for fabricating a memory device in accordance with one further embodiment of the present invention.

Referring to FIG. 4A, a substrate 310 is provided, and a stacked body S3' is formed on the upper surface 310a of the substrate 310. The stacked body S3' including a first insulating layer 322, a lower sacrificial layer 342, a second insulating layer 324, an upper sacrificial layer 340 and a third insulating layer 326 sequentially stacked on (eg, by a deposition process) the upper surface 310a of the substrate 310.

In some embodiments, the substrate 310 can be a silicon substrate or other suitable substrate. The first insulating layer 322, the second insulating layer 324, and the third insulating layer 326 may be formed of an oxide such as silicon dioxide. The lower sacrificial layer 342 and the upper sacrificial layer 340 may be formed of silicon nitride (SiN).

Figure 4B:
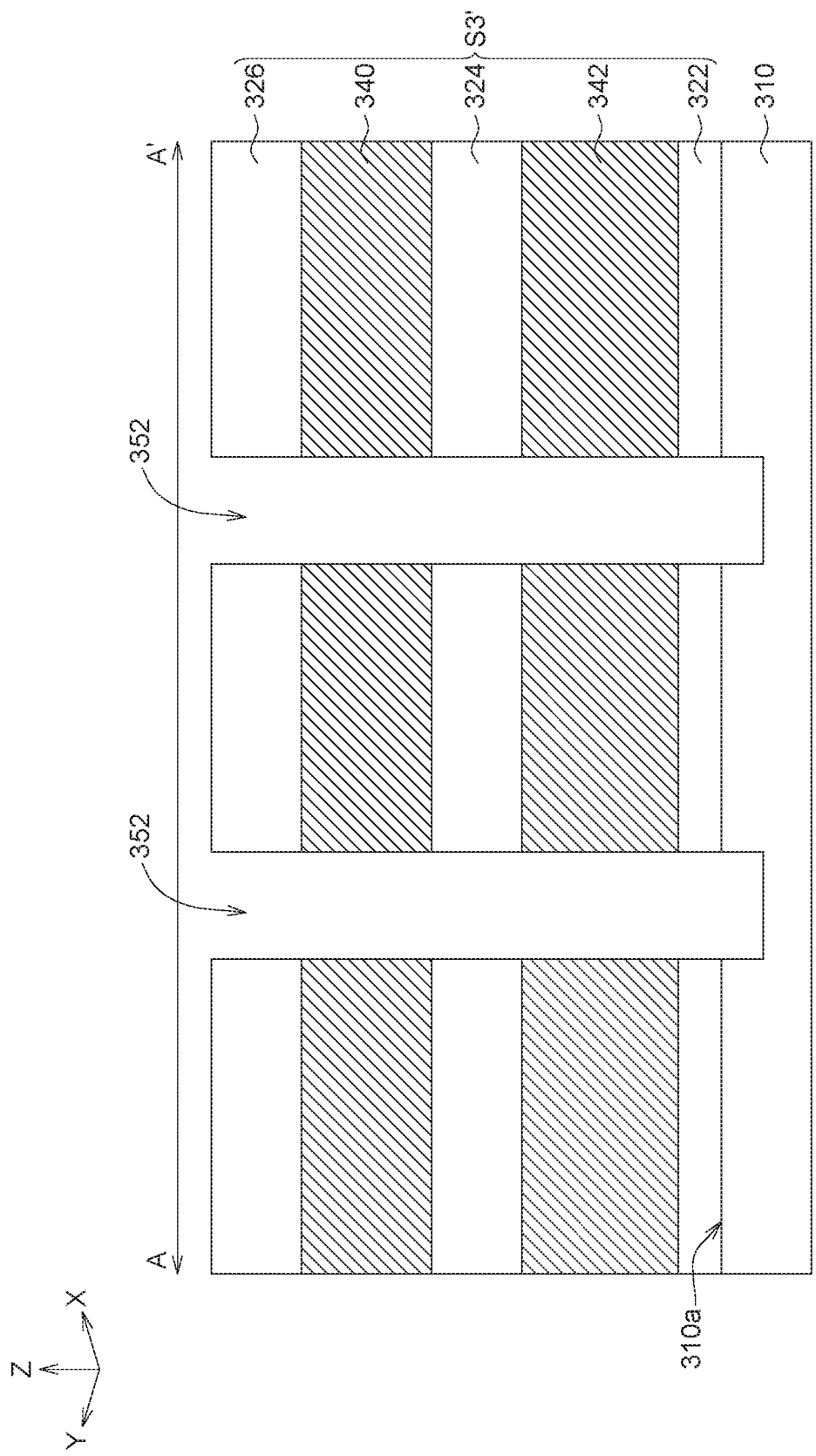

Referring to FIG. 4B, a plurality of first openings 352 are formed, and each of the first openings 352 penetrates the stacked body S3' to expose a portion of the substrate 310. In some embodiments, the first opening 352 can be formed by an etching process, such as a dry etching process. In some embodiments, the substrate 310 can be overetched such that the bottom of the first opening 352 is lower than the upper surface 310a of the substrate 310.

Figure 4C:
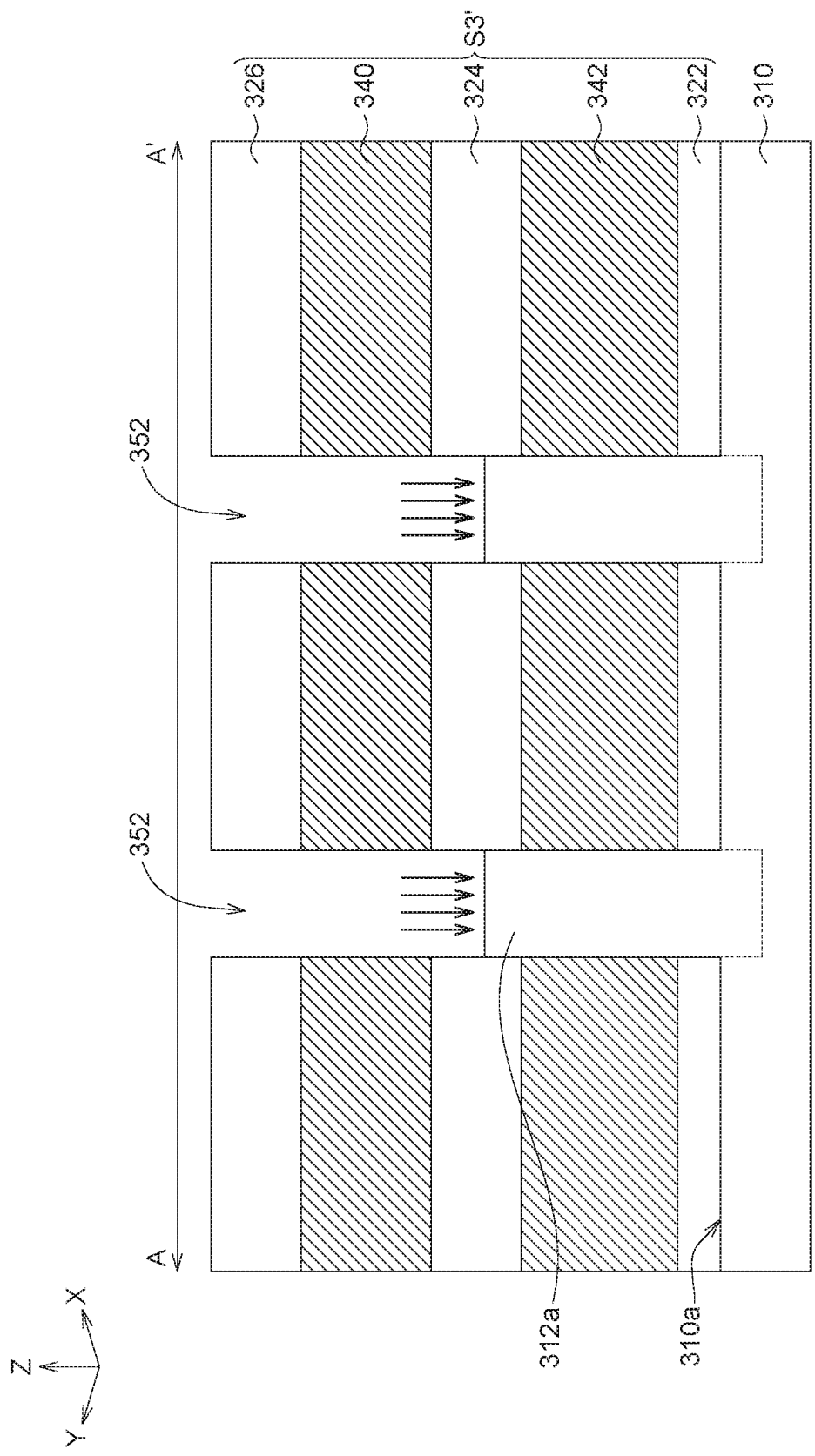

Referring to FIG. 4C, the lower portion 312a of the channel structure is formed by a first epitaxial growth process. That is, the lower portion 312a of the channel structure is an epitaxial growth layer of silicon. The height of the top surface of the lower portion 312a of the channel structure is larger than the height of the top surface of the lower sacrificial layer 342.

Thereafter, a p-type dopant is implanted into the lower portion 312a of the channel structure by ion implantation. The p-type dopant is helpful for adjusting the threshold voltage.

Figure 4D:
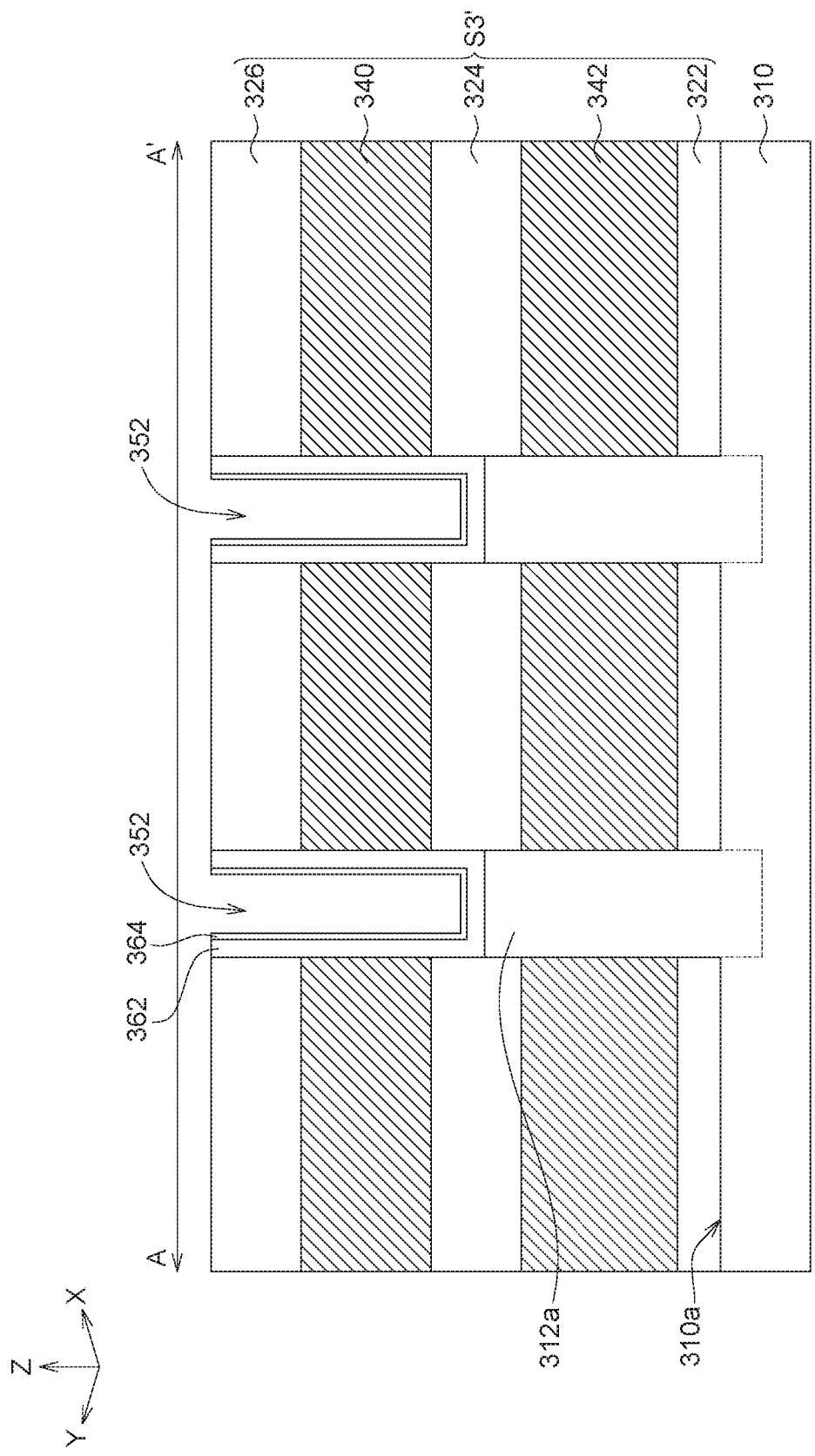

Referring to FIG. 4D, a memory layer 362 covering a portion of the sidewall of the first opening 352 and the lower portion 312a of the channel structure is formed. The memory layer 362 may be composed of a composite layer (ie, an ONO layer) including a silicon oxide layer, a silicon nitride layer, and a silicon oxide layer. For example, the memory layer 362 can include a tunneling layer, a trapping layer, and a blocking layer. The tunneling layer may include silicon dioxide ($SiO_2$), a two-layer structure formed of silicon dioxide ($SiO_2$)/silicon oxynitride (SiON) or other suitable material. The trapping layer can include silicon nitride, polysilicon or other suitable materials. The blocking layer may include silicon dioxide ($SiO_2$) or other suitable material.

Next, a protective layer 364 is formed on the memory layer 362 by a deposition process. The protective layer 364 can prevent the memory layer 362 from being damaged in subsequent processes. The protective layer 364 is, for example, silicon nitride (SiN), polysilicon or other suitable material.

Figure 4E:
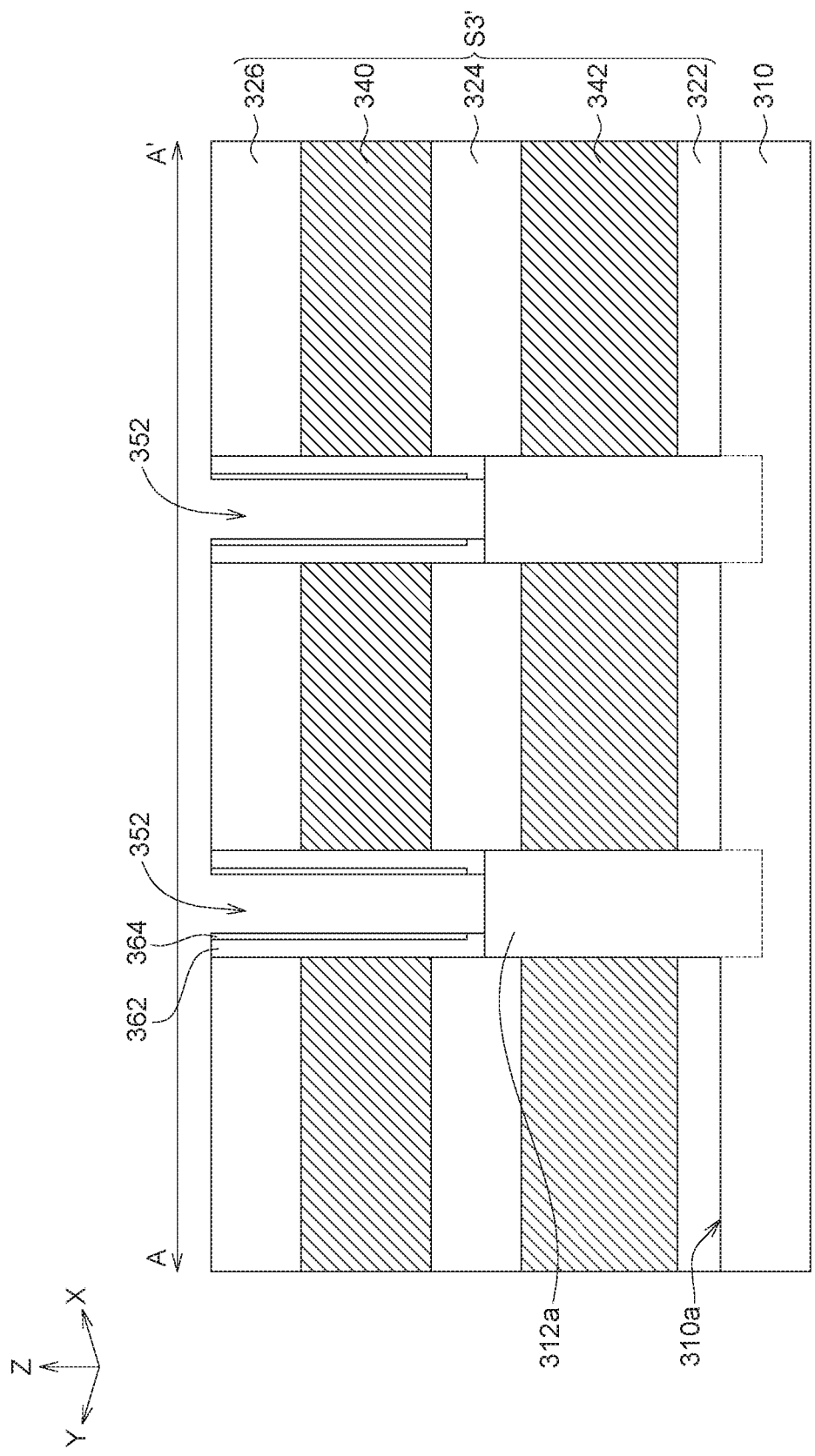

Referring to FIG. 4E, a portion of the memory layer 362 and the protective layer 364 are removed by an etching process to expose the lower portion 312a of the channel structure. The etching process can be a dry etching process or a wet etching process.

Figure 4F:
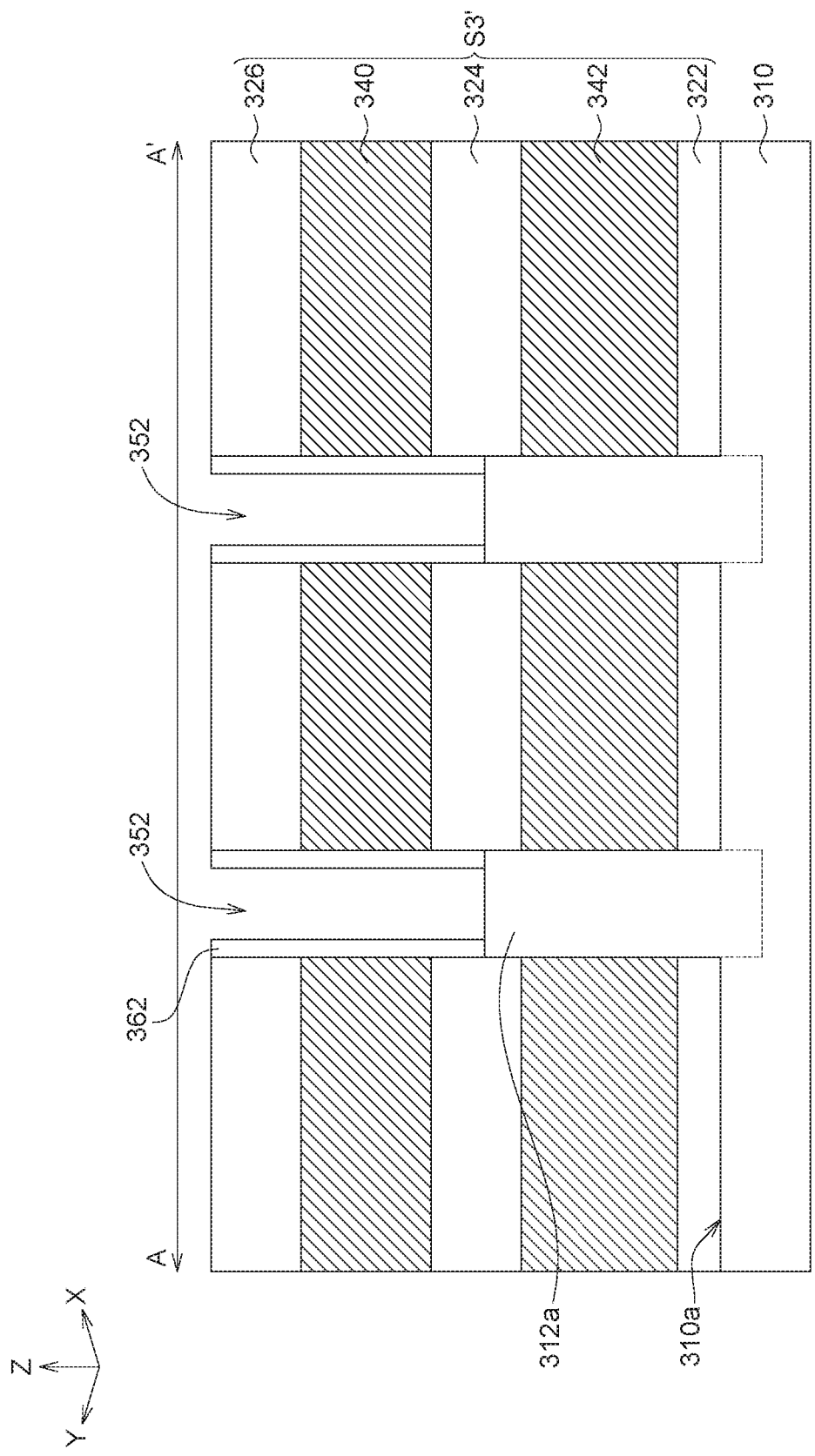

Referring to FIG. 4F, the protective layer 364 is removed by immersing a solvent to expose the memory layer 362. The solvent is, for example, hot phosphoric acid ($H_3PO_4$), but the present invention is not limited thereto, as long as it is a solvent which can remove the protective layer 364 without damaging the memory layer 362.

Figure 4G:
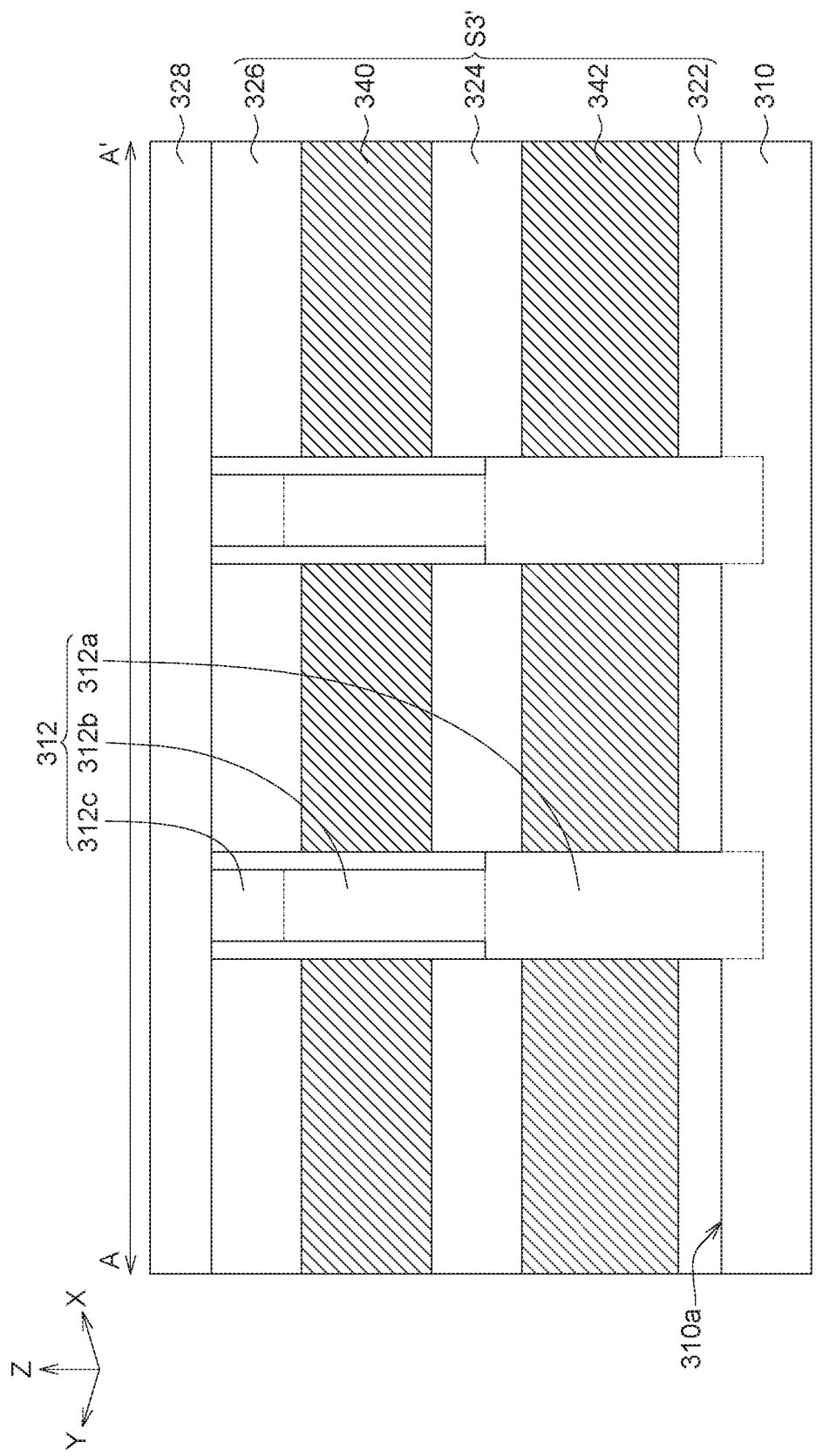

Referring to FIG. 4G, the upper portion 312b of the channel structure is formed by a second epitaxial growth process, such that the channel structure 312 including the lower portion 312a and the upper portion 312b is formed. In the present embodiment, the channel structure 312 is an epitaxial growth layer of silicon.

Thereafter, a doped region 312c is formed on top of the channel structure 312 by ion implantation, and the doped region 312c is, for example, a heavily doped region of an n-type semiconductor. The doped region 312c can be used to form a contact structure in a subsequent process to electrically connect to the bit line.

Next, a capping layer 328 covering the stacked body S3' is formed by a deposition process, that is, the capping layer 328 covers the third insulating layer 326 and the channel structure 312.

Figure 4H:
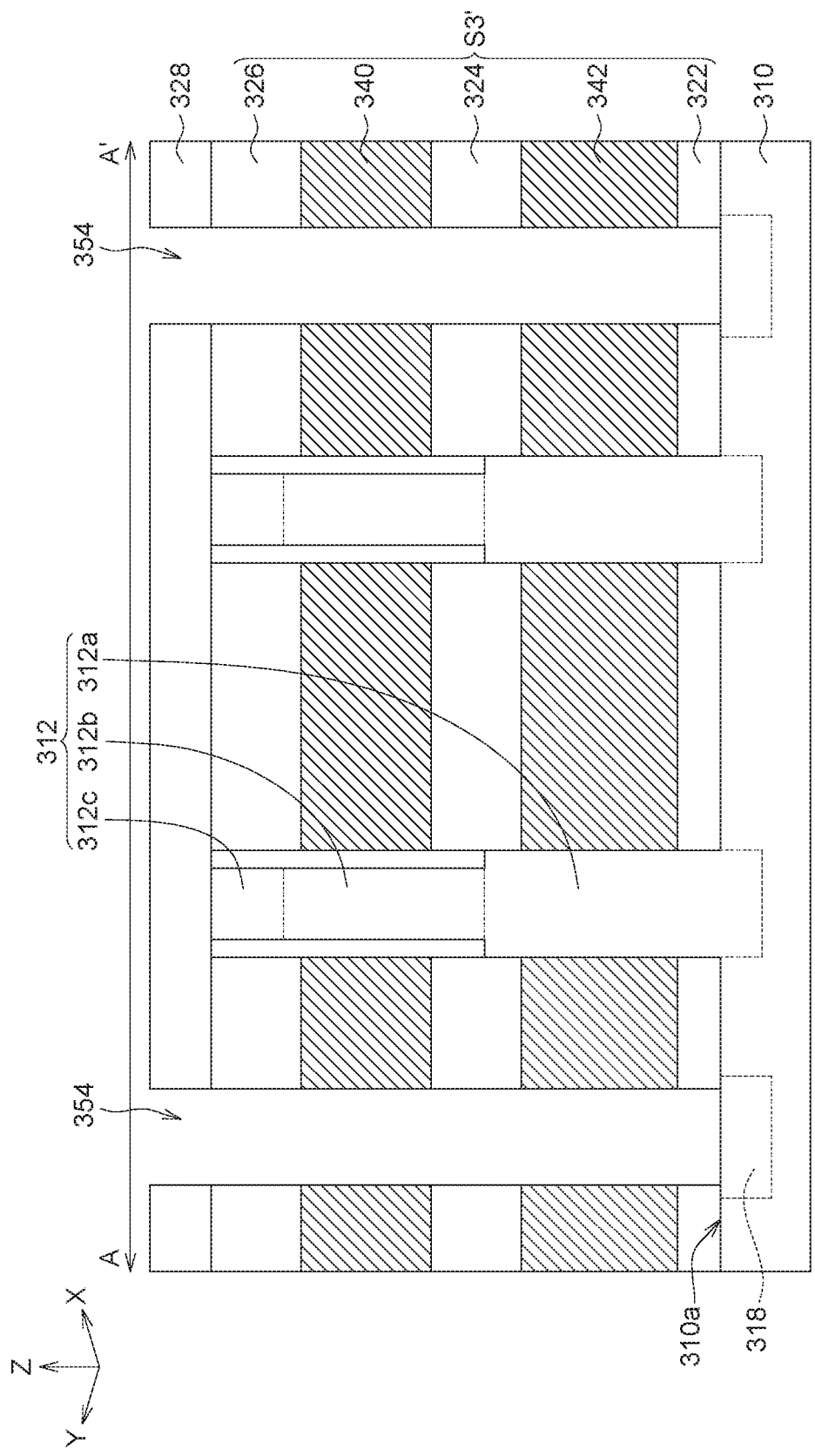

Referring to FIG. 4H, a second opening 354 penetrating the stacked body S3' is formed by an etching process. This etching process is, for example, a dry etching process. Thereafter, doped regions 318 may be formed on the substrate 310 corresponding to the second openings 354 by ion implantation. The doped region 318 includes, for example, a heavily doped n-type semiconductor. Alternatively, the step of forming the doped region 318 may be performed after the upper sacrificial layer 340 and the lower sacrificial layer 342 are removed.

Figure 4I:
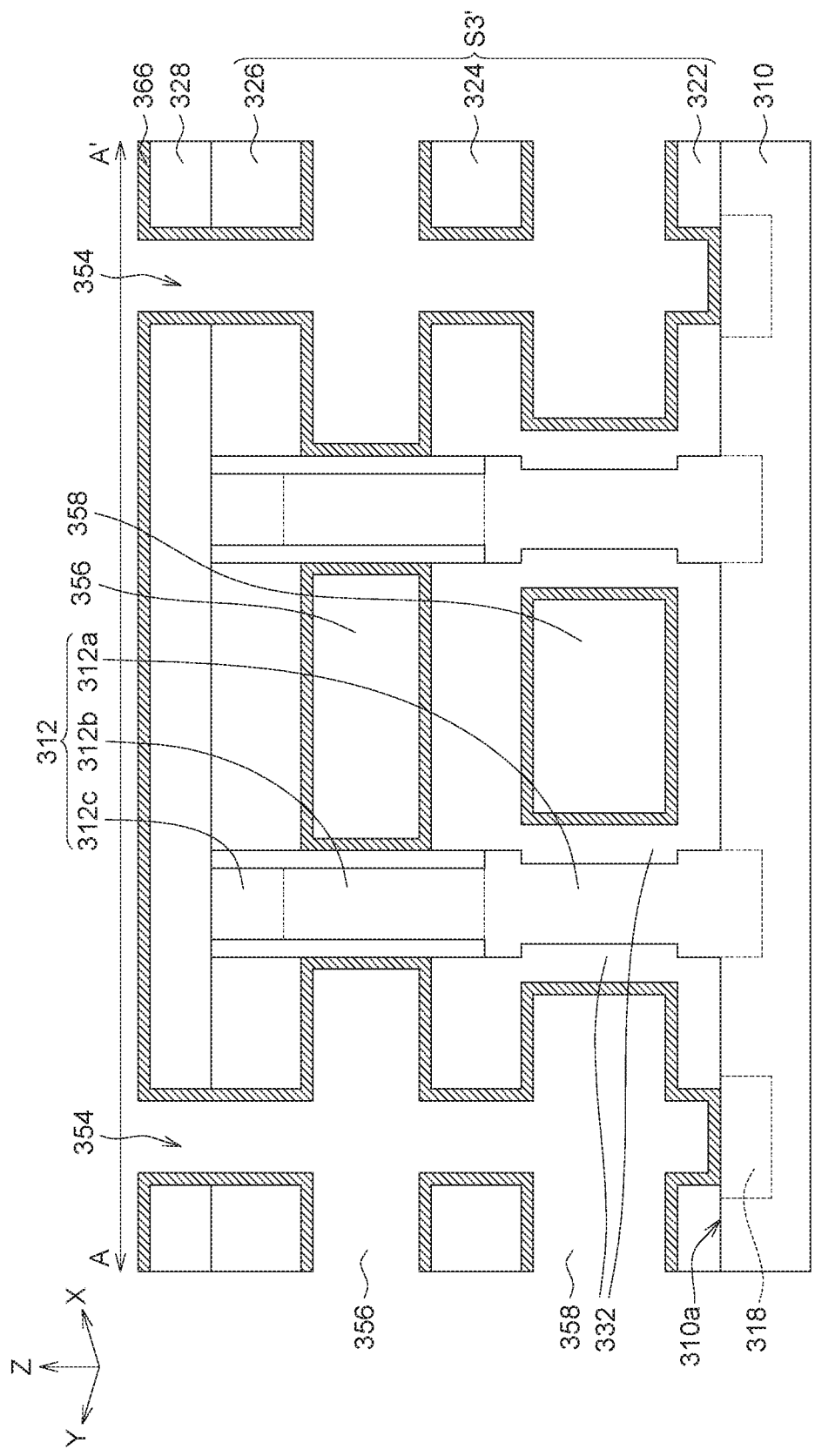

Referring to FIG. 4I, the upper sacrificial layer 340 and the lower sacrificial layer 342 are removed from the second opening 354 by an etching process to form an upper opening 356 and a lower opening 358 at positions where the upper sacrificial layer 340 and the lower sacrificial layer 342 are removed, respectively. The etching process can be an isotropic etching (for example, a wet etching method), and can be a highly selective etching, such as selectively etching silicon nitride without etching the silicon dioxide.

Next, a thermal oxide layer 332 is formed on one side surface of the channel structure 312 exposed from the lower opening 358 by an oxidation process. In some embodiments, the channel structure 312 is an epitaxial growth layer of silicon. The side surface of the channel structure 312 exposed from the lower opening 358 forms a thermal oxide layer 332 including silicon dioxide by an oxidation process and a high temperature.

Thereafter, a dielectric material 366 extending along the sidewalls of the second opening 354, the lower opening 358, and the upper opening 356 and covering the capping layer 328 is formed by a deposition process. In some embodiments, the dielectric material 366 can include a high k material, such as aluminum oxide ($Al_2O_3$) or other suitable material. The dielectric material 66 can also act as a blocking layer to prevent lateral diffusion of charges.

Figure 4J:
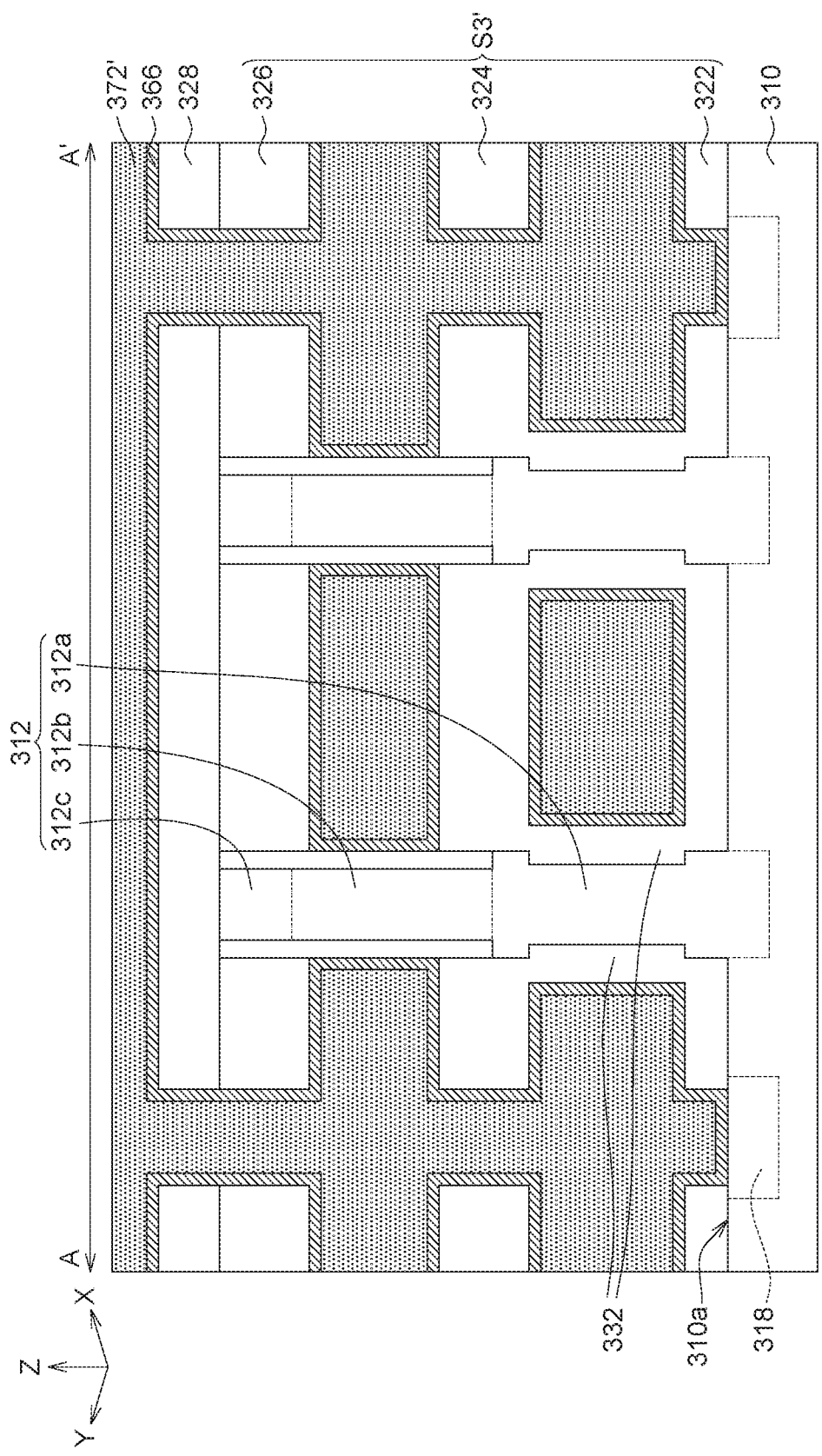

Referring to FIG. 4J, the conductive material 372' is filled in the second opening 354, the lower opening 358, and the upper opening 356 by a deposition process. The conductive material 372' may include tungsten (W), aluminum (Al), titanium nitride (TiN), tantalum nitride (TaN), or other suitable materials.

Figure 4K:
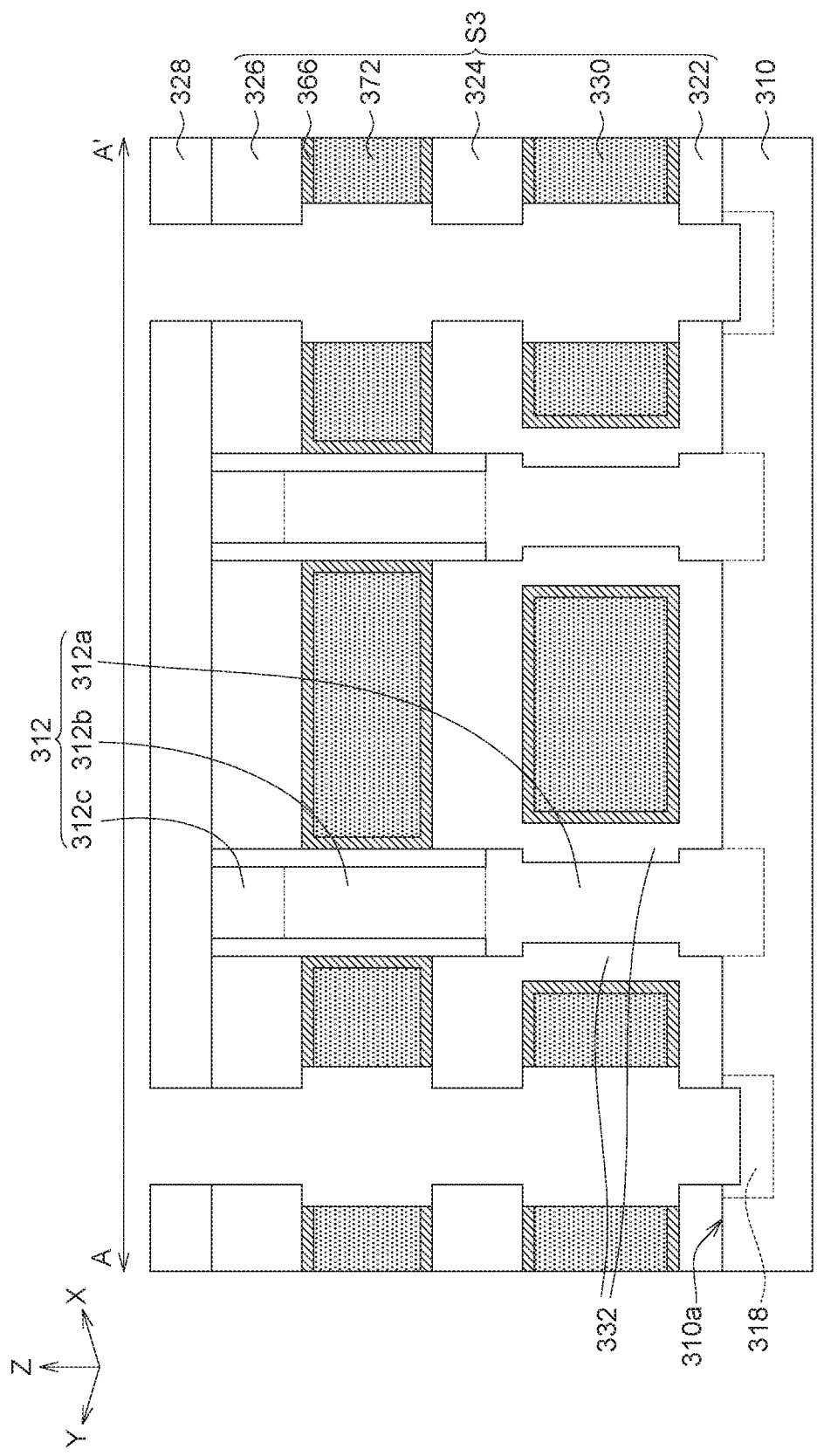

Referring to FIG. 4K, the conductive material 372' disposed in the second opening 354 is removed by an etching process to form a first conductive layer 330 disposed in the lower opening 358 and a second conductive layer 372 disposed in the upper opening 356. This etching process is, for example, a dry etching process. In some embodiments, the etching process can remove a portion of the conductive material 372' in the upper opening 356 and the lower opening 358. The first conductive layer 330 and the second conductive layer 372 may respectively include tungsten (W), aluminum (Al), titanium nitride (TiN), tantalum nitride (TaN), or other suitable conductive material. In the present embodiment, the first conductive layer 330 and the second conductive layer 372 may include a same conductive material, such as tungsten (W). Thereby, a stacked structure S3 including the first insulating layer 322, the first conductive layer 330, the second insulating layer 324, the second conductive layer 372, and the third insulating layer 326 is formed.

Figure 4L:
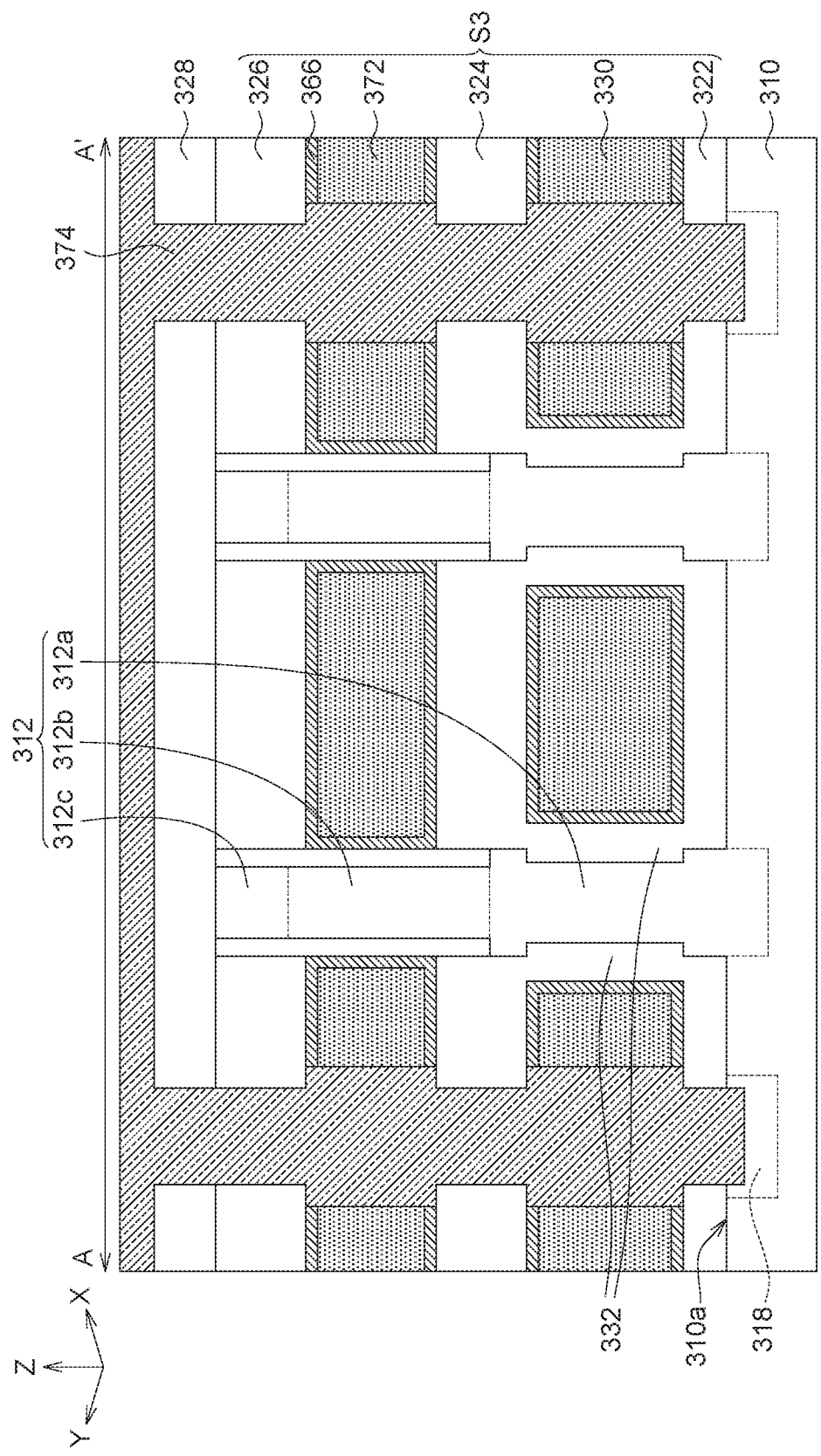

Referring to FIG. 4L, an insulating material is filled in the second opening 354 by a deposition process to form a plurality of isolation structures 374. The isolation structure 374 can include an oxide or other suitable insulating material.

Thereafter, referring back to FIG. 1D, a plurality of vertical openings extending through the isolation structure 374 and extending along the normal direction of the upper surface 310a of the substrate 310 are formed, and then a conductive material is filled in the vertical openings by a deposition process to form a plurality of conductive connection structures 376. The conductive connection structures 376 can include tungsten (W), aluminum (Al), titanium nitride (TiN), or other suitable electrically conductive material. As a result, the memory device 300 as shown in FIG. 1D is formed.

Figure 5:
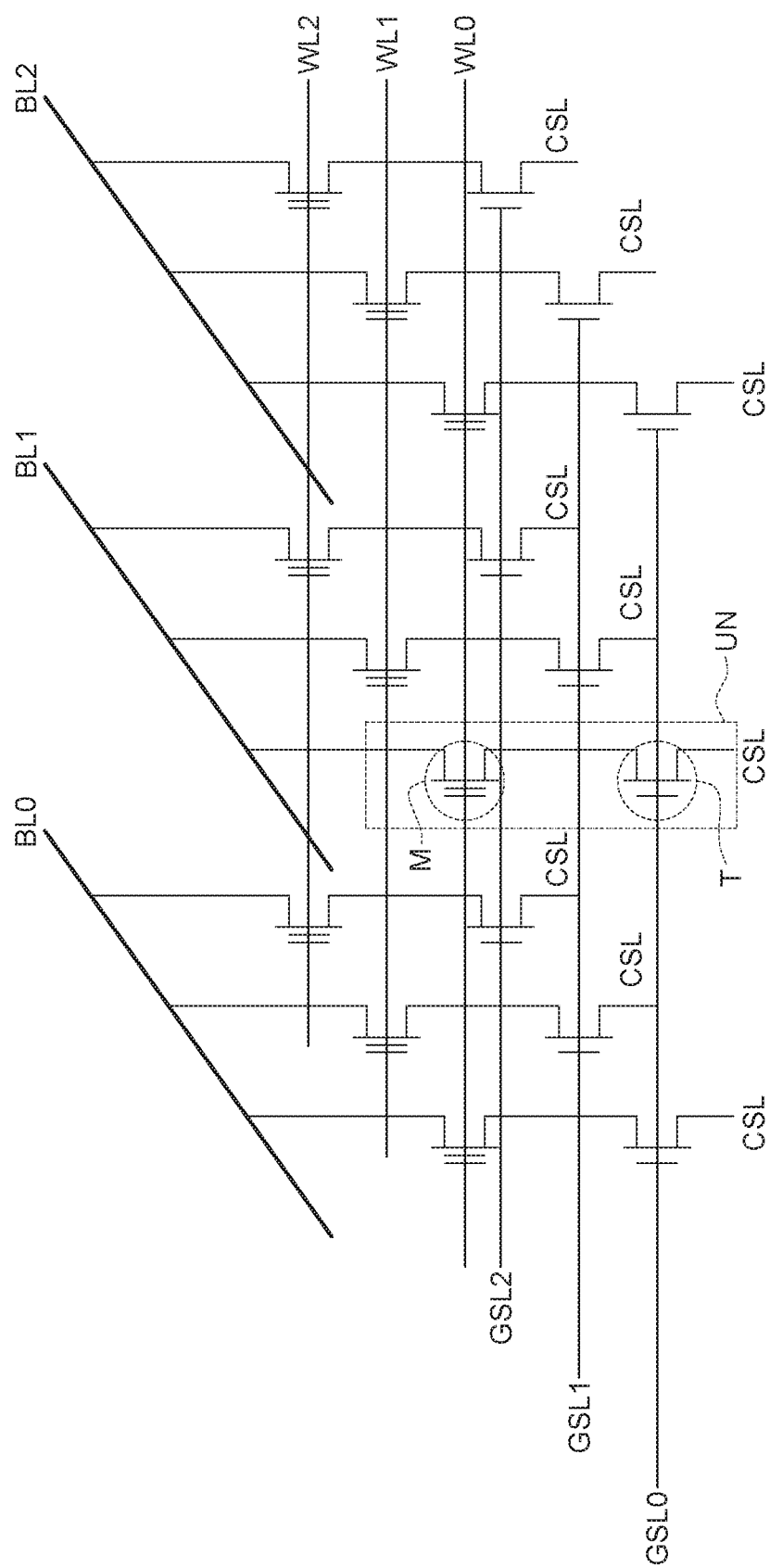
FIG. 5 is an equivalent circuit diagram illustrating a memory device in accordance with one embodiment of the present invention.

FIG. 5 is an equivalent circuit diagram illustrating a memory device 100, 200 or 300 in accordance with one embodiment of the present invention.

The memory device 100, 200 or 300 can be a three-dimensional NOR type memory device. Three word lines WL0, WL1, WL2, three bit lines BL0, BL1, BL2 and three ground selection lines GSL0, GSL1, GSL2 are exemplarily shown in the array area of the memory device 100, 200 or 300. However, the present invention is not limited thereto, and the number of word lines, bit lines, and ground selection lines may be greater than three, respectively. Each of intersections of word lines and the channel structures form a memory cell M, and each of the intersections of the ground selection lines and the channel structures form a transistor T. The memory cell M is disposed above the transistor T, and the memory cell M and the transistor T are connected by the channel structure in series. A memory cell M and a transistor T can together form a unit cell UN. Each of the transistors T is electrically connected to a common source line CSL. The word lines (eg, WL0, WL1, WL2) can be electrically isolated by isolation structures.

Figure 6A:
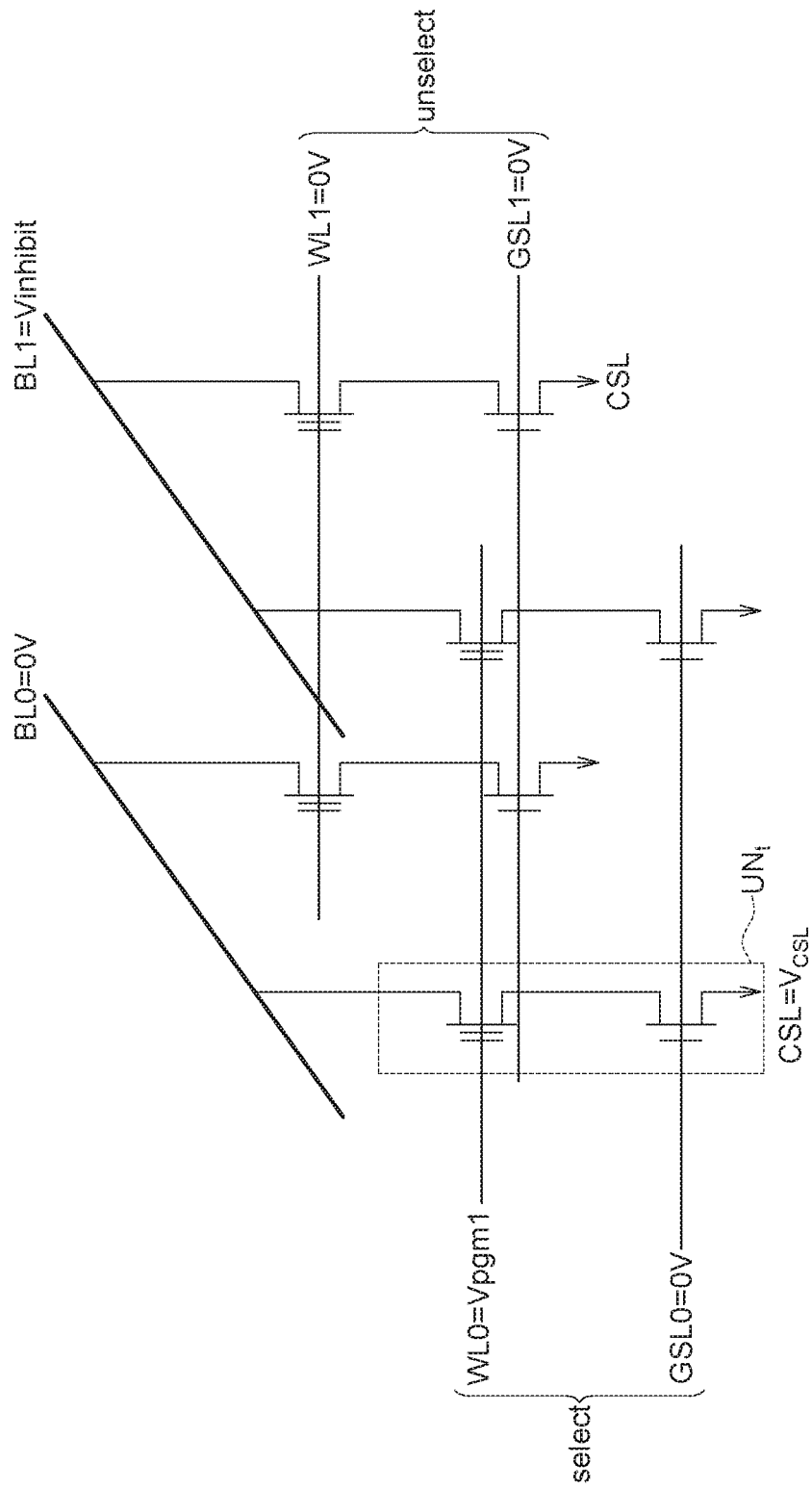
FIG. 6A is an equivalent circuit diagram illustrating a programming operation performed to a memory device by Fowler-Nordheim injection in accordance with one embodiment of the present invention.

FIG. 6A is an equivalent circuit diagram illustrating a programming operation performed to a memory device by Fowler-Nordheim (FN) injection in accordance with one embodiment of the present invention.

Referring to FIG. 6A, in order to program the target unit memory cell $UN_t$, the word line WL0 and the ground selection line GSL0 are selected, and a program voltage Vpgm1 is applied to the word line WL0. The word line WL1 and the ground selection line GSL1 are unselected, and 0 voltage (V) is applied to the word line WL1 and the ground selection line GSL1. 0 V is applied to the ground selection line GSL0. A common source voltage $V_{CSL}$ is applied to the common source line. 0V is applied to the bit line BL0. An inhibition voltage $V_{inhibit}$ is applied to the bit line BL1. The unit cell coupled to the bit line BL1 is inhibited.

Figure 6B:
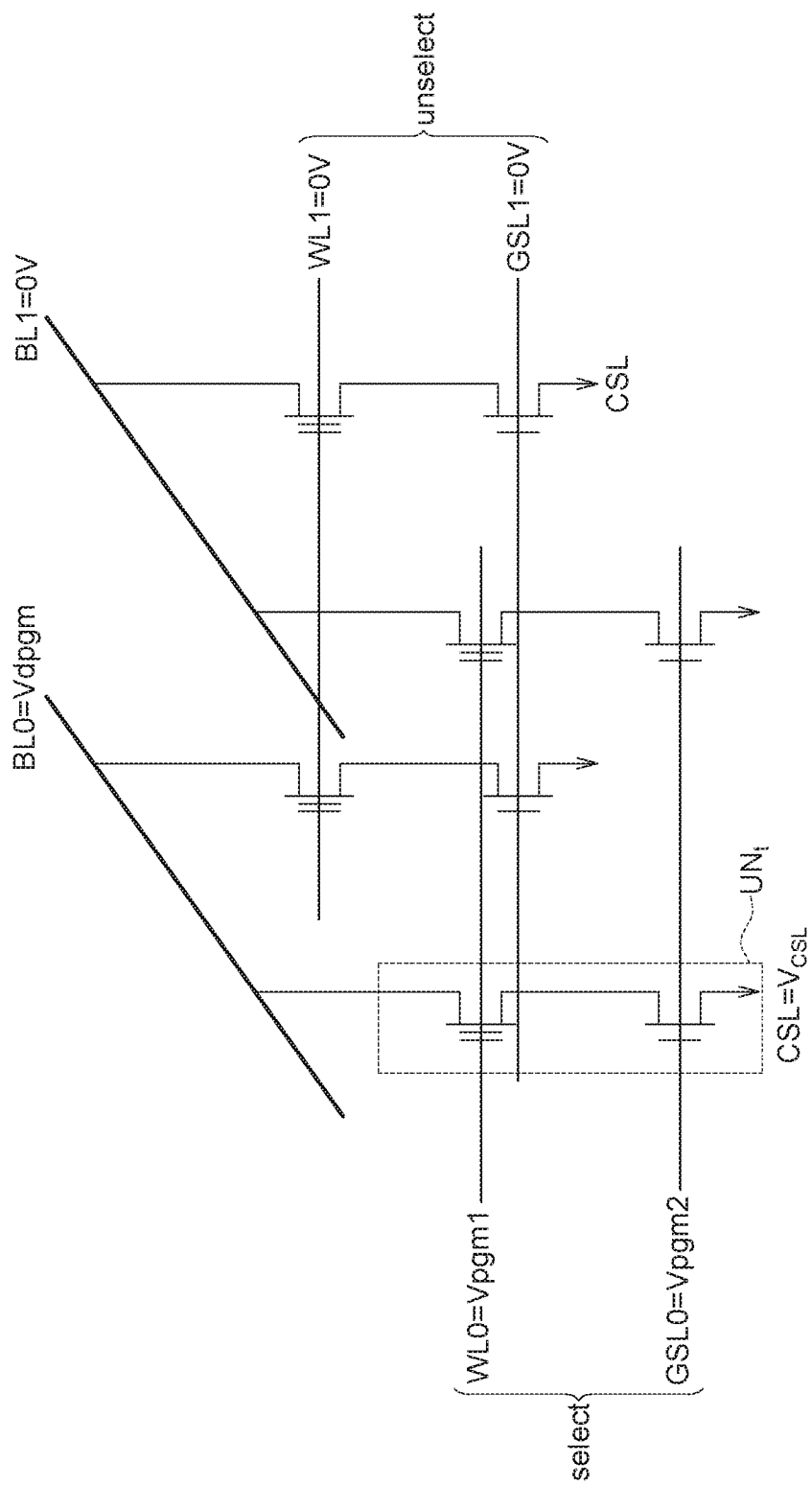
FIG. 6B is an equivalent circuit diagram illustrating a programming operation performed to a memory device by channel-hot-electron injection in accordance with one embodiment of the present invention.

FIG. 6B is an equivalent circuit diagram illustrating a programming operation performed to a memory device by channel-hot-electron injection in accordance with one embodiment of the present invention.

Referring to FIG. 6B, in order to program the target unit memory cell $UN_t$, the word line WL0 and the ground selection line GSL0 are selected. A program voltage Vpgm1 is applied to the word line WL0. A program voltage Vpgm2 is applied to the ground selection line GSL0. The word line WL1 and the ground selection line GSL1 are unselected, and 0 volt (V) is applied. 0 V is applied to the common source line CSL. A drain programming voltage Vdpgm is applied to the bit line BL0. 0 V is applied to the bit line BL1. The programming voltage Vpgm2 can be less than the programming voltage Vpgm1. In some embodiments, the programming voltage Vpgm1 can be 5-10 V. The drain programming voltage Vdpgm can be 4-10 V.

Figure 7A:
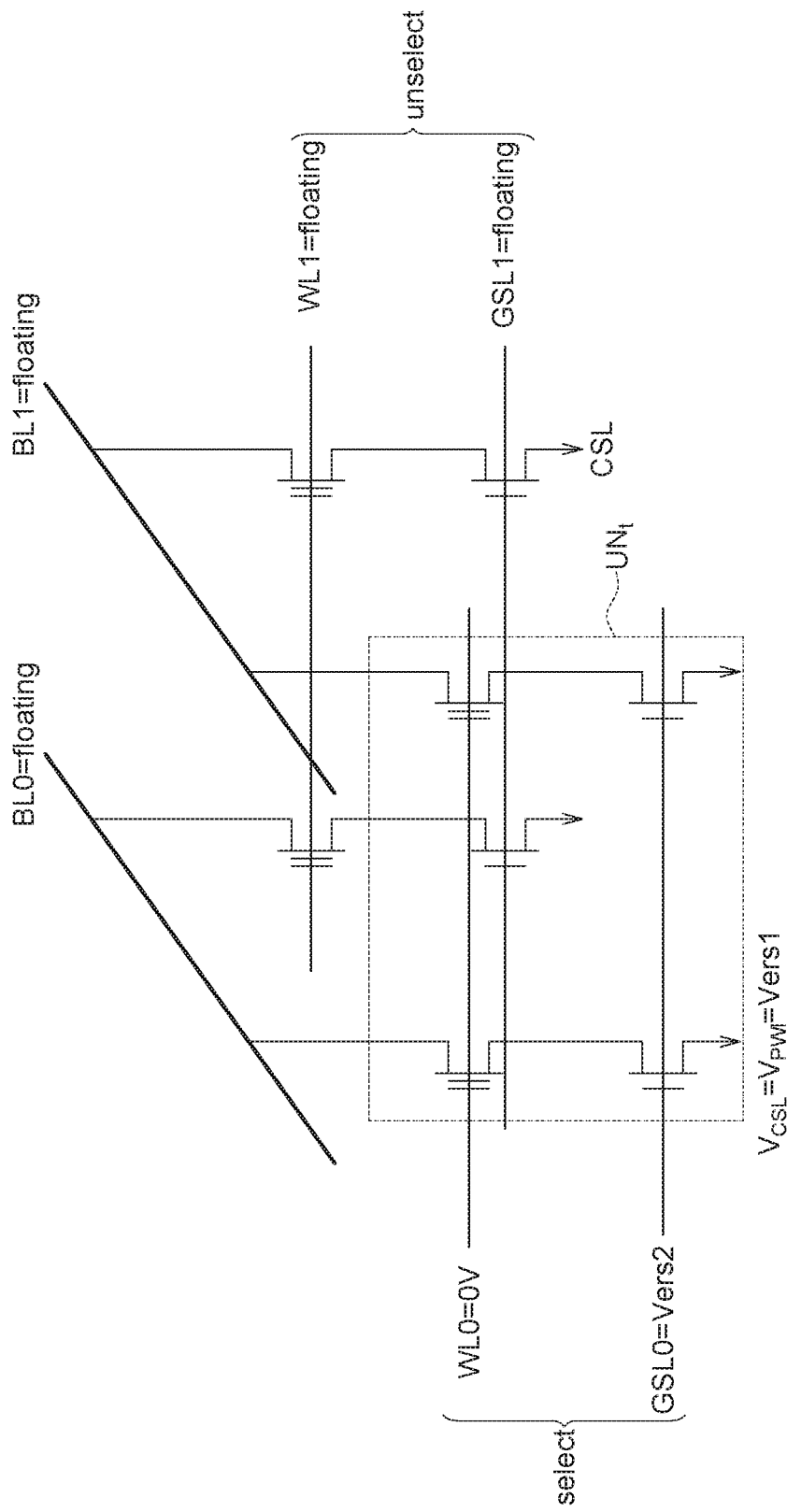
FIG. 7A is an equivalent circuit diagram illustrating an erase operation performed to a memory device by Fowler-Nordheim injection in accordance with one embodiment of the present invention.

FIG. 7A is an equivalent circuit diagram illustrating an erase operation performed to a memory device by Fowler-Nordheim (FN) injection in accordance with one embodiment of the present invention.

Referring to FIG. 7A, in order to erase the target unit memory cell $UN_t$ (for example, including 2 memory cells and 2 transistors), the word line WL0 and the ground selection line GSL0 are selected. 0 V is applied to the word line WL0. An erase voltage Vers2 is applied to the ground selection line GSL0. The word line WL1 and the ground selection line GSL1 are unselected, both of which are floating (that is, no voltage is applied). A common source voltage $V_{CSL}$ is applied to the common source line. A P-well voltage $V_{PWT}$ is applied to the P-well. An erase voltage Vers1 is applied to the peripheral circuit. The bit lines BL0 and BL1 are floating. The common source voltage $V_{CSL}$ can be the same as the erase voltage Vers1 and the P-type well voltage $V_{PWT}$.

Figure 7B:
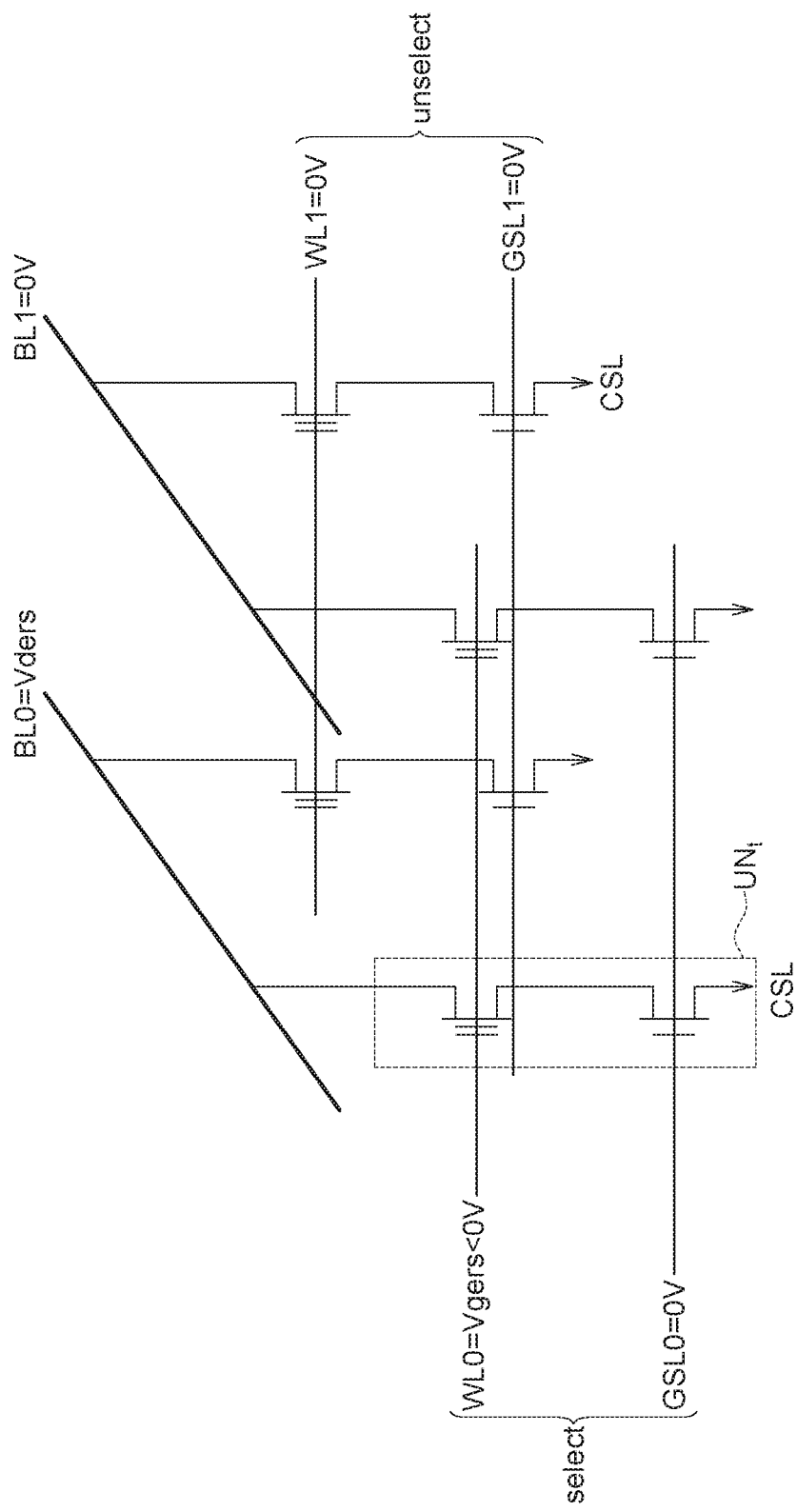
FIG. 7B is an equivalent circuit diagram illustrating an erase operation performed to a memory device by a band-to-band tunneling induced hot hole injection in accordance with one embodiment of the present invention.

FIG. 7B is an equivalent circuit diagram illustrating an erase operation performed to a memory device by a band-to-band tunneling induced hot hole injection in accordance with one embodiment of the present invention.

Referring to FIG. 7B, in order to erase the target unit memory cell $UN_t$, the word line WL0 and the ground selection line GSL0 are selected. 0 V is applied to the ground selection line GSL0. A ground erase voltage Vgers is applied to the word line WL0. The ground erase voltage Vgers can be less than zero. The word line WL1 and the ground selection line GSL1 are unselected, and 0 volt is applied to both of them. A drain erase voltage Vders can be applied to the bit line BL0. The drain erase voltage Vders can be greater than zero. 0 V can be applied to the bit line BL1. A common source voltage $V_{CSL}$ can be applied to the common source line. Add FN ERS with BL bias (ERS/inhibit) (+Vders for ERS, 0V for not inhibiting) for bit-alternative ERS operation (all GSLs (e.g. GSL0, GSL1 . . . )=0V, CSL=+Vcsl).

Figure 8:
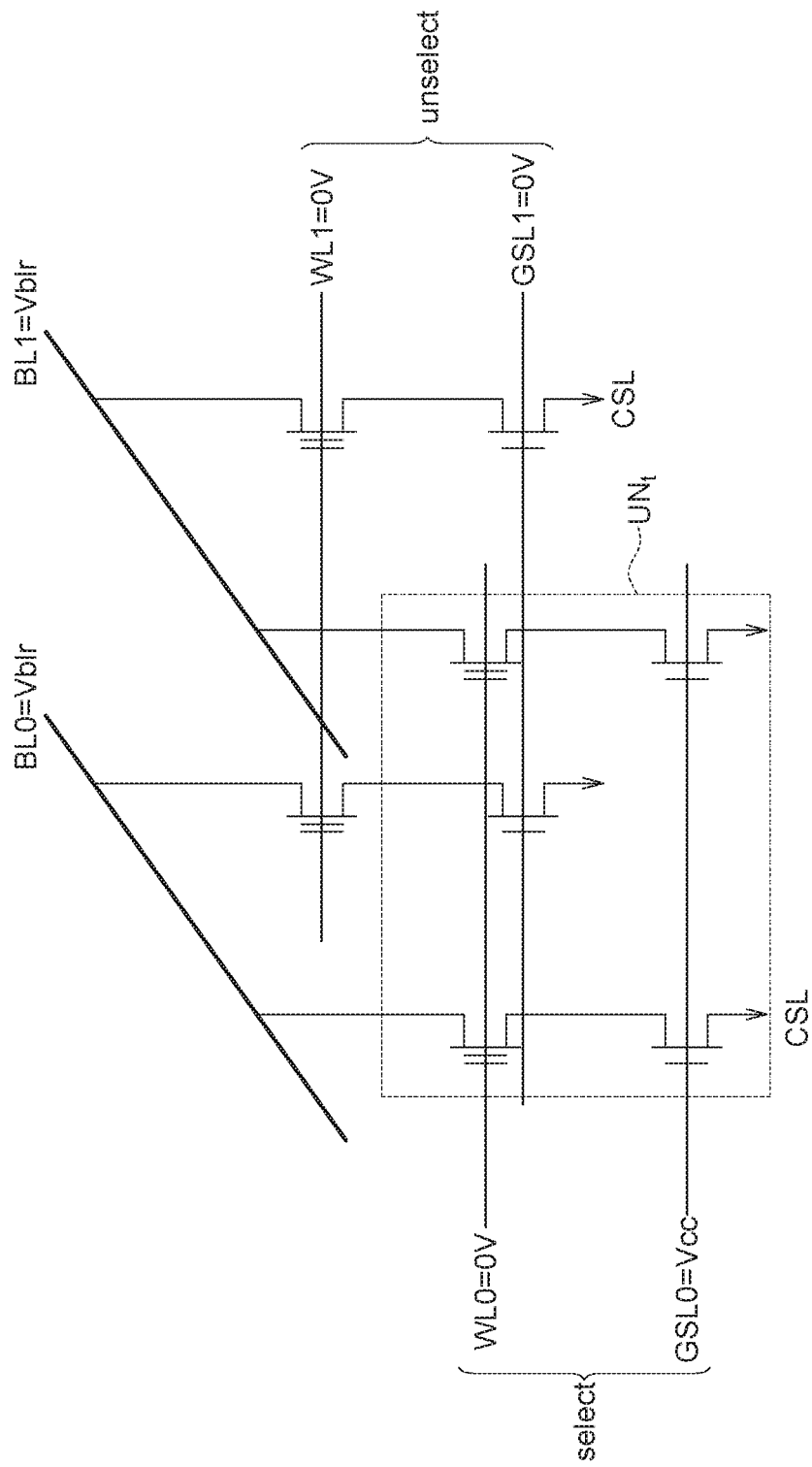
FIG. 8 is an equivalent circuit diagram illustrating a read operation performed to a memory device in accordance with one embodiment of the present invention.

FIG. 8 is an equivalent circuit diagram illustrating a read operation performed to a memory device in accordance with one embodiment of the present invention.

Referring to FIG. 8, in order to read the target unit memory cell $UN_t$ (for example, including 2 memory cells and 2 transistors), the word line WL0 and the ground selection line GSL0 are selected. 0 V can be applied to the word line WL0. The power supply voltage $V_{CC}$ can be applied to the ground selection line GSL0. The word line WL1 and the ground selection line GSL1 are unselected, and 0 V is applied to both of them. A bit line read voltage Vblr can be applied to the bit lines BL0 and BL1. A common source voltage $V_{CSL}$ is applied to the common source line. When the read operation is performed in the memory device of the present invention, all voltages applied to the bit line, the word line, and the ground selection line can be equal to or smaller than the power supply voltage $V_{CC}$, so that power consumption can be reduced.

Figure 9A:
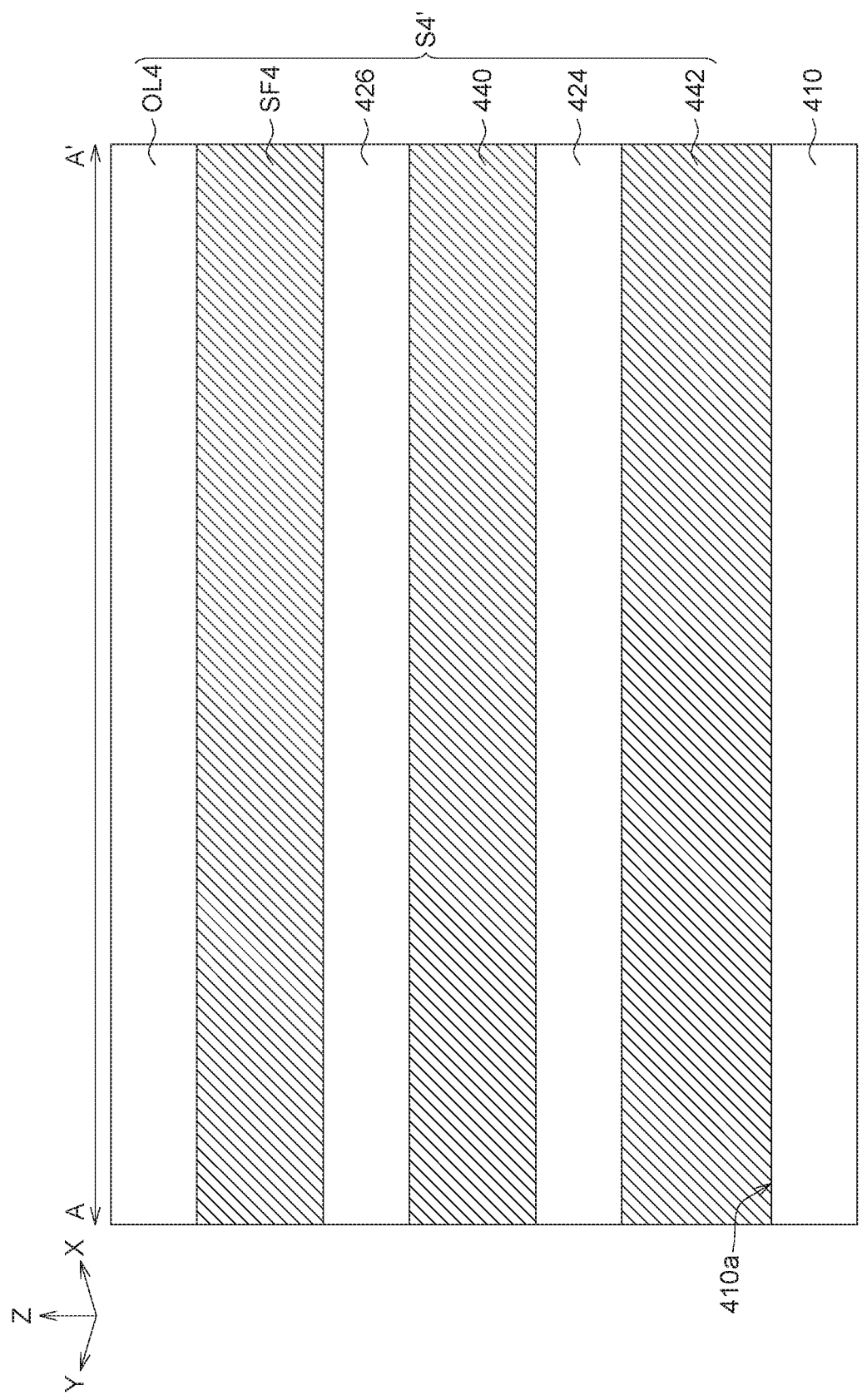
FIGS. 9A to 9R are cross-sectional views illustrating a method for fabricating a memory device in accordance with one further embodiment of the present invention.
Figure 9B:
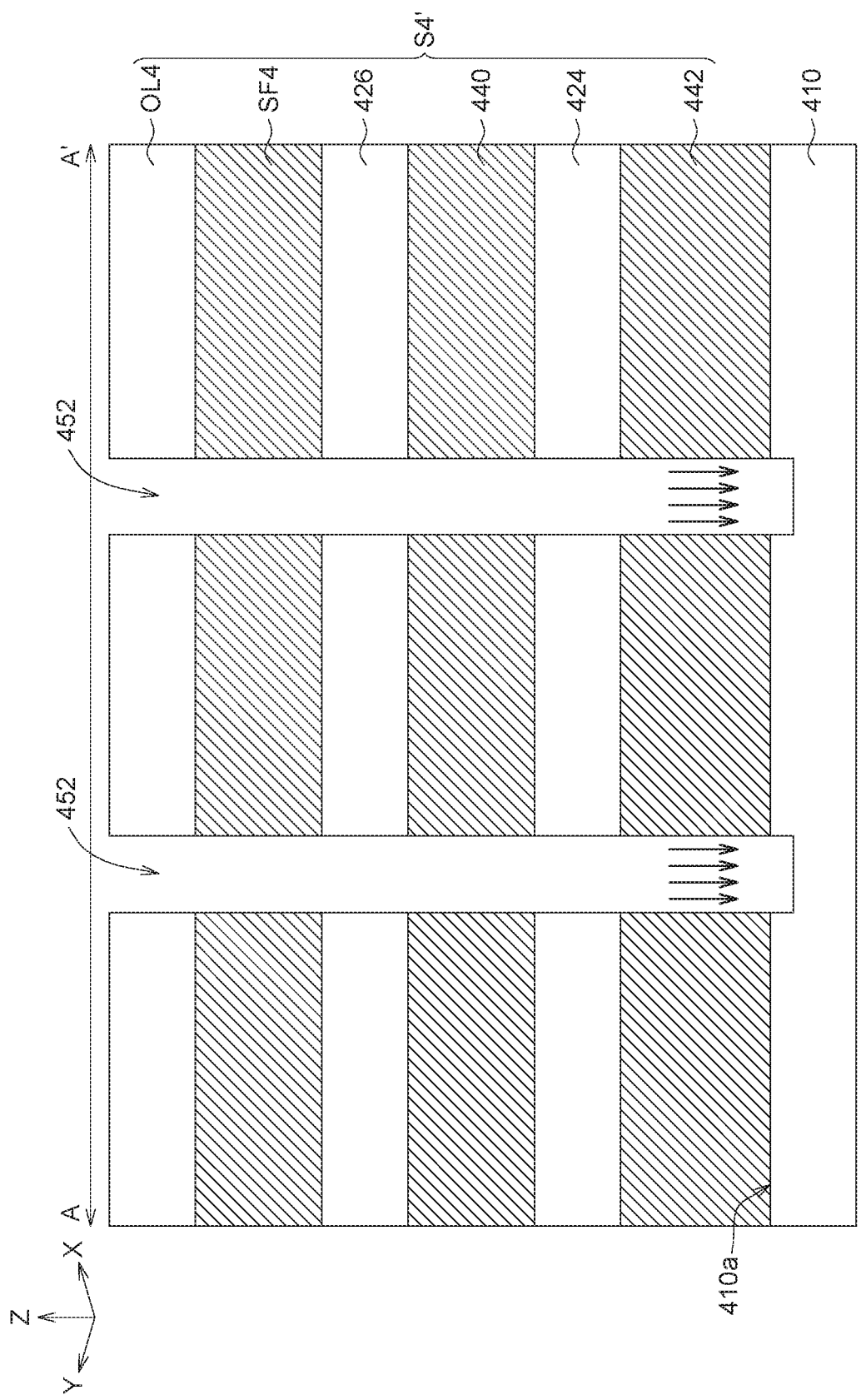
Figure 9C:
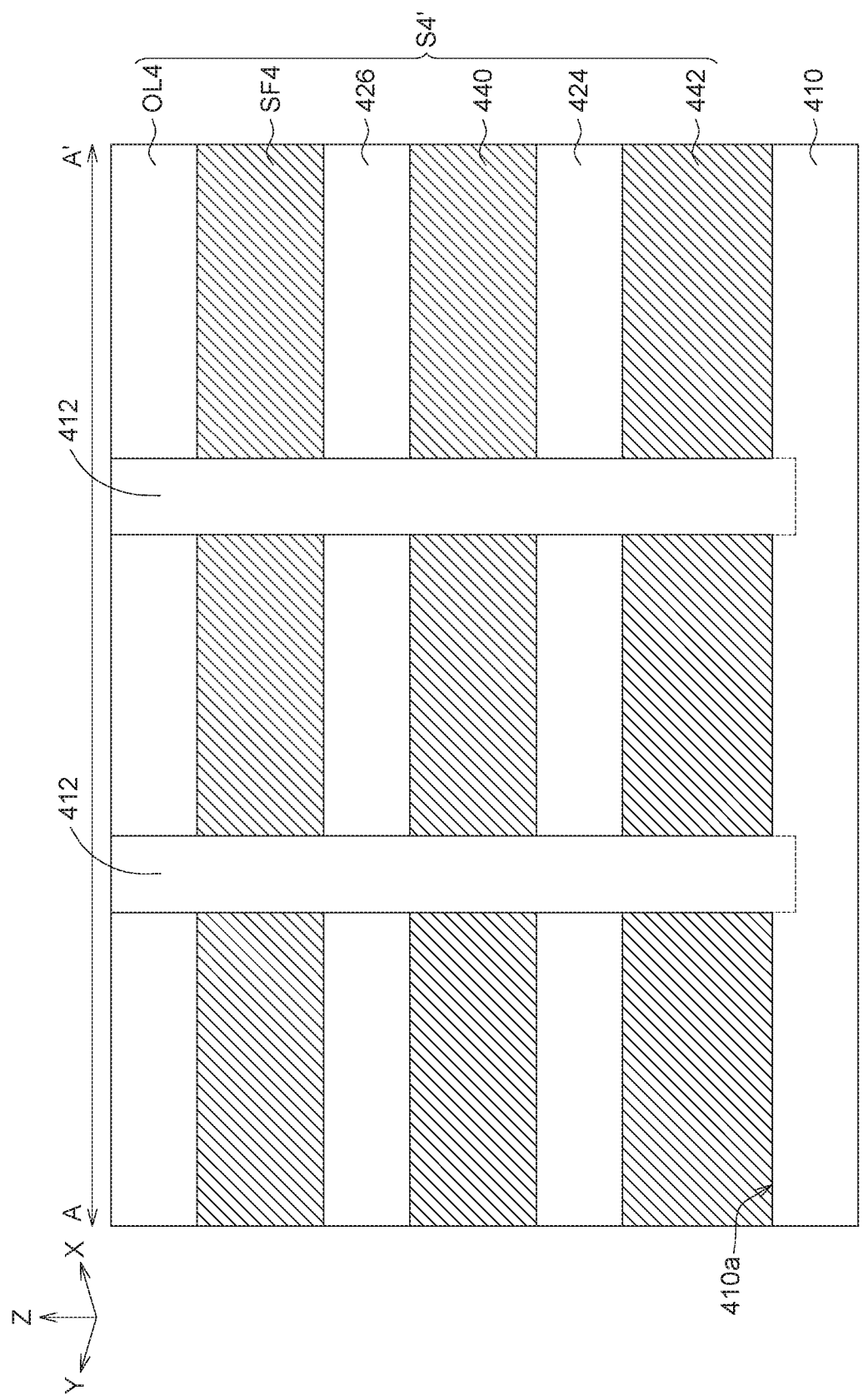
Figure 9D:
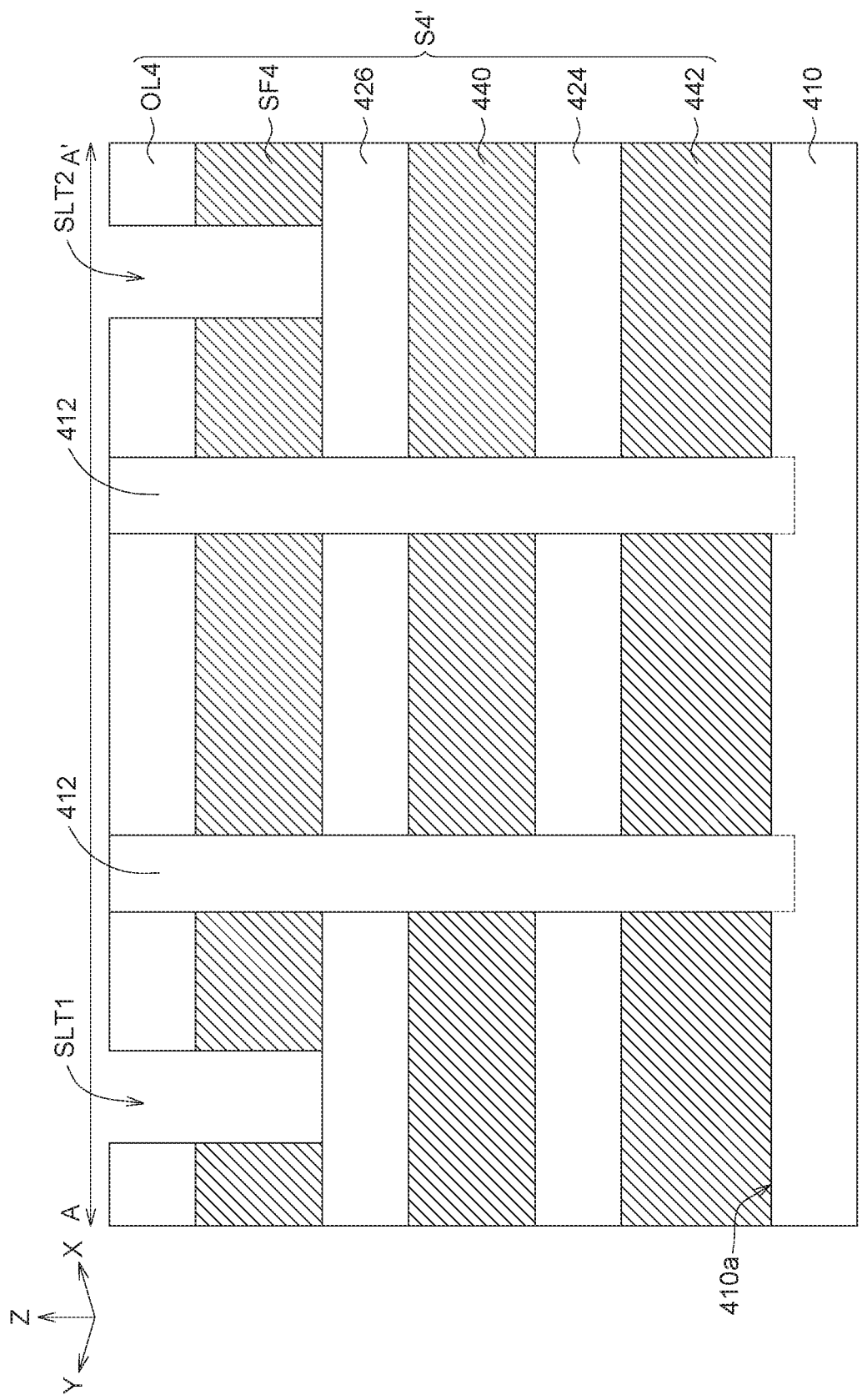
Figure 9E:
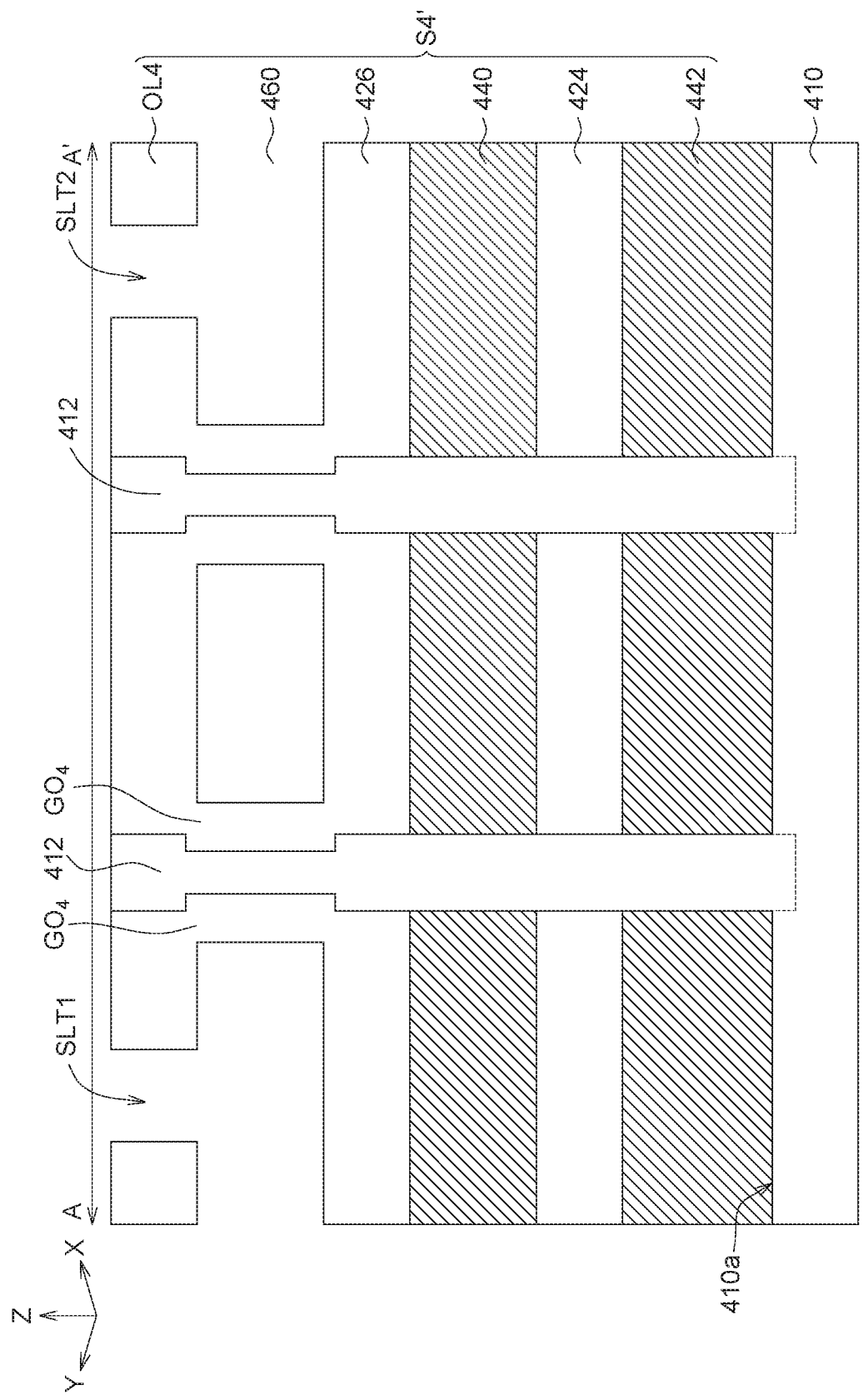
Figure 9F:
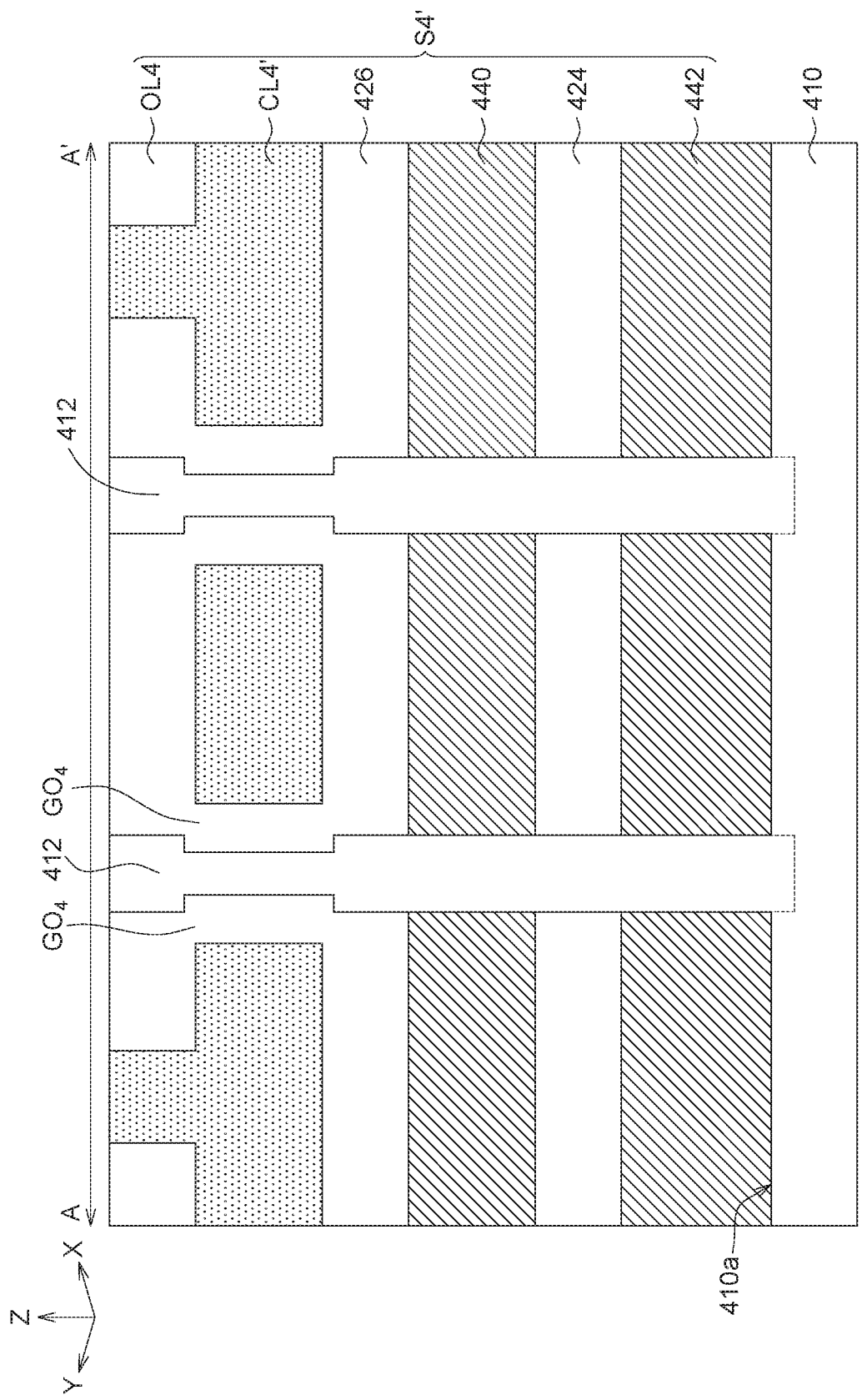
Figure 9G:
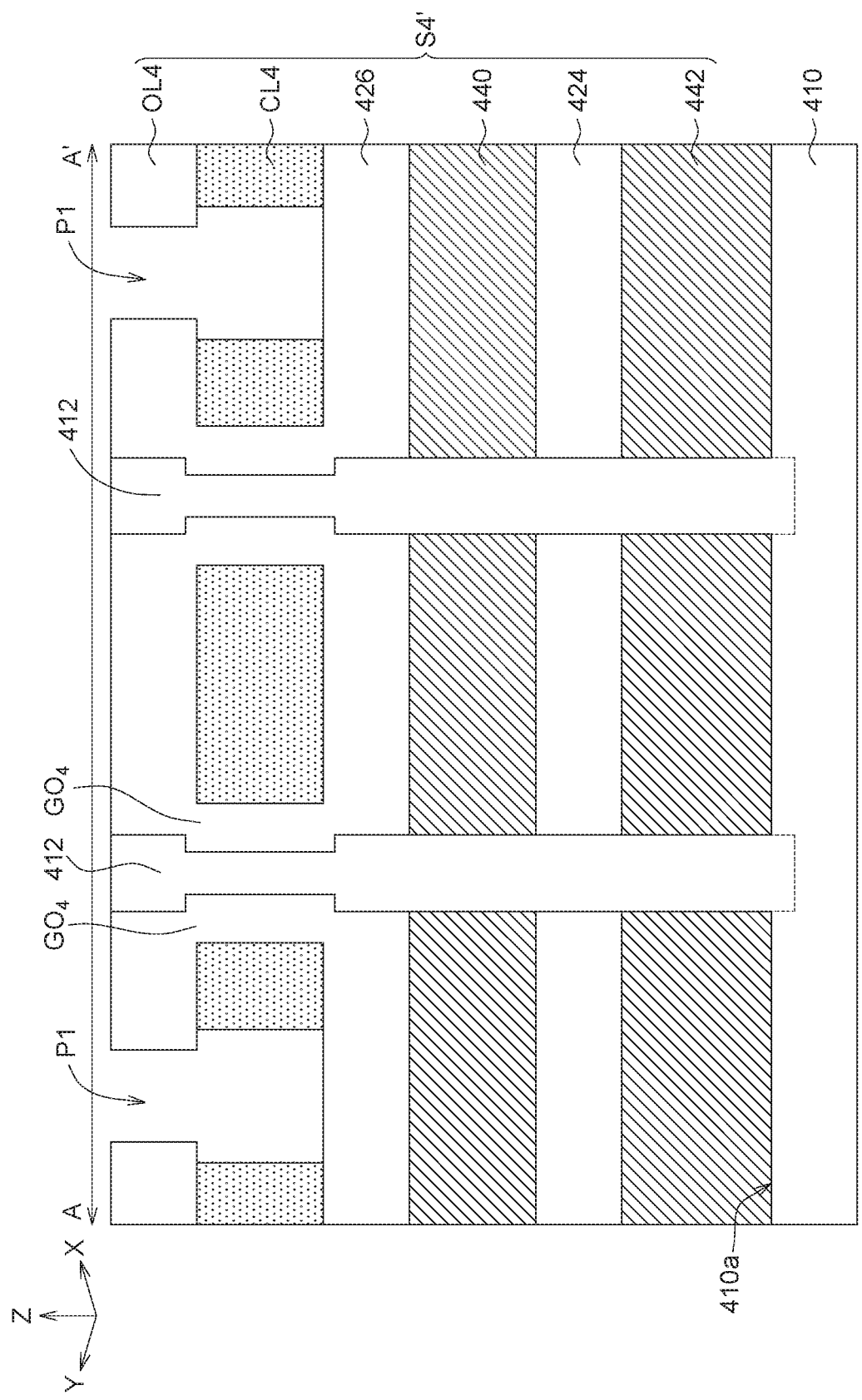
Figure 9H:
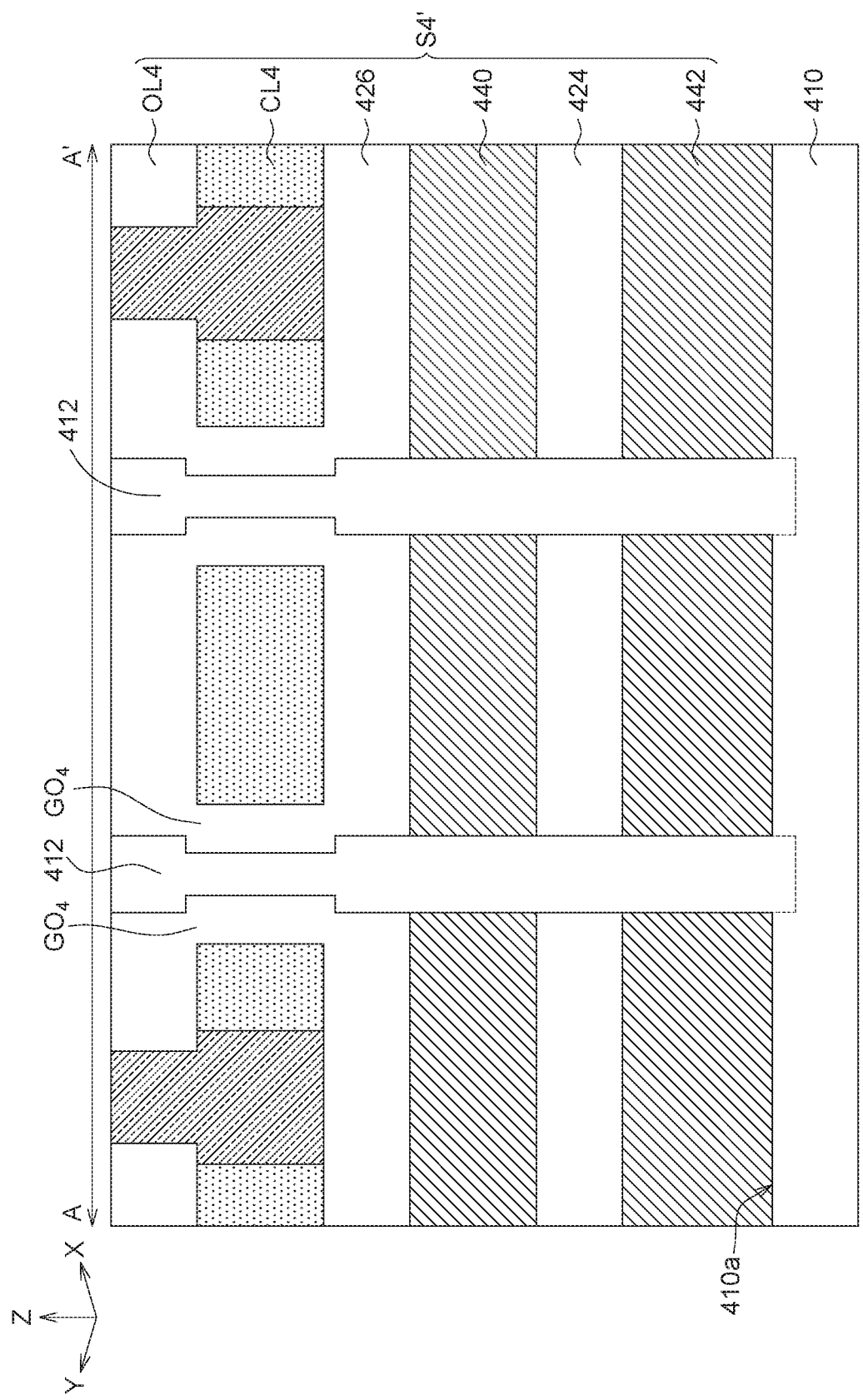
Figure 9I:
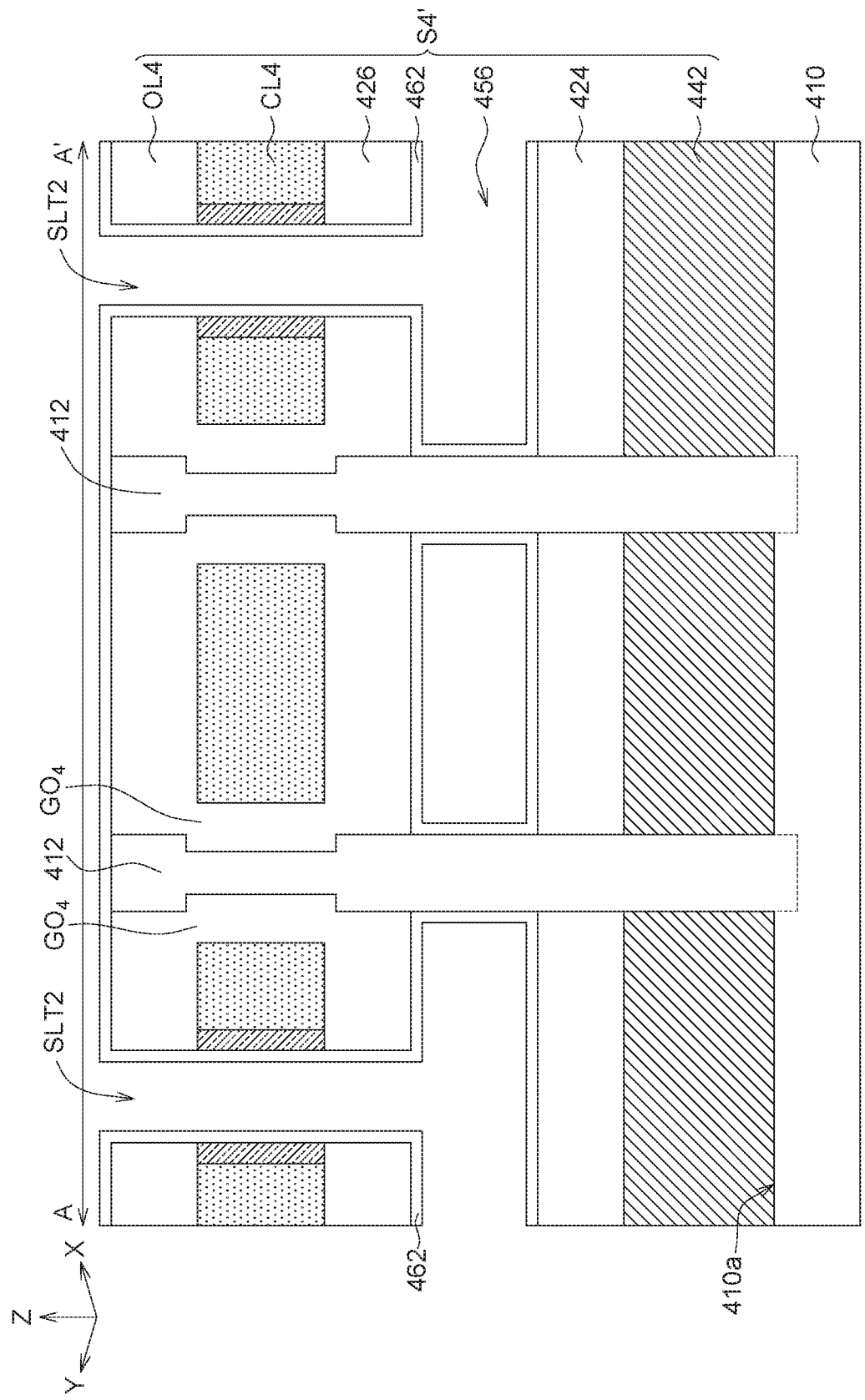
Figure 9J:
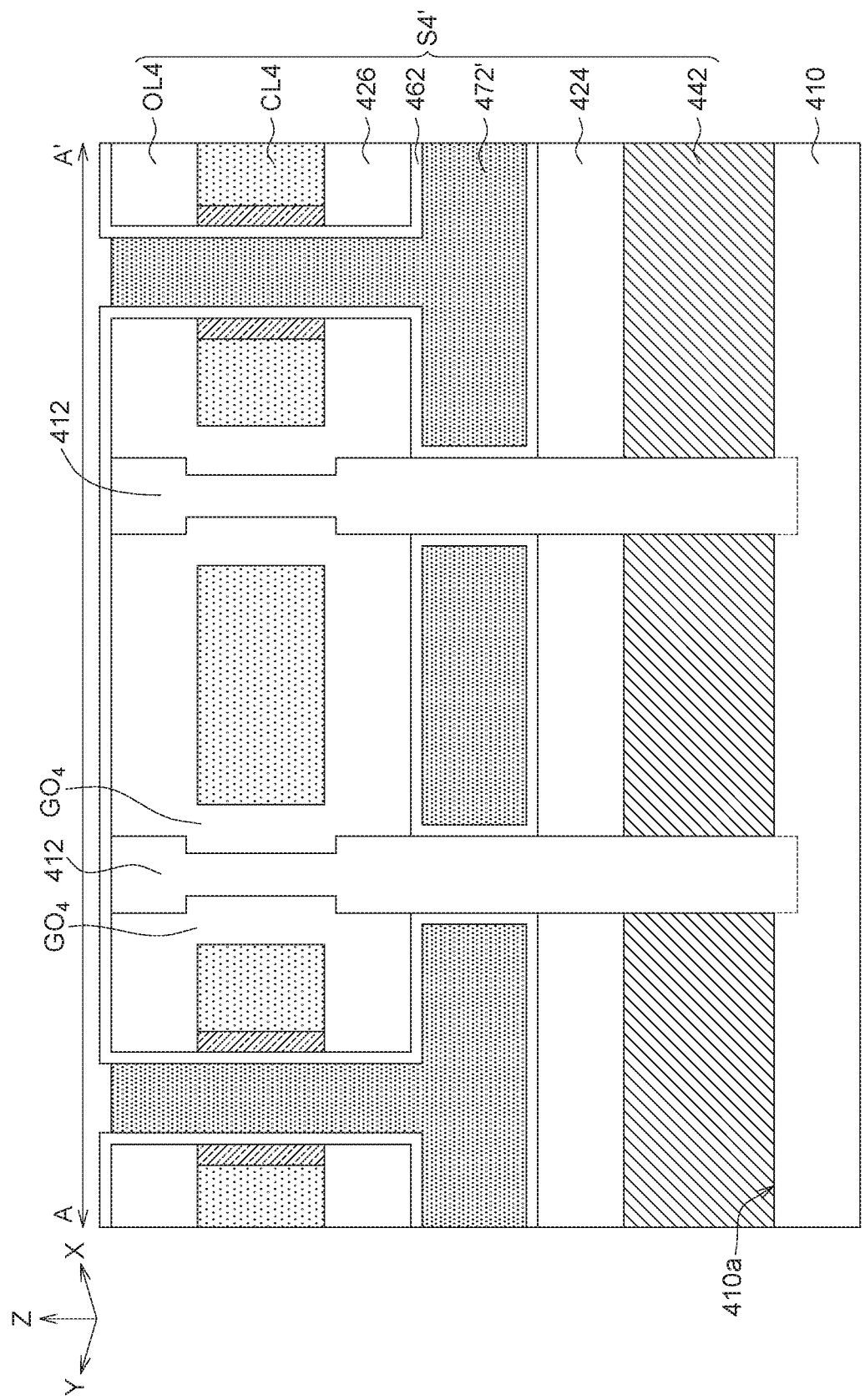
Figure 9K:
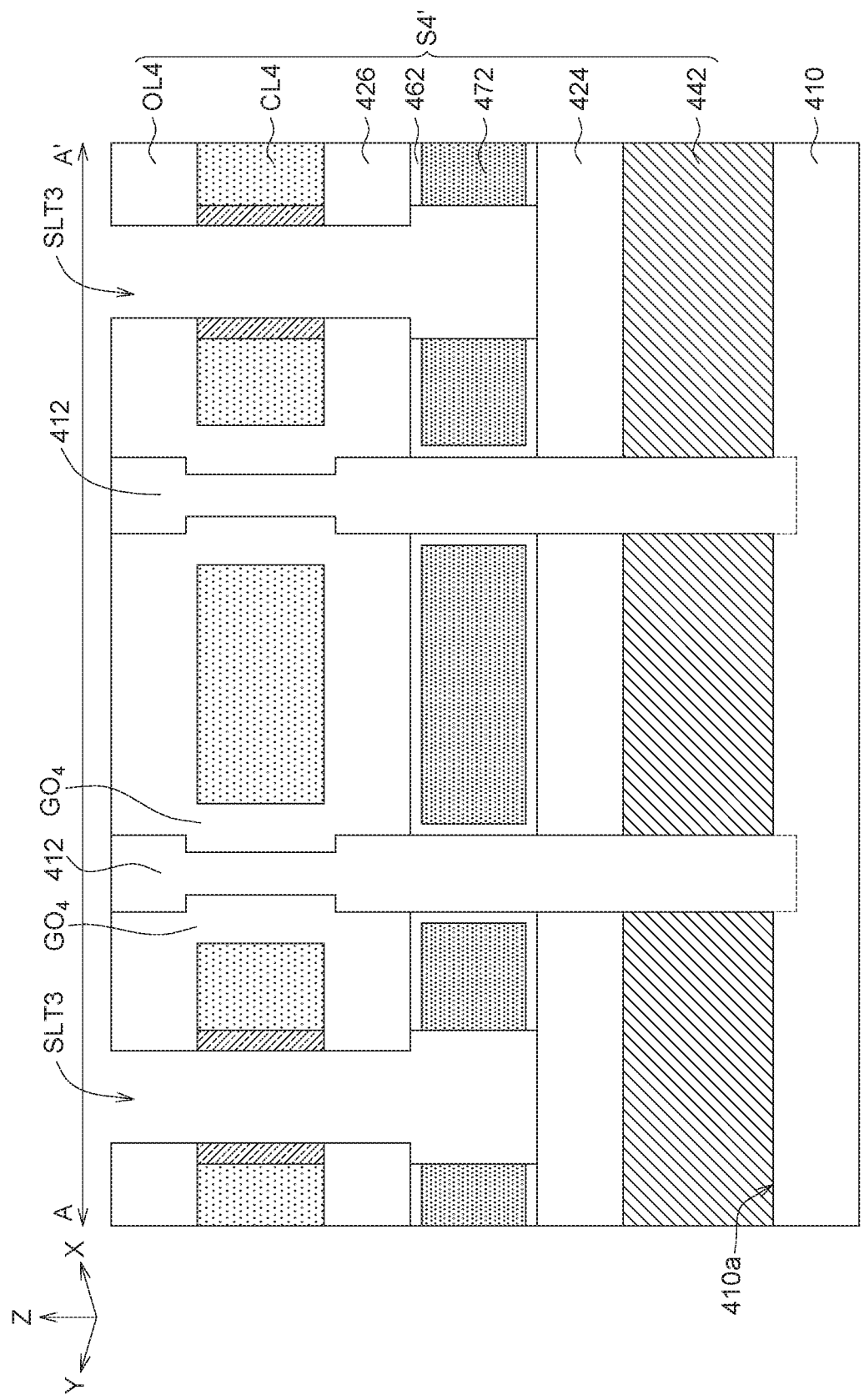
Figure 9L:
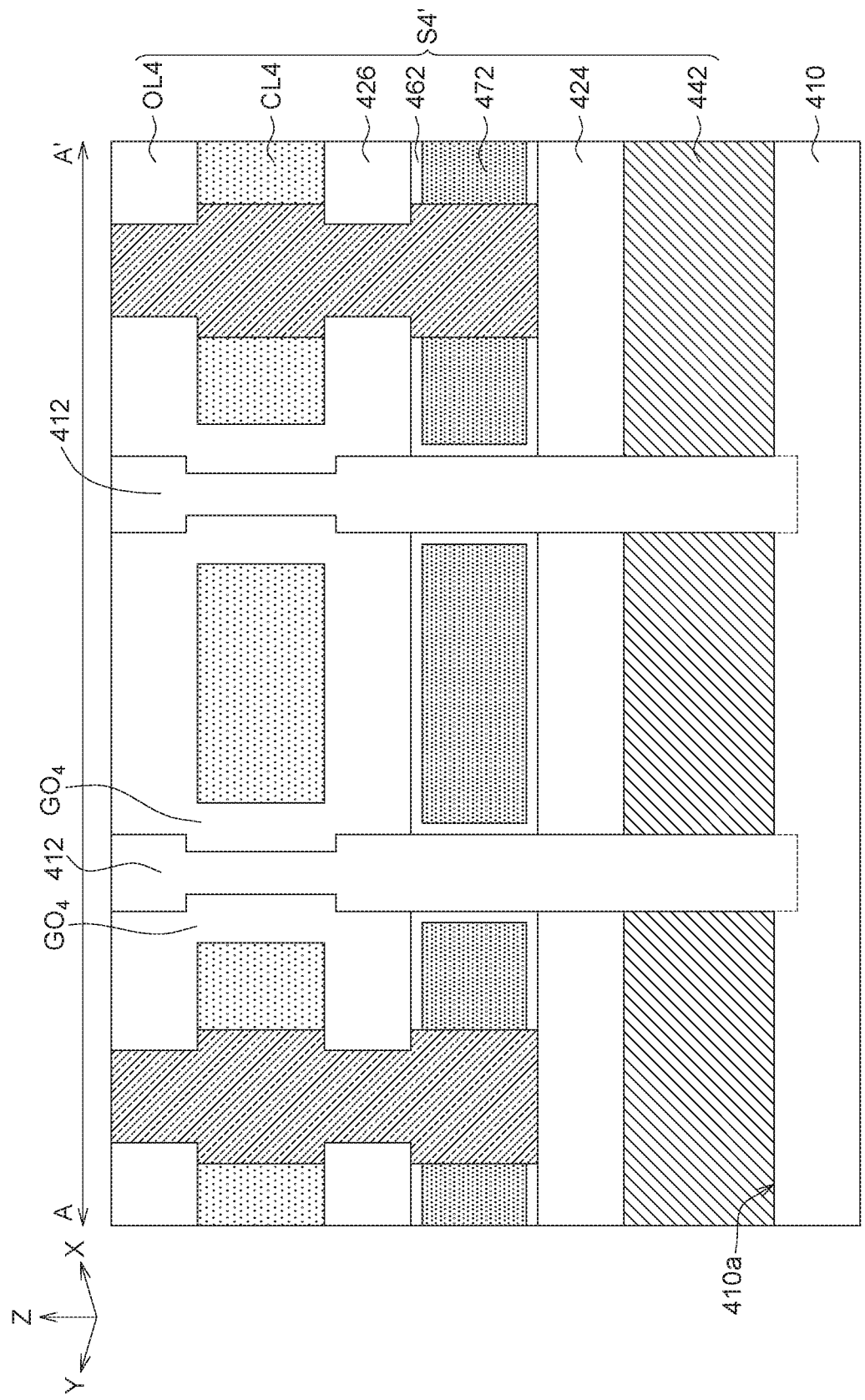
Figure 9M:
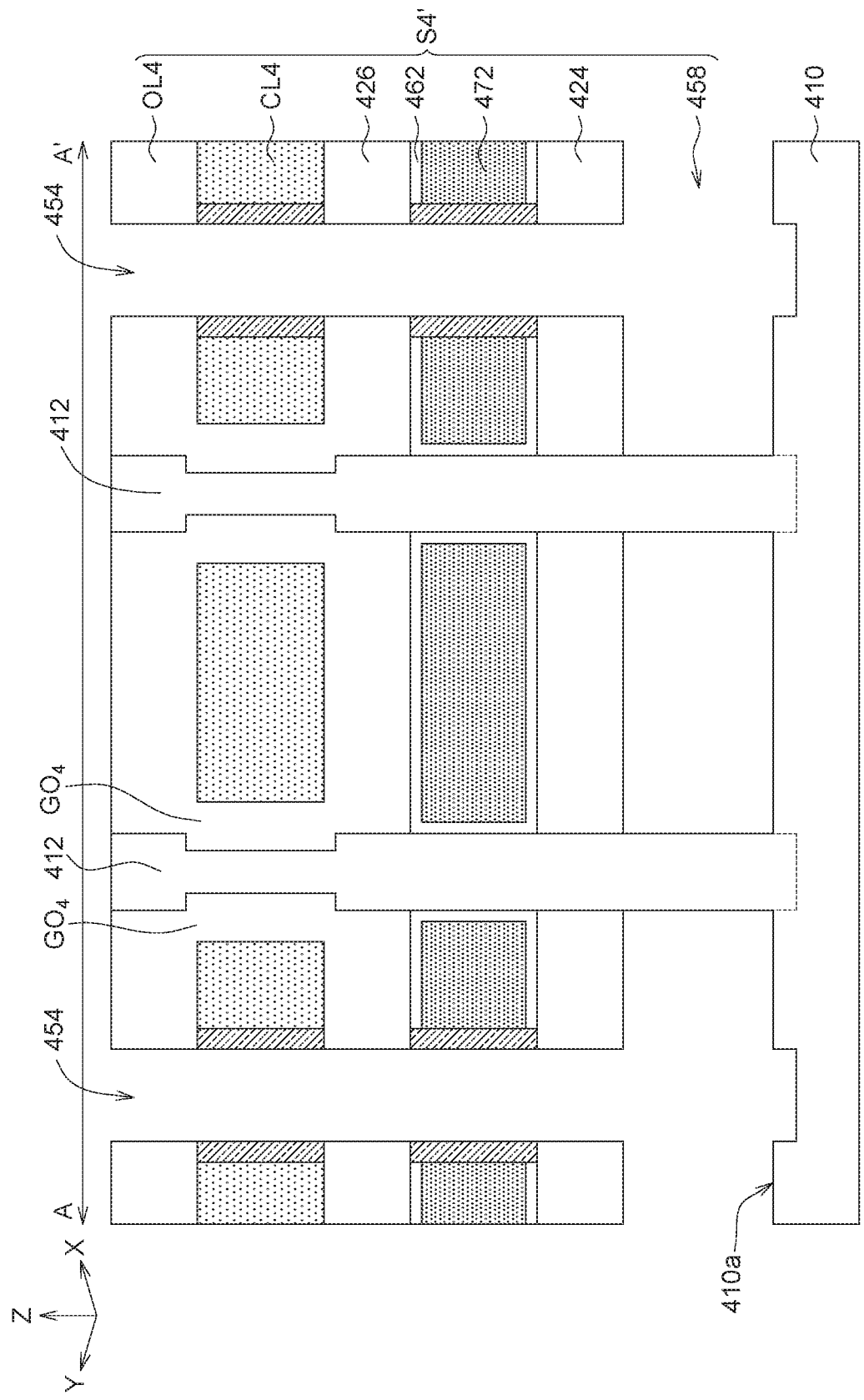
Figure 9N:
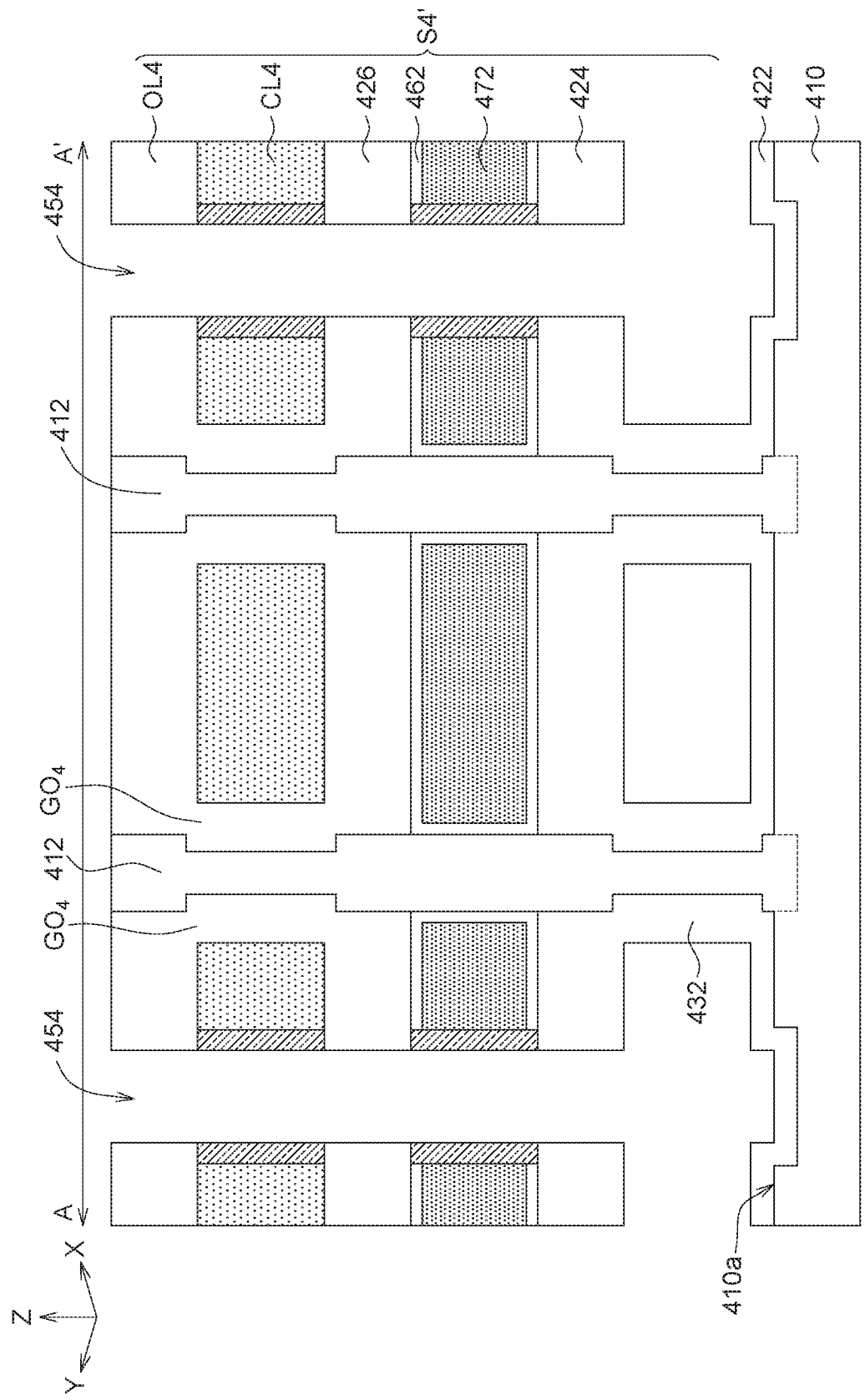
Figure 9O:
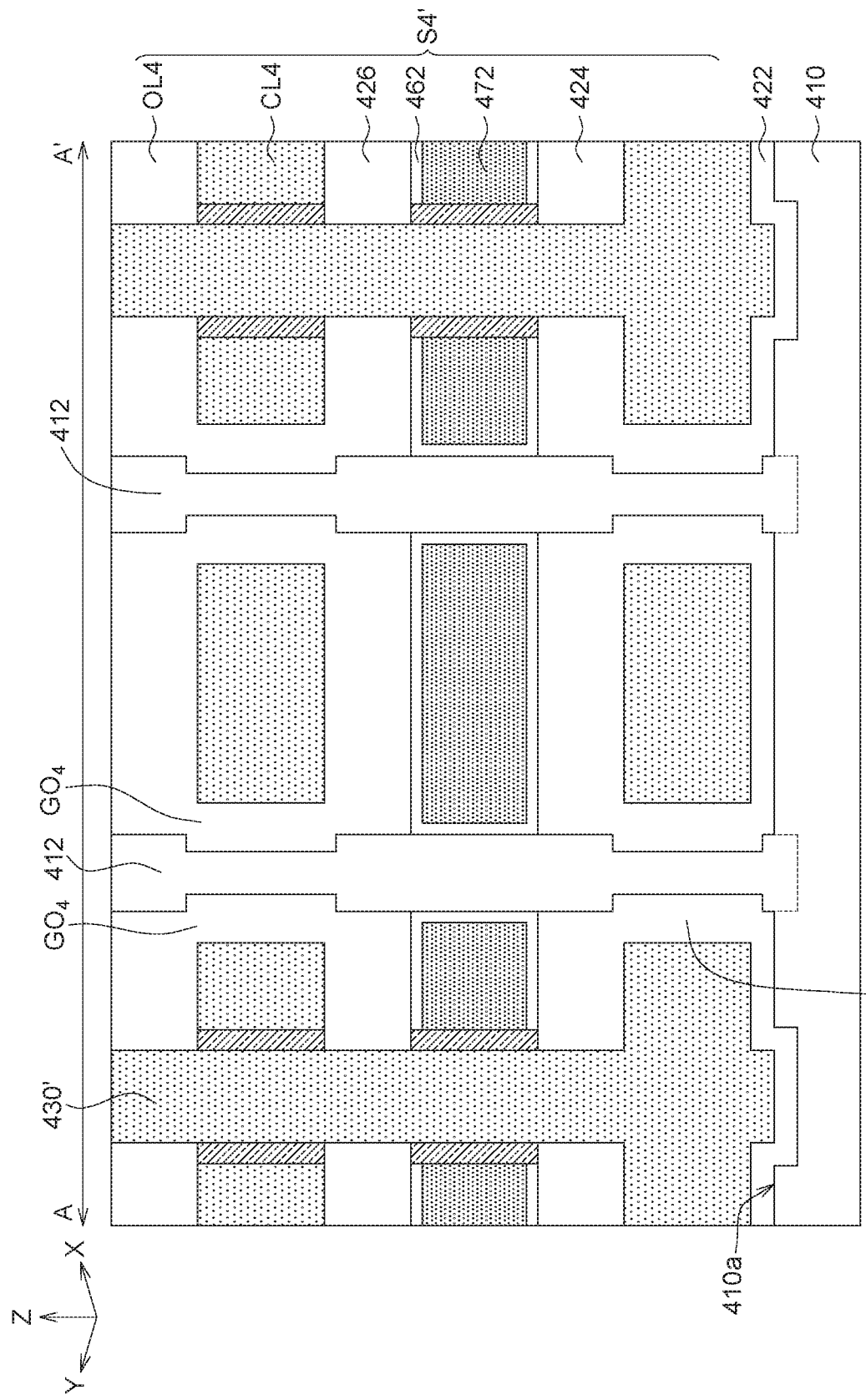
Figure 9P:
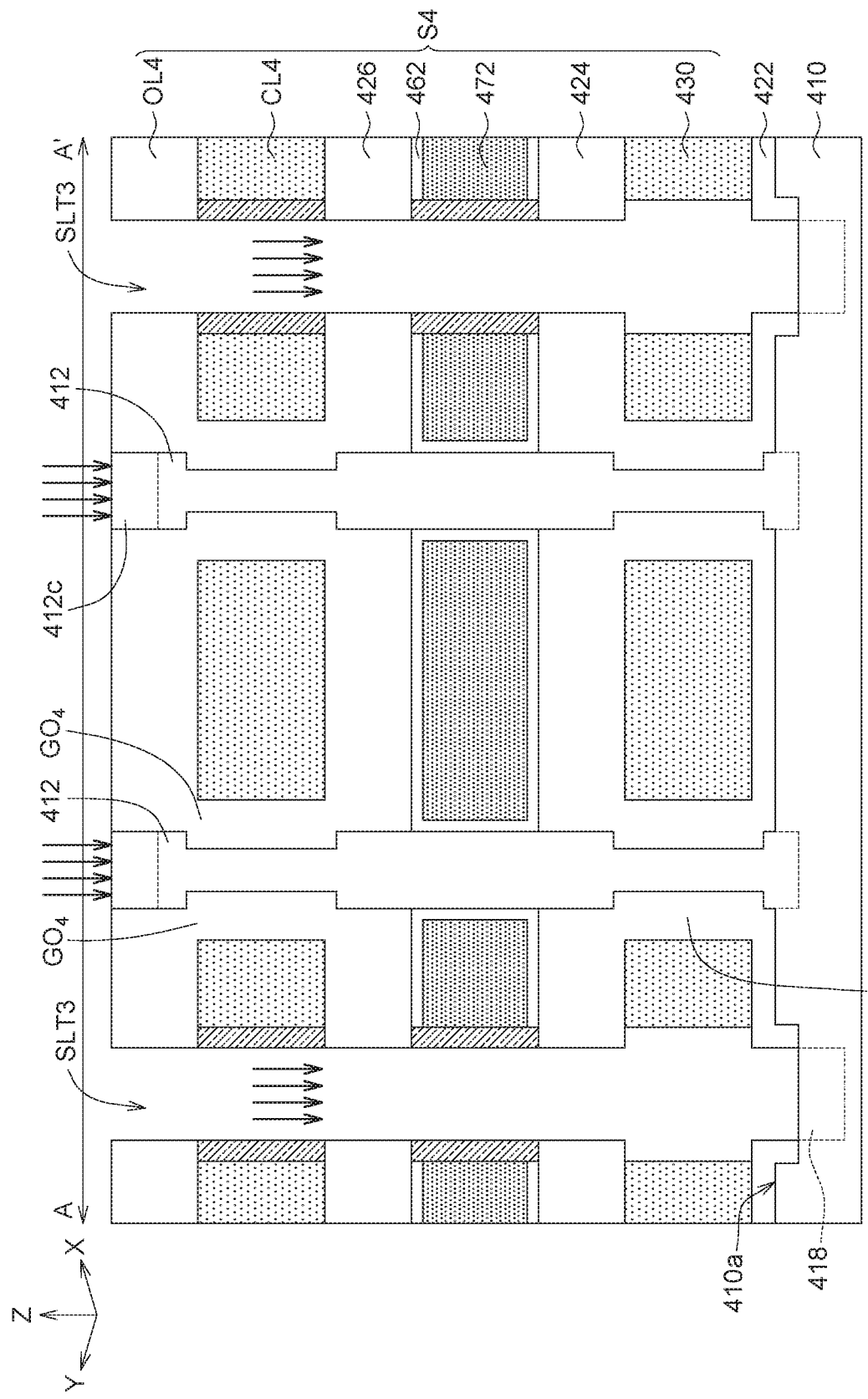
Figure 9R:
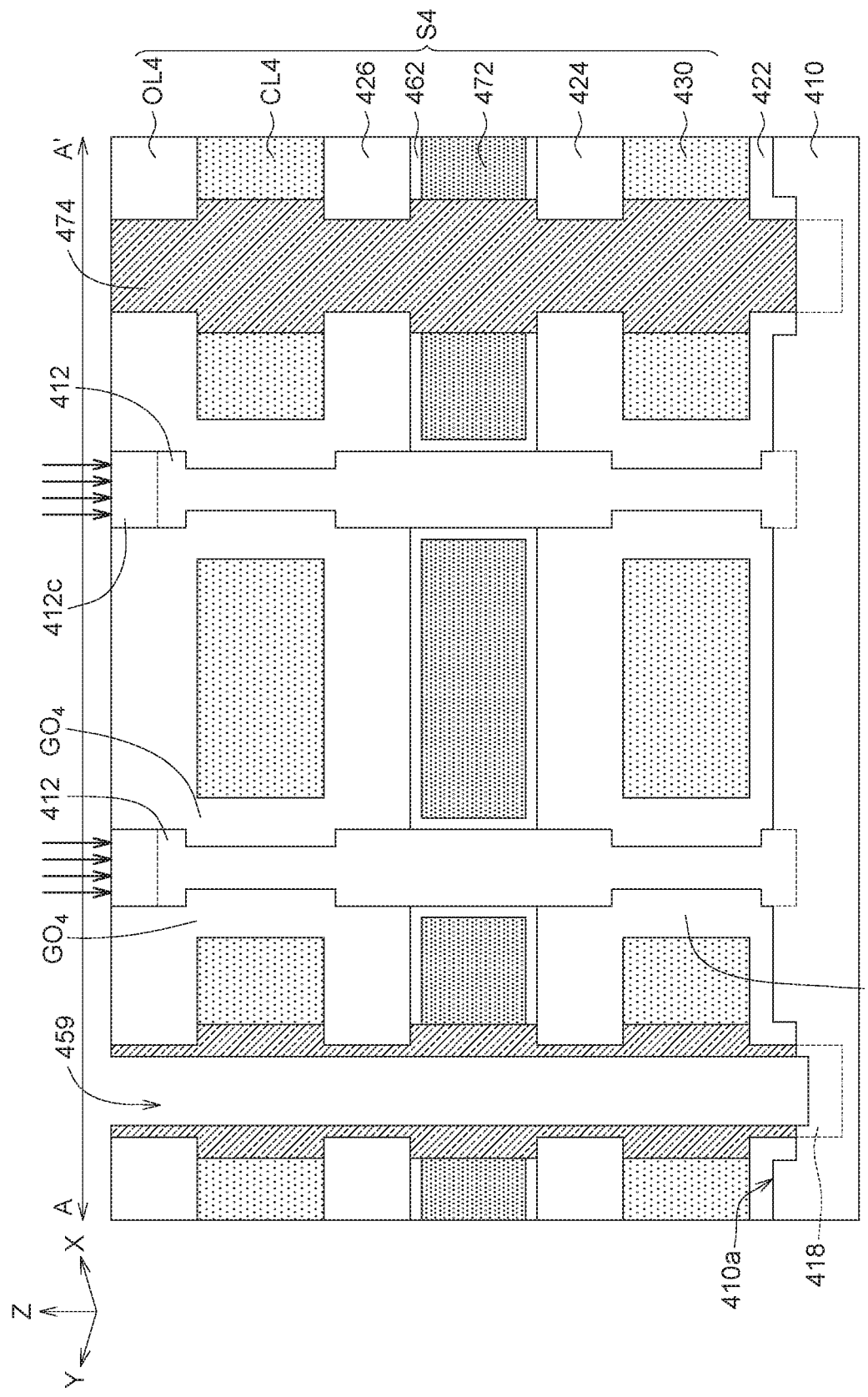

FIGS. 9A to 9R are cross-sectional views illustrating a method for fabricating a memory device 400 in accordance with one further embodiment of the present invention.

Referring to FIG. 9A, a substrate 410 is provided, and a stacked body S4' is formed on the upper surface 410a of the substrate 410. The stacked body S4' including a first insulating layer 422, a lower sacrificial layer 442, a second insulating layer 424, an upper sacrificial layer 440 and a third insulating layer 426, a top sacrificial layer SF4 and a top insulating layer OL4 sequentially stacked on (eg, by a deposition process) the upper surface 410a of the substrate 410.

In some embodiments, the substrate 410 can be a silicon substrate or other suitable substrate. The second insulating layer 424, the third insulating layer 426 and the top insulating layer OL4 may be formed of an oxide such as silicon dioxide. The lower sacrificial layer 442, the upper sacrificial layer 440 and the top sacrificial layer SF4 may be formed of silicon nitride (SiN).

Referring to FIG. 9B, a plurality of first openings 452 are formed, and each of the first openings 452 penetrates the stacked body S4' to expose a portion of the substrate 410. In some embodiments, the first opening 452 can be formed by an etching process, such as a dry etching process. In some embodiments, the substrate 410 can be overetched such that the bottom of the first opening 452 is lower than the upper surface 410a of the substrate 410.

Referring to FIG. 9C, the channel structure 412 is formed by a first epitaxial growth process. That is, the entire of the channel structure 412 (including upper portion and the lower portion) is an epitaxial growth layer of silicon.

Referring to FIG. 9D, a plurality of first trenches SLT1 penetrating the top sacrificial layer SF4 and the top insulating layer OL4 are formed by an etching process.

Referring to FIG. 9E, the top sacrificial layer SF4 is removed through the first trenches SLT1. The space where the top sacrificial layer SF4 is removed forms a top opening 460. A thermal oxide layer $GO_4$ is then formed on one side surface of the upper portion of the exposed channel structure 412 by an oxidation process. In some embodiments, the channel structure 412 is a P-type doped polycrystalline silicon epitaxial growth layer. The thermal oxide layer $GO_4$ including silicon dioxide is formed on the side surface of the exposed channel structure 412 through an oxidation process and a high temperature.

Referring to FIG. 9F, a conductive material CL4' is deposited in the top opening 460 and the first trenches SLT1 by a deposition process. The conductive material CL4' may include tungsten (W), aluminum (Al), titanium nitride (TiN), tantalum nitride (TaN), doped or undoped poly-silicon, or other suitable materials.

Referring to FIG. 9G, a portion of the conductive material CL4' is removed by an etching process to form a top opening P1, and a top conductive layer CL4 is formed between the third insulating layer 426 and the top insulating layer OL4.

Referring to FIG. 9H, an insulating material is filled in the top opening P1 through a deposition process.

Referring to FIG. 9I, second trenches SLT2 penetrating the top insulating layer OL4 and the third insulating layer 426 are formed by an etching process, and then the upper sacrificial layer 440 is removed to form an upper opening 456. Thereafter, a memory layer 462 extending along the second trench SLT2 and the upper opening 456 is formed by a deposition process. The memory layer 462 may be composed of a composite layer (ie, an AONO layer) including an aluminum oxide ($Al_2O_3$), a silicon oxide layer, a silicon nitride layer and a silicon oxide layer.

Referring to FIG. 9J, a conductive material 472' is deposited on the memory layer 462 through a deposition process. The conductive material 472' may include tungsten (W), aluminum (Al), titanium nitride (TiN), tantalum nitride (TaN), or other suitable conductive materials. That is, a conductive material 472' is filled in the second trenches SLT2 and the upper opening 456.

Referring to FIG. 9K, third trenches SLT3 are formed by removing a portion of the conductive material 472' and the memory layer 462 by an etching process, and the second conductive layer 472 and the memory layer 462 disposed between the second insulating layer 424 and the third insulating layer 426 are remained.

Referring to FIG. 9L, an insulating material is filled in the third trenches SLT3 through a deposition process.

Referring to FIG. 9M, second openings 454 penetrating the lower sacrificial layer 442, the second insulating layer 424, the third insulating layer 426, and the top insulating layer OL4 are formed through an etching process. Thereafter, the lower sacrificial layer 442 is removed from the second opening 454 through an etching process, and the lower opening 458 is formed at a position where the lower sacrificial layer 442 is removed.

Referring to FIG. 9N, thermal oxide layers 432 are formed on one side surface of the channel structures 412 exposed by the lower opening 458 through an oxidation process, and a first insulating layer 422 is formed on the upper surface exposed by the substrate 410. For example, the thermal oxide layer 432 and the first insulating layer 422 may include silicon dioxide, respectively.

Referring to FIG. 9O, a conductive material 430' is filled in the second openings 454 and the lower openings 458 by a deposition process. The conductive material 430' may include polycrystalline silicon or other suitable materials.

Referring to FIG. 9P, the conductive material 430' disposed in the second openings 454 is removed by an etching process to form a first conductive layer 430 disposed in the lower openings 458. In some embodiments, the etching process may remove a portion of the conductive material in the lower openings 458 together. The first conductive layer 430 may include polycrystalline silicon or other suitable conductive materials. Thereby, a stacked structure S4 including a first insulating layer 422, a first conductive layer 430, a second insulating layer 424, a second conductive layer 472, a third insulating layer 426, a top conductive layer CL4, and a top insulating layer OL4 is formed. In some embodiments, doped regions 412c and 418 may be formed on the top of the channel structures 412 and the surface of the substrate 410 exposed to the second openings 454 by an ion implant, respectively. For example, the doped regions 412c and 418 is heavily doped regions of a semiconductor. The doped regions 412c and 418 can be used to form contact structures in subsequent processes to be electrically connected to the bit line and the common source line, respectively.

Referring to FIG. 9Q, an insulating material is filled into the second openings 454 through a deposition process to form a plurality of isolation structures 474. The isolation structure 474 may include an oxide or other suitable insulating material.

Referring to FIG. 9R, a plurality of vertical openings 459 penetrating the isolation structures 474 and extending along the normal direction of the upper surface 410a of the substrate 410 are formed.

Thereafter, referring back to FIG. 1E, a plurality of conductive connection structures 476 are formed by filling conductive materials in the vertical openings 459 in a deposition process. The conductive connection structures 476 can include tungsten (W), aluminum (Al), titanium nitride (TiN), or other suitable electrically conductive material. As a result, the memory device 400 as shown in FIG. 1E is formed.

FIGS. 10A to 10K are cross-sectional views illustrating a method for fabricating a memory device 500 in accordance with one further embodiment of the present invention.

Figure 10A:
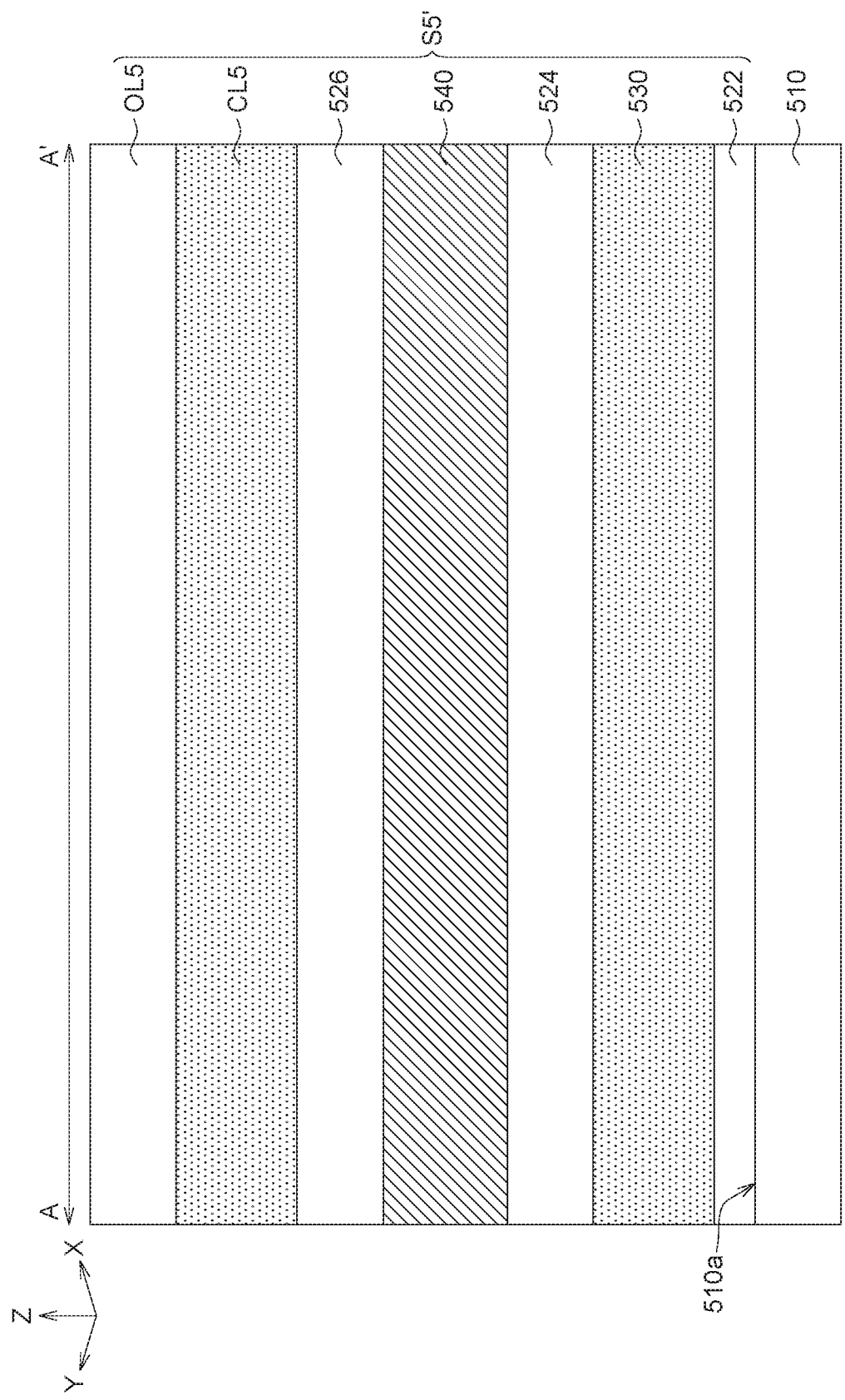
FIGS. 10A to 10K are cross-sectional views illustrating a method for fabricating a memory device in accordance with one further embodiment of the present invention.

Referring to FIG. 10A, a substrate 510 is provided, and a stacked body S5' is formed on the upper surface 510a of the substrate 510. The stacked body S5' including a first insulating layer 522, a first conductive layer 530, a second insulating layer 524, an upper sacrificial layer 540, a third insulating layer 526, a top conductive layer CL5 and a top insulating layer OL5 sequentially stacked on (eg, by a deposition process) the upper surface 510a of the substrate 510.

In some embodiments, the substrate 510 can be a silicon substrate or other suitable substrate. The first insulating layer 522, the second insulating layer 524, the third insulating layer 526 and the top insulating layer OL5 may be formed of an oxide such as silicon dioxide. The upper sacrificial layer 540 may be formed of silicon nitride (SiN).

Figure 10B:
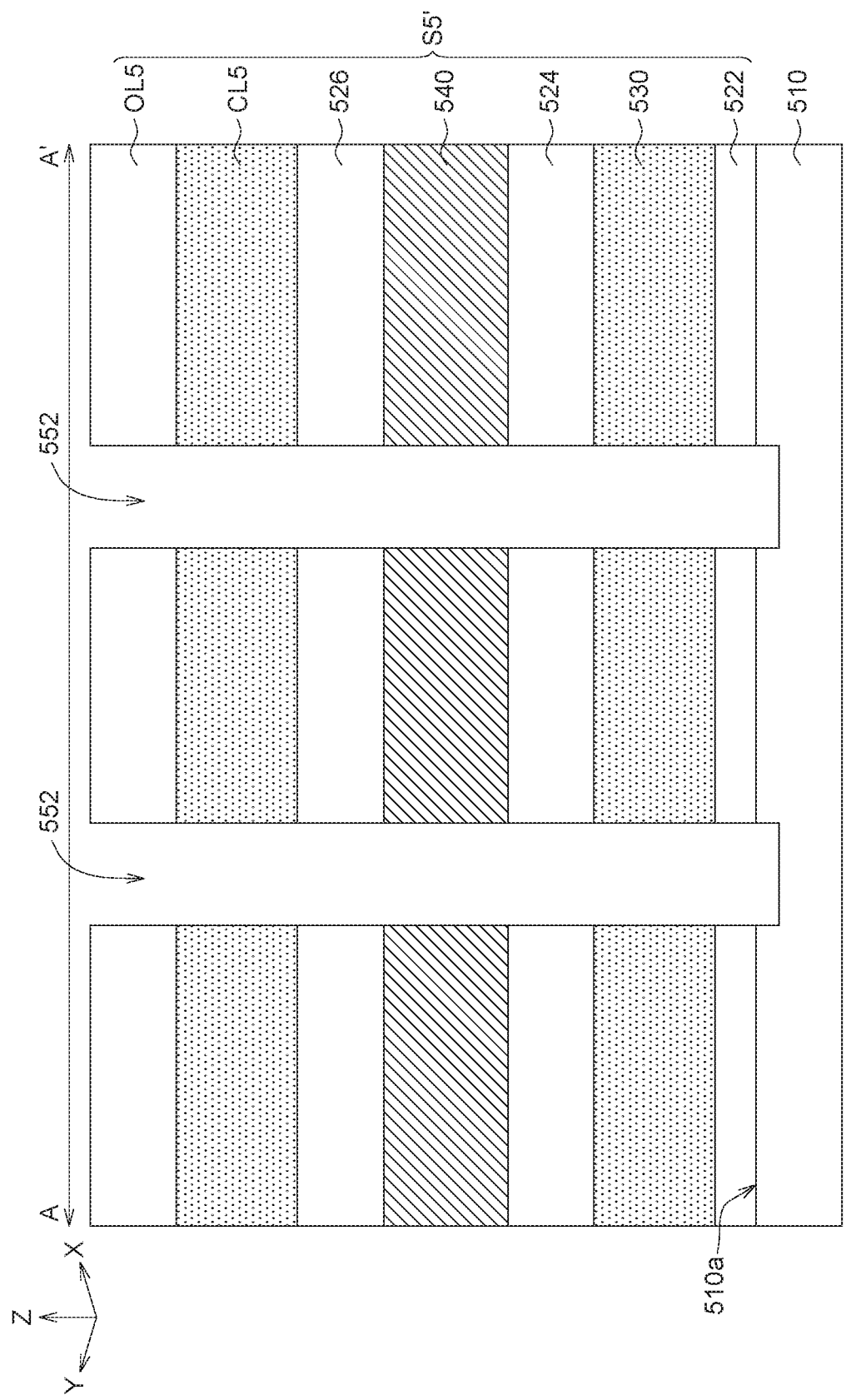

Referring to FIG. 10B, a plurality of first openings 552 are formed, and each of the first openings 552 penetrates the stacked body S5' to expose a portion of the substrate 510. In some embodiments, the first opening 452 can be formed by an etching process, such as a dry etching process. In some embodiments, the substrate 510 can be overetched such that the bottom of the first opening 552 is lower than the upper surface 510a of the substrate 510.

Figure 10C:
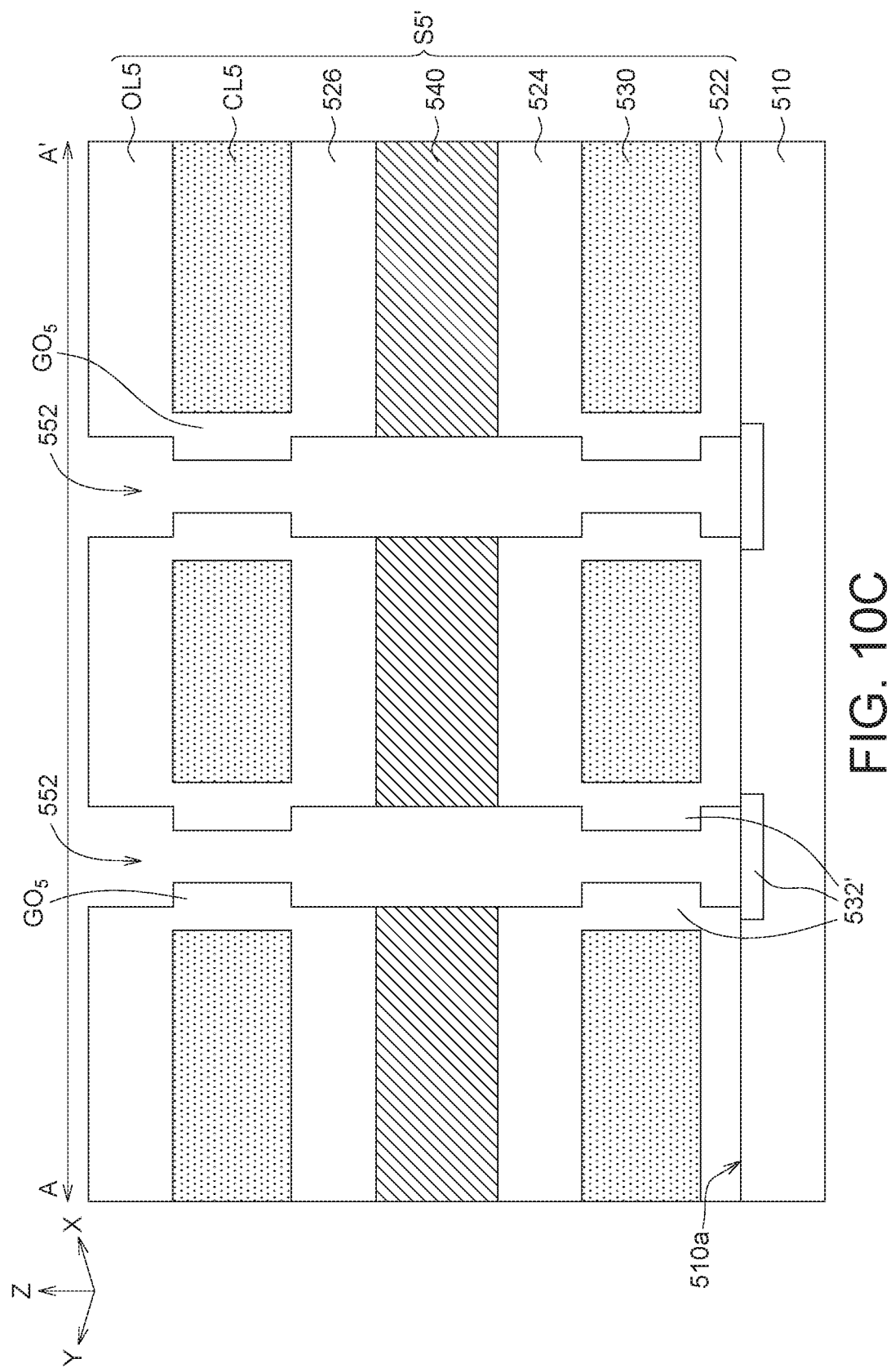

Referring to FIG. 10C, a portion of the oxide layer 532' is formed on one side surface of the first conductive layer 530 exposed by the first opening 552, a portion of the oxide layer 532' is formed on the surface of the substrate 510 exposed by the first opening 552, and an oxide layer $GO_5$ is formed on one surface of the top conductive layer CL5 through an oxidation process. In some embodiments, the first conductive layer 530 and the top conductive layer CL5 are n-type doped polycrystalline silicon layers, and the substrate 510 is a silicon substrate. The oxide layers 532' including silicon dioxide are formed on the side surface of the first conductive layer 530 exposed by the first openings 552, and formed on a surface of the substrate 510 exposed by the first opening 552 through an oxidation process and a high temperature.

Figure 10D:
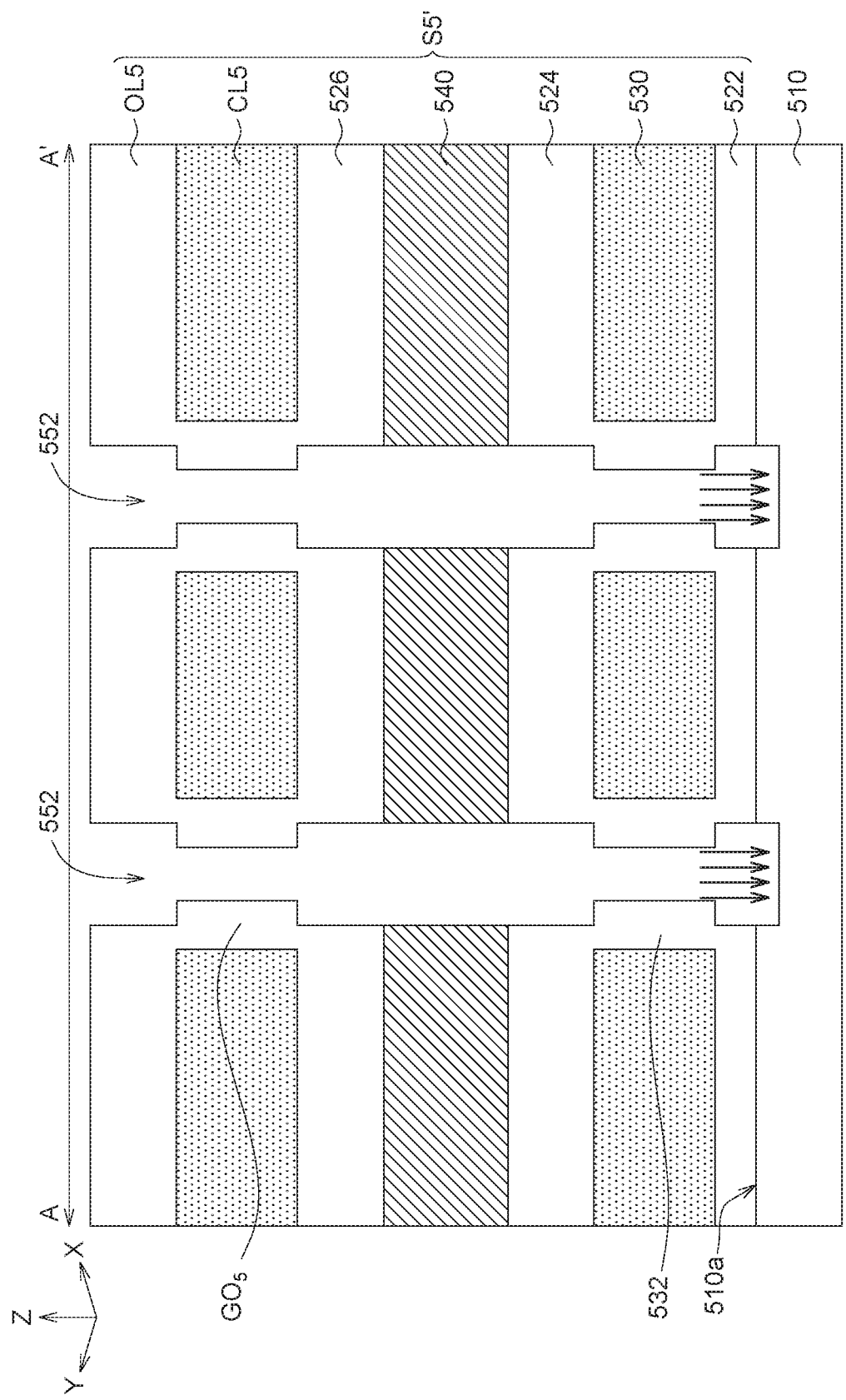

Referring to FIG. 10D, the excess portion of the oxide layers 532' in the first opening 552 is removed to form a thermal oxide layer 532 that directly contacts the first conductive layer 530, and the substrate 510 is exposed. The thermal oxide layer 532 is an oxide layer formed by directly oxidizing the conductive layer (for example, the first conductive layer 530), rather than by a deposition process (for example, chemical vapor deposition (CVD), physical vapor deposition (PVD) or other deposition processes), the purity of the oxide of the thermal oxide layer 532 is greater than that of the insulating layer (such as the first insulating layer 522, the second insulating layer 524, or the third insulating layer 526) formed by the deposition method. In some embodiments, a P-type dopant is implanted into the substrate 510 by an ion implantation. This P-type dopant helps to adjust the threshold voltage.

Figure 10E:
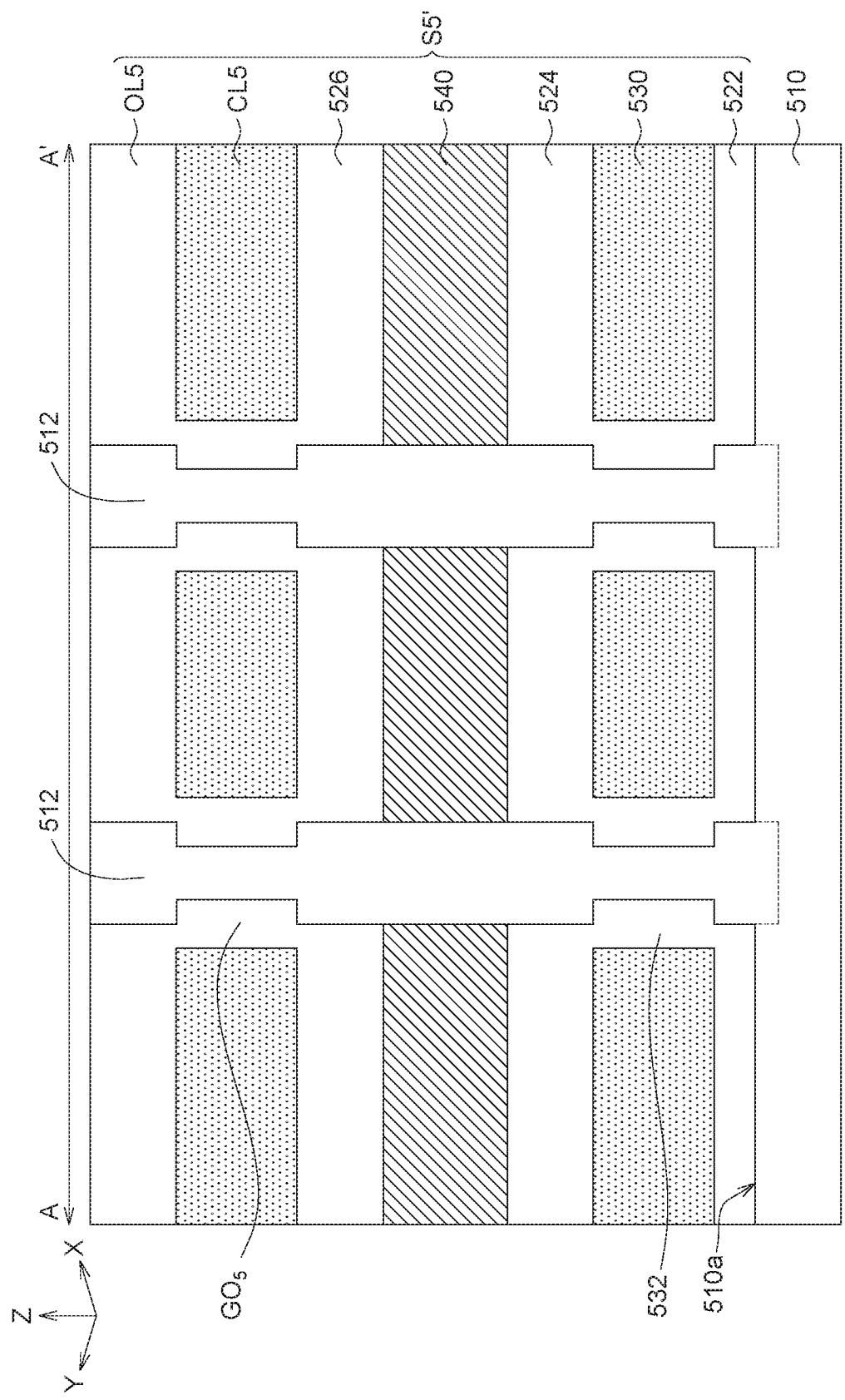

Referring to FIG. 10E, channel structures 512 covering the thermal oxide layer 532 and $GO_5$ are formed by a first epitaxial growth process. The thermal oxide layer 532 is disposed between the first conductive layer 530 and the channel structures 512, and the thermal oxide layer $GO_5$ is disposed between the top conductive layer CL5 and the channel structures 512.

Figure 10F:
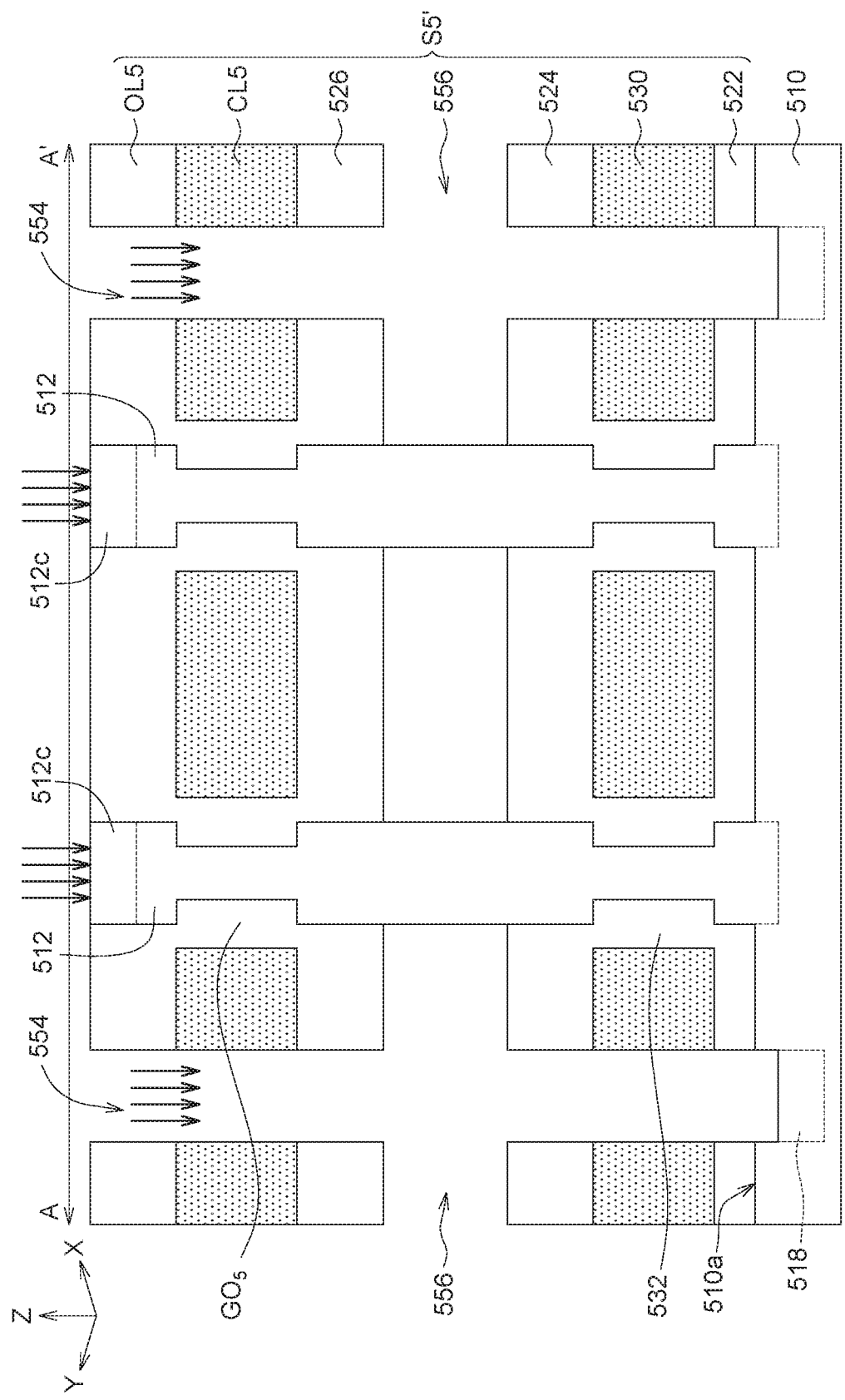

Referring to FIG. 10F, second openings 554 penetrating the first insulating layer 522, the first conductive layer 530, the second insulating layer 524, the upper sacrificial layer 540, the third insulating layer 526, the top conductive layer CL5 and the top insulating layer OL5 are formed by an etching process. Then, the upper sacrificial layer 540 is removed to form an upper opening 556 at a position where the upper sacrificial layer 540 is removed. Next, doped regions 512c and 518 are formed on the top of the channel structures 512 and the surfaces of the substrate 510 exposed from the second openings 554 by an ion implantation, respectively. The doped regions 512c and 518 are, for example, regions of heavily doped n-type semiconductors. The doped regions 512c and 518 can be used to form contact structures in subsequent processes to be electrically connected to the bit line and the common source line, respectively.

Figure 10G:
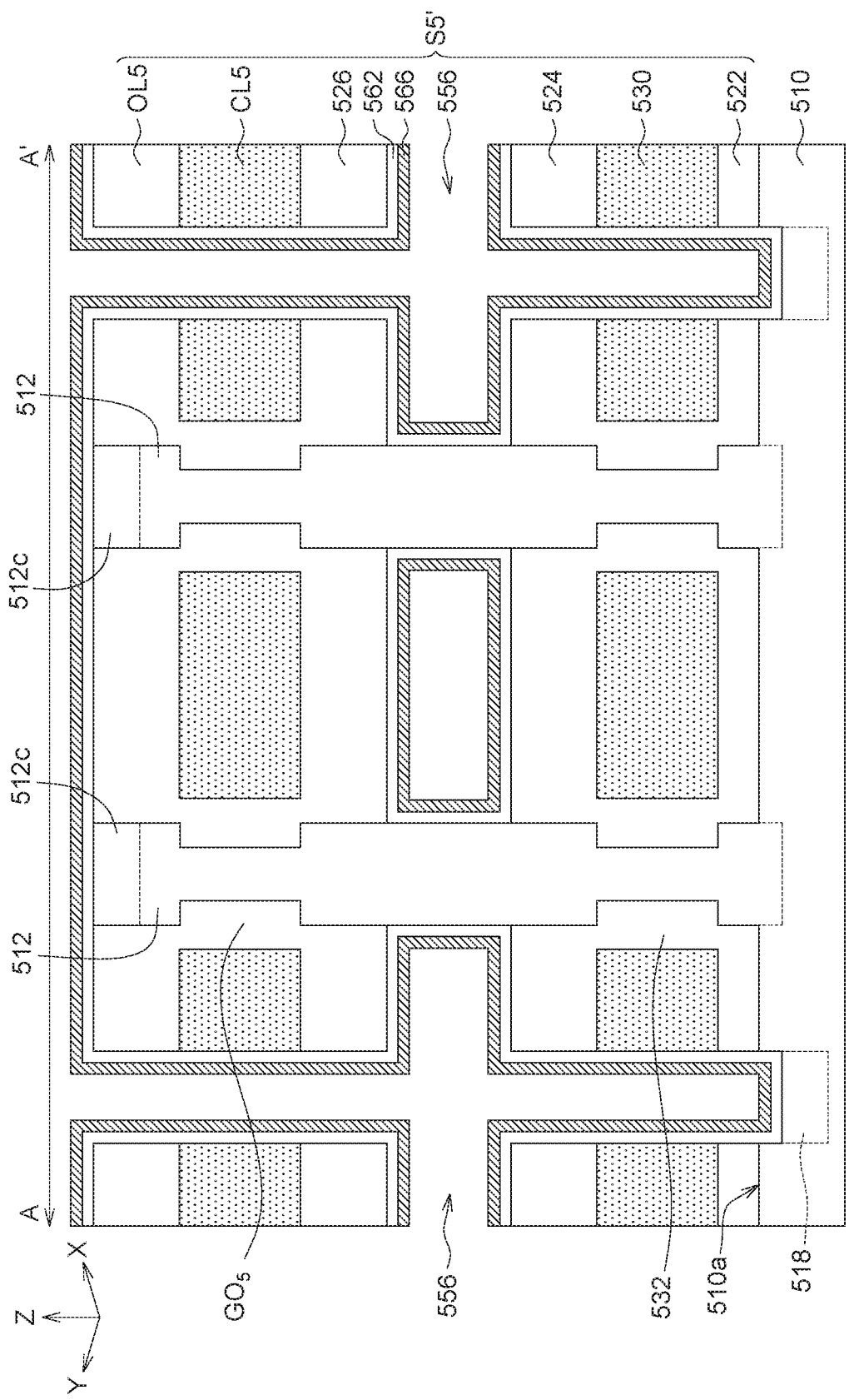

Referring to FIG. 10G, by a deposition process, a memory layer 562 and a dielectric material 566 extending along the sidewalls of the second openings 554 and the upper opening 556 and covering the top insulating layer OL5 are sequentially formed. The memory layer 562 may be composed of a composite layer (ie, an ONO layer) including a silicon oxide layer, a silicon nitride layer, and a silicon oxide layer. For example, the memory layer 562 may include a tunneling layer, a trapping layer, and a blocking layer. The tunneling layer may include silicon dioxide ($SiO_2$) or a two-layer structure formed of silicon dioxide ($SiO_2$)/silicon oxynitride (SiON) or other suitable material. The trapping layer can include silicon nitride, polysilicon or other suitable materials. The blocking layer may include silicon dioxide ($SiO_2$) or other suitable material. In some embodiments, the dielectric material 566 may include a high k material, such as aluminum oxide ($Al_2O_3$) or other suitable materials. The dielectric material 566 can also serve as a barrier layer to prevent lateral diffusion of charges.

Figure 10H:
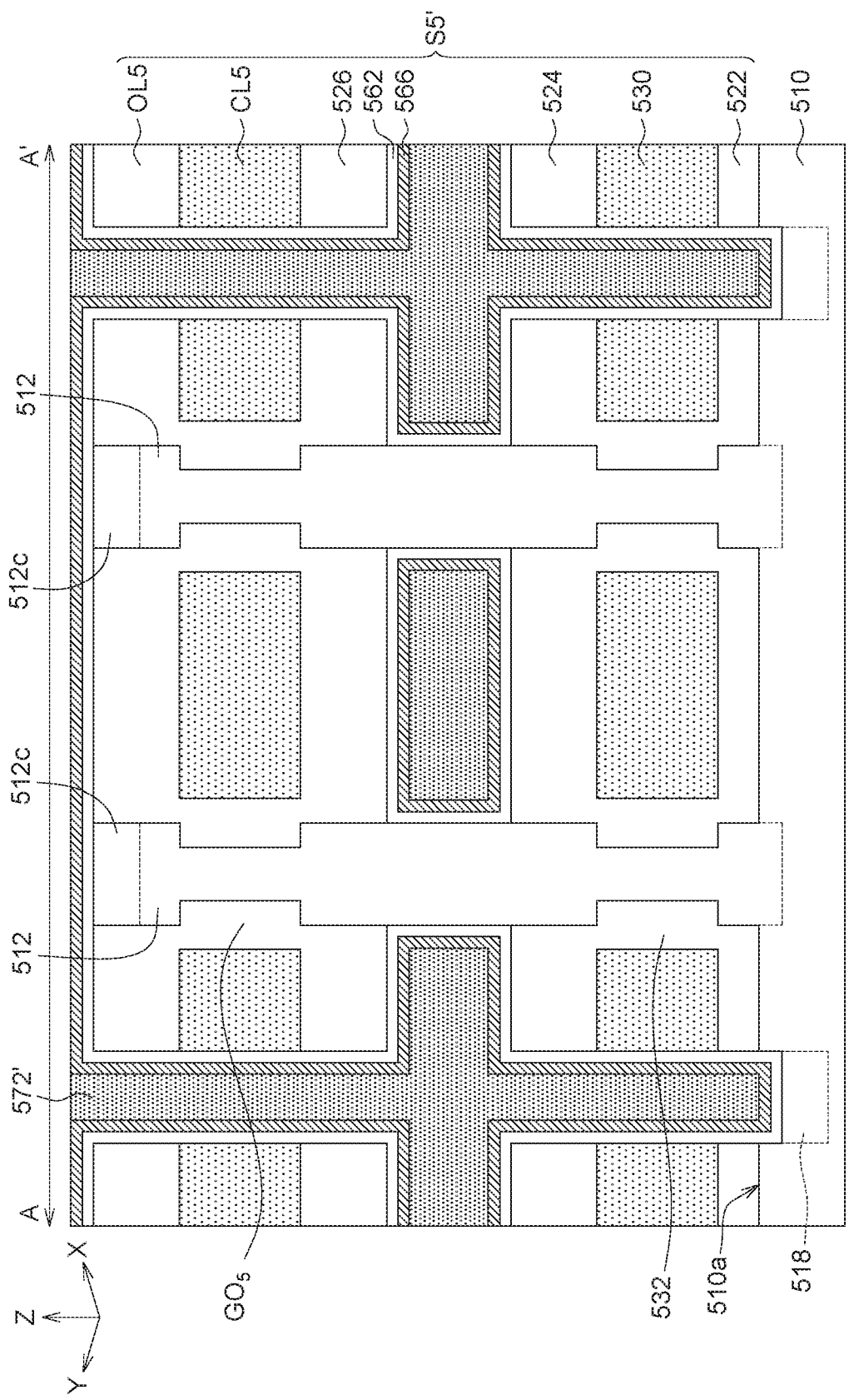

Referring to FIG. 10H, a conductive material 572' is filled in the second openings 554 and the upper opening 556 by a deposition process. The conductive material 572' may include tungsten (W), aluminum (Al), titanium nitride (TiN), tantalum nitride (TaN), or other suitable materials.

Figure 10I:
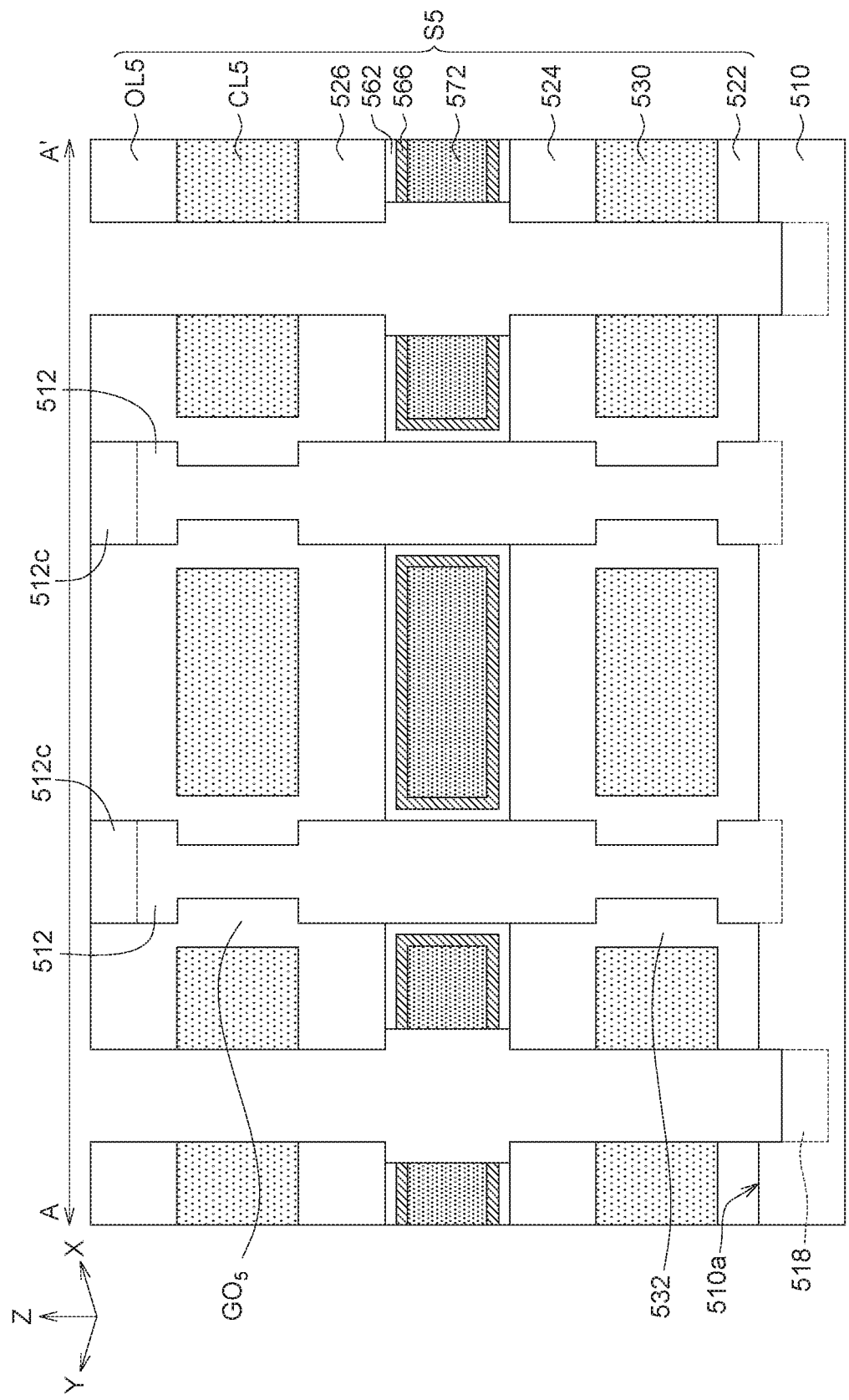

Referring to FIG. 10I, the conductive material 572' disposed in the second openings 554 is removed by an etching process to form a second conductive layer 572 disposed in the upper opening 556. The etching process is, for example, a dry etching process. In some embodiments, the etching process may concurrently remove a portion of the conductive material in the upper opening 556. The second conductive layer 572 may include tungsten (W), aluminum (Al), titanium nitride (TiN), tantalum nitride (TaN), or other suitable conductive materials. In the present embodiment, the second conductive layer 572 includes tungsten (W). Thereby, a stacked structure S5 including a first insulating layer 522, a first conductive layer 530, a second insulating layer 524, a second conductive layer 572, a third insulating layer 526, a top conductive layer CL5, and a top insulating layer OL5 is formed.

Figure 10J:
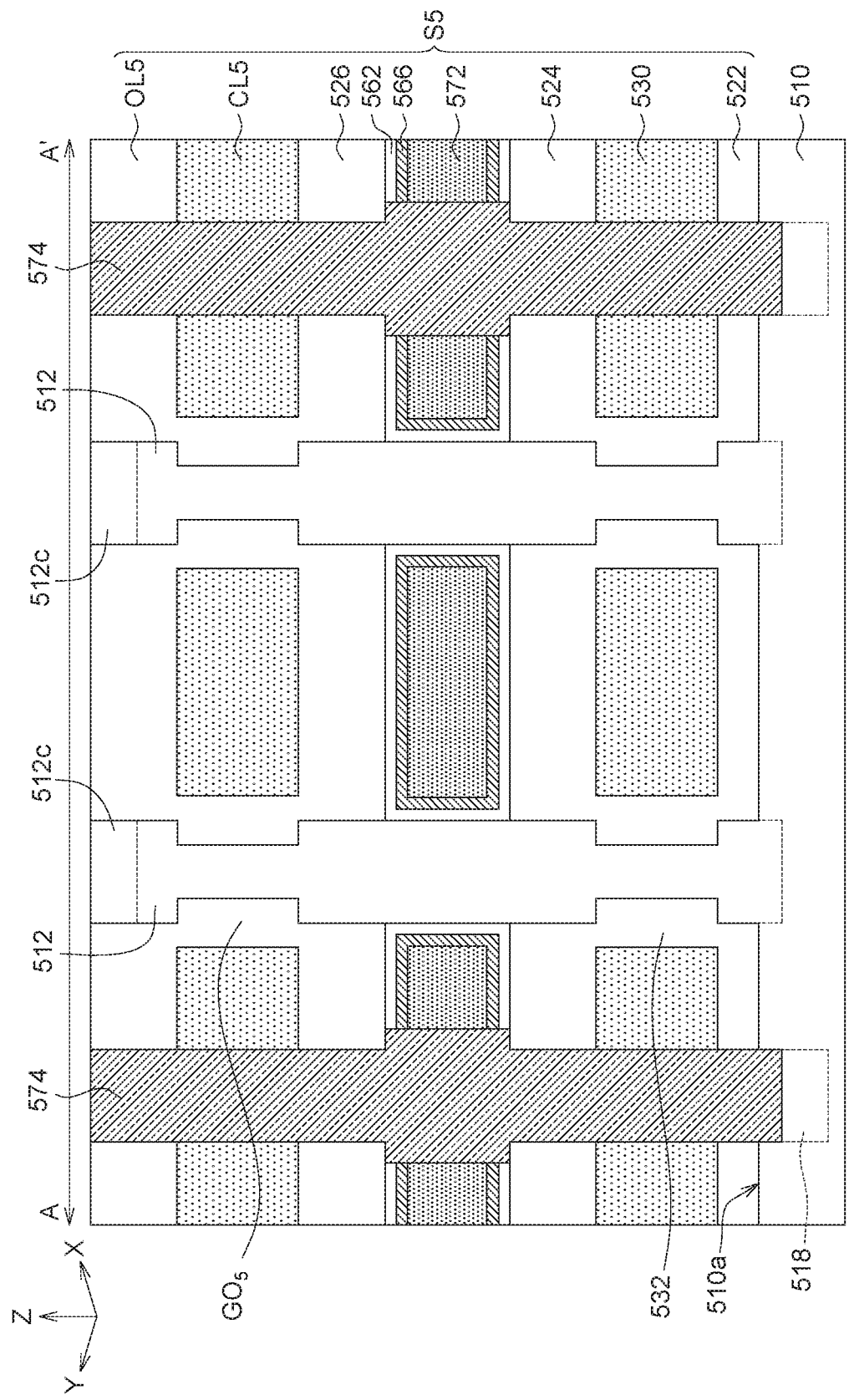

Referring to FIG. 10J, an insulating material is filled into the second openings 554 through a deposition process to form a plurality of isolation structures 574. The isolation structures 574 may include an oxide or other suitable insulating material.

Figure 10K:
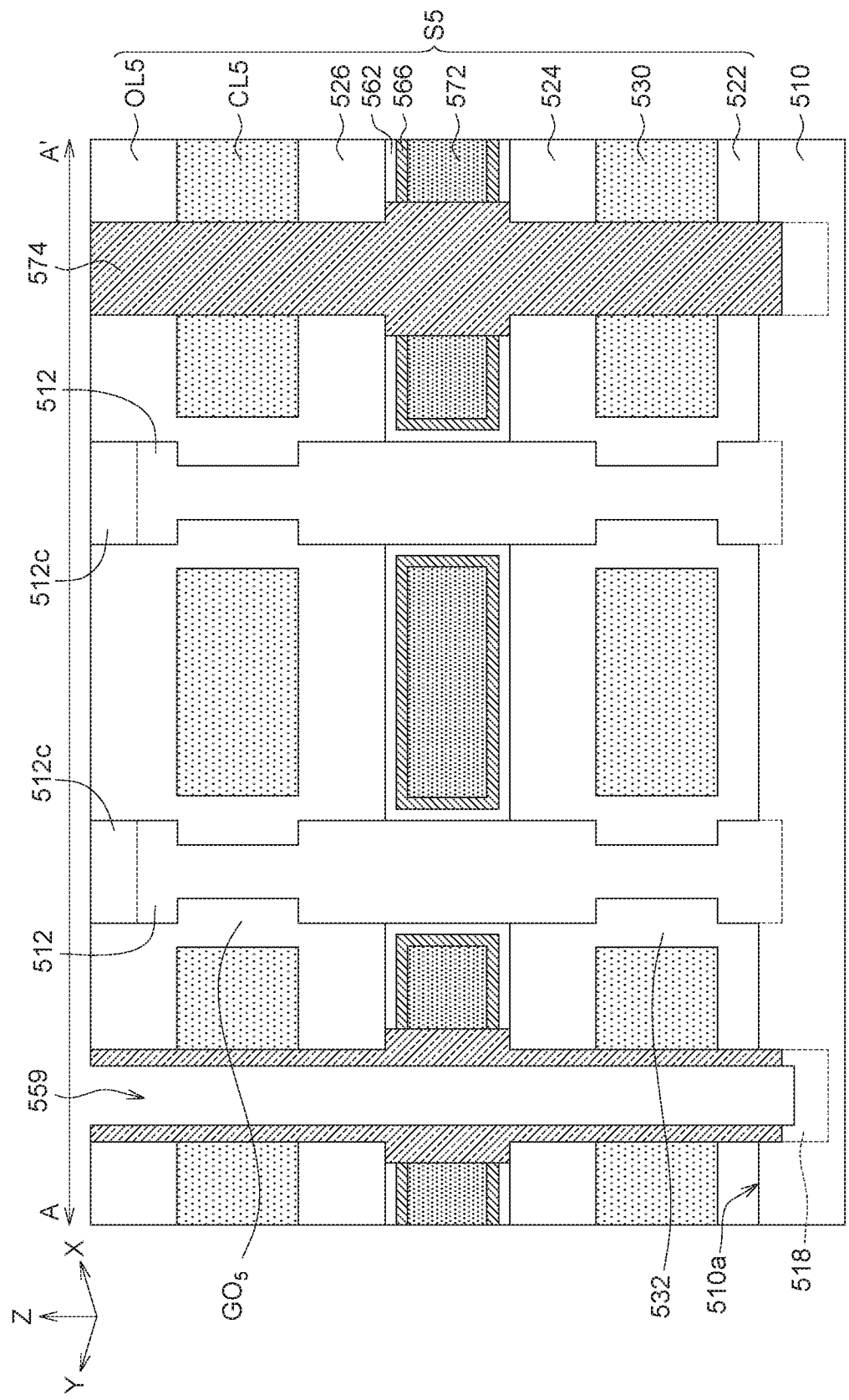

Referring to FIG. 10K, a plurality of vertical openings 559 penetrating the isolation structures 574 and extending along the normal direction of the upper surface 510a of the substrate 510 are formed.

Thereafter, referring back to FIG. 1F, a conductive material is filled into the vertical openings 559 by a deposition process to form a plurality of conductive connection structures 576. The conductive connection structure 576 may include tungsten (W), aluminum (Al), titanium nitride (TiN), or other suitable conductive materials. In this way, a memory device 500 as shown in FIG. 1F is formed.

FIGS. 11A to 11M are cross-sectional views illustrating a method for forming a memory device 600 according to an embodiment of the present application.

Figure 11A:
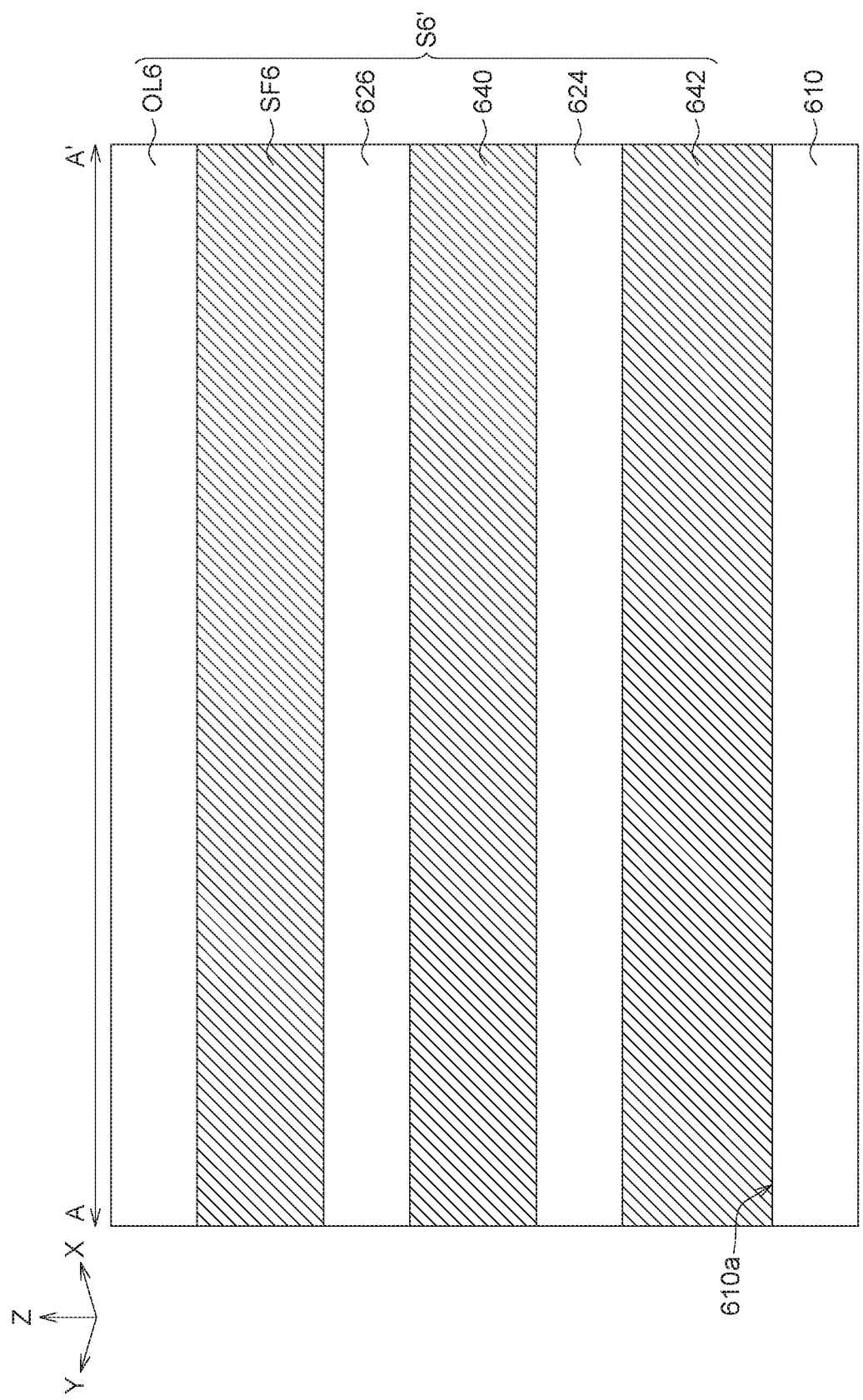
FIGS. 11A to 11M are cross-sectional views illustrating a method for fabricating a memory device in accordance with one further embodiment of the present invention.

Referring to FIG. 11A, a substrate 610 is provided, and a stacked body S6' is formed on the upper surface 610a of the substrate 610. The stacked body S6' includes a lower sacrificial layer 642, a second insulating layer 624, an upper sacrificial layer 640, a third insulating layer 626, a top sacrificial layer SF6, and a top insulating layer OL6 sequentially stacked (for example, by a deposition process) on the upper surface 610a of the substrate 610.

In some embodiments, the substrate 610 may be a silicon substrate or other suitable substrates. The second insulating layer 624, the third insulating layer 626, and the top insulating layer OL6 may be formed of an oxide, such as silicon dioxide. The lower sacrificial layer 642, the upper sacrificial layer 640, and the top sacrificial SF6 may be formed of silicon nitride (SiN).

Figure 11B:
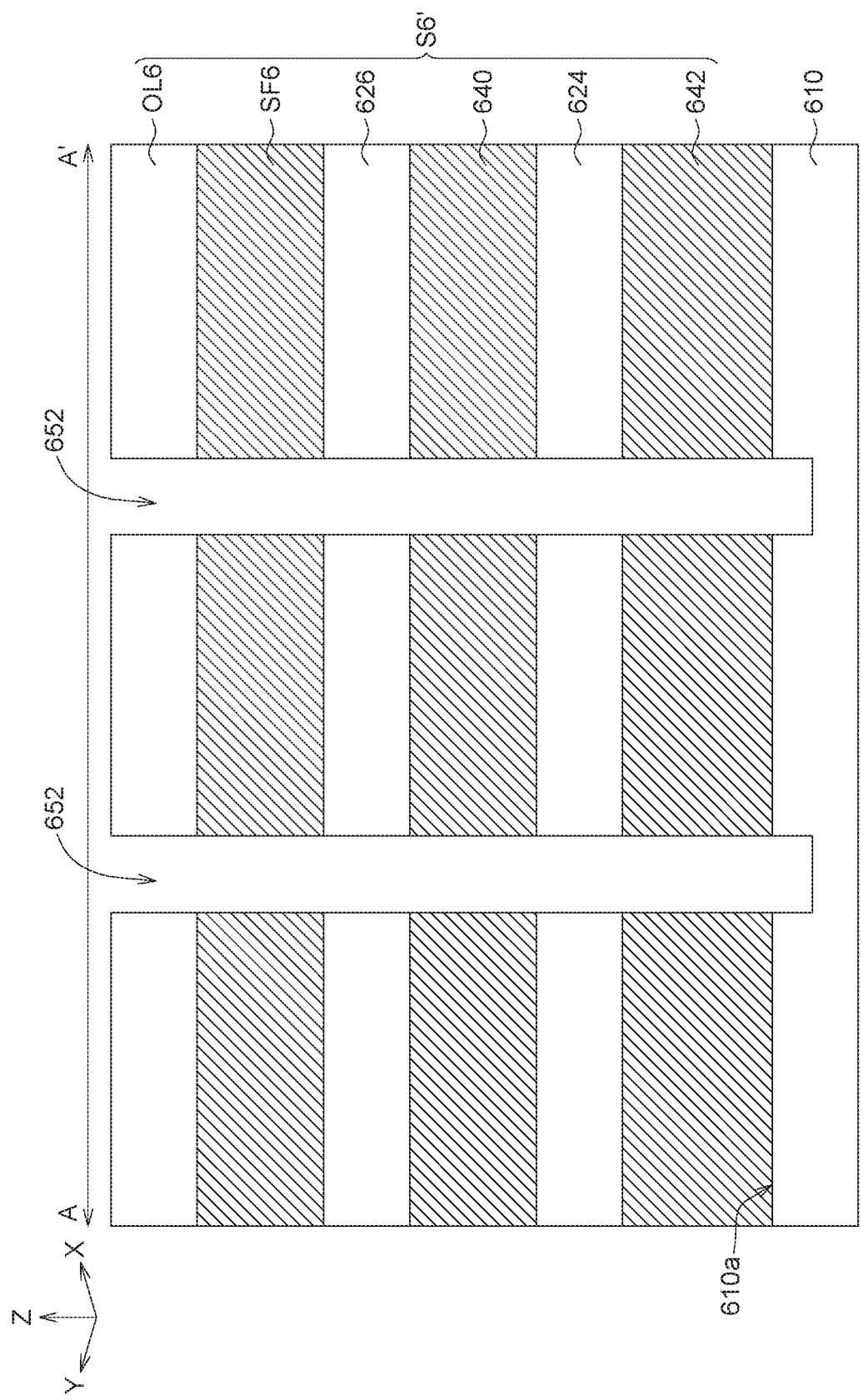
Figure 11C:
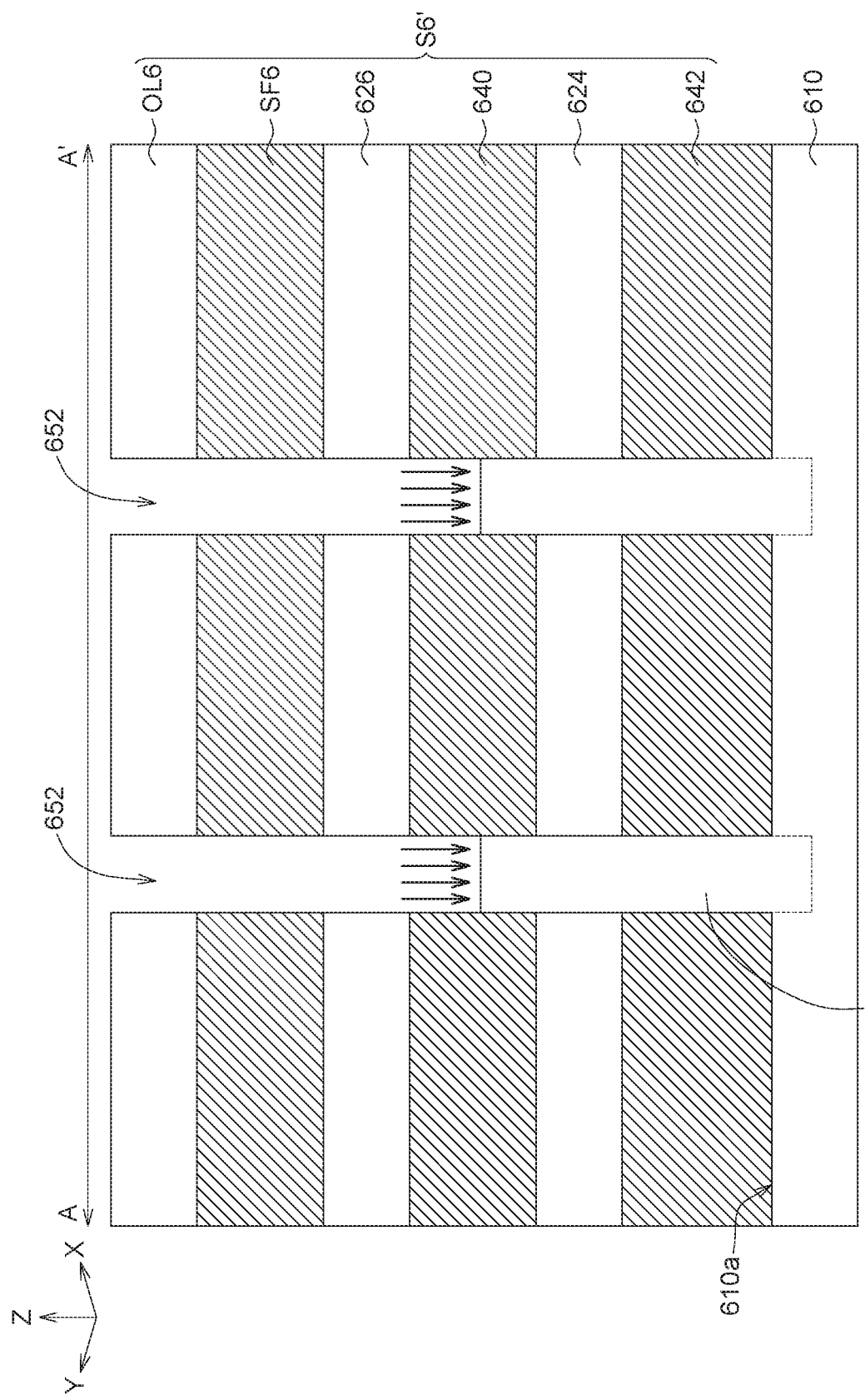

Referring to FIG. 11B, a plurality of first openings 652 are formed, and each of the first openings 652 penetrating the stacked body S6' to expose portions of the substrate 610 to the outside. In some embodiments, the first openings 652 may be formed by an etching process, such as a dry etching process. In some embodiments, the substrate 610 may be overetched such that the bottom of the first opening 652 is lower than the upper surface 610a of the substrate 610.

Referring to FIG. 11O, a lower portion 612a of the channel structure is formed by a first epitaxial growth process. That is, the lower portion 612a of the channel structure is an epitaxial growth layer of silicon. The height of the top surface of the lower portion 612a of the channel structure is greater than the height of the top surface of the lower sacrificial layer 642.

Thereafter, a P-type dopant is implanted into the lower portion 612a of the channel structure by an ion implantation. This P-type dopant helps to adjust the threshold voltage.

Figure 11D:
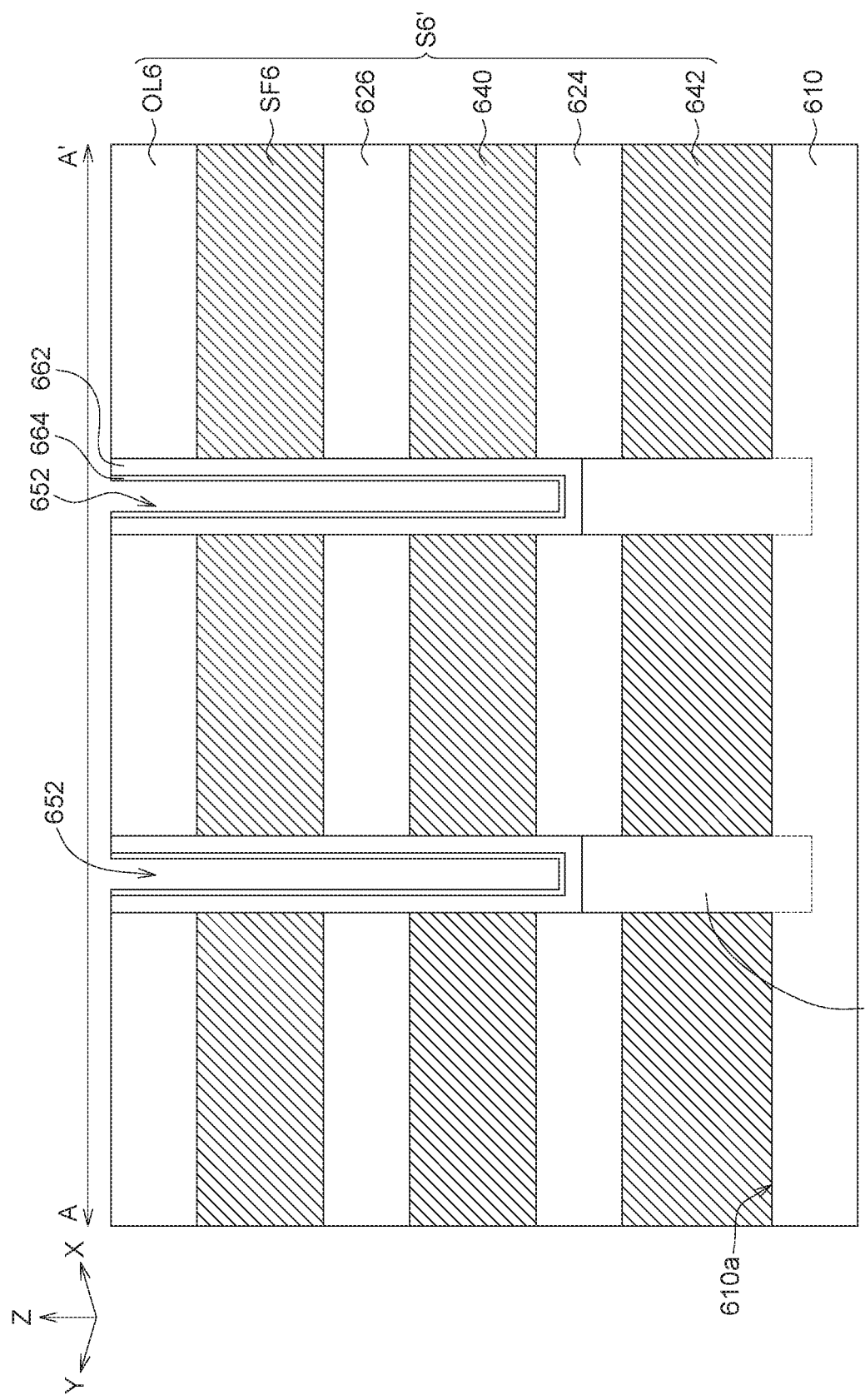

Referring to FIG. 11D, a memory layer 662 is formed to cover a portion of the sidewall of the first openings 652 and the lower portion 612a of the channel structure. The memory layer 662 may be composed of a composite layer (ie, an ONO layer) including a silicon oxide layer, a silicon nitride layer, and a silicon oxide layer. For example, the memory layer 662 may include a tunneling layer, a trapping layer, and a blocking layer. The tunneling layer may include a double-layer structure formed by silicon dioxide ($SiO_2$), silicon dioxide ($SiO_2$)/silicon oxynitride (SiON), or other suitable materials. The trapping layer may include silicon nitride, polycrystalline silicon, or other suitable materials. The blocking layer may include silicon dioxide ($SiO_2$) or other suitable materials.

Next, a protective layer 664 is formed on the memory layer 662 by a deposition process. The protective layer 664 prevents the memory layer 662 from being damaged in subsequent processes. The protective layer 664 is, for example, silicon nitride, polycrystalline silicon, or other suitable materials.

Figure 11E:
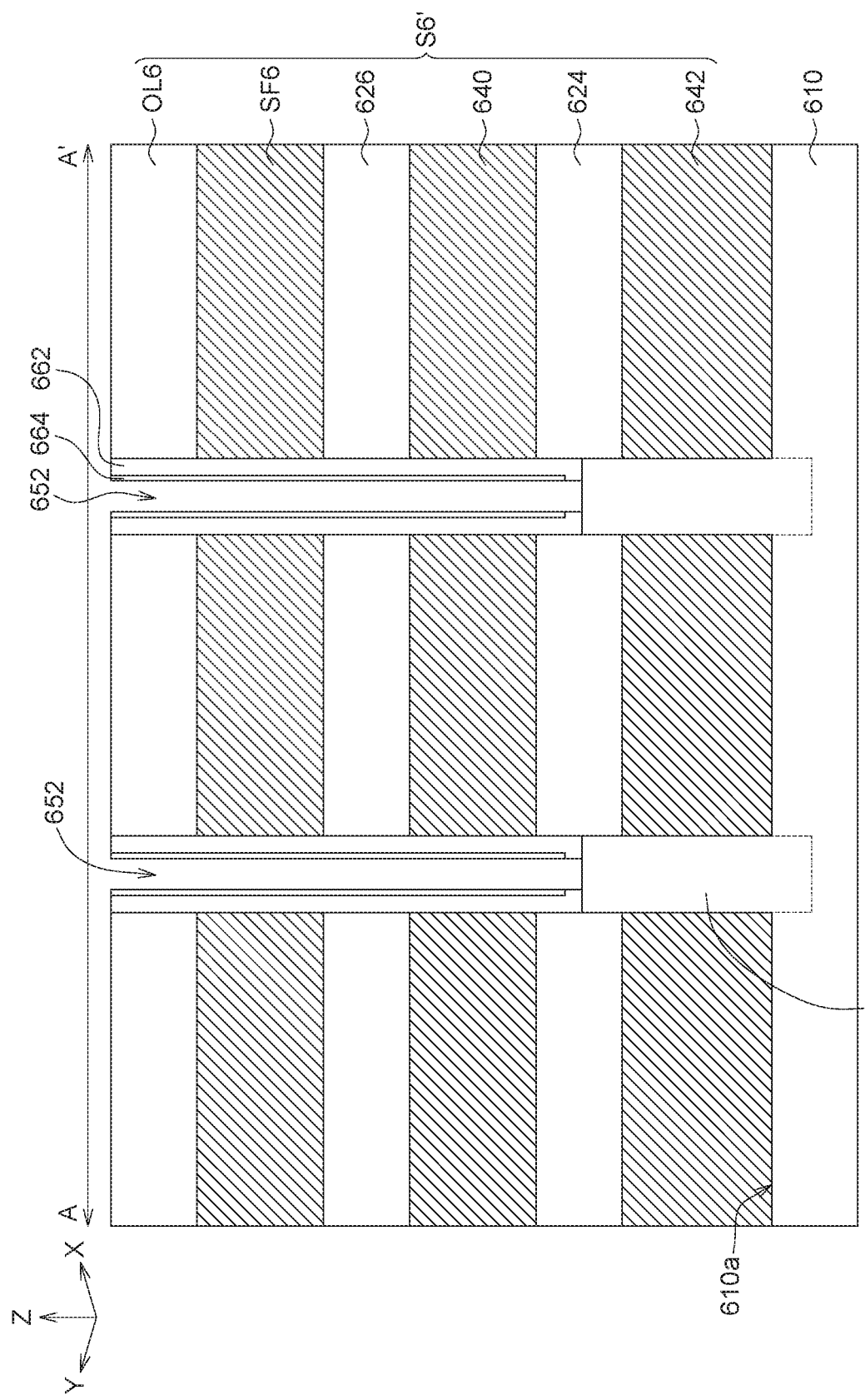

Referring to FIG. 11E, portions of the memory layer 662 and the protective layer 664 are removed by an etching process to expose the lower portion 612a of the channel structure. The etching process may be a dry etching process or a wet etching process.

Figure 11F:
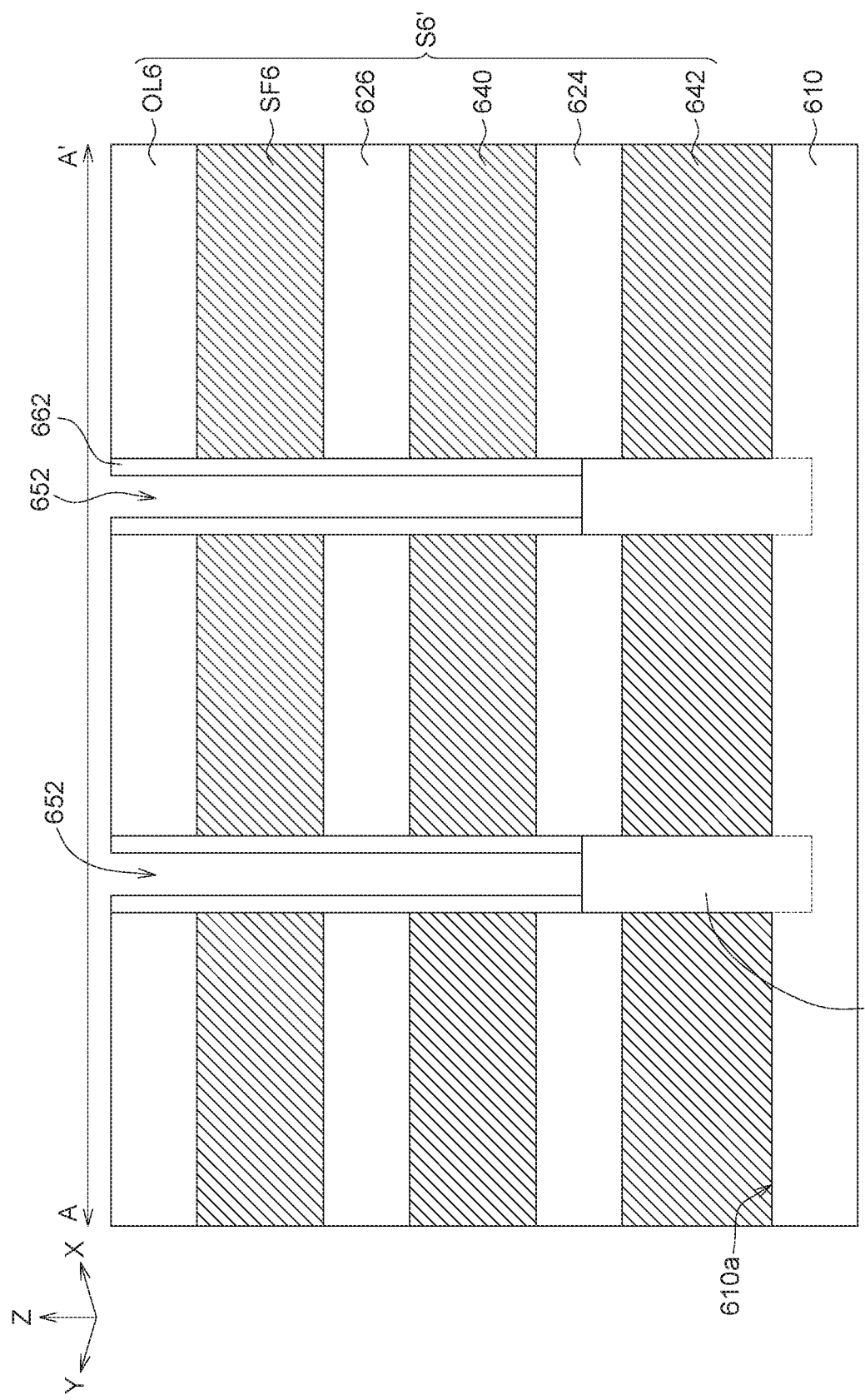

Referring to FIG. 11F, the protective layer 664 is removed by immersed in a solvent, and the memory layer 662 is exposed. This solvent is, for example, hot phosphoric acid ($H_3PO_4$), but the present invention is not limited thereto, as long as it is a solvent that can remove the protective layer 664 without damaging the memory layer 662.

Figure 11G:
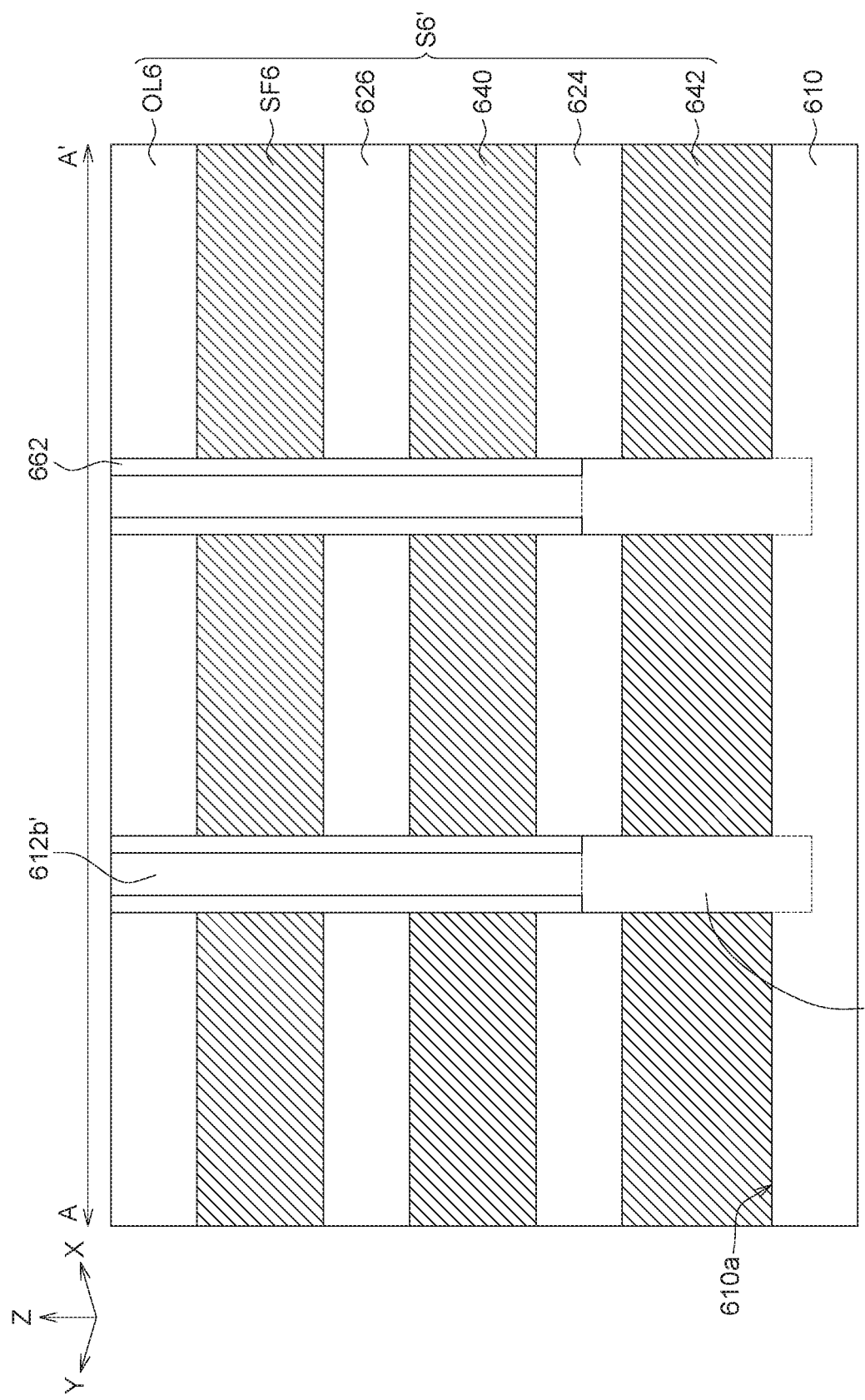

Referring to FIG. 11G, an upper portion 612b' of the channel structure is formed by a second epitaxial growth process.

Figure 11H:
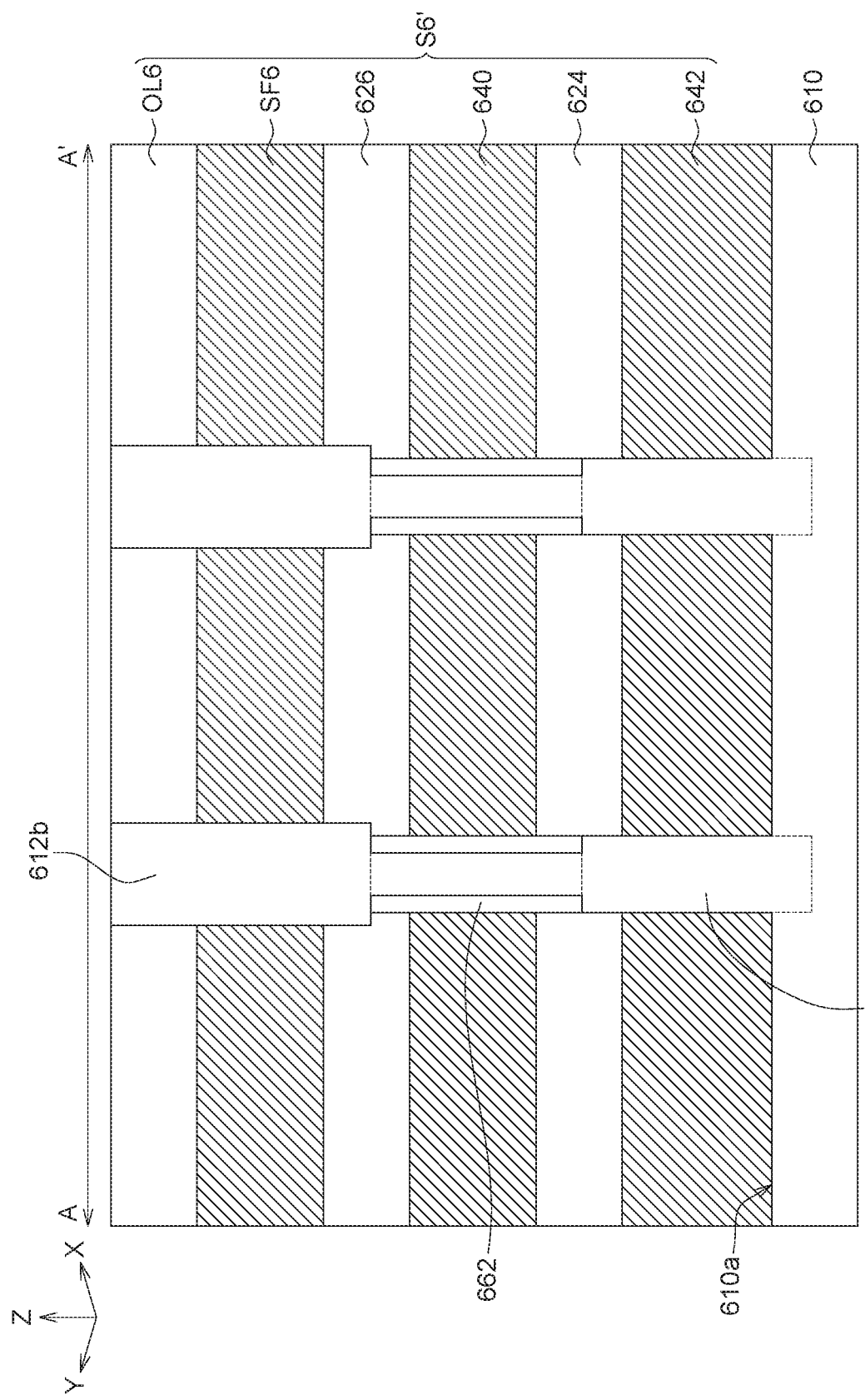

Referring to FIG. 11H, portions of the upper portion 612b' and the memory layer 662 are removed to form vertical openings penetrating the top insulating layer OL6, the top sacrificial layer SF6, and a portion of the third insulating layer 626. A width of the vertical opening may be greater than a width of the lower portion 612a of the channel structure. Next, an upper portion 612b of the channel structure is formed by a third epitaxial growth process.

Figure 11I:
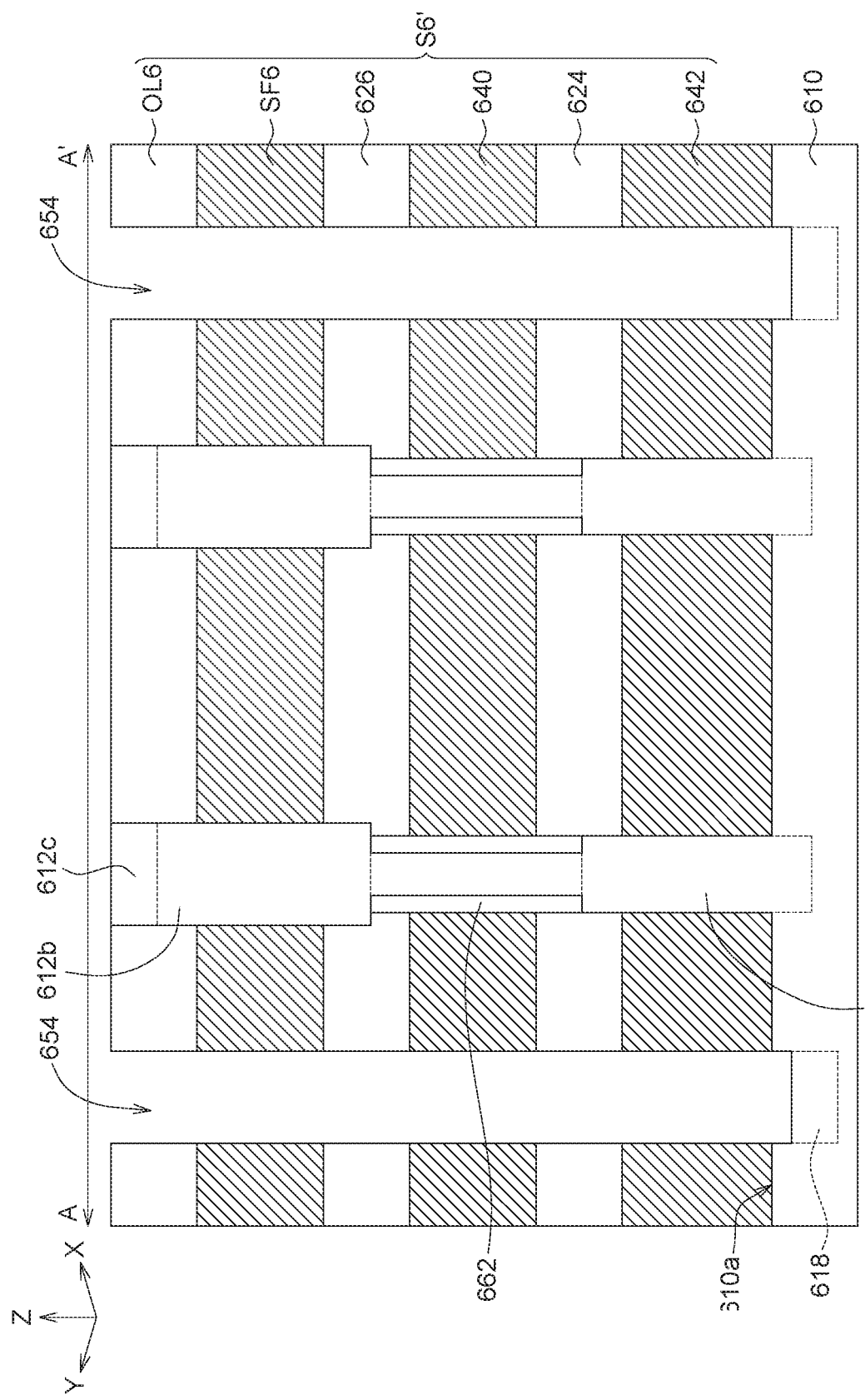

Referring to FIG. 11I, second openings 654 penetrating the stacked body S6' are formed by an etching process. The etching process is, for example, a dry etching process. Thereafter, doped regions 618 may be formed on the substrate 610 corresponding to the second openings 654 by an ion implantation, and a doped region 612c may be formed on top of the channel structure 612. The doped regions 612c and 618 include, for example, heavily doped n-type semiconductors. Alternatively, the steps of forming the doped regions 612c and 618 may be performed after removing the upper sacrificial layer 640 and the lower sacrificial layer 642.

Figure 11J:
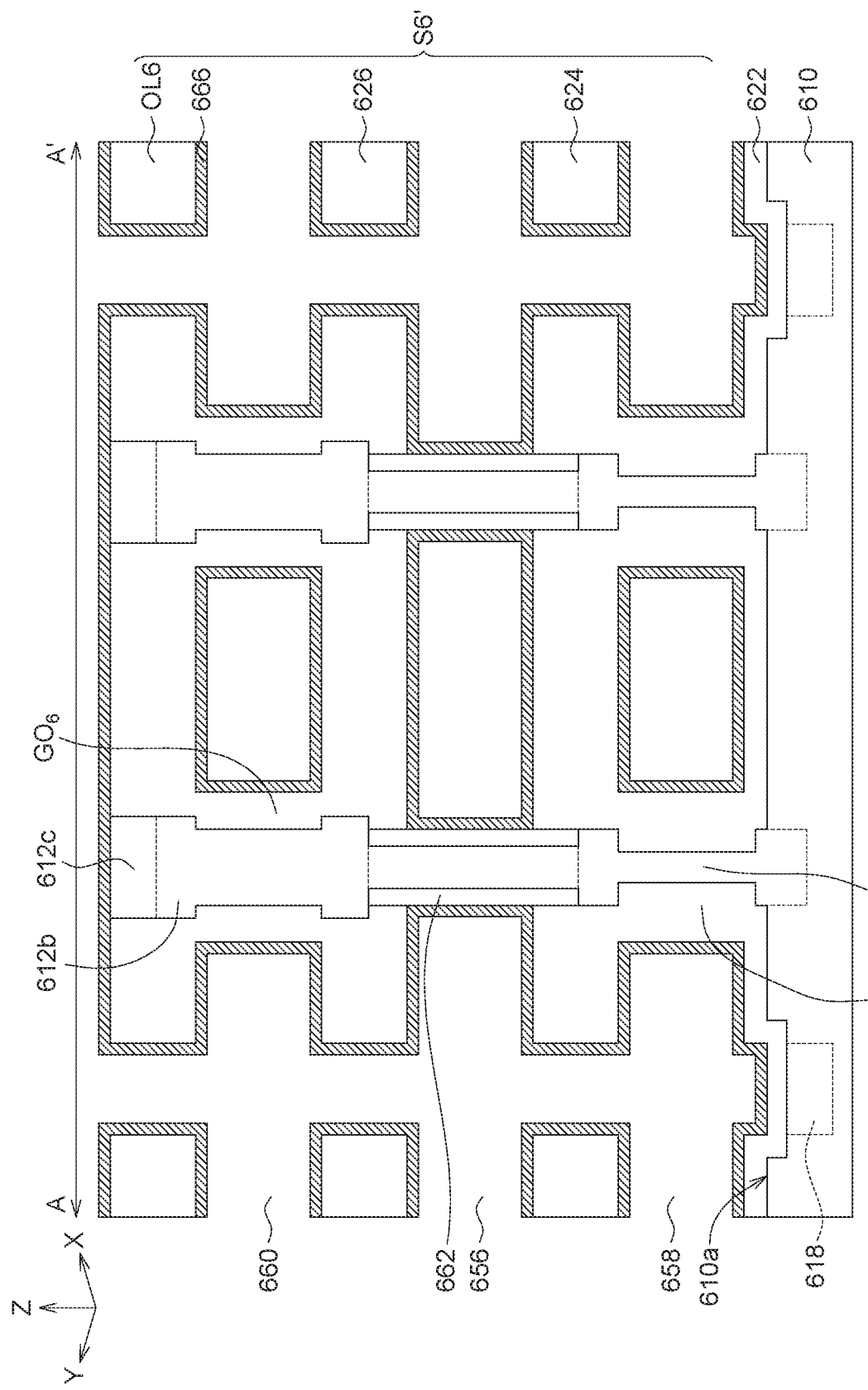

Referring to FIG. 11J, the top sacrificial layer SF6, the upper sacrificial layer 640, and the lower sacrificial layer 642 are removed from the second openings 654 through an etching process, so that top openings 660, upper openings 656, and lower openings 658 are respectively formed at the positions where the top sacrificial layer SF6, the upper sacrificial layer 640 and the sacrificial layer 642 are removed. The etching process may be isotropic etching (such as wet etching), and may be a highly selective etching, such as selectively etching silicon nitride without etching silicon dioxide.

Next, a thermal oxide layer 632 is formed on the surface of the channel structures 612 exposed from the lower openings 658, a first insulating layer 622 is formed on the upper surface 610a of the substrate 610 exposed from the lower openings 658, and a thermal oxidation layer GO6 is formed on one side surface of the channel structure 612 exposed from the top openings 660, through an oxidation process. In some embodiments, the channel structures 612 are epitaxial growth layers of silicon. Through the oxidation process and high temperature, thermal oxide layers $GO_6$ and 632 including silicon dioxide are respectively formed on the side surfaces of the channel structures 612 exposed from the top openings 660 and the side surfaces of the channel structures 612 exposed from the lower openings 658.

Thereafter, a dielectric material 666 extending along the sidewalls of the second openings 654, the lower opening 658, the upper opening 656, and the top opening 660 and covering the top insulating layer OL6 is formed by a deposition process. In some embodiments, the dielectric material 666 may include a high k material, such as aluminum oxide ($Al_2O_3$) or other suitable materials. The dielectric material 666 can also serve as a barrier layer to prevent lateral diffusion of charges.

Figure 11K:
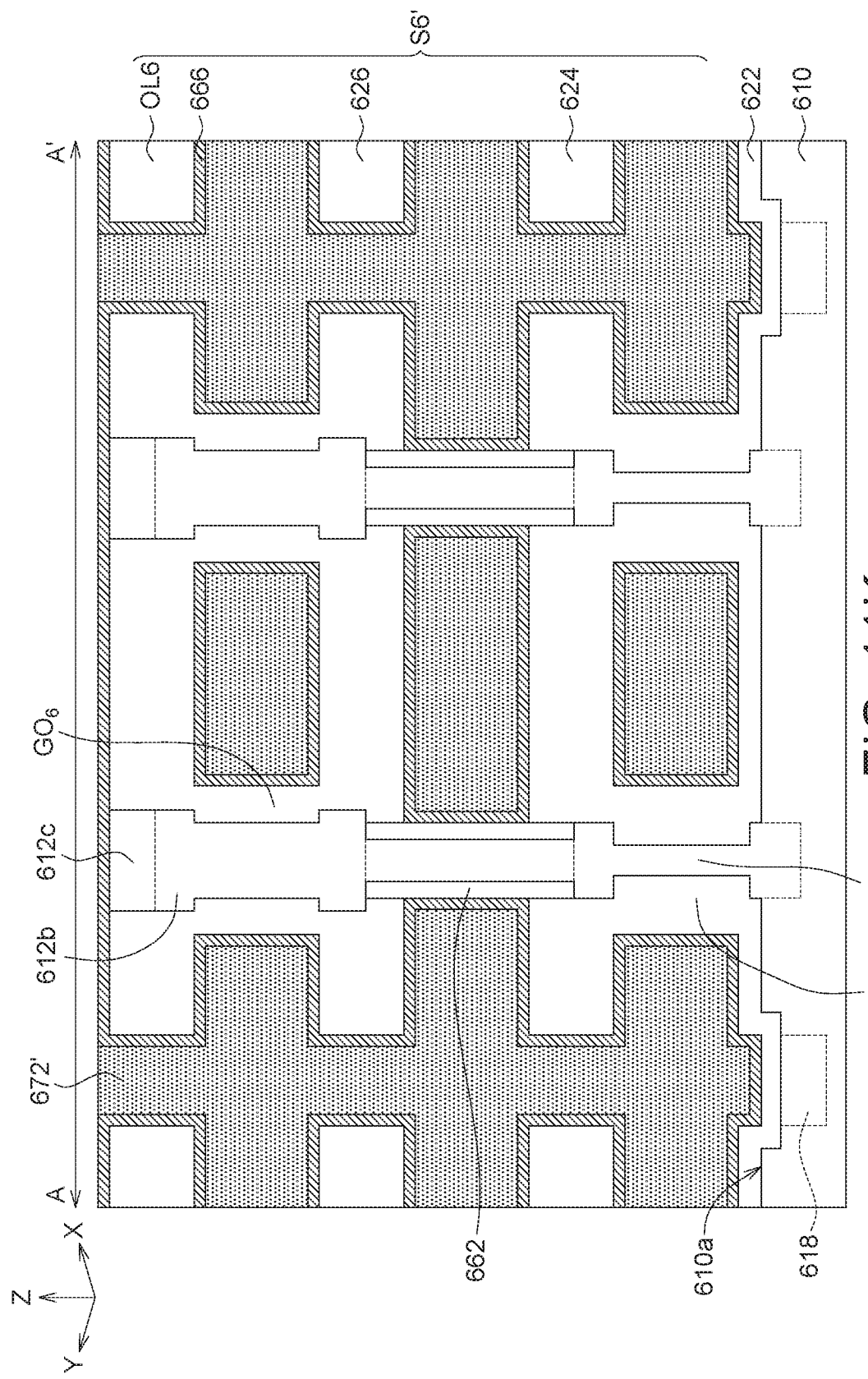

Referring to FIG. 11K, a conductive material 672' is filled in the second openings 654, the top opening 660, the lower opening 658, and the upper openings 656 by a deposition process. The conductive material 672' may include tungsten (W), aluminum (Al), titanium nitride (TiN), tantalum nitride (TaN), or other suitable materials.

Figure 11L:
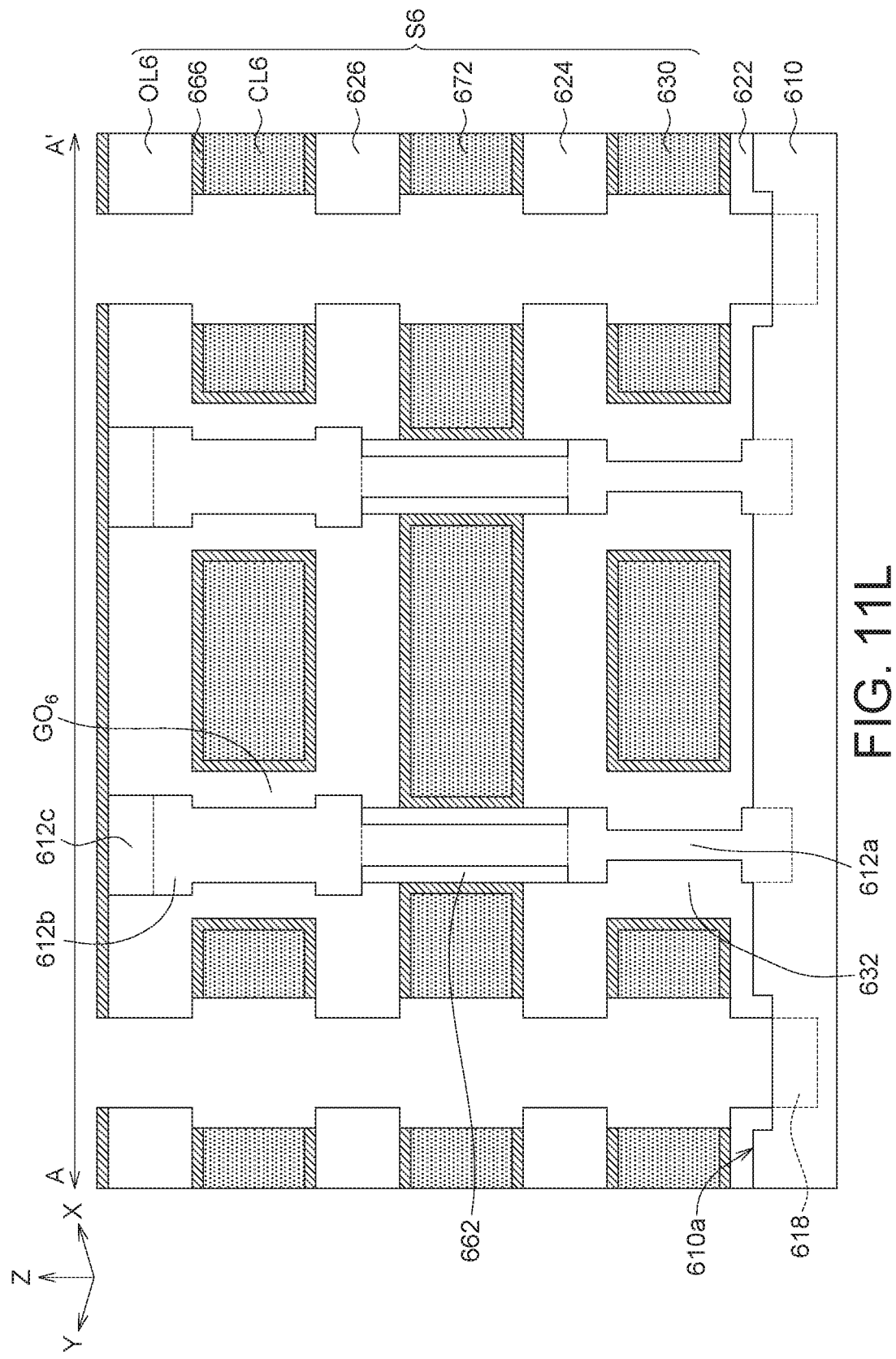

Referring to FIG. 11L, the conductive material 672' disposed in the second openings 654 is removed by an etching process to form a first conductive layer 630 disposed in the lower opening 658 and a second conductive layer 672 disposed in the upper opening 656 and a top conductive layer CL6 disposed in the top opening 660. The etching process is, for example, a dry etching process. In some embodiments, portions of the conductive material 672' in the top opening 660, the upper opening 656, and the lower opening 658 can be concurrently removed by the etching process. The first conductive layer 630, the second conductive layer 672, and the top conductive layer OL6 may include tungsten (W), aluminum (Al), titanium nitride (TiN), tantalum nitride (TaN), or other suitable conductive materials, respectively. In this embodiment, the first conductive layer 630, the second conductive layer 672, and the top conductive layer CL6 may include the same conductive material, such as tungsten (W). Thereby, a stacked structure S6 including a first insulating layer 622, a first conductive layer 630, a second insulating layer 624, a second conductive layer 672, a third insulating layer 626, a top conductive layer OL6 and a top insulating layer OL6 is formed.

Figure 11M:
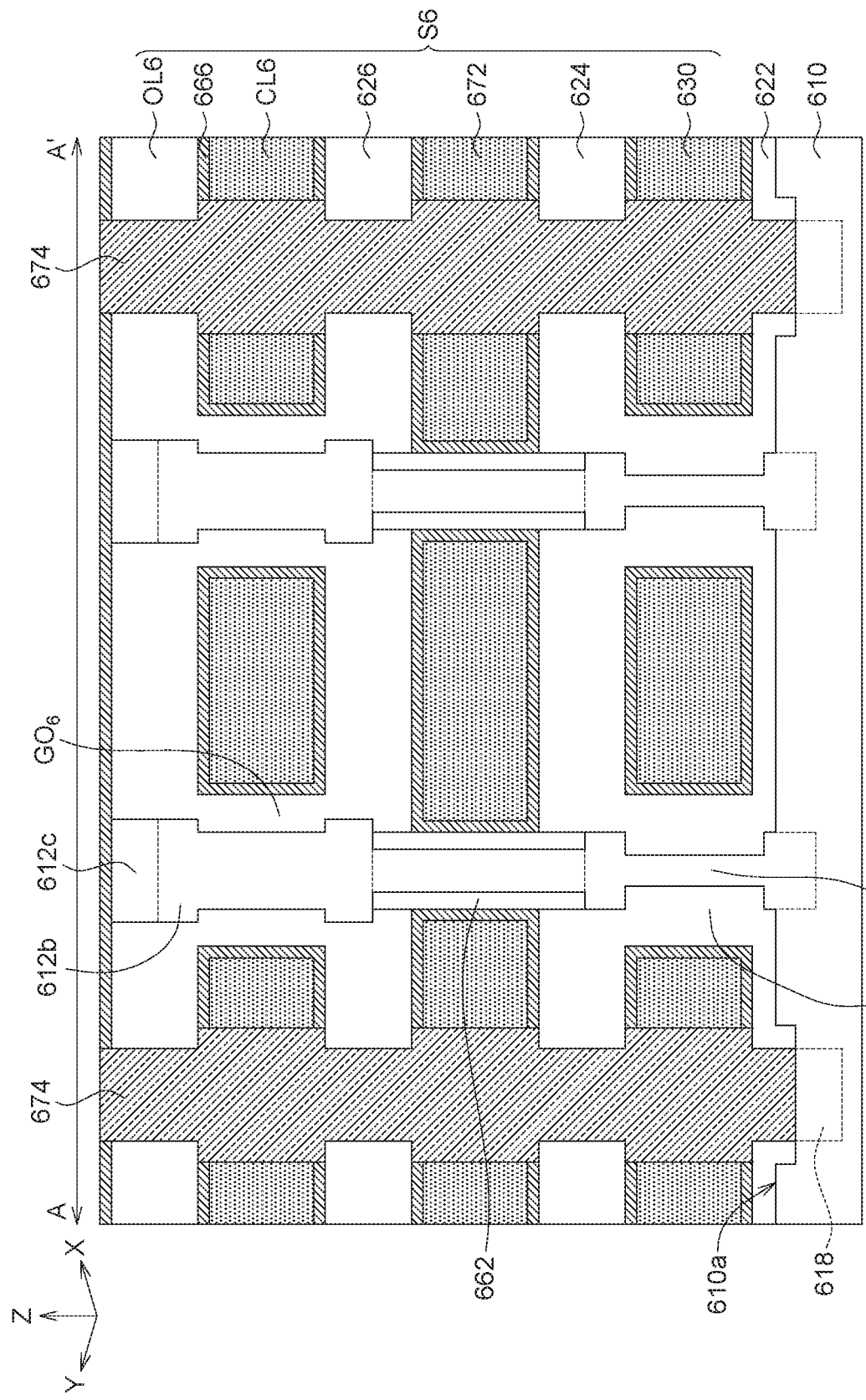

Referring to FIG. 11M, an insulating material is filled into the second openings 654 through a deposition process to form a plurality of isolation structures 674. The isolation structure 674 may include an oxide or other suitable insulating material.

Thereafter, please refer back to FIG. 1G, a plurality of vertical openings penetrating the isolation structures 674 and extending along the normal direction of the upper surface 610a of the substrate 610 are formed, and then a conductive material is filled in the vertical openings by a deposition process, to form a plurality of conductive connection structures 676. The conductive connection structures 676 may include tungsten (W), aluminum (Al), titanium nitride (TiN), or other suitable conductive materials. In this way, the memory device 600 shown in FIG. 1G is formed.

FIGS. 12A to 12K are cross-sectional views illustrating a method for forming a memory device 700 according to an embodiment of the present disclosure.

Figure 12A:
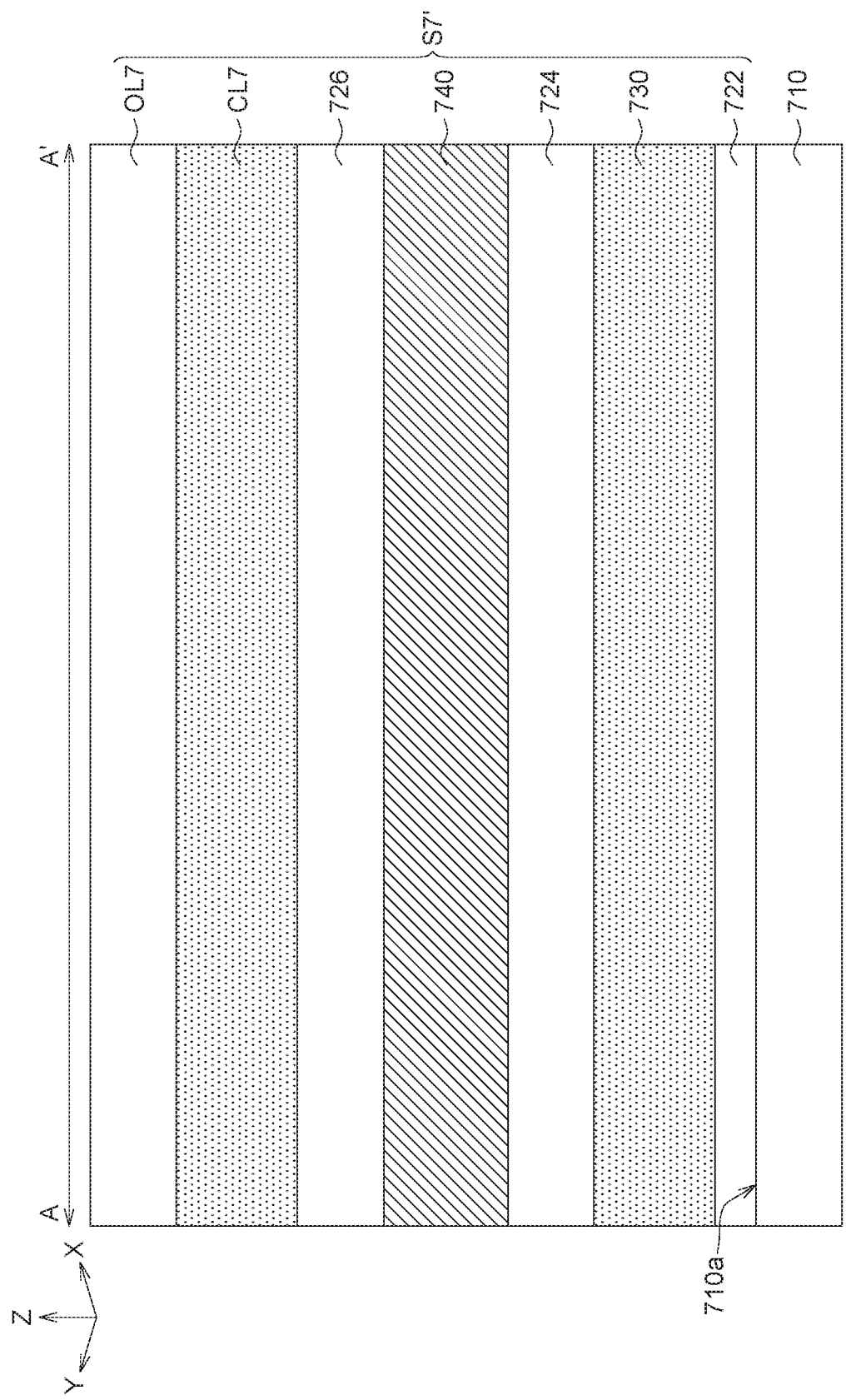
FIGS. 12A to 12K are cross-sectional views illustrating a method for fabricating a memory device in accordance with one further embodiment of the present invention.

Referring to FIG. 12A, a substrate 710 is provided, and a stacked body S7' is formed on the upper surface 710a of the substrate 710. The stacked body S7' includes a first insulating layer 722, a first conductive layer 730, a second insulating layer 724, an upper sacrificial layer 740, a third insulating layer 726, a top conductive layer CL7, and a top insulating layer OL7 sequentially stacked (for example, by a deposition process) on a top surface 710a of the substrate 710.

In some embodiments, the substrate 710 may be a silicon substrate or other suitable substrates. A first insulating layer 722, a second insulating layer 724, a third insulating layer 726, and a top insulating layer OL7 may be formed of an oxide, such as silicon dioxide. The lower sacrificial layer 742, the upper sacrificial layer 740, and the top insulating layer OL7 may be formed of silicon nitride (SiN).

Figure 12B:
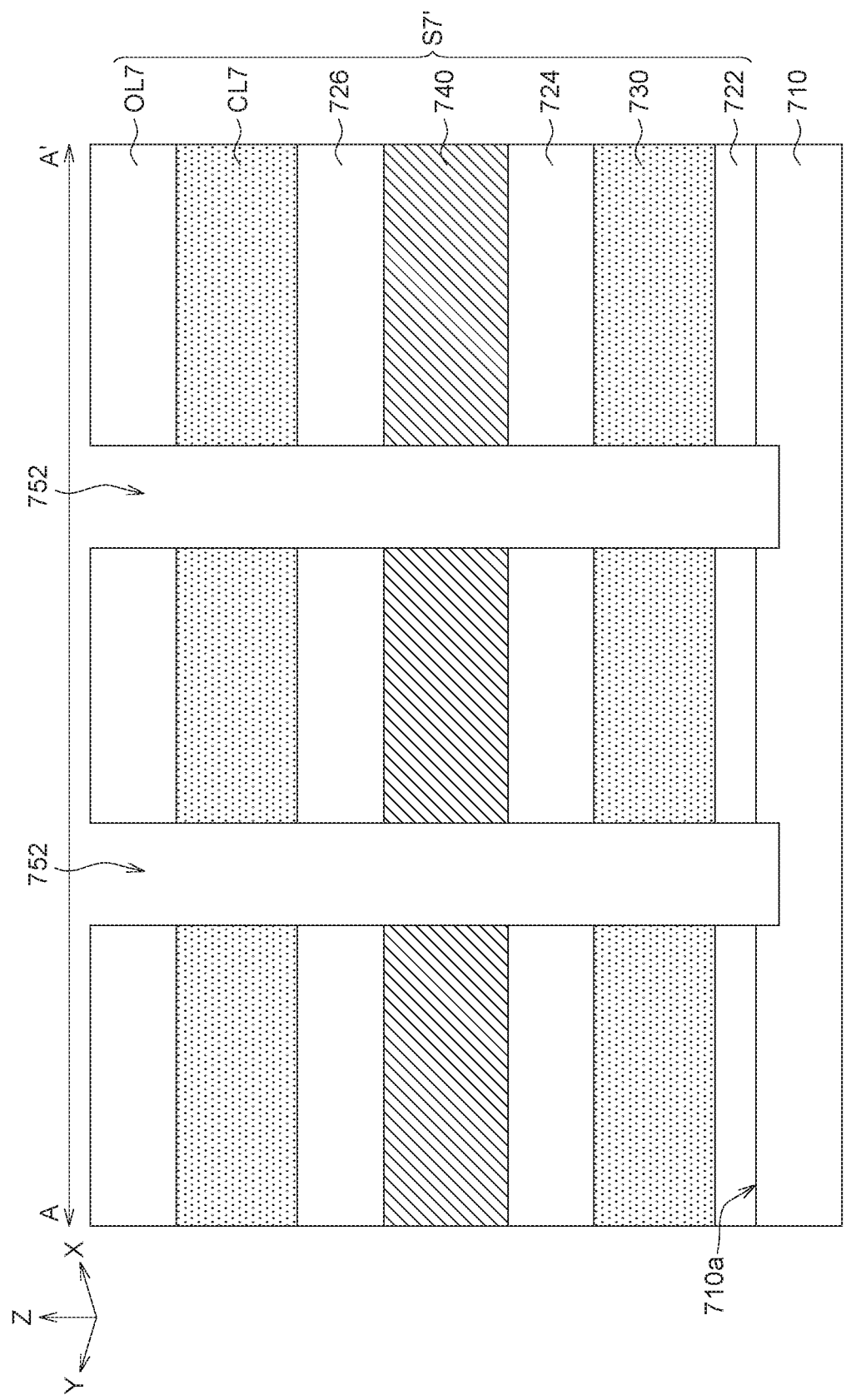

Referring to FIG. 12B, a plurality of first openings 752 are formed, and each of the first openings 752 penetrating the stacked body S7' to expose portions of the substrate 710 to the outside. In some embodiments, the first openings 752 may be formed by an etching process, such as a dry etching process. In some embodiments, the substrate 710 may be overetched such that the bottom of the first opening 752 is lower than the upper surface 710a of the substrate 710.

Figure 12C:
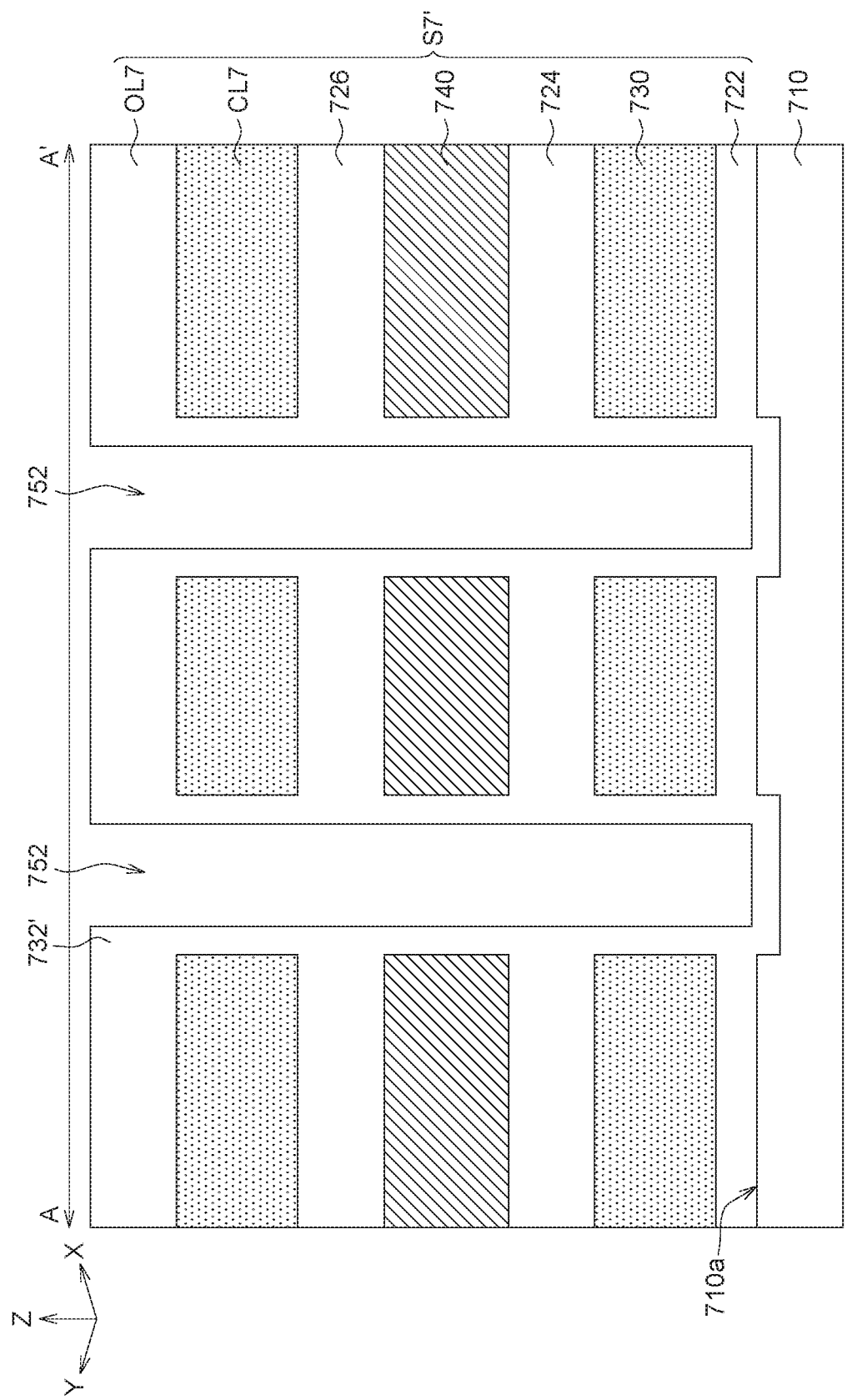

Referring to FIG. 12C, an oxide layer 732' is formed on a sidewall and the bottom of the first openings 752 by a deposition process. In some embodiments, the first insulating layer 722, the second insulating layer 724, the oxide layer 732', the third insulating layer 726, and the top insulating layer OL7 may be formed of the same material.

Figure 12D:
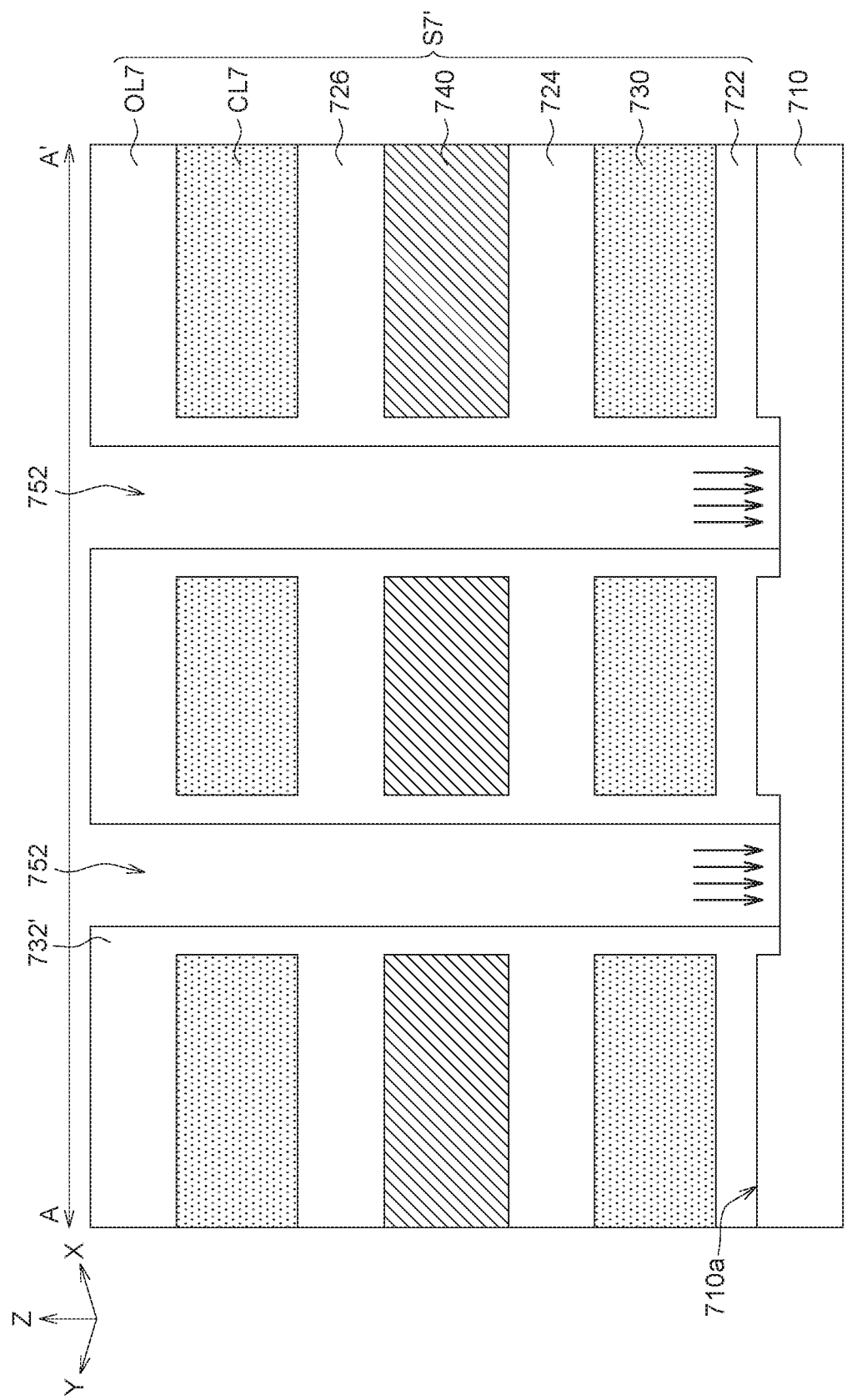

Referring to FIG. 12D, the excess portions of the oxide layer 732' in the first openings 752 are removed, and the substrate 510 is exposed. In some embodiments, a P-type dopant is implanted into the substrate 710 by an ion implantation. This P-type dopant helps to adjust the threshold voltage.

Figure 12E:
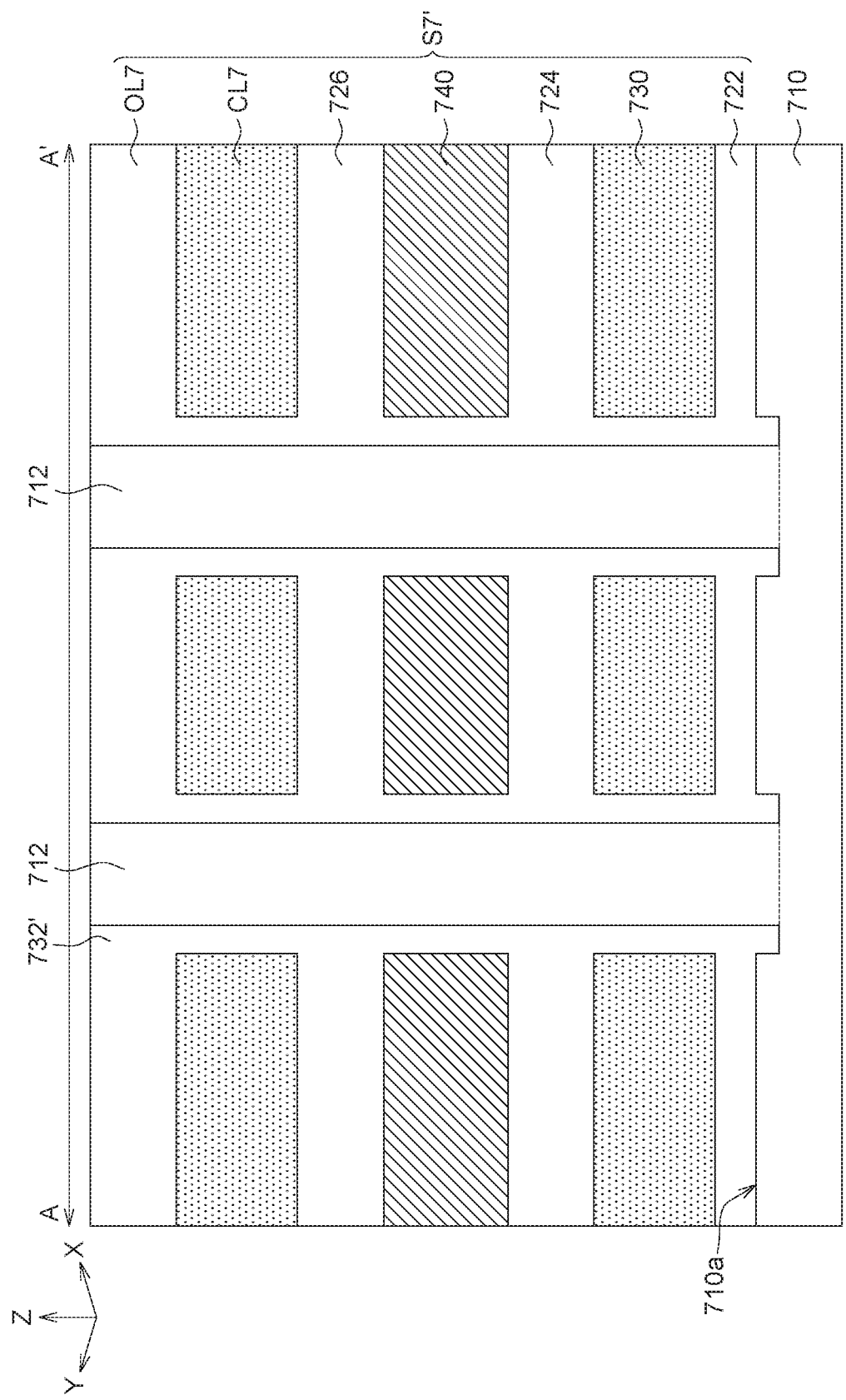

Referring to FIG. 12E, channel structures 712 covering the oxide layer 732' are formed by a first epitaxial growth process.

Figure 12F:
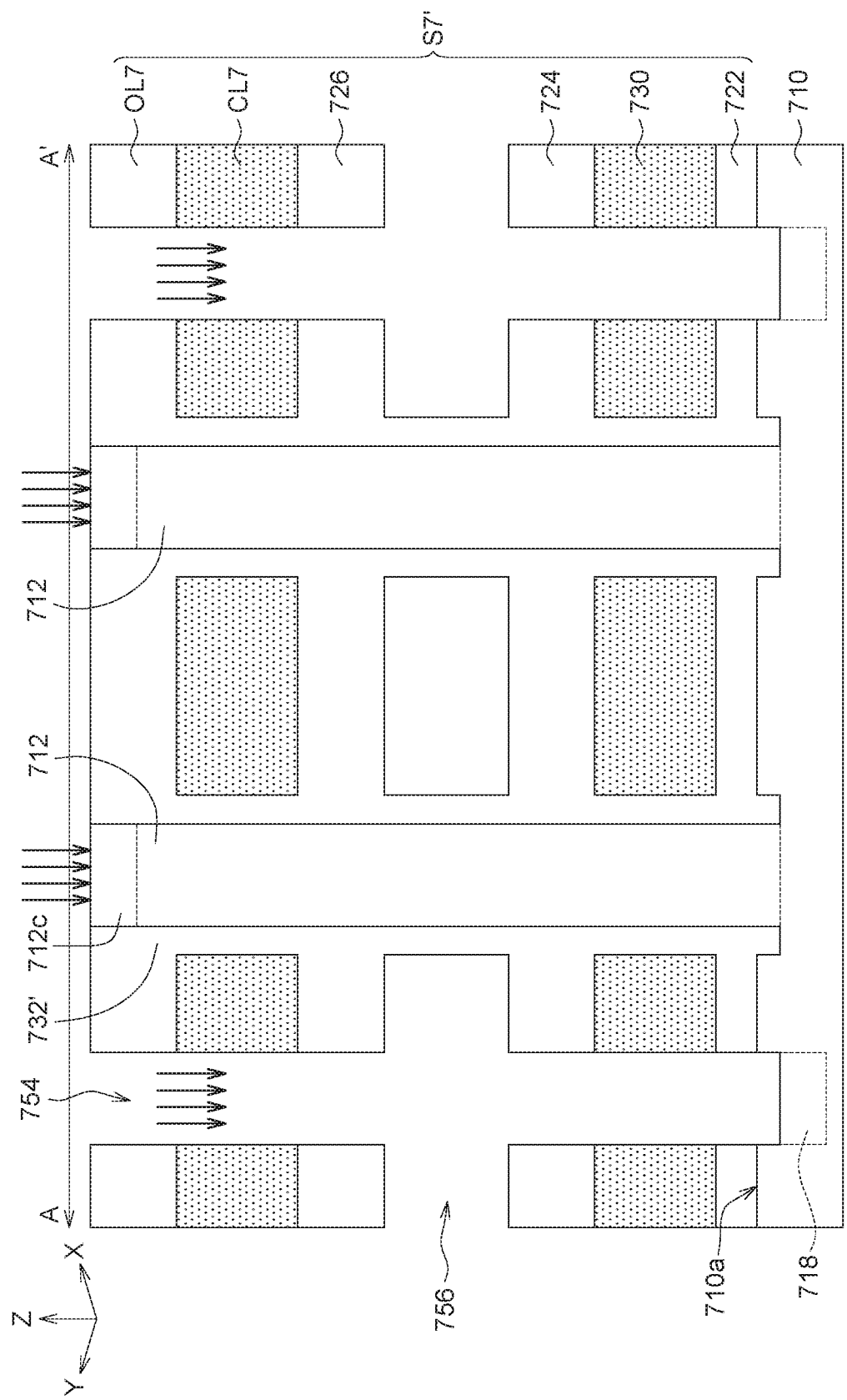

Referring to FIG. 12F, second openings 754 penetrating the first insulating layer 722, the first conductive layer 730, the second insulating layer 724, the upper sacrificial layer 740, the third insulating layer 726, and the top conductive layer OL7 and the top insulating layer OL7 are formed by an etching process. Next, the upper sacrificial layer 740 is removed to, and an upper opening 756 is formed at a position where the upper sacrificial layer 740 is removed. Next, doped regions 712c and 718 are formed on the top of the channel structures 712 and the surfaces of the substrate 710 exposed from the second opening 754 by an ion implantation, respectively. The doped regions 712c and 718 are, for example, regions of heavily doped n-type semiconductors. Doped regions 712c and 718 can be used to form contact structures in subsequent processes to be electrically connected to the bit line and the common source line, respectively.

Figure 12G:
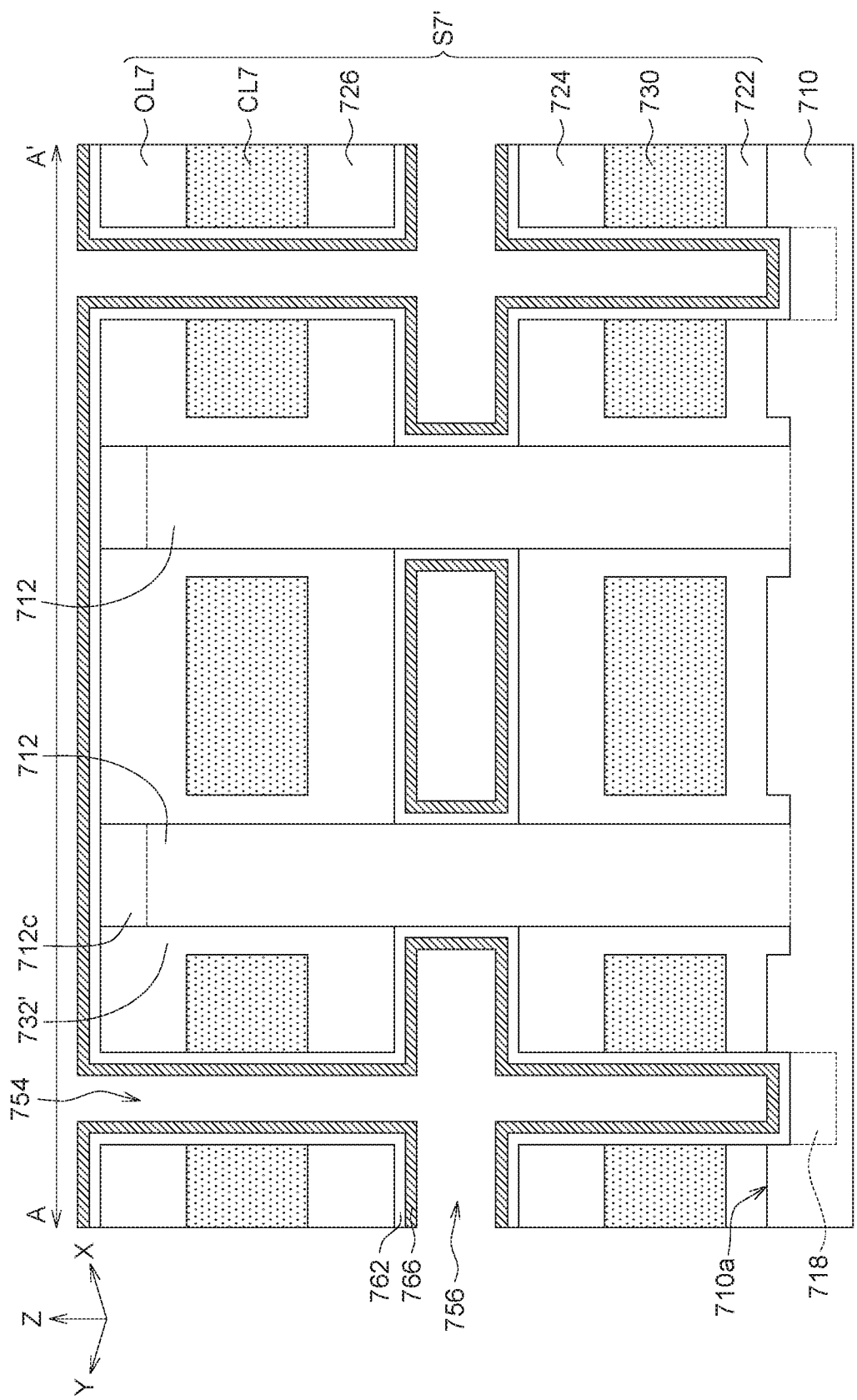

Referring to FIG. 12G, the oxide layer 732' corresponding to the upper opening 756 is removed (that is, the middle portion of the oxide layer 732' is removed), and then a memory layer 762 and a dielectric material 766 extending along the sidewalls of the second openings 754 and the upper opening 756 and covering the top insulating layer OL7 are sequentially formed by a deposition process. The memory layer 762 may be composed of a composite layer (ie, an ONO layer) including a silicon oxide layer, a silicon nitride layer, and a silicon oxide layer. For example, the memory layer 762 may include a tunneling layer, a trapping layer, and a blocking layer. The tunneling layer may include a double-layer structure formed by silicon dioxide ($SiO_2$), silicon dioxide ($SiO_2$)/silicon oxynitride (SiON), or other suitable materials. The trapping layer may include silicon nitride, polycrystalline silicon, or other suitable materials. The blocking layer may include silicon dioxide ($SiO_2$) or other suitable materials. In some embodiments, the dielectric material 766 may include a high k material, such as aluminum oxide ($Al_2O_3$) or other suitable materials. The dielectric material 766 can also serve as a barrier layer to prevent lateral diffusion of charges.

Figure 12H:
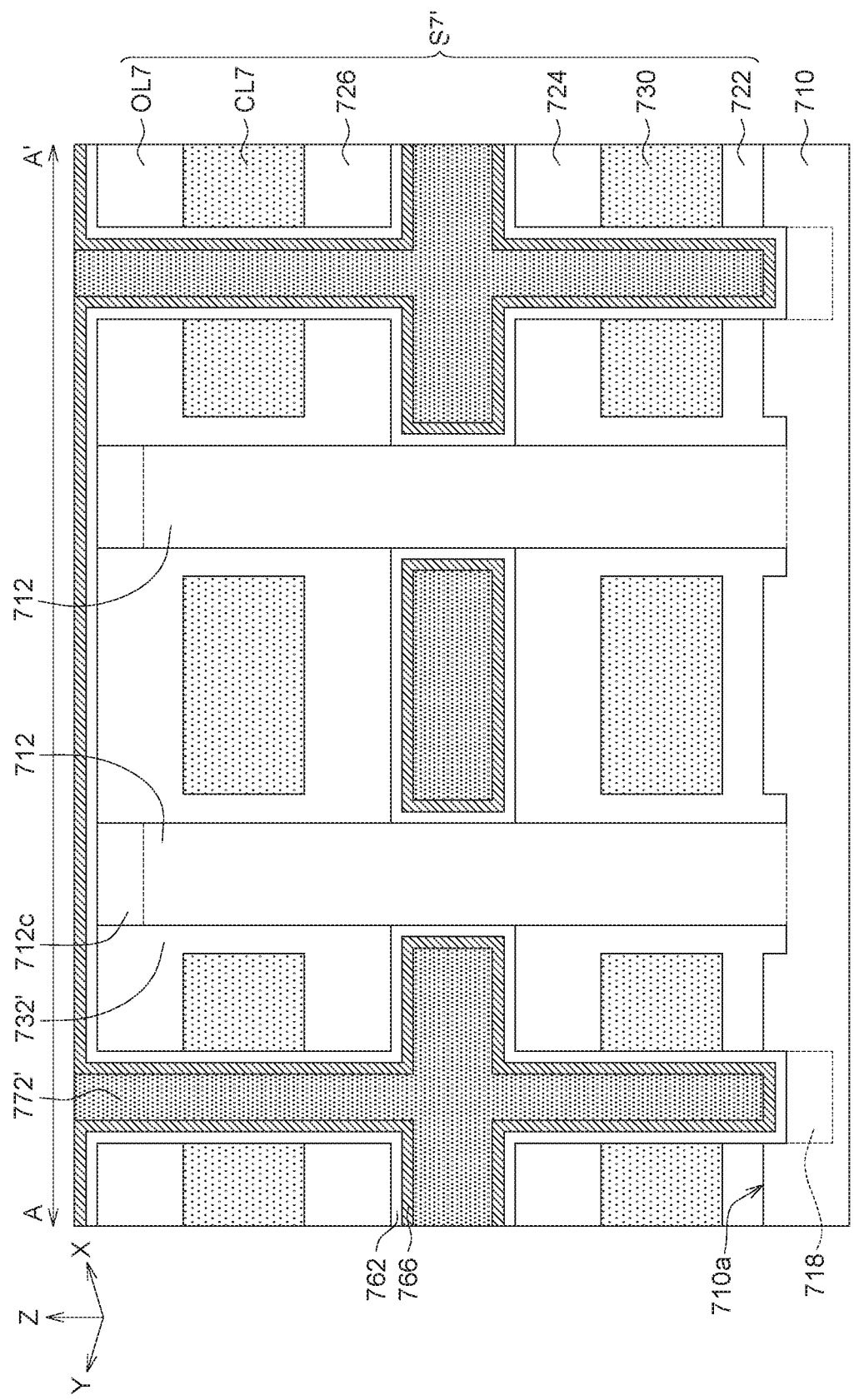

Referring to FIG. 12H, a conductive material 772' is filled in the second openings 754 and the upper opening 756 by a deposition process. The conductive material 772' may include tungsten (W), aluminum (Al), titanium nitride (TiN), tantalum nitride (TaN), or other suitable materials.

Figure 12I:
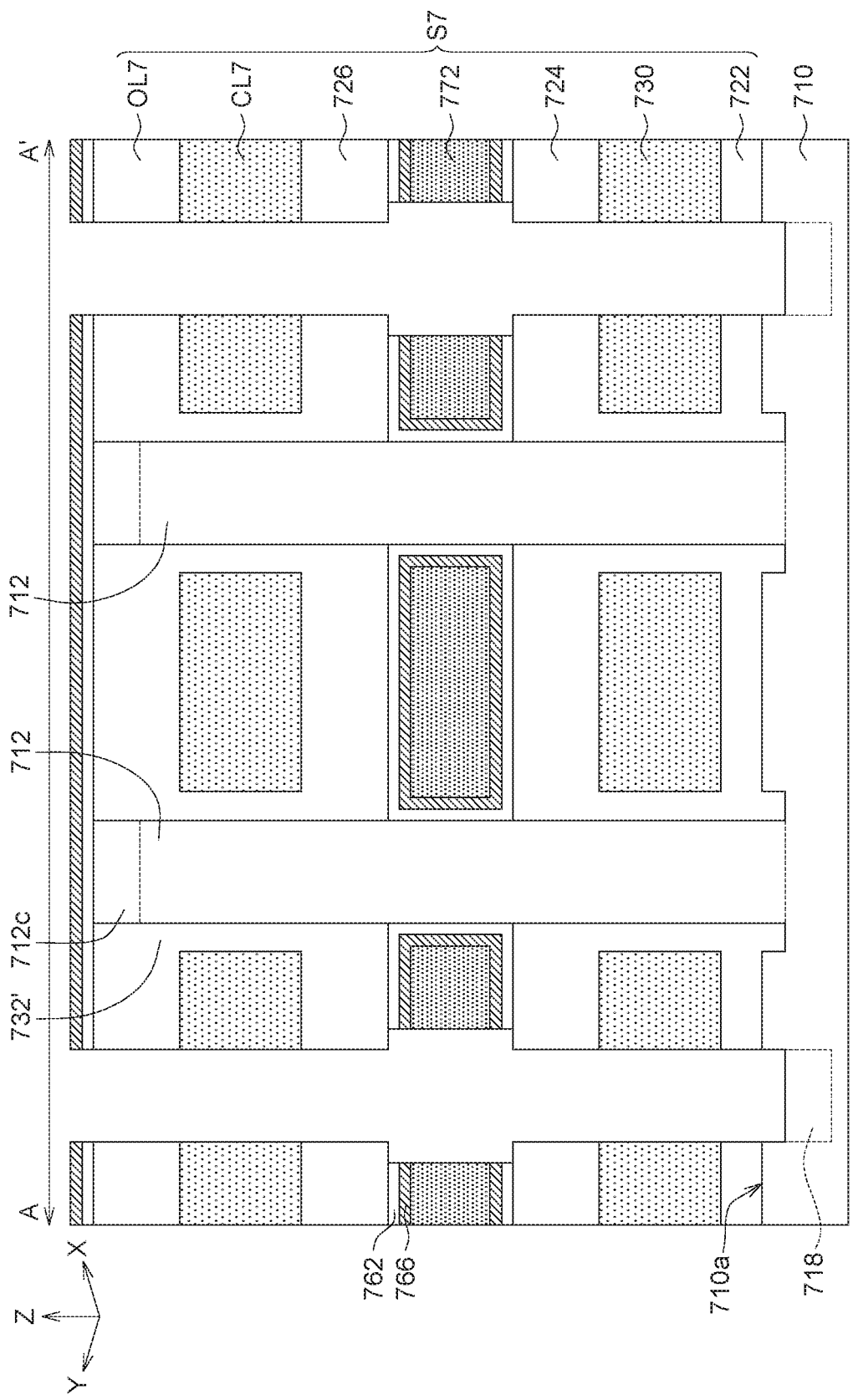

Referring to FIG. 12I, the conductive material 772' disposed in the second openings 754 is removed by an etching process to form a second conductive layer 772 disposed in the upper opening 756. The etching process is, for example, a dry etching process. In some embodiments, the etching process may concurrently remove portions of the conductive material in the upper opening 756. The second conductive layer 772 may include tungsten (W), aluminum (Al), titanium nitride (TiN), tantalum nitride (TaN), or other suitable conductive materials. In this embodiment, the second conductive layer 772 includes tungsten (W). Thereby, a stacked structure S7 including a first insulating layer 722, a first conductive layer 730, a second insulating layer 724, a second conductive layer 772, a third insulating layer 726, a top conductive layer CL7, and a top insulating layer OL7 is formed.

Figure 12J:
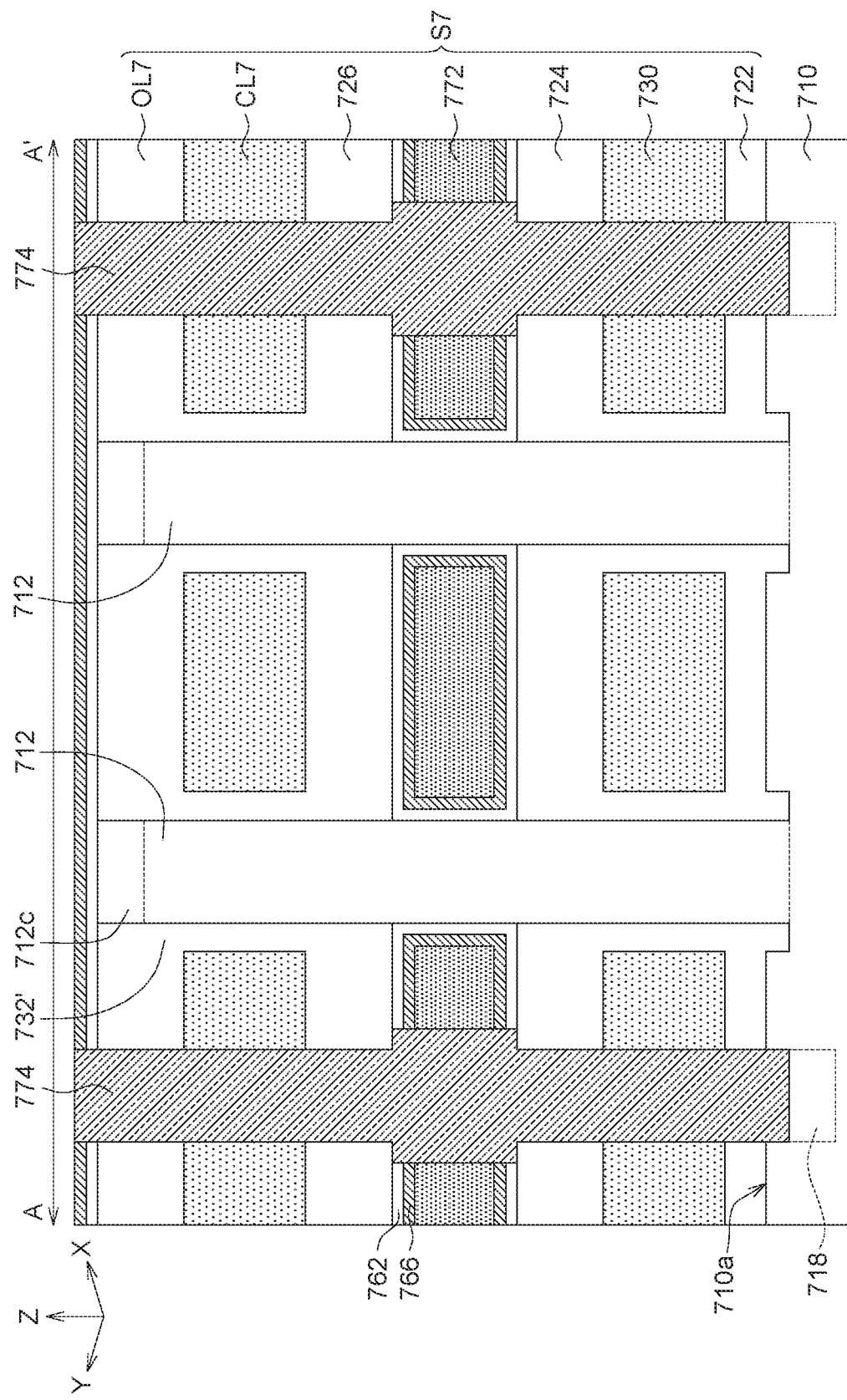

Referring to FIG. 12J, an insulating material is filled into the second openings 754 through a deposition process to form a plurality of isolation structures 774. The isolation structures 774 may include an oxide or other suitable insulating material.

Figure 12K:
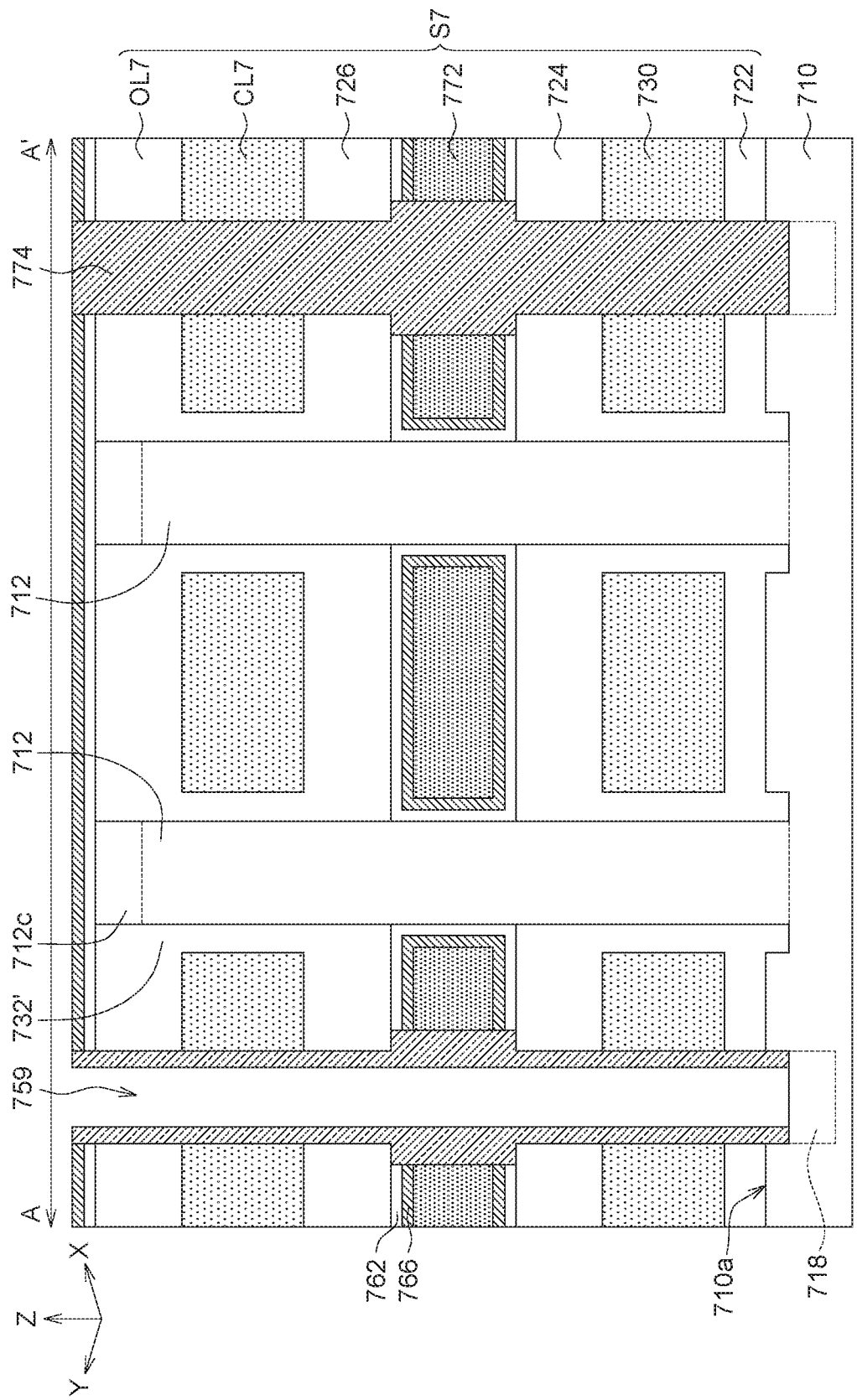

Referring to FIG. 12K, a plurality of vertical openings 759 extending through the isolation structures 774 and extending along the normal direction of the upper surface 710a of the substrate 710 are formed.

After that, please refer back to FIG. 1H, a conductive material is filled in the vertical openings 759 by a deposition process to form a plurality of conductive connection structures 776. The conductive connection structures 776 may include tungsten (W), aluminum (Al), titanium nitride (TiN), or other suitable conductive materials. In this way, a memory device 700 as shown in FIG. 1H is formed.

Figure 13:
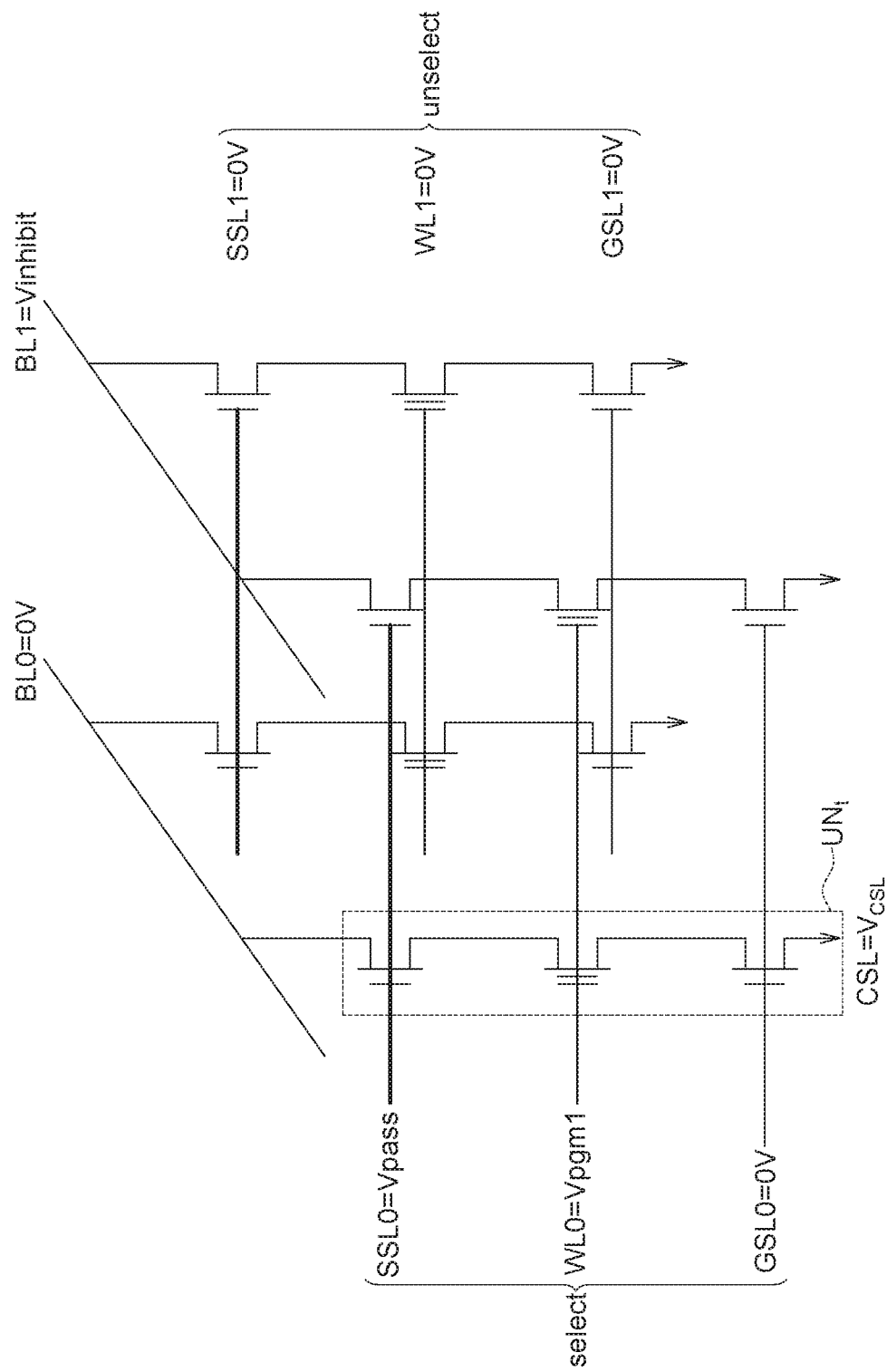
FIG. 13 is an equivalent circuit diagram illustrating an erase operation performed to a memory device by Fowler-Nordheim injection in accordance with one embodiment of the present invention.
Figure 14A:
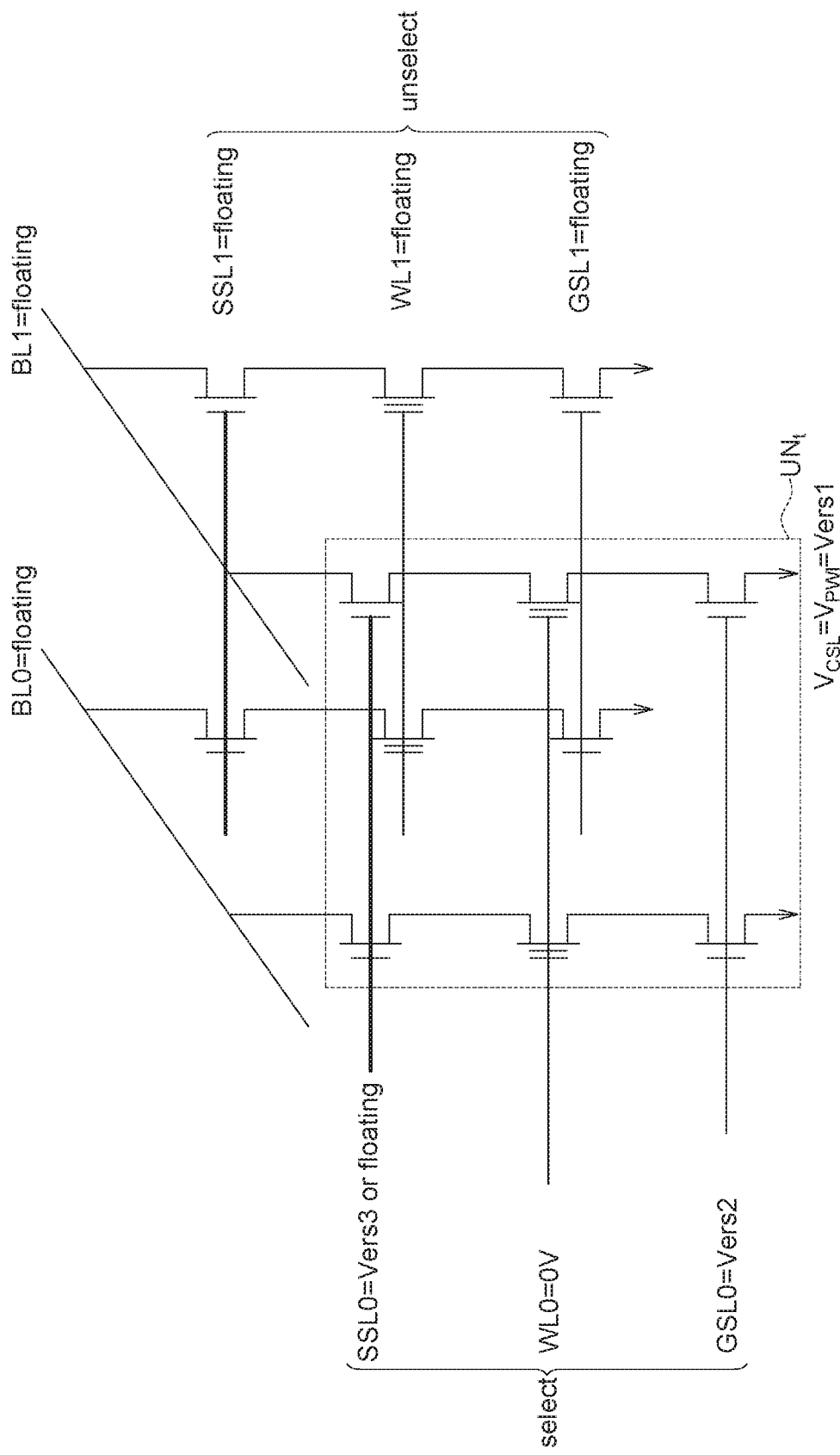
FIG. 14A is an equivalent circuit diagram illustrating an erase operation performed to a memory device by Fowler-Nordheim injection in accordance with one embodiment of the present invention.
Figure 14B:
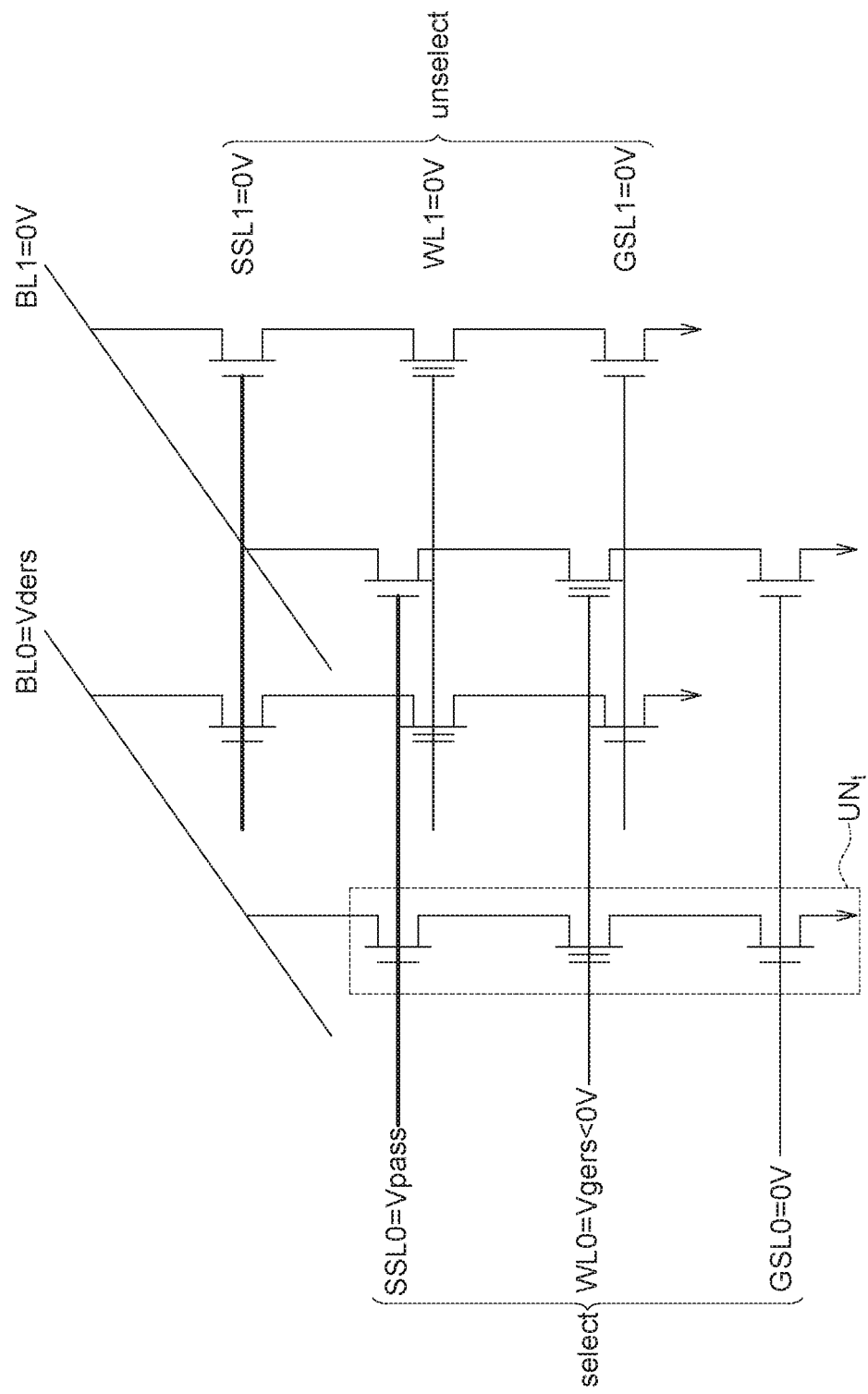
FIG. 14B is an equivalent circuit diagram illustrating an erase operation performed to a memory device by a band-to-band tunneling induced hot hole injection in accordance with one embodiment of the present invention.
Figure 15:
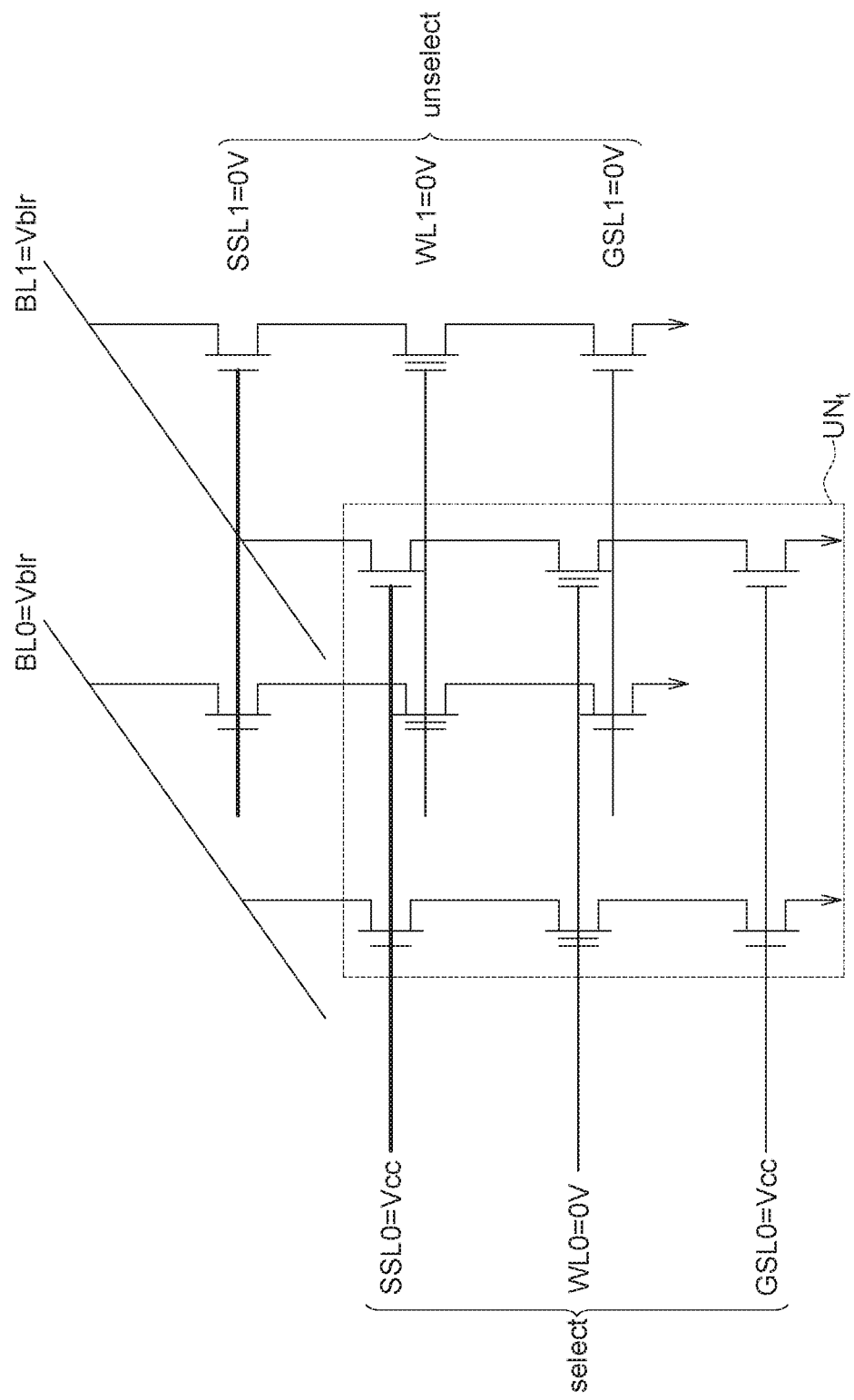
FIG. 15 is an equivalent circuit diagram illustrating a read operation performed to a memory device in accordance with one embodiment of the present invention.

FIGS. 13 to 15 show equivalent circuit diagrams of the operation to the memory device 400, 500, 600, or 700 according to an embodiment of the present disclosure.

The memory device 400, 500, 600, or 700 may be a three-dimensional NOR type memory device. In FIGS. 13-15, two selection lines SSL0, SSL1, two word lines WL0, WL1, and two bit lines BL0, BL1 are exemplarily shown in the array area of the memory device 400, 500, 600, or 700, and two ground selection lines GSL0, GSL1. However, the present invention is not limited to this, and the number of the selection lines, the word lines, the bit lines, and the ground selection lines may be more than two, respectively. Each of the intersections of word lines and the channel structures forms a memory cell M, each of the intersections of ground selection lines and the channel structures forms a transistor T, and each of the intersections of the string selection lines and the channel structures forms a transistor TS. The memory cell M is disposed above the transistor T, and the transistor TS is disposed above the memory cell M. The transistor TS, the memory cell M and the transistor T are connected by the channel structure in series. One transistor TS, one memory cell M, and one transistor T can together form a unit cell UN. Each of the transistors T is electrically connected to a common source line CSL. The word lines (eg, WL0, WL1) can be electrically isolated by isolation structures.

FIG. 13 is an equivalent circuit diagram illustrating a programming operation performed to a memory device by Fowler-Nordheim (FN) injection in accordance with one embodiment of the present invention.

Referring to FIG. 13, in order to program the target unit memory cell $UN_t$, the string selection line SSL0, the word line WL0 and the ground selection line GSL0 are selected, and a pass voltage Vpass is applied to the string selection line SSL0; a program voltage Vpgm1 is applied to the word line WL0; 0 V is applied to the ground selection line GSL0. The string selection line SSL1, the word line WL1 and the ground selection line GSL1 are unselected, and 0 V is applied to the string selection line SSL1, the word line WL1 and the ground selection line GSL1. A common source voltage $V_{CSL}$ is applied to the common source line. 0V is applied to the bit line BL0. An inhibition voltage $V_{inhibit}$ is applied to the bit line BL1. The unit cell coupled to the bit line BL1 is inhibited. In one embodiment, the pass voltage Vpass is greater than the inhibition voltage $V_{inhibit}$, to transfer the $V_{inhibit}$ to the unit cell. In one embodiment, the pass voltage Vpass equals to the inhibition voltage $V_{inhibit}$ for self-boosting, and the interference to the programming can be reduced.

FIG. 14A is an equivalent circuit diagram illustrating an erase operation performed to a memory device by Fowler-Nordheim (FN) injection in accordance with one embodiment of the present invention.

Referring to FIG. 14A, in order to erase the target unit memory cell $UN_t$ (for example, including 2 memory cells and 4 transistors in different strings), the string selection line SSL0, the word line WL0 and the ground selection line GSL0 are selected. An erase voltage Vers3 is applied to the string selection line SSL0 or the string selection line SSL0 is floating. 0 V is applied to the word line WL0. An erase voltage Vers2 is applied to the ground selection line GSL0. The string selection line SSL1 the word line WL1 and the ground selection line GSL1 are unselected, and all of which are floating (that is, no voltage is applied). A common source voltage $V_{CSL}$ is applied to the common source line. A P-well voltage $V_{PWT}$ is applied to the P well. An erase voltage Vers1 is applied to the peripheral circuit. The bit lines BL0 and BL1 are floating. The common source voltage $V_{CSL}$ can be the same as the erase voltage Vers1 and the P well voltage $V_{PWT}$.

FIG. 14B is an equivalent circuit diagram illustrating an erase operation performed to a memory device by a band-to-band tunneling induced hot hole injection in accordance with one embodiment of the present invention.

Referring to FIG. 14B, in order to erase the target unit memory cell $UN_t$, the string selection line SSL0, the word line WL0 and the ground selection line GSL0 are selected. The pass voltage Vpass is applied to the string selection line SSL0. 0 V is applied to the ground selection line GSL0. A ground erase voltage Vgers is applied to the word line WL0. The ground erase voltage Vgers can be less than zero. The string selection line SSL1, the word line WL1 and the ground selection line GSL1 are unselected, and 0 V is applied to all of them. A drain erase voltage Vders can be applied to the bit line BL0. The drain erase voltage Vders can be greater than zero. 0 V can be applied to the bit line BL1. A common source voltage $V_{CSL}$ can be applied to the common source line.

FIG. 15 is an equivalent circuit diagram illustrating a read operation performed to a memory device in accordance with one embodiment of the present invention.

Referring to FIG. 15, in order to read the target unit memory cell $UN_t$ (for example, including 2 memory cells and 2 transistors in different strings), the string selection line SSL0, the word line WL0 and the ground selection line GSL0 are selected. The power supply voltage $V_{CC}$ can be applied to the string selection line SSL0. 0 V can be applied to the word line WL0. The power supply voltage $V_{CC}$ can be applied to the ground selection line GSL0. The string selection line SSL1, the word line WL1 and the ground selection line GSL1 are unselected, and 0 V is applied to all of them. A bit line read voltage Vblr can be applied to the bit lines BL0 and BL1. A common source voltage $V_{CSL}$ is applied to the common source line. When the read operation is performed in the memory device of the present invention, all voltages applied to the bit line, the word line, and the ground selection line can be equal to or smaller than the power supply voltage $V_{CC}$, so that power consumption can be reduced.

The present invention provides a memory device, a method of fabricating the same, and a method of operating the same. Since the memory device of the present invention has a three-dimensional structure, it can be applied to the NOR type memory device, and has a smaller unit cell area than a general two-dimensional NOR memory device. Furthermore, the memory device of the present invention can use a high k material as a dielectric material, and can operate the memory device (for example, erase, write, and program) without requiring a too high voltage. Moreover, according to an embodiment of the present invention, the channel structure is an epitaxial growth layer, which has better electric characteristics than the comparative example in which only a portion of the channel structure including the epitaxial growth layer or the channel structure formed mainly by the polysilicon layer, so that the ground selection line provides better control and the threshold voltage can be smaller and the distribution is tight. In addition, the thermal oxide layer of the present invention is an oxide formed by an oxidation process directly to the first conductive layer or the channel structure, and has higher oxidation purity than that of a thermal oxide layer generally formed by a deposition method. Accordingly, it is beneficial for the regulation of the threshold voltage and can have a small threshold voltage. Therefore, the memory device of the present invention can have lower power consumption, better reliability and improved performance.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    a substrate, having an upper surface;
    a stacked structure disposed on the upper surface of the substrate, wherein the stacked structure comprises a first insulating layer, a first conductive layer, a second insulating layer, a second conductive layer and a third insulating layer sequentially stacked on the substrate;
    a plurality of channel structures penetrating the stacked structure and electrically connected to the substrate, wherein each of the channel structures comprises an upper portion corresponding to the second conductive layer and a lower portion corresponding to the first conductive layer;
    a memory layer disposed between the second conductive layer and the upper portion;
    a plurality of isolation structures penetrating the stacked structure to separate the stacked structure into a plurality of sub-stacks; and
    a thermal oxide layer disposed between the first conductive layer and each of the channel structures, wherein the thermal oxide layer directly contacts the first conductive layer.

2. The memory device according to claim 1, wherein each of the channel structures is an epitaxial growth layer, wherein a first height between a top surface of the channel structure and the upper surface of the substrate is larger than a second height between a top surface of the second conductive layer and the upper surface of the substrate.

3. The memory device of claim 1, further comprising a dielectric material disposed between the memory layer and the second conductive layer.

4. The memory device of claim 1, wherein at least a portion of the memory layer extends along a normal direction of the upper surface of the substrate.

5. The memory device of claim 4, wherein another portion of the memory layer extends in a direction parallel to the upper surface of the substrate.

6. The memory device of claim 1, wherein a purity of an oxide of the thermal oxide layer is higher than a purity of an oxide of the first insulating layer.

7. The memory device of claim 1, wherein an intersection between the first conductive layer and the thermal oxide layer forms a transistor, and an intersection between the second conductive layer and the memory layer forms a memory cell.

8. The memory device of claim 1, wherein the first conductive layer has a thickness of 300 Å to 1000 Å.

9. The memory device of claim 1, further comprising a plurality of conductive connection structures, wherein the conductive connection structures penetrate the isolation structures and are electrically connected to the substrate.

* * * * *